US007009261B2

(12) United States Patent
Nakashima

(10) Patent No.: US 7,009,261 B2
(45) Date of Patent: Mar. 7, 2006

(54) SEMICONDUCTOR DEVICE AND METHOD OF MANUFACTURING THE SAME

(75) Inventor: Takashi Nakashima, Hyogo (JP)

(73) Assignee: Renesas Technology Corp., Tokyo (JP)

(*) Notice: Subject to any disclaimer, the term of this patent is extended or adjusted under 35 U.S.C. 154(b) by 237 days.

(21) Appl. No.: 10/732,517

(22) Filed: Dec. 11, 2003

(65) Prior Publication Data

US 2004/0251517 A1 Dec. 16, 2004

(30) Foreign Application Priority Data

Jun. 11, 2003 (JP) .............................. 2003-166487

(51) Int. Cl.
*H01L 31/119* (2006.01)

(52) U.S. Cl. ....................................... 257/378; 257/499

(58) Field of Classification Search ................ 257/725, 257/499, 517, 536, 552, 557
See application file for complete search history.

(56) References Cited

U.S. PATENT DOCUMENTS 6,359,318 B1 * 3/2002 Yamamoto et al. ......... 257/378

FOREIGN PATENT DOCUMENTS

| | | |
|---|---|---|
| JP | 3-104270 | 5/1991 |
| JP | 5-3293 | 1/1993 |
| JP | 8-227945 | 9/1996 |
| JP | 2002-198448 A | 7/2002 |

* cited by examiner

*Primary Examiner*—Roy Potter
(74) *Attorney, Agent, or Firm*—McDermott Will & Emery LLP

(57) ABSTRACT

A semiconductor device includes a $p^-$-silicon substrate, $n^-$-epitaxial growth layers on the $p^-$-silicon substrate, a field insulating film at the surface of the $n^-$-epitaxial growth layer, an npn transistor formed at the $n^-$-epitaxial growth layer, an pnp transistor formed at the $n^-$-epitaxial growth layer, a DMOS transistor on the $n^-$-epitaxial growth layer, and a resistance. The DMOS transistor includes an $n^+$-diffusion layer forming a source, a p-type diffusion layer forming a back gate region, a lightly doped n-type diffusion layer forming a drain, and a heavily doped $n^+$-diffusion layer forming the drain.

11 Claims, 166 Drawing Sheets

SEMICONDUCTOR DEVICE AND METHOD OF MANUFACTURING THE SAME

BACKGROUND OF THE INVENTION

1. Field of the Invention

The invention relates to a semiconductor device and a method of manufacturing the same, and particularly to a semiconductor device provided with a DMOS (Double-Diffused Metal Oxide Semiconductor) and a bipolar transistor as well as a method of manufacturing the same.

2. Description of the Background Art

A semiconductor device employing a bipolar transistor in an output circuit has been known. For example, Japanese Patent Laying-Open No. 5-3293 has disclosed a semiconductor integrated circuit for providing an output-stage inverter circuit formed of a combination of a vertical PNP transistor and a DMOSFET.

As related arts, Japanese Patent Laying-Open No. 8-227945 has disclosed a method of forming an integrated circuit based on a BiCDMOS process, and Japanese Patent Laying-Open No. 2002-198448 has disclosed a method of manufacturing a semiconductor device by a BiCMOS process.

In the semiconductor integrated circuit disclosed in the foregoing Japanese Patent Laying-Open No. 5-3293, first and second epitaxial layers are formed on a semiconductor substrate, and an $n^+$-type collector resistance region, a p-type base region and an $n^+$-emitter region of an npn transistor are formed in the second epitaxial layer. The DMOSFET is also formed on the second epitaxial layer.

In the semiconductor integrated circuit disclosed in the foregoing Japanese Patent Laying-Open No. 5-3293, it is necessary to lower a concentration in the second epitaxial layer for lowering a saturation voltage of the DMOSFET. However, the low concentration in the second epitaxial layer impairs a breakdown voltage between a collector and a base of the npn transistor.

SUMMARY OF THE INVENTION

Accordingly, an object of the invention is to provide a structure and a manufacturing method of a semiconductor device, which is provided with a bipolar transistor and an MOS transistor, can lower a saturation voltage of the MOS transistor without lowering a breakdown voltage between elements of the bipolar transistor.

A semiconductor device according to the invention includes a semiconductor substrate of a first conductivity type; a semiconductor layer of a second conductivity type formed on the semiconductor substrate; a field insulating film selectively formed on a surface of the semiconductor layer; an element isolating region of the first conductivity type extending from the surface of the semiconductor layer to the semiconductor substrate, and isolating respective elements from each other; a gate electrode of a DMOS (Double-Diffused Metal Oxide Semiconductor) transistor formed on the semiconductor layer with a gate insulating film therebetween; a well region of the first conductivity type formed at the surface of the semiconductor layer, extending from a source side of the DMOS transistor to a position under the gate electrode of the DMOS transistor; a first impurity diffusion layer of the first conductivity type formed at the surface of the semiconductor layer and functioning as a base of the first bipolar transistor; a second impurity diffusion layer of the first conductivity type formed at the surface of the semiconductor layer and functioning as a resistance; third and fourth impurity diffusion layers of the first conductivity type formed at the surface of the semiconductor layer and functioning as an emitter and a collector of the second bipolar transistor; a fifth impurity diffusion layer of the first conductivity type formed at the surface of the well region and functioning as a back gate region of the DMOS transistor; a sixth impurity diffusion layer formed at the surface of the semiconductor layer, functioning as a drain of the DMOS transistor, and including a lightly doped region containing impurities of the second conductivity type at a relatively low concentration and a first heavily doped region containing impurities of the second conductivity type at a relatively high concentration; seventh and eighth impurity diffusion layers formed at the surface of the semiconductor layer, and functioning as an emitter and a collector of the first bipolar transistor; a ninth impurity diffusion layer formed at the surface of the semiconductor layer, and functioning as a base of the second bipolar transistor; and a tenth impurity diffusion layer formed at the surface of the well region, functioning as a source of the DMOS transistor, and formed of a second heavily doped region containing impurities of the second conductivity type at a concentration similar to that of the first heavily doped region.

According to the invention, since the MOS transistor is provided at its drain with the lightly doped region, the concentration of this lightly doped region can be determined independently of the others elements of the bipolar transistor. Therefore, a saturation voltage of the MOS transistor can be lowered without lowering a breakdown voltage between the elements of the bipolar transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to FIGS. 1 to 166.

(First Embodiment)

Figure 1:
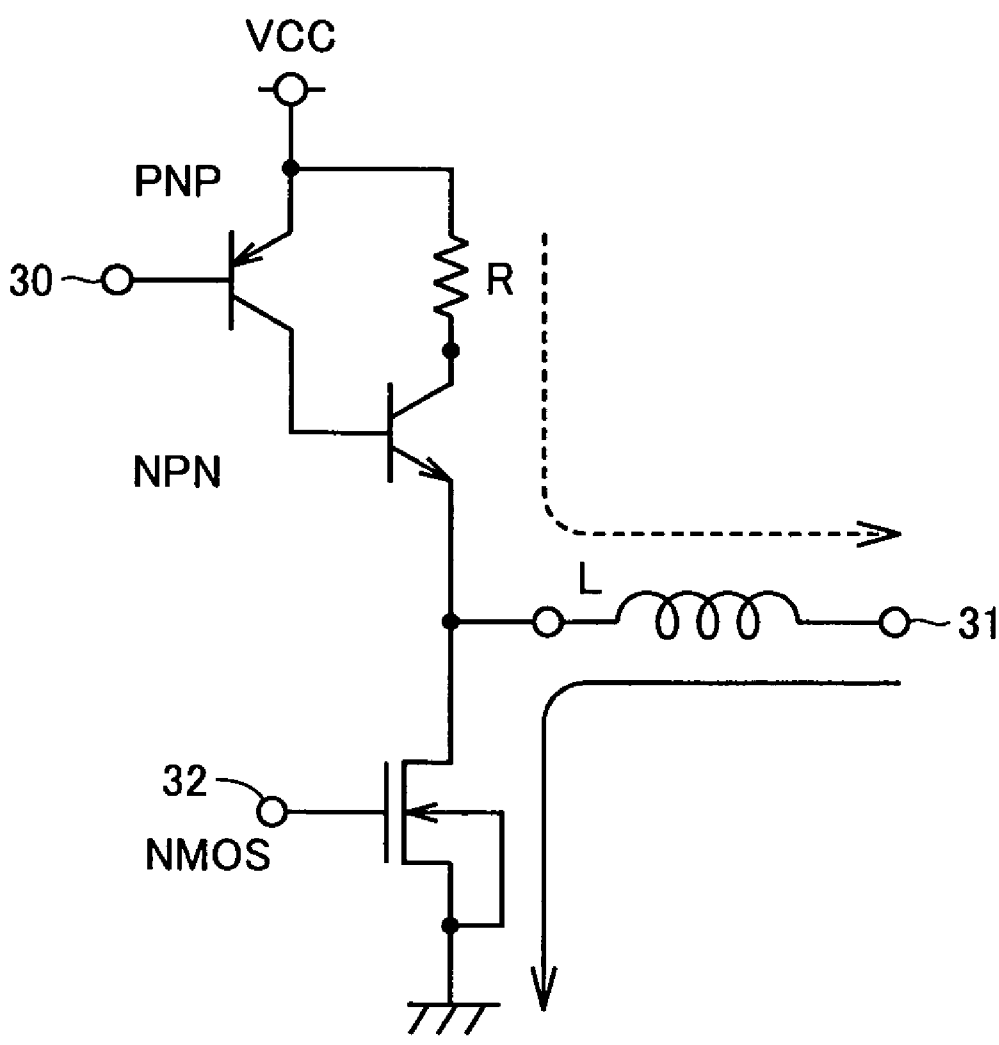
FIG. 1 is an equivalent circuit diagram of a semiconductor device of an embodiment of the invention.

FIG. 1 is an equivalent circuit diagram of a semiconductor device (semiconductor integrated circuit) according to a first embodiment. As shown in FIG. 1, bipolar transistors are used in an output circuit of the semiconductor device.

It is assumed that a large equivalent inductor L is present on an output destination. An output transistor on a power supply Vcc side (upper side in FIG. 1) is formed of a Darlington connection of pnp and npn transistors. More specifically, an emitter of the pnp transistor is connected to a power supply terminal, a collector of the npn transistor is connected to the power supply terminal via a resistance (R), and a collector of the pnp transistor is connected to a base of the npn transistor. A collector current of the pnp transistor directly drives the base of the npn transistor. The Darlington connection thus formed provides the transistors effectively having a high current amplification factor $h_{FE}$. By providing resistance R between power supply Vcc and the collector of the npn transistor as shown in FIG. 1, the collector current can be converted into an opposite end voltage of resistance R for sensing it.

The base of the pnp transistor is connected to an input terminal 30, and the emitter of the npn transistor is connected to an output terminal 31. An nMOS transistor is arranged on a ground (GND) side (lower side in FIG. 1). The emitter of the npn transistor is connected to a drain of the nMOS transistor, and a source and a back gate of the nMOS transistor are grounded. A gate of the nMOS transistor is connected to an inverted input terminal 32.

When the output pnp transistor on the power supply Vcc side is on, a current flows toward a load side. In FIG. 1, dotted line represents a flow of the current. In this state, the output nMOS transistor on the ground side is off. Conversely, when the output pnp transistor is off, the output nMOS transistor is on, and a current flows from the output side to the ground side. This current flow is represented by solid line in FIG. 1. As described above, the output circuit transmits the current to and from an external inductance.

In this embodiment, since the nMOS transistor is employed as the transistor on the ground side, power consumption can be low, as compared with the case of using a bipolar transistor. Since the output circuit handles a high voltage, the transistor must have a high breakdown voltage. Therefore, by using a lateral DMOS transistor as the nMOS transistor, the resistance in the on state can be reduced while ensuring a high breakdown voltage. Accordingly, it is possible to reduce an area occupied by the lateral DMOS transistor in the lower stage of the output circuit, and the size of the output circuit can be reduced.

Figure 32:
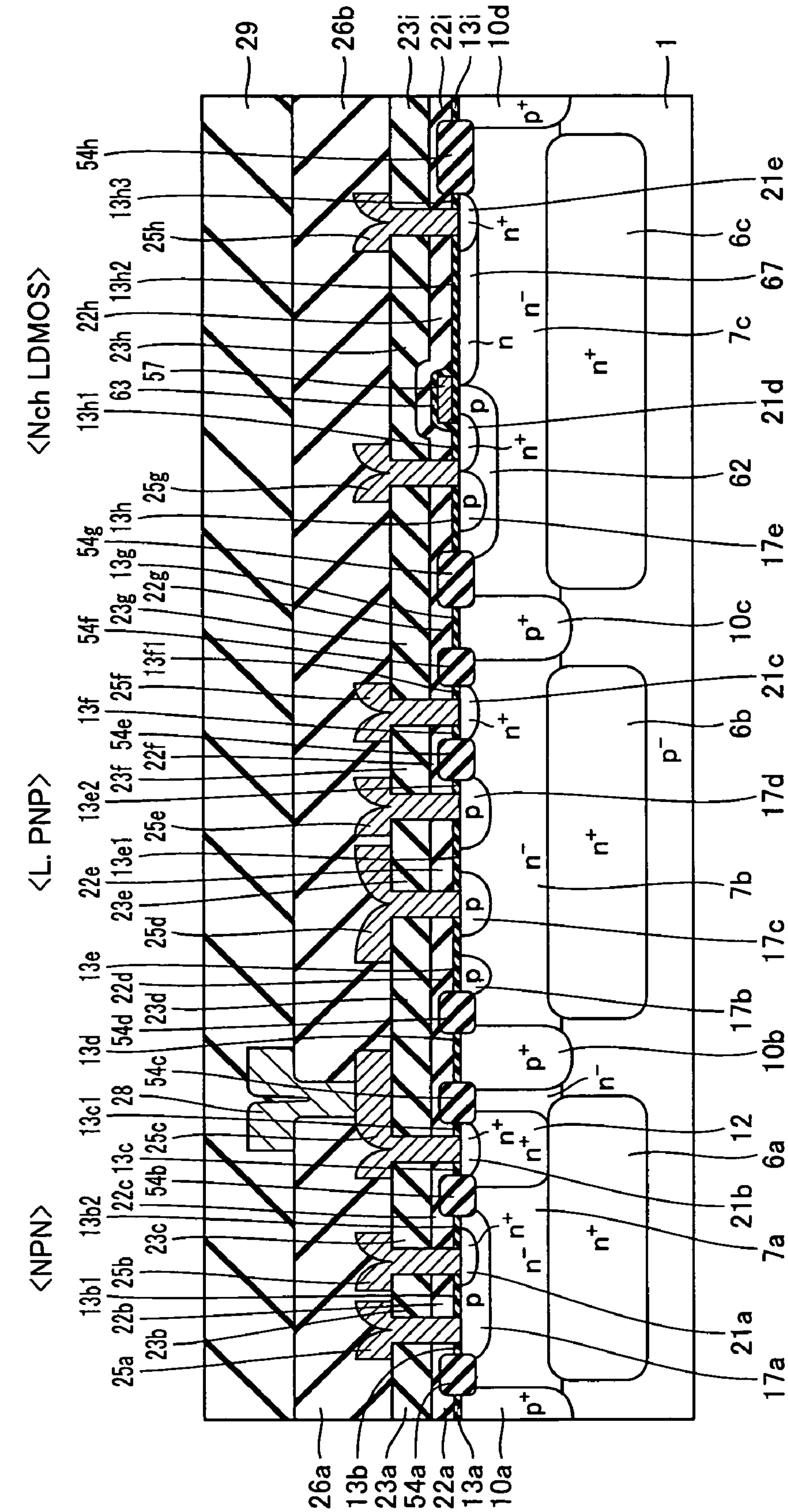
FIG. 32 is a cross section of the semiconductor device according to the first embodiment of the invention.

Description will now be given on an example of a sectional structure of the semiconductor device according to the first embodiment. FIG. 32 is a cross section of the semiconductor device according to the first embodiment.

As shown in FIG. 32, $n^+$-buried diffusion layers (heavily doped impurity diffusion layers) 6*a*, 6*b* and 6*c* are formed in a $p^-$-type silicon substrate (semiconductor substrate) 1, and $n^-$-epitaxial growth layers (semiconductor layers) 7*a*, 7*b* and 7*c* are formed at a main surface of silicon substrate 1. $p^+$-isolation diffusion layers (heavily doped impurity diffusion layers) 10*a* and 10*b* are formed on the opposite sides of $n^-$-epitaxial growth layer 7*a*, respectively, $p^+$-isolation diffusion layers 10*b* and 10*c* are formed on the opposite sides of $n^-$-epitaxial growth layer 7*b*, respectively, and $p^+$-isolation diffusion layers 10*c* and 10*d* are formed on the opposite sides of $n^-$-epitaxial growth layer 7*c*, respectively. $p^+$-isolation diffusion layers (element isolating regions) 10*a*–10*d* thus formed reach silicon substrate 1.

A vertical npn bipolar transistor (NPN) is formed in $n^-$-epitaxial growth layer 7*a*, a lateral pnp bipolar transistor (L-PNP) is formed in $n^-$-epitaxial growth layer 7*b* and an n-channel lateral DMOS transistor (Nch-LDMOS) is formed on $n^-$-epitaxial growth layer 7*c*.

A p-type diffusion layer (impurity diffusion layer) 17*a* is formed at the surface of $n^-$-epitaxial growth layer 7*a*. This p-type diffusion layer 17*a* forms a base (base-leading layer) of the vertical npn bipolar transistor. An $n^+$-diffusion layer (heavily doped impurity diffusion layer) 21*a* is formed at the surface of p-type diffusion layer 17*a*. This $n^+$-diffusion layer 21*a* forms an emitter (emitter-leading layer) of the vertical npn bipolar transistor. An $n^+$-diffusion layer 21*b* spaced from p-type diffusion layer 17*a* is formed at the surface of $n^-$-epitaxial growth layer 7*a*. This $n^+$-diffusion layer 21*b* forms a collector (collector-leading layer) of the vertical npn bipolar transistor. An $n^+$-diffusion layer 12 is formed under $n^+$-diffusion layer 21*b*. This diffusion layer serves as a diffusion layer for leading a collector.

p-type diffusion layers 17*b*, 17*c* and 17*d* spaced from each other are formed at the surface of $n^-$-epitaxial growth layer 7*b*. p-type diffusion layers 17*b* and 17*d* form a collector of the lateral pnp transistor, and p-type diffusion layer 17*c* forms an emitter of the lateral pnp bipolar transistor. $n^+$-diffusion layer 21*c* spaced from p-type diffusion layer 17*d* is formed at the surface of epitaxial growth layer 7*b*. $n^+$-diffusion layer 21*c* forms a base of the lateral pnp bipolar transistor.

At the surface of $n^-$-epitaxial growth layer 7*c*, p-type diffusion layer (p-well) 62, n-type diffusion layer 67 and $n^+$-diffusion layer 21*e* neighboring. to each other are formed. At the surface of p-type diffusion layer 62, p-type diffusion layer 17*e* and $n^+$-diffusion layer 21*d* are formed. p-type diffusion layer 17*e* functions as a back grate region of the lateral DMOS transistor, and $n^+$-diffusion layer 21*d* provides a source of the lateral DMOS transistor.

n-type diffusion layer 67 forms an $n^-$-drain of the lateral DMOS transistor. n-type diffusion layer 67 contains n-type impurities at a concentration from $1\times10^{16}$ $cm^{-3}$ to $1\times10^{18}$ $cm^{-3}$, which is lower than those of n-type impurities in $n^+$-diffusion layers 21*d* and 21*e*. n-type diffusion layer 67 is in contact with p-type diffusion layer 62, and $n^+$-diffusion layer 21*e* is formed at the surface of n-type diffusion layer 67.

The concentration of n-type impurities contained in n-type diffusion layer 67 can be determined independently of various elements of the bipolar transistor. Therefore, by setting the n-type impurity concentration of the n-type diffusion layer 67 within the foregoing range, it is possible to lower the saturation voltage of the lateral DMOS transistor without lowering the breakdown voltage between the collector and base of the vertical npn bipolar transistor. Thus, the saturation resistance of the lateral DMOS transistor can be reduced.

Field oxide films (insulating films) 54*a*–54*h* are selectively formed on epitaxial growth layers 7*a*–7*c*. Field oxide films 54*a*, 54*c*, 54*d*, 54*f*, 54*g* and 54*h* neighbor to the element isolating regions, i.e., $p^+$-isolation diffusion layers 10*a*–10*d*. Field oxide films 54*b* and 54*e* are formed between the bases and collectors of the vertical npn bipolar transistor and the lateral pnp bipolar transistor.

By forming field oxide films 54*a*–54*h* as described above, diffusion windows for forming the respective diffusion layers of the bipolar transistors can be determined by a mask for forming field oxide films 54*a*–54*h*. Therefore, such a processing manner is not required that margins between the diffusion layers are ensured in every processing of forming the diffusion layer of the bipolar transistors. Accordingly, spaces between the diffusion layers can be small, and the density of the elements can be improved. A mask aligner apparatus having a high precision is not required in the process of forming the diffusion layers of the bipolar transistor so that a manufacturing cost can be reduced.

Thermal oxide films (insulating films) 13*a*, 13*b*, 13*b*1, 13*b*2, 13*c*, 13*c*1, 13*d*, 13*e*, 13*e*1, 13*e*2, 13*f*, 13*f*1, 13*g*, 13*h*, 13*h*1, 13*h*2, 13*h*3 and 13*i* are formed on epitaxial growth layers 7*a*–7*c* located between field oxide films 54*a*–54*h*.

A gate electrode 57 is formed on a portion of oxide film 13*h*1. An oxide film (insulating film) 63 partially covering gate electrode 57 is formed. First interlayer insulating films 22*a*–22*i* are formed over field oxide films 54*a*–54*h*, oxide films 13*a*–13*i*, gate electrode 57 and oxide film 63. First interlayer insulating films 22*a*–22*i* may be formed of a CVD (Chemical Vapor Deposition) oxide film not doped with impurities.

Second interlayer insulating films 23*a*–23*i* are formed on first interlayer insulating films 22*a*–22*i*, respectively. Second interlayer insulating films 23*a*–23*i* may be formed of a CVD oxide film doped with impurities such as boron or phosphorus.

First and second interlayer insulating films 22*a*–22*i* and 23*a*–23*i* are provided with a plurality of contact holes, which extend therethrough and reach $n^-$-epitaxial growth layers 7*a*–7*c*. More specifically, each of these contact holes reaches p-type diffusion layer 17*a*, $n^+$-diffusion layer 21*a*, $n^+$-diffusion layer 21*b*, p-type diffusion layer 17*c*, p-type diffusion layer 17*d*, $n^+$-diffusion layer 21*c*, both of p-type diffusion layer 17*e* and $n^+$-diffusion layer 21*d*, or $n^+$-diffusion layer 21*e*.

First interconnections 25*a*–25*h* are formed in the foregoing contact holes, respectively. First interconnections 25*a*–25*h* may be made of a metal material such as Al, AlSi or AlCu.

First interconnection 25*a* serves as a base electrode of the vertical npn bipolar transistor. First interconnection 25*b* serves as an emitter electrode of the vertical npn bipolar transistor. First interconnection 25*c* serves as a collector electrode of the vertical npn bipolar transistor.

First interconnection 25*d* functions as an emitter electrode of the lateral pnp bipolar transistor. First interconnection 25*e* functions as a collector electrode of the lateral pnp bipolar transistor. First interconnection 25*f* functions as a base electrode of the lateral pnp bipolar transistor.

First interconnection 25*g* functions as a source electrode of the lateral DMOS transistor. First interconnection 25*h* functions as a drain electrode of the lateral DMOS transistor.

Third interlayer insulating films 26*a* and 26*b* are formed over second interlayer insulating films 23*a*–23*i* and first interconnections 25*a*–25*h*. Third interlayer insulating films 26*a* and 26*b* may be formed of a CVD oxide film. Third interlayer insulating films 26*a* and 26*b* are provided with through holes reaching first interconnections 25, and a second interconnection 28 is formed in each through hole. Second interconnection 28 is covered with a protection film 29, which may be made of a nitride film.

Figure 33:
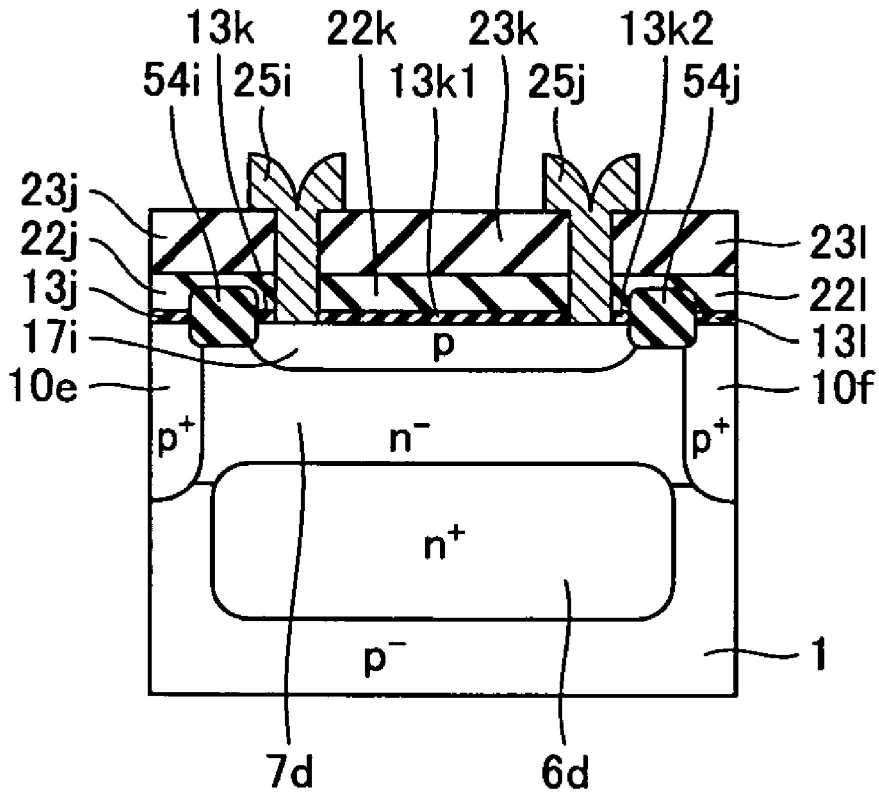
FIG. 33 is a cross section showing, by way of example, a structure of a resistance portion of the semiconductor device according to the first embodiment of the invention.

FIG. 33 shows an example of a resistance portion of the semiconductor device according to the first embodiment. As shown in FIG. 33, an $n^+$-buried diffusion layer 6*d* is formed in $p^-$-type silicon substrate 1, and $n^-$-epitaxial growth layer 7*d* is formed at the main surface of silicon substrate 1. $p^+$-isolation diffusion layers 10*e* and 10*f* are formed on the opposite sides of $n^-$-epitaxial growth layer 7*d*, respectively, and p-type diffusion layer 17*i* is formed at the surface of $n^-$-epitaxial growth layer 7*d*.

The concentration of p-type impurities in p-type diffusion layer 17*i* is in a range, e.g., from about $1\times10^{18}$ $cm^{-3}$ to about $1\times10^{19}$ $cm^{-3}$. p-type diffusion layer 17*i* is formed in a region surrounded by field oxide films 54*i* and 54*j*. p-type diffusion layer 17*i* can be formed in the same steps as p-type diffusion layers 17*a*–17*e*, in which case the concentration of p-type impurities in p-type diffusion layer 17*i* is substantially in the same range as the concentration of p-type impurities in p-type diffusion layers 17*a*–17*e*.

Thermal oxide films 13*j*–13*l* are formed on $p^+$-isolation diffusion layers 10*e* and 10*f*, and thermal oxide films 13*k*–13*k*2 are formed on the surface of p-type diffusion layer 17*i*. First interlayer insulating films 22*j*–22*l* are formed over thermal oxide films 13*j*–13*l*, and second interlayer insulating films 23*j*–23*l* are formed over first interlayer insulating films 22*j*–22*l*. First and second interlayer insulating films 221*j*–22*l* and 23*j*–23*l* are provided with contact holes extending therethrough to $n^-$-epitaxial growth layer 7*d*, and first interconnection 25*i* or 25*j* is formed in each contact hole.

Description will now be given on a method of manufacturing the semiconductor device having the foregoing structure with reference to FIGS. 2 to 31.

Figure 2:
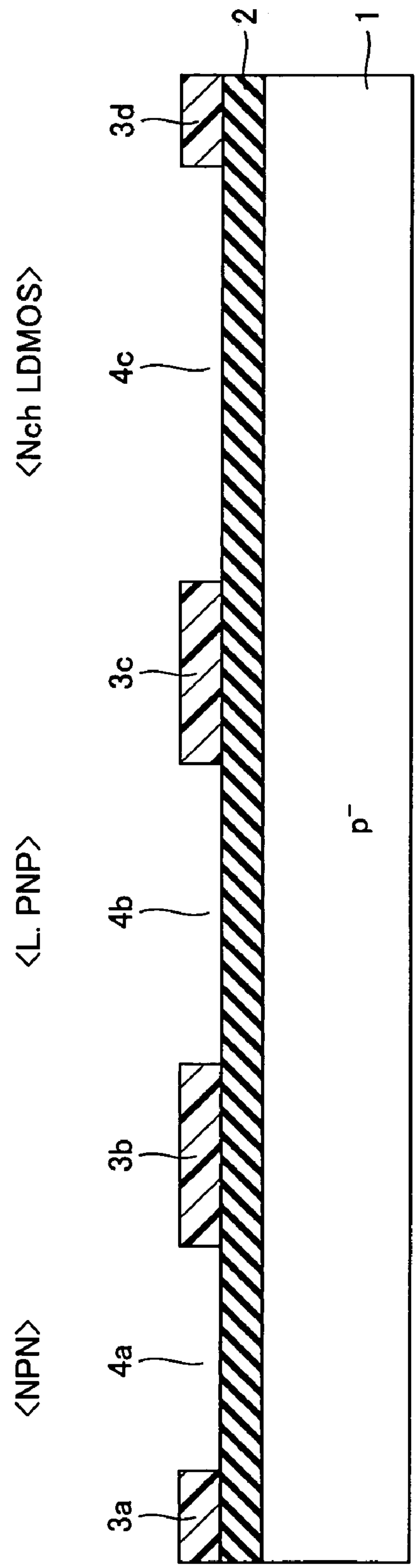
FIGS. 2 to 24 are cross sections showing 1st to 23rd steps in a manufacturing process of the semiconductor device according to a first embodiment of the invention, respectively.

As shown in FIG. 2, a thermal oxidation process is performed to form a thermal oxide film (insulating film) 2 of about 1 $\mu$m in thickness on the main surface of $p^-$-type silicon substrate 1. Photoresist is applied to thermal oxide film 2, and is patterned to have a predetermined configuration by photolithography. Thereby, photoresist patterns (masks) 3*a*–3*d* having openings 4*a*–4*c* are formed.

Figure 3:
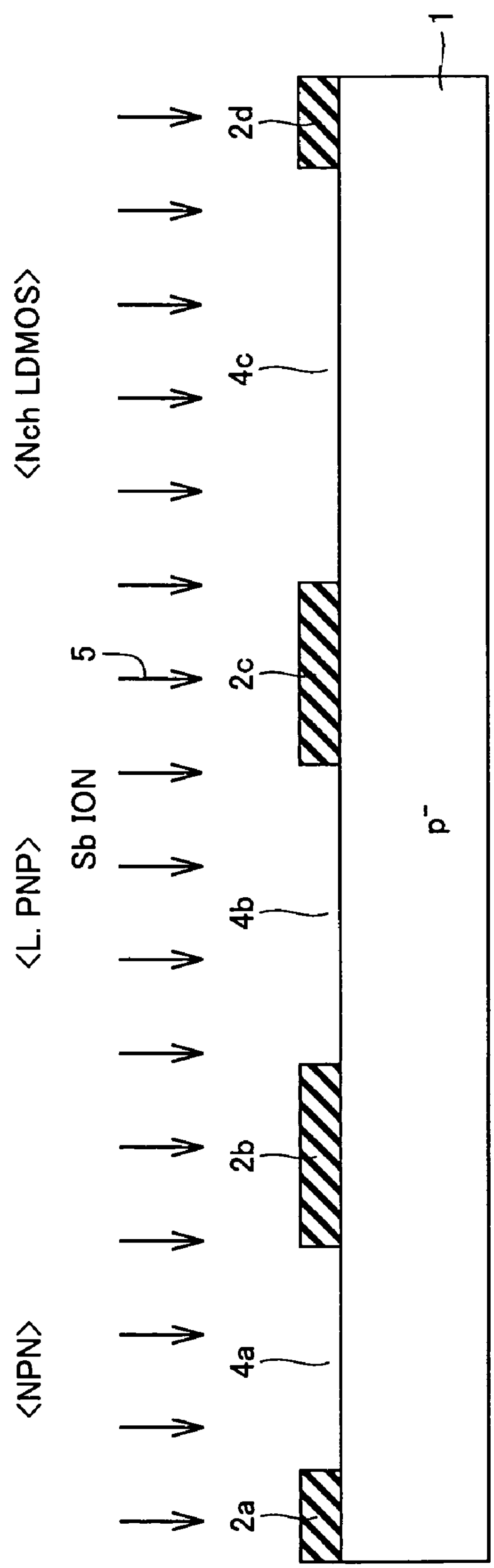

Then, etching is effected on thermal oxide film 2 masked with photoresist patterns 3*a*–3*d*. For example, the etching can be performed by immersing it in an aqueous solution of hydrogen fluoride (HF). Thereby, thermal oxide films 2*a*–2*d* having openings 4*a*–4*c* are formed as shown in FIG. 3.

Figure 4:
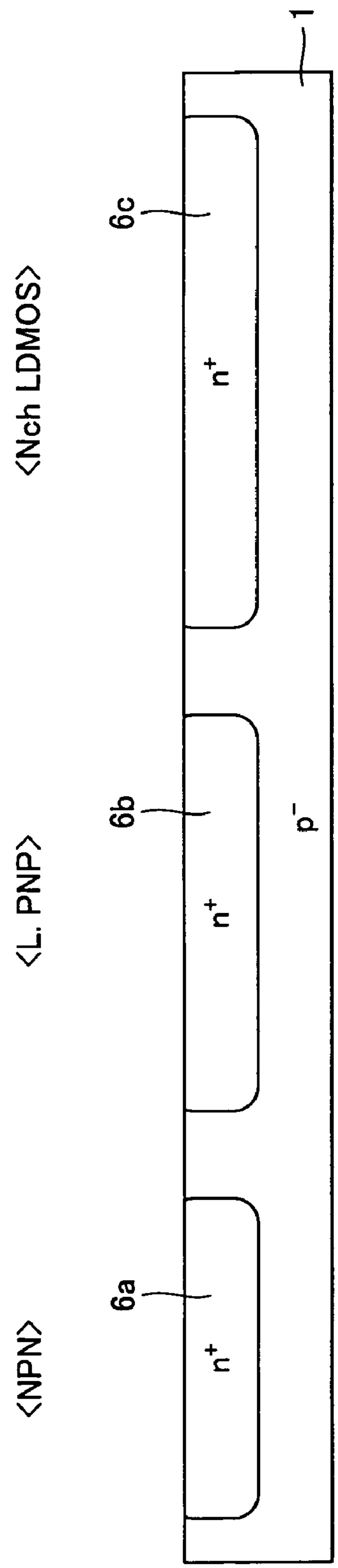

After removing photoresist patterns 3*a*–3*d*, n-type impurity ions 5 of antimony (Sb), arsenic (As) or the like are introduced into silicon substrate 1 masked with thermal oxide films 2*a*–2*d* by an ion implanting method or the like. Thermal processing is performed to diffuse the introduced n-type impurities such as antimony so that $n^+$-buried diffusion layers 6*a*–6*c* are formed as shown in FIG. 4. In this processing, $n^+$-buried diffusion layer 6*d* is formed in the resistance portion shown in FIG. 33. Thereafter, thermal oxide films 2*a*–2*d* are removed.

Figure 5:
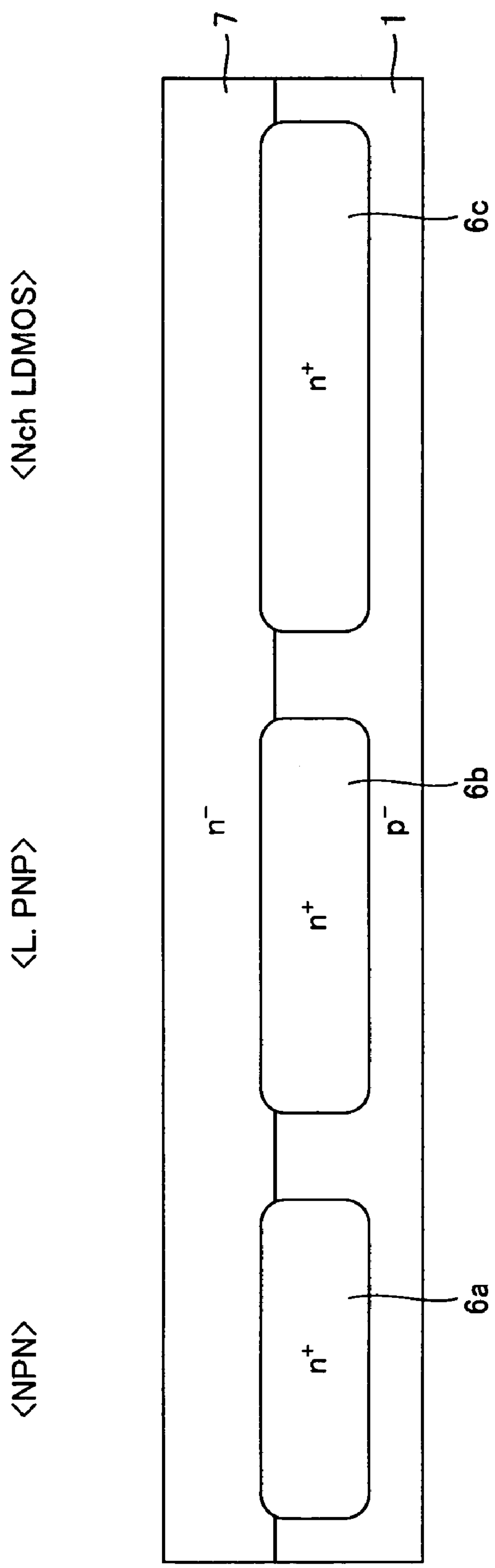
Figure 6:
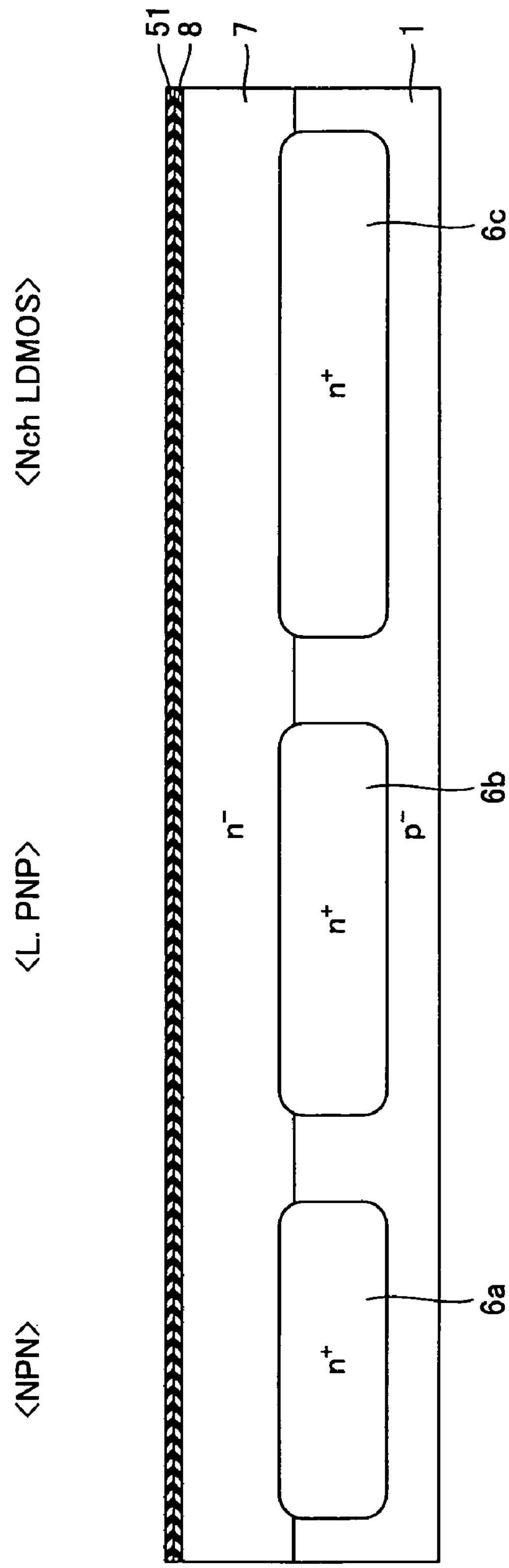

As shown in FIG. 5, an epitaxial growth method is performed to form $n^-$-epitaxial growth layer 7 of about 4 to about 6 $\mu$m in thickness. As shown in FIG. 6, thermal oxide film 8 of about 0.05 $\mu$m in thickness is formed on $n^-$-epitaxial growth layer 7, and a low pressure CVD method is performed to deposit a nitride film (insulating film) 51 of about 0.1 $\mu$m in thickness on thermal oxide film 8.

Figure 7:
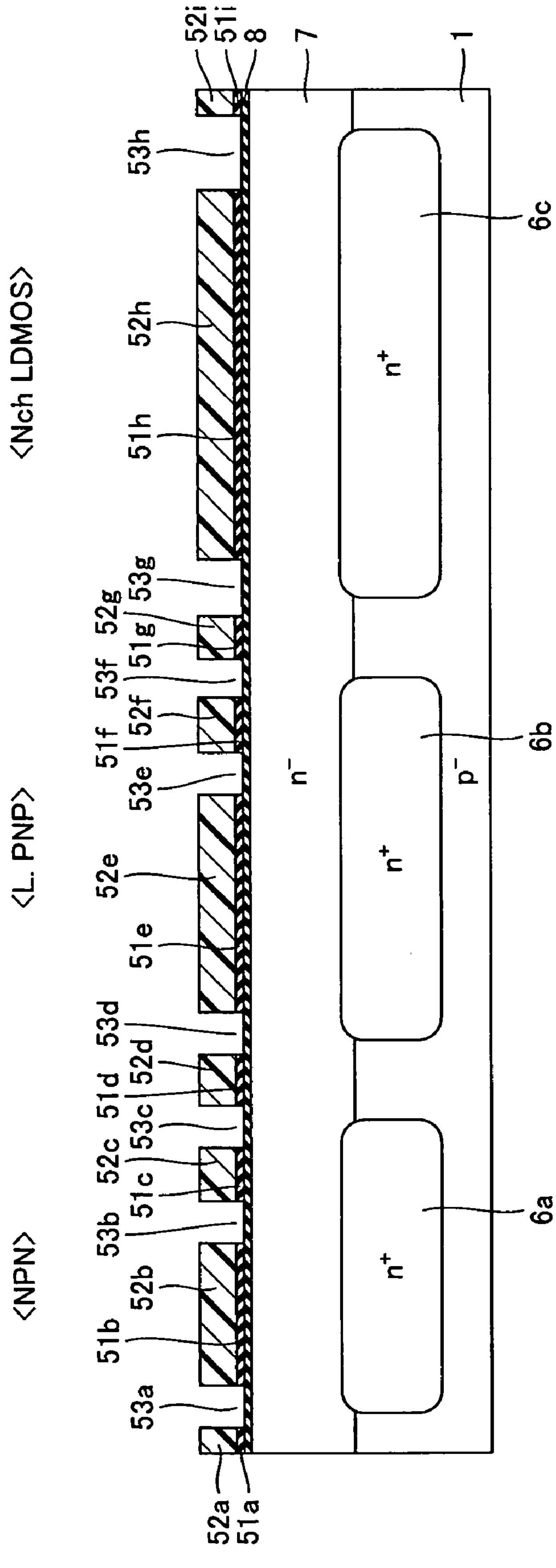

As shown in FIG. 7, photoresist patterns 52*a*–52*i* having opening at predetermined positions are formed on nitride film 51 by a method similar to the foregoing method. Etching is effected on nitride film 51 masked with photoresist patterns 52*a*–52*i* to form nitride films 51*a*–51*i* having openings 53*a*–53*h*.

Figure 8:
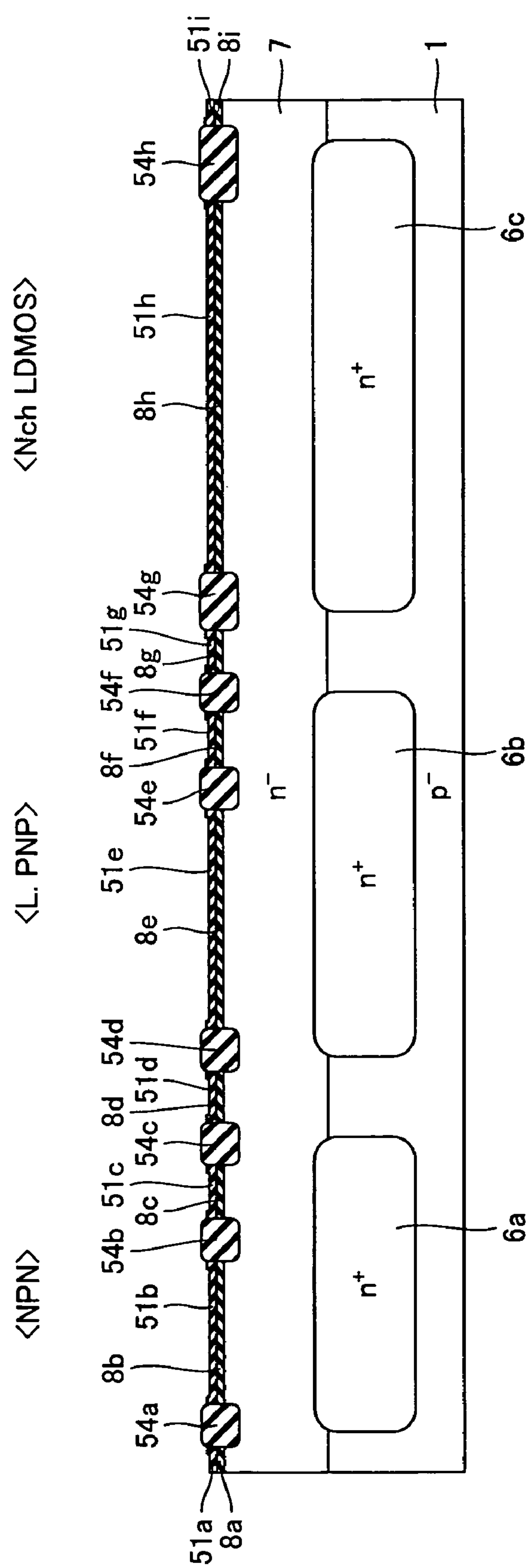

As shown in FIG. 8, a thermal oxidation method using nitride films 51*a*–51*i* as a mask is performed to form field oxide films 54*a*–54*h* having a thickness, e.g., of about 0.6 $\mu$m. In this processing, regions covered with nitride films 51*a*–51*i* are not oxidized. In FIG. 8, 8*a*–8*i* indicate thermal oxide films located around field oxide films 54*a*–54*h*.

Figure 9:
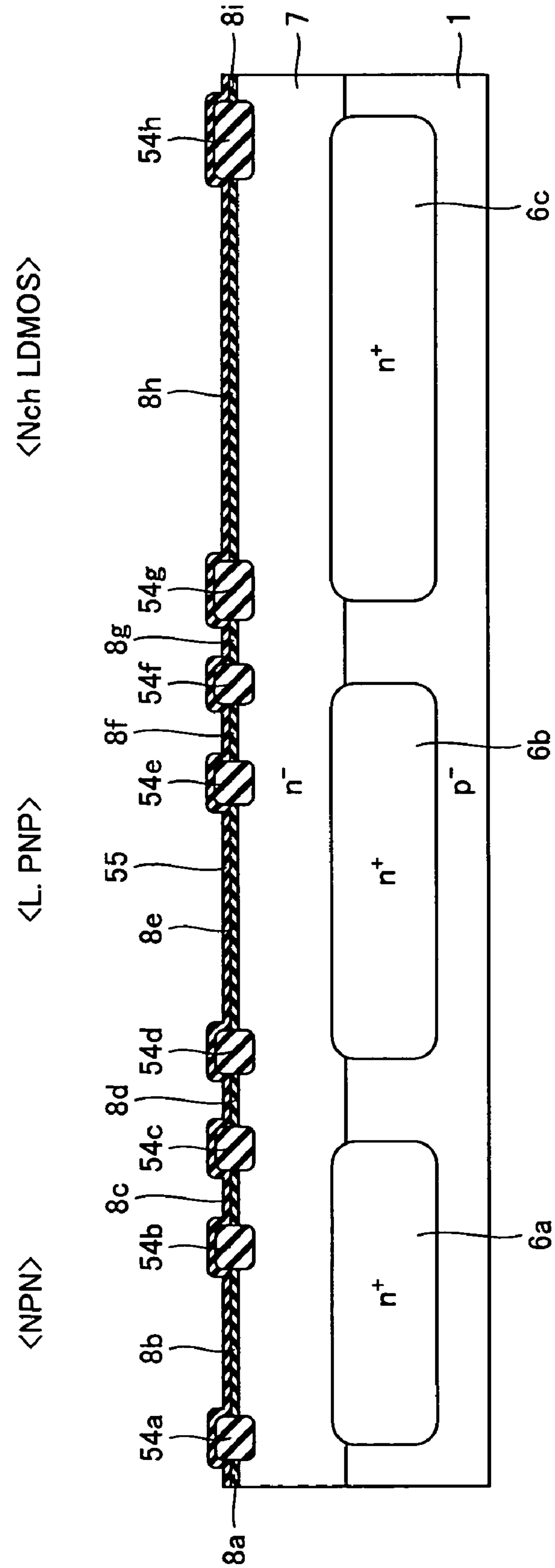

Then, nitride films 51*a*–51*i* are removed with thermal phosphoric acid or the like. As shown in FIG. 9, a low pressure CVD method or the like is performed to deposit, e.g., a nitride film 55 of about 0.1 $\mu$m in thickness covering field oxide films 54*a*–54*h* and thermal oxide films 8*a*–8*i*.

Figure 10:
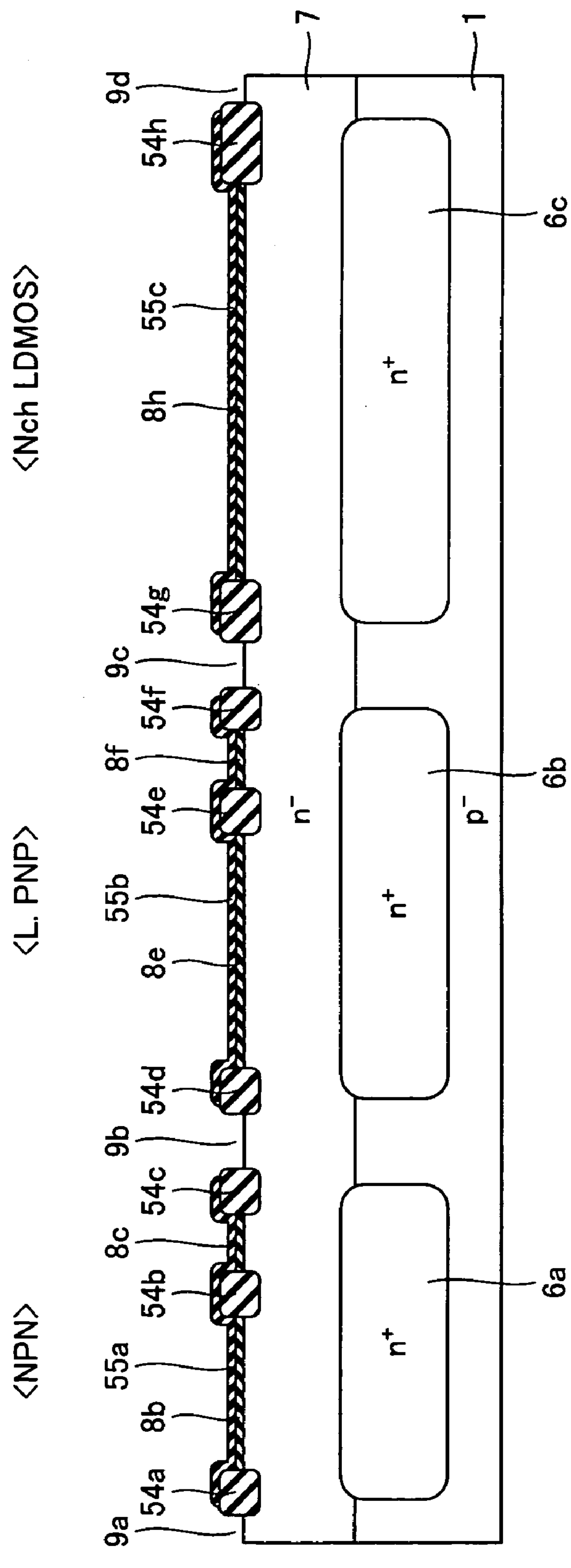

On nitride film 55, a photoresist pattern (not shown) having openings at positions, where isolation diffusion layers are to be formed, is formed. Etching is effected on nitride film 55 and thermal oxide films 8*a*, 8*d*, 8*g* and 8*i* masked with the photoresist pattern. Thereby, as shown in FIG. 10, openings 9*a*–9*d* for forming the isolation diffusion layers are formed, and nitride films 55*a*–55*c* are left. Thereafter, the photoresist pattern is removed.

Figure 11:
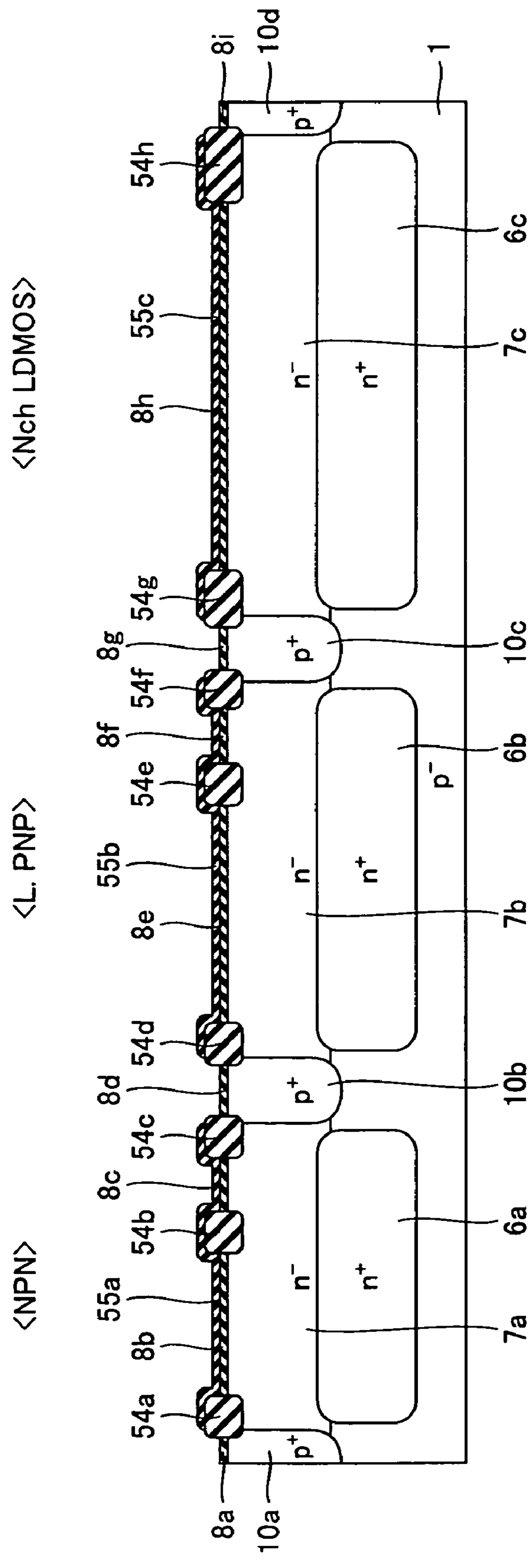

Then, as shown in FIG. 11, $p^+$-isolation diffusion layers 10*a*–10*d* reaching silicon substrate 1 are formed by a gas diffusion method using boron. Thereby, $n^-$-epitaxial growth layer 7 is substantially divided into $n^-$-epitaxial growth layers 7*a*–7*c*.

In the gas diffusion method using boron, boron glass is first deposited. For example, thermal processing is effected on a wafer for a predetermined time, e.g., from 10 to 30 minutes while flowing a $B_2H_6$ gas at a low rate not exceeding 1 liter/minute, an $O_2$ gas at a low rate not exceeding 1 liter/minute and an $N_2$ gas at a high rate not exceeding 50 liter/minute into a diffusion furnace at a temperature of about 1000° C. Then, the wafer is immersed in a dilute solution of HF to remove boron glass deposited on the wafer. Thereafter, thermal processing is performed to diffuse the boron. In this processing, thermal oxide films 8*a*, 8*d*, 8*g* and 8*i* of about 0.1 $\mu$m in thickness are formed on $p^+$-isolation diffusion layers 10*a*–10*d*.

In the resistance portion shown in FIG. 33, $p^+$-diffusion layers 10*e* and 10*f* are formed simultaneously with the formation of $p^+$-isolation diffusion layers 10*a*–10*d*. These layers define $n^-$-epitaxial growth layer 7*d*.

Figure 12:
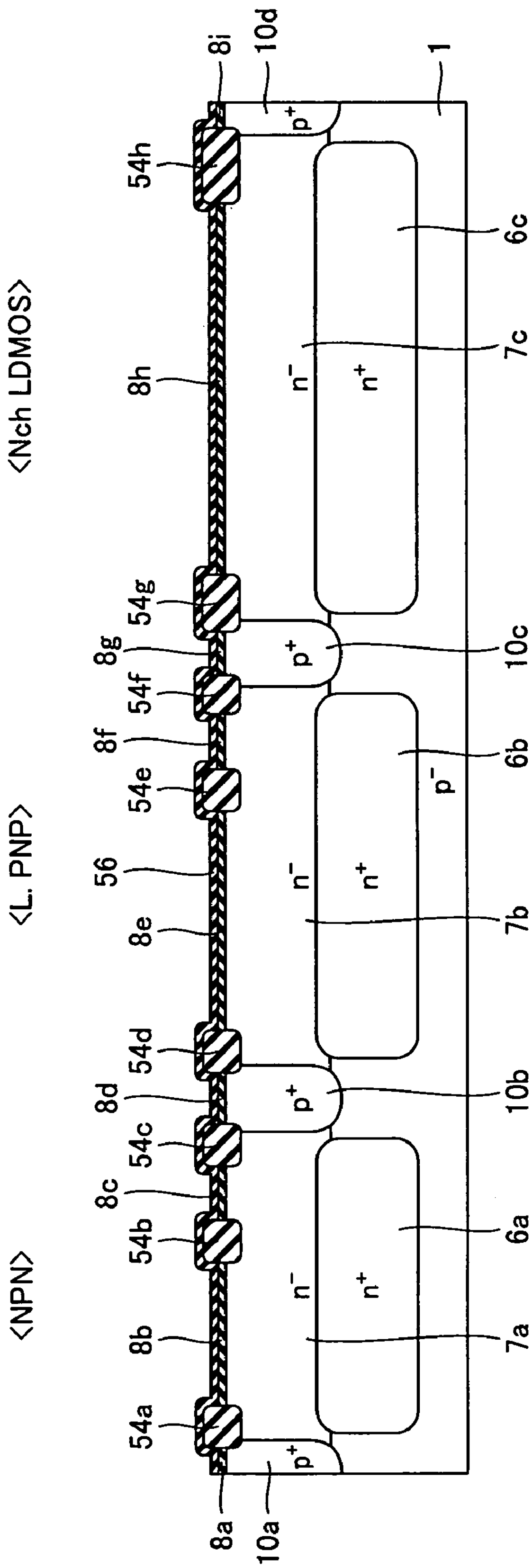
Figure 13:
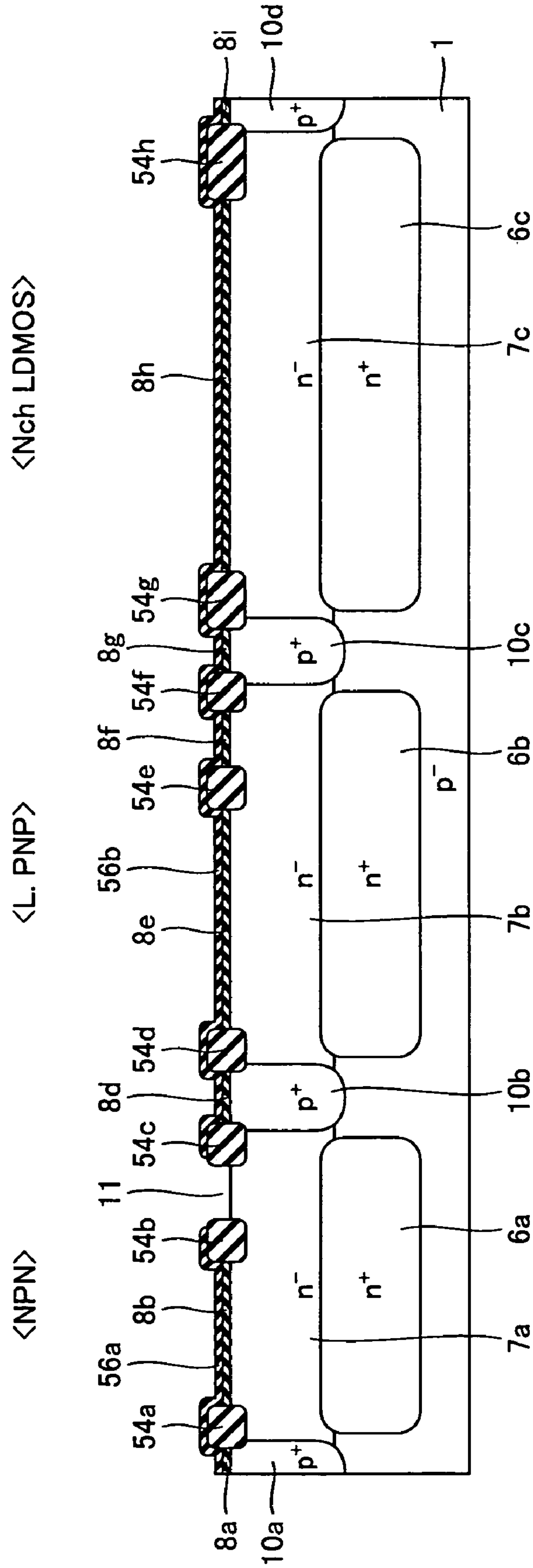

After removing nitride films 55*a*–55*c*, a nitride film 56, e.g., of about 0.1 $\mu$m in thickness is formed as shown in FIG. 12. A photoresist pattern (not shown) having openings on regions, in which $n^+$-diffusion layer 12 is to be formed, is formed on nitride film 56. Etching is effected on nitride film 56 and thermal oxide film 8*c* masked with this photoresist pattern so that an opening 11 is formed as shown in FIG. 13. In this processing, nitride films 56*a* and 56*b* are left around opening 11. Thereafter, the photoresist pattern is removed.

Figure 14:
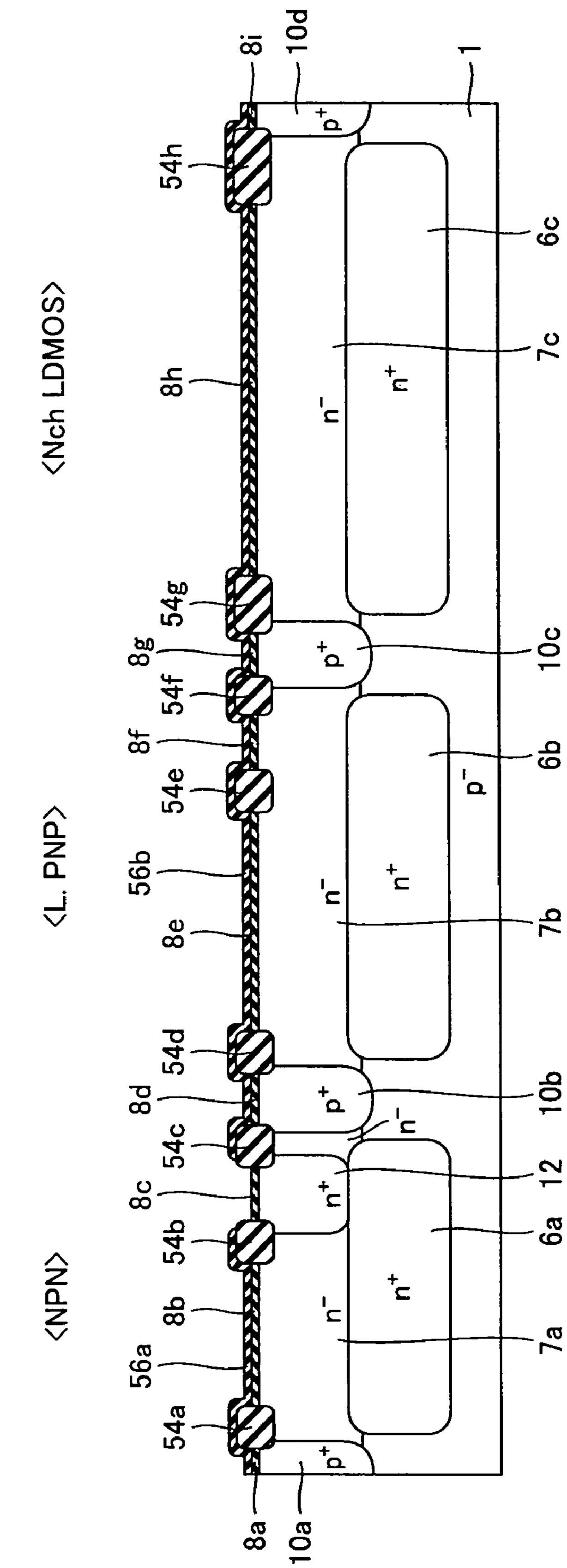

Then, as shown in FIG. 14, $n^+$-diffusion layer 12 reaching $n^+$-buried diffusion layer 6*a* is formed by a gas diffusion method using phosphorus. In this gas diffusion method using phosphorus, phosphorus glass is first deposited. For example, thermal processing is effected on the wafer for a predetermined time, e.g., from 10 to 30 minutes while flowing a $PH_3$ gas at a low rate not exceeding 1 liter/minute, an $O_2$ gas at a low rate not exceeding 1 liter/minute and an $N_2$ gas at a high rate not exceeding 50 liter/minute into a diffusion furnace at a temperature of about 1000° C. Then, the wafer is immersed in a dilute solution of HF to remove phosphorus glass deposited on the wafer. Then, thermal oxide film 8*c* of about 0.1 $\mu$m in thickness is formed on $n^+$-diffusion layer 12.

Figure 15:
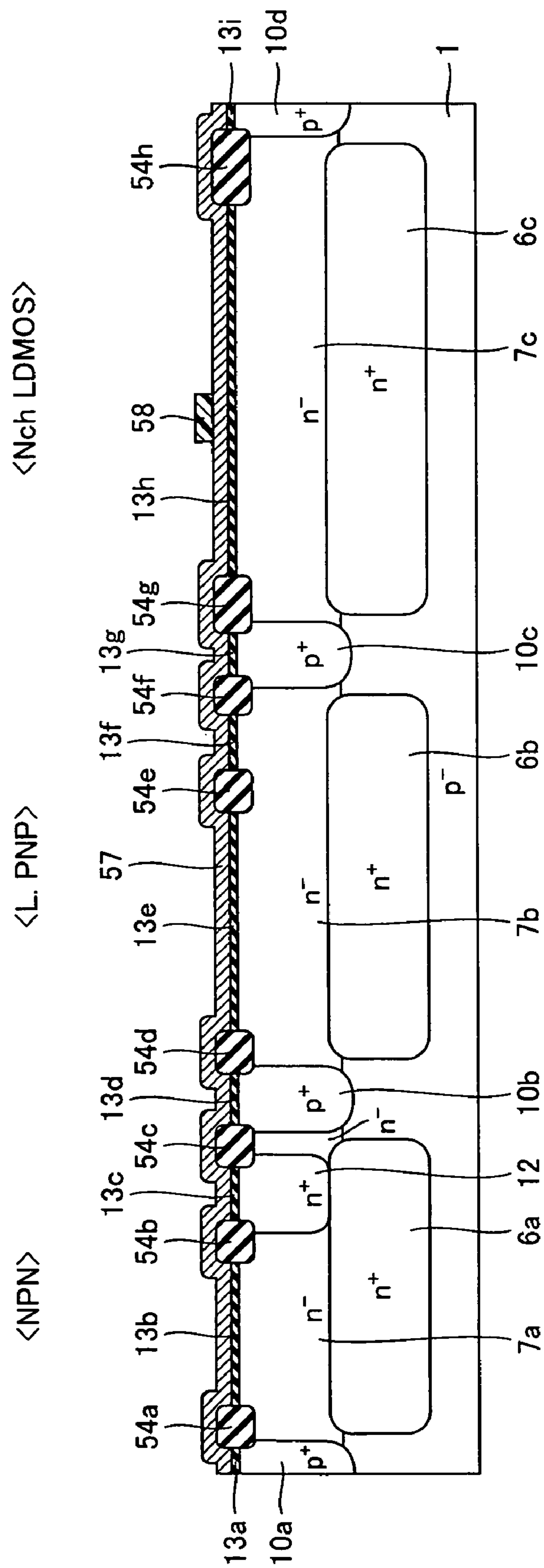

Then, nitride films 56*a* and 56*b* as well as thermal oxide films 8*a*–8*i* are removed, and thermal oxide films 13*a*–13*i* of about 0.01–0.02 $\mu$m in thickness are formed as shown in FIG. 15. A portion of these thermal oxide films will form a gate oxide film of the lateral DMOS transistor. In this processing, thermal oxide films 13*j*–13*l* are formed in the resistance portion shown in FIG. 33.

Subsequently, a low pressure CVD method is performed to deposit a silicon film (semiconductor film) 57, which has a thickness, e.g., of about 0.2 $\mu$m and is made of undoped polycrystalline silicon or amorphous silicon. A photoresist pattern 58 is formed on silicon film 57.

Figure 16:
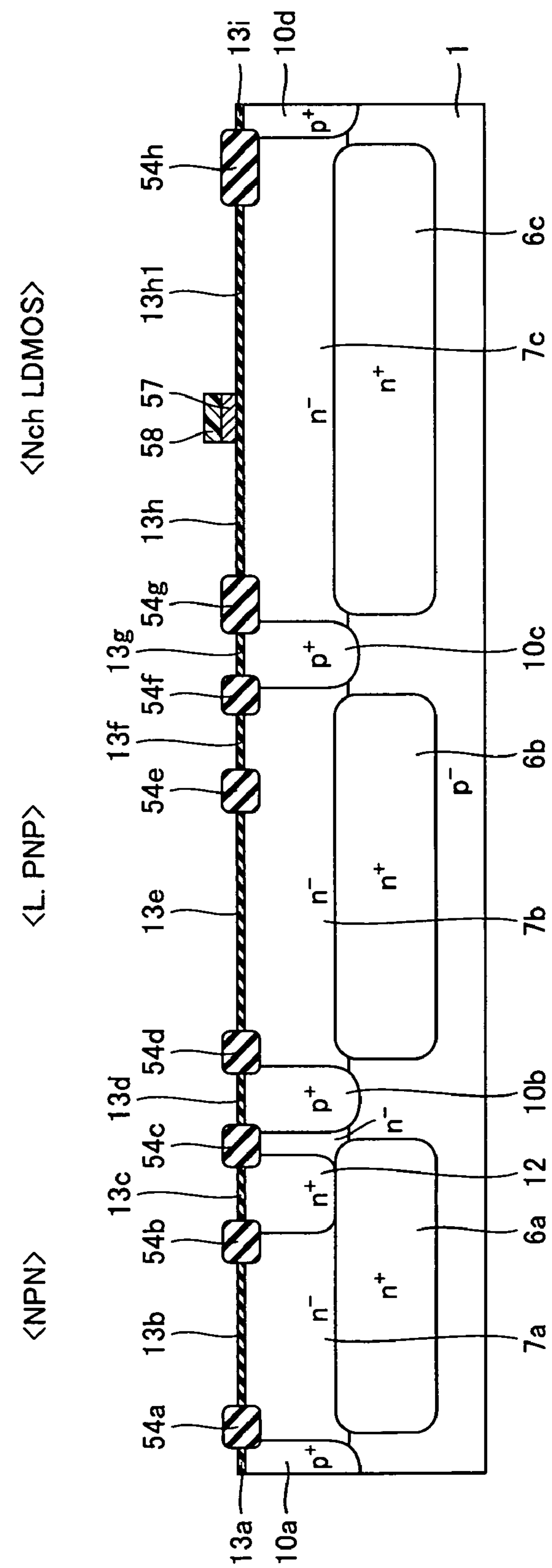
Figure 17:
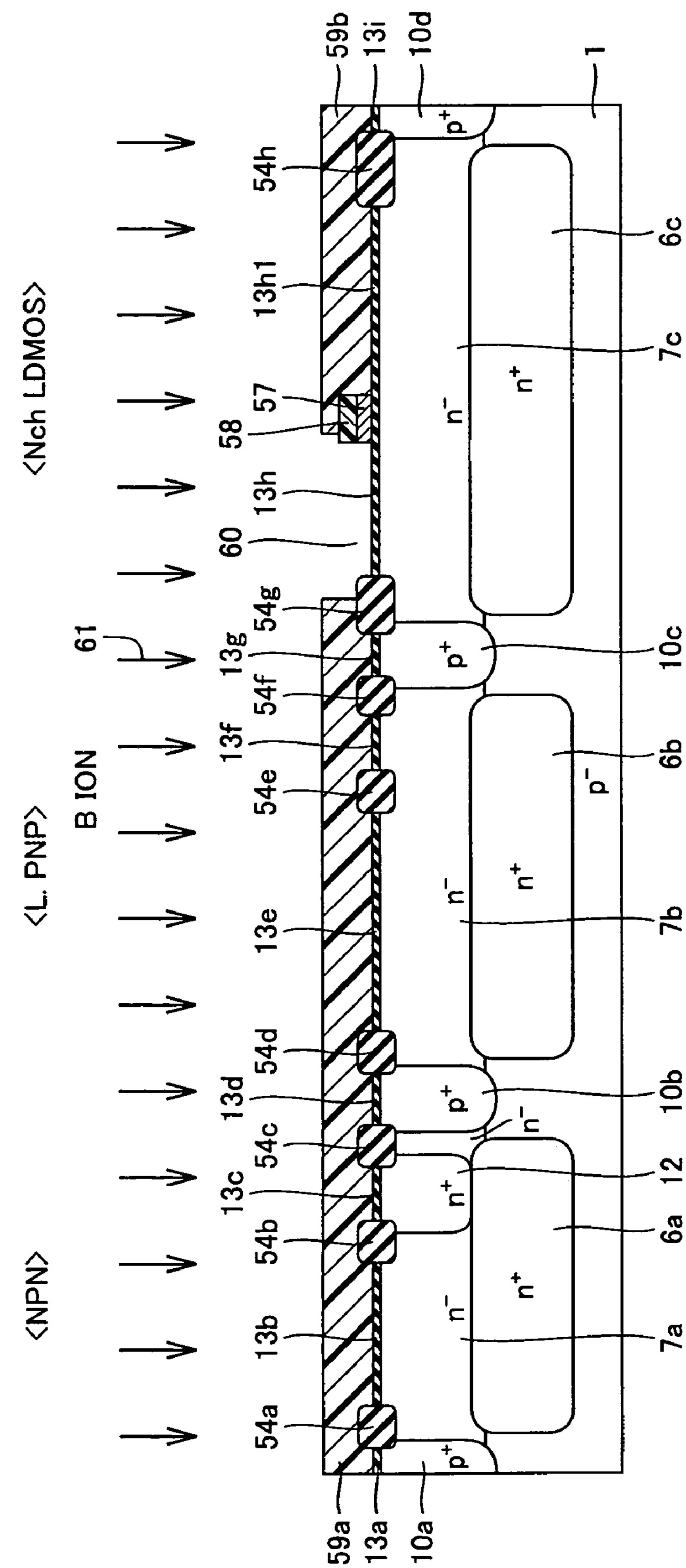

As shown in FIG. 16, etching is effected on silicon film 57 masked with photoresist pattern 58 to form gate electrode 57. As shown in FIG. 17, processing is performed to form photoresist patterns 59*a* and 59*b* having an opening 60 located on a region, in which p-type diffusion layer 62 is to be formed. Boron ions are introduced into $n^-$-epitaxial growth layer 7*c* masked with photoresist patterns 59*a* and 59*b* by an ion implanting method.

As shown in FIG. 17, photoresist pattern 59*b* may not completely cover gate electrode 57 due to misalignment of the mask. Therefore, photoresist patterns 59*a* and 59*b* are formed without removing photoresist pattern 58 on gate electrode 57. By leaving photoresist pattern 58 on gate electrode 57, such a situation can be prevented that boron ions 61 are implanted into $n^-$-epitaxial growth layer 7*c* through a portion of gate electrode 57, which is not covered with photoresist pattern 59*b*.

Figure 18:
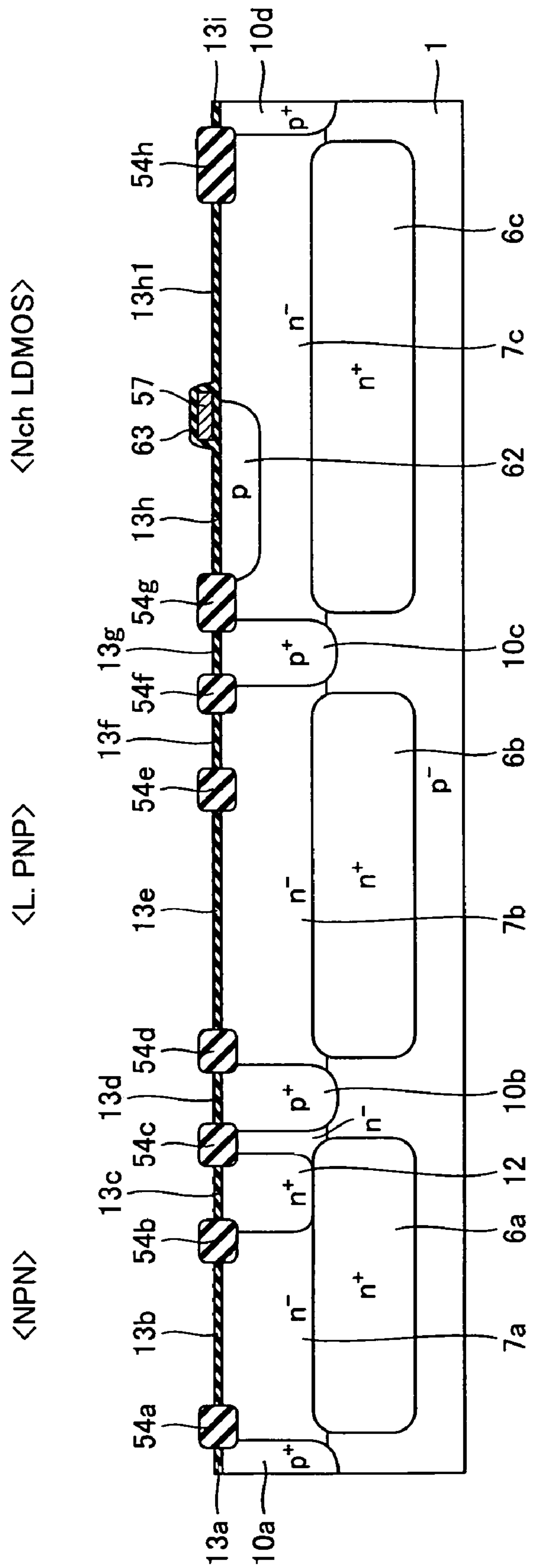

After removing photoresist patterns 58, 59*a* and 59*b*, thermal processing is performed to form p-type diffusion layer 62. By this thermal processing, the surface of gate electrode 57 is oxidized to form oxide film 63 as shown in FIG. 18.

Figure 19:
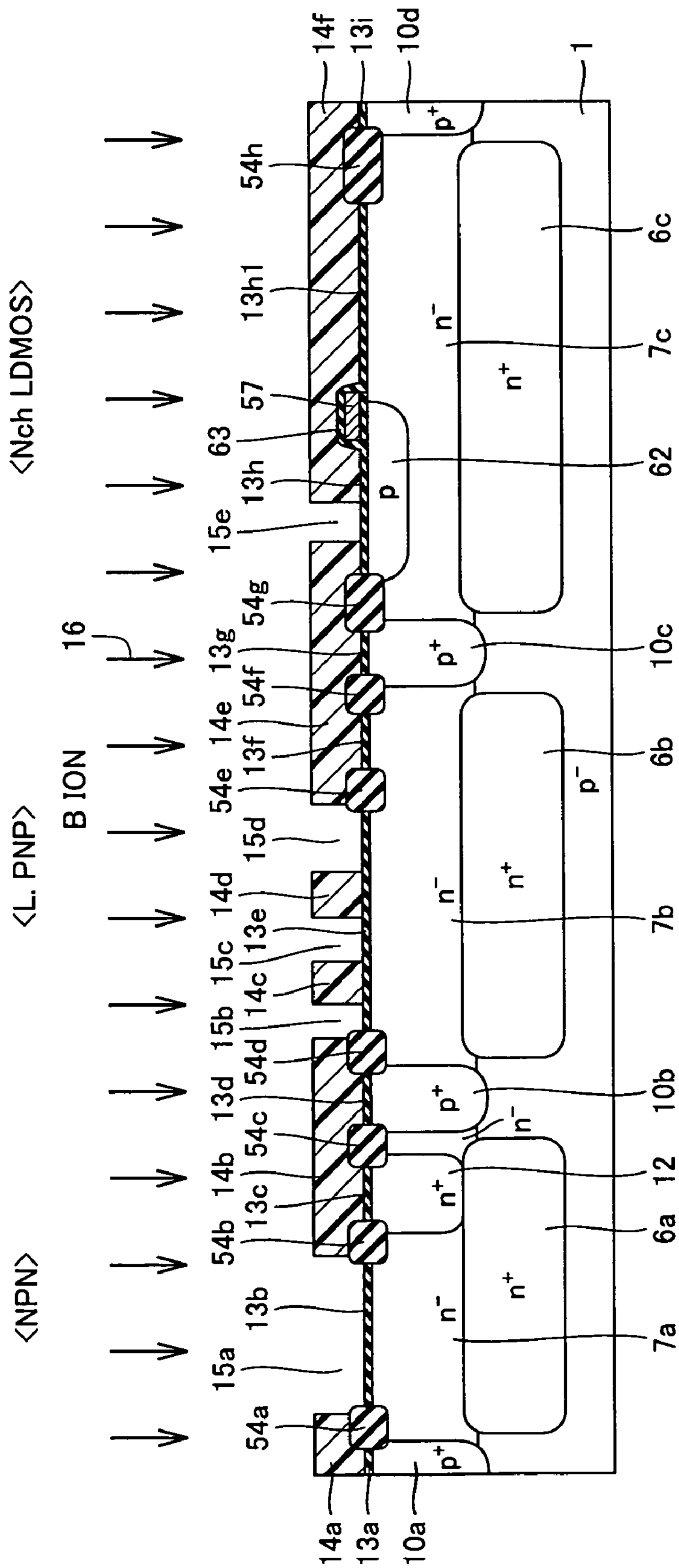

Then, as shown in FIG. 19, processing is performed to form photoresist patterns 14*a*–14*f* having an opening 15*a* located on a region, in which p-type diffusion layer 17*a* forming a base of the vertical npn bipolar transistor is to be formed, openings 15*b*–15*d* located on regions, in which p-type diffusion layers 17*b*–17*d* forming a collector and an emitter of the lateral pnp bipolar transistor are to be formed, and an opening 15*e* located on a region, in which p-type diffusion layer 17*e* forming a back gate of the lateral DMOS transistor is to be formed. Using photoresist patterns 14*a*–14*f* as a mask, an ion implanting method is performed to introduce boron ions 16 into $n^-$-epitaxial growth layers 7*a*–7*c*.

Figure 20:
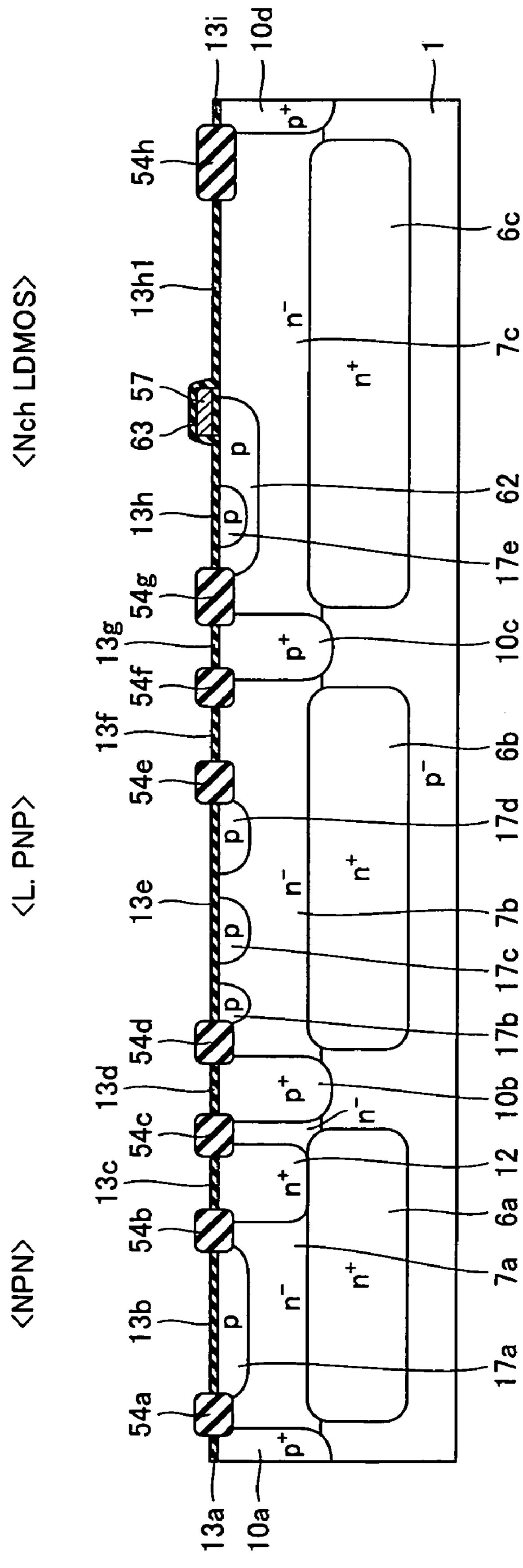

After removing photoresist patterns 14*a*–14*f*, thermal processing is performed. Thereby, p-type diffusion layers 17*a*–17*e* are formed as shown in FIG. 20. Thus, the base of the vertical npn bipolar transistor, the collector and emitter of the lateral pnp bipolar transistor and the back gate of the lateral DMOS transistor are simultaneously formed.

In the resistance portion shown in FIG. 33, p-type diffusion layer 17*i* is formed simultaneously with formation of p-type diffusion layers 17*a*–17*e*.

Figure 21:
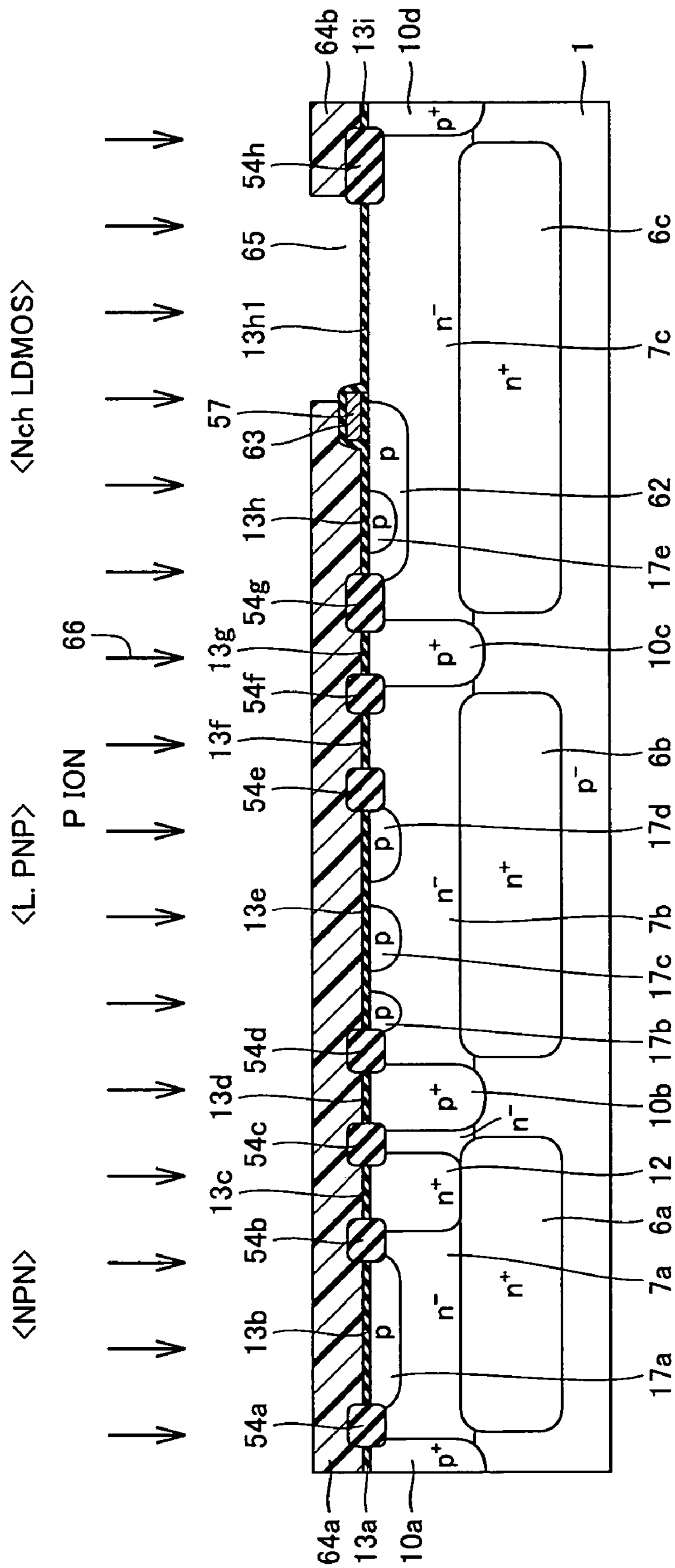
Figure 22:
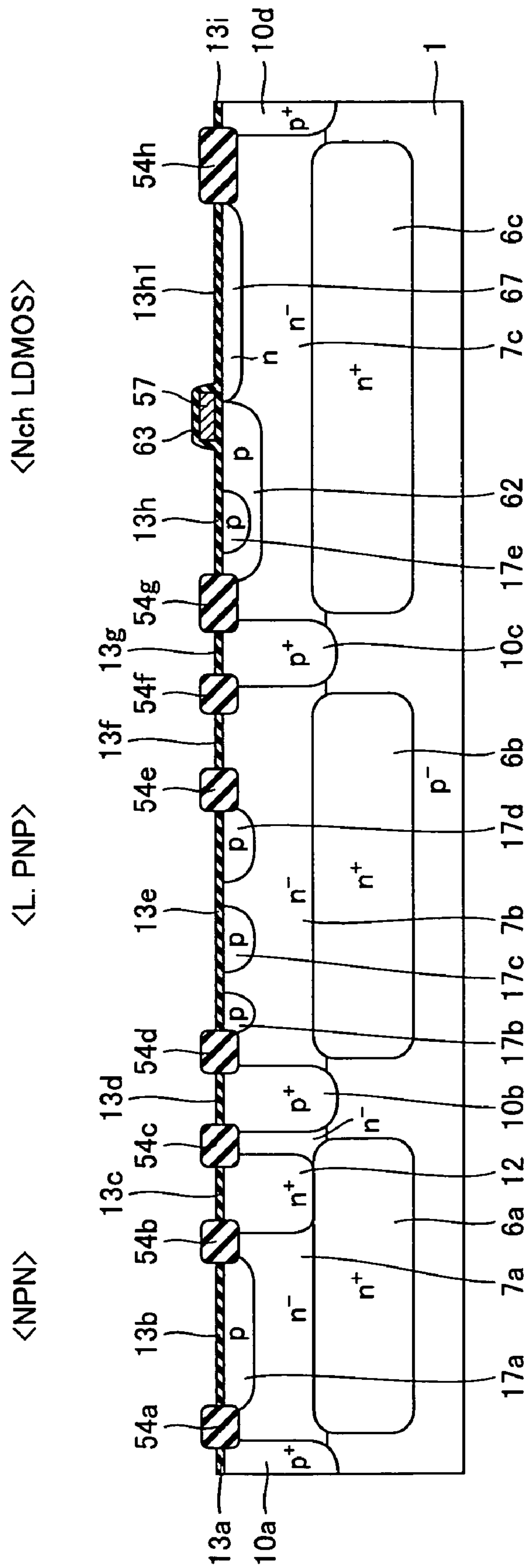

As shown in FIG. 21, processing is performed to form photoresist patterns 64*a* and 64*b* having an opening 65 on a region, in which the drain of the lateral DMOS transistor is to be formed. Using photoresist patterns 64*a* and 64*b* as a mask, phosphorus ions 66 are introduced into $n^-$-epitaxial growth layer 7*c* by an ion implanting method. After removing photoresist patterns 64*a* and 64*b*, thermal processing is performed. Thereby, n-type diffusion layer 67 is formed as shown in FIG. 22.

Figure 23:
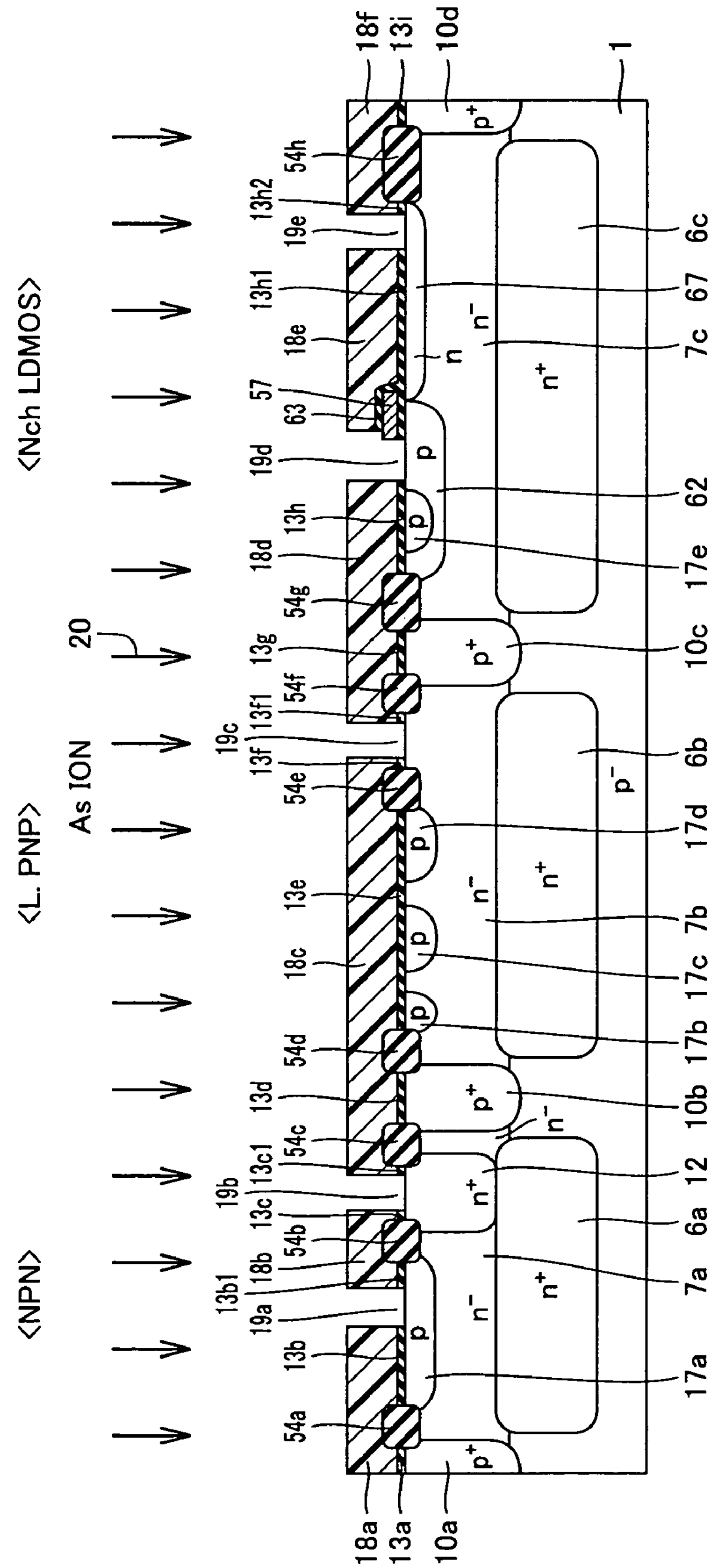

Then, as shown in FIG. 23, processing is performed to form photoresist patterns 18*a*–18*f* having openings respectively located on p-type diffusion layer 17*a* and $n^+$-diffusion layer 12 of the vertical npn bipolar transistor, on regions, in which the base of the lateral pnp bipolar transistor are to be formed, on regions, in which the source and drain of the lateral DMOS transistor are to be formed. Using photoresist patterns 18*a*–18*f* as a mask, thermal oxide films 13*b*, 13*c*, 13*f*, 13*h* and 13*h*1 are etched to form openings 19*a*–19*e*. This etching leaves thermal oxide films 13*b*1, 13*c*1, 13*f*1 and 13*h*2 at the positions neighboring to openings 19*a*–19*e*.

Thereafter, using photoresist patterns 18*a*–18*f* as a mask, n-type impurity ions 20 of arsenic, phosphorus or the like are introduced into $n^-$-epitaxial growth layers 7*a*–7*c* by an ion implanting method.

Figure 24:
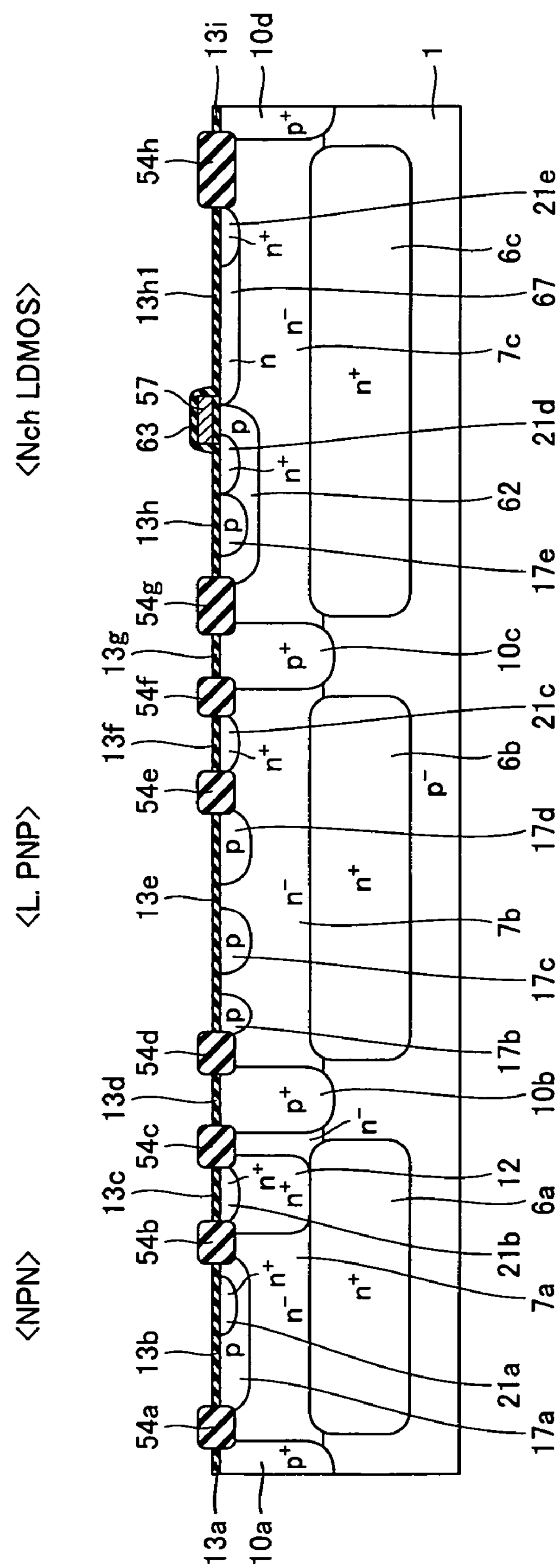

After removing photoresist patterns 18*a*–18*f*, thermal processing is performed. This forms $n^+$-diffusion layers 21*a*–21*e* as shown in FIG. 24. Thus, the emitter and the collector of the vertical npn bipolar transistor, the base of the lateral pnp bipolar transistor, and the source and drain of the lateral DMOS transistor are simultaneously formed. This thermal processing also forms oxide films on implantation openings 19*a*–19*e*.

Figure 25:
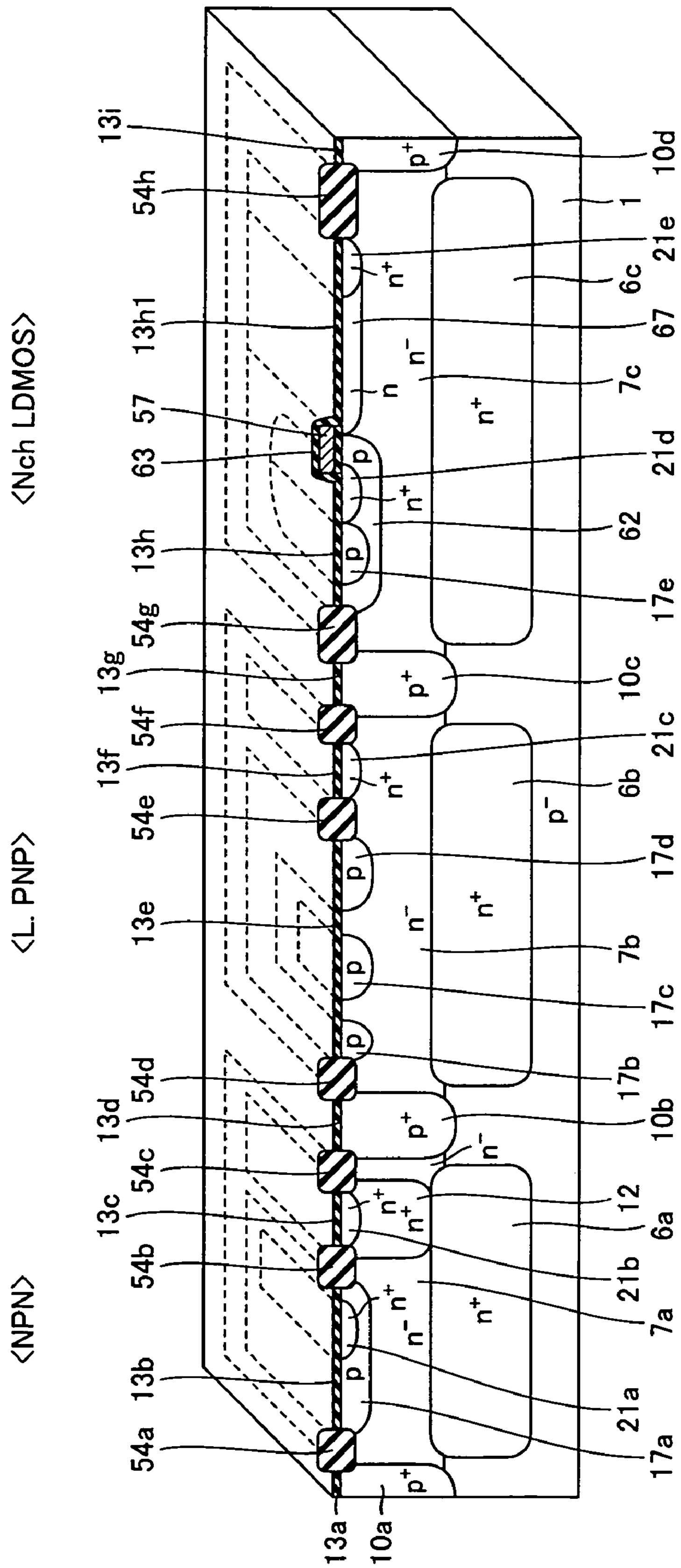
FIG. 25 is a perspective view of the semiconductor device in the state shown in FIG. 24.
Figure 26:
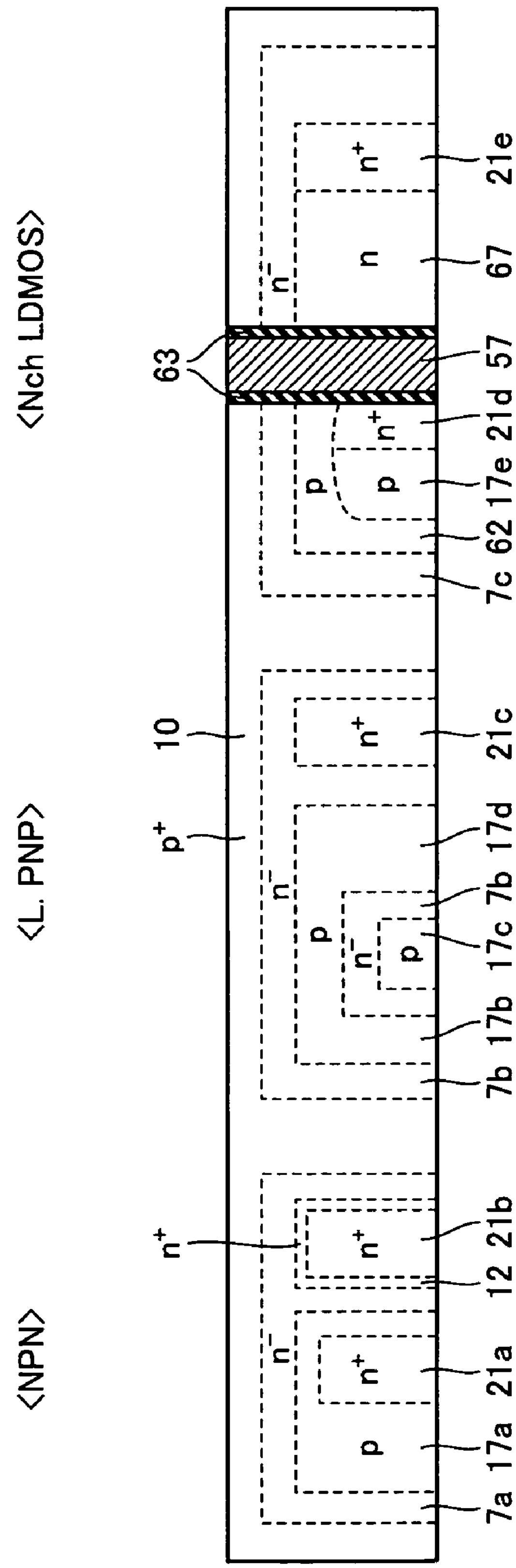
FIG. 26 is a plan of the semiconductor device in the state shown in FIG. 24.

FIGS. 25 and 26 are a perspective view and a plan of the semiconductor device in the state shown in FIG. 24. As shown in FIGS. 25 and 26, p-type diffusion layers 17*b* and 17*d* are connected together to form the collector of the lateral pnp bipolar transistor. p-type diffusion layer 17*e* forming the back gate of the lateral DMOS transistor is in contact with $n^+$-diffusion layer 21*d*, which will form the source of the lateral DMOS transistor. p-type diffusion layer 17*e* and $n^+$-diffusion layer 21*d* have ends, of which corners are rounded, e.g., into an arc for ensuring an intended breakdown voltage. Although the source of the lateral DMOS transistor is formed of only a heavily doped impurity diffusion layer, the drain of the lateral DMOS transistor is formed of a heavily doped impurity diffusion layer and a lightly doped impurity diffusion layer.

Figure 27:
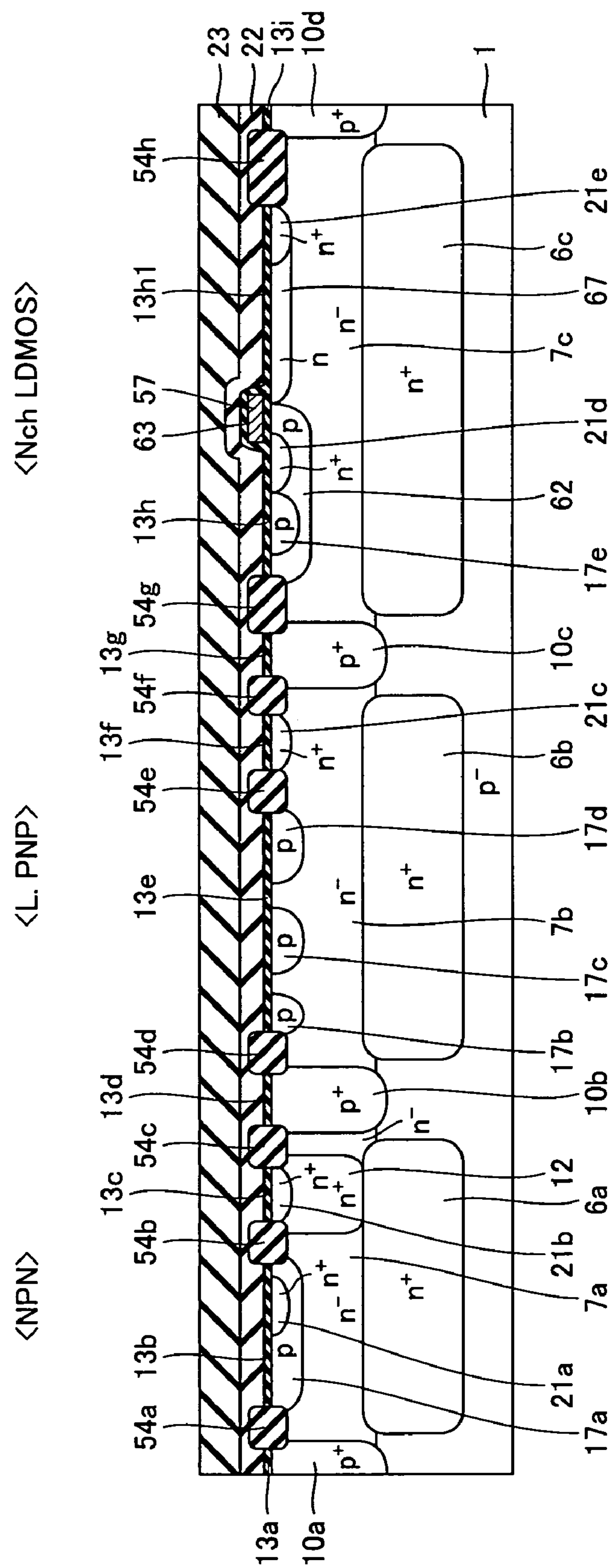
FIGS. 27 to 31 show 24th to 28th steps in the manufacturing process of the semiconductor device according to the first embodiment of the invention, respectively.

As shown in FIG. 27, a CVD method is then performed to deposit first interlayer insulating film 22 formed of a CVD oxide film, which has a thickness of about 0.2 μm and is, for example, not doped with impurities. Further, a CVD method is performed to deposit second interlayer insulating film 23 formed of a CVD oxide film, which has a thickness of about 0.6 μm and is doped with, e.g., boron or phosphorus. Then, appropriate thermal processing is performed to fluidize second interlayer insulating film 23 for flattening the wafer surface.

Figure 28:
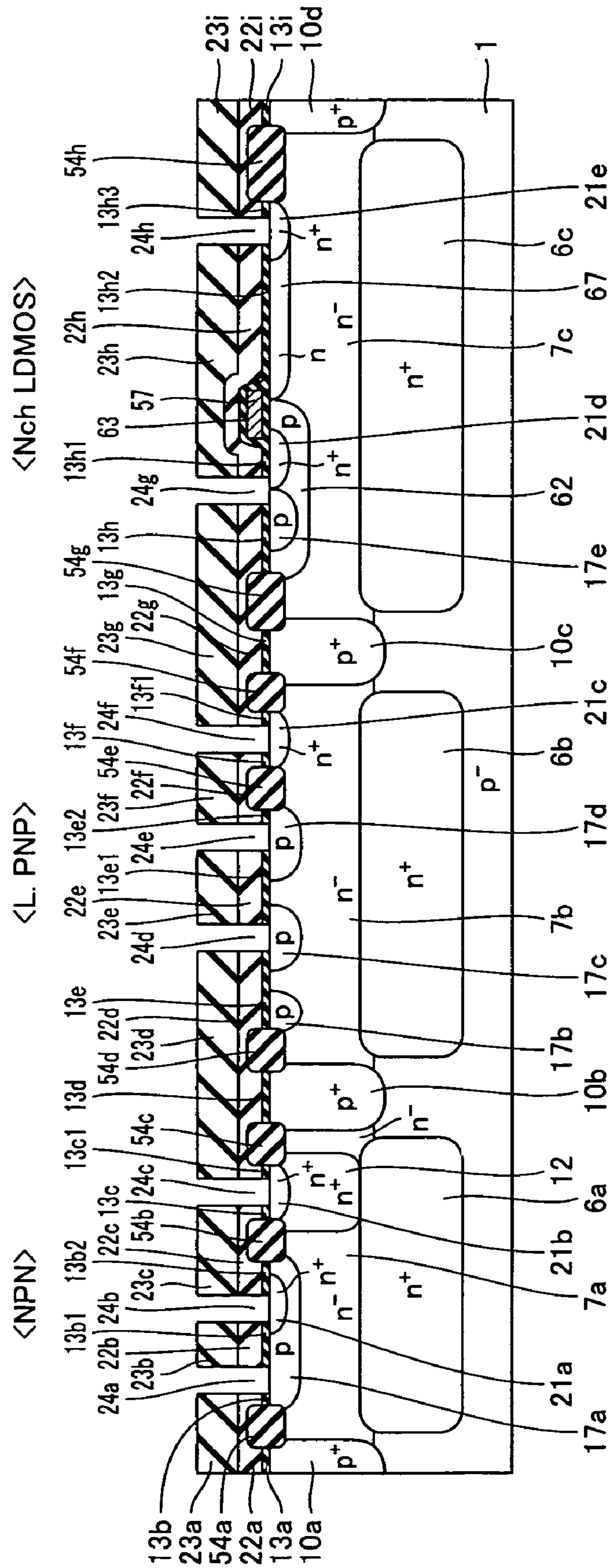

Then, a photoresist pattern (not shown) of a predetermined configuration is formed on second interlayer insulating film 23. Using this photoresist pattern as a mask, RIE (Reactive Ion Etching), i.e., dry etching with reactive ions is performed. This etching forms contact holes 24*a*–24*h* as shown in FIG. 28.

First and second interlayer insulating films 22*a*–22*i* and 23*a*–23*i* are left around contact holes 24*a*–24*h*. Also, thermal oxide films 13*b*1, 13*b*2, 13*c*1, 13*e*1, 13*e*2, 13*f*1, 13*h*1, 13*h*2 and 13*h*3 are left.

Although not shown, a contact hole for gate electrode 57 is formed at the same time. In the resistance portion shown in FIG. 33, first and second interlayer insulating films 22*j* and 23 are successively formed. A contact hole reaching p-type diffusion layer 17*i* is also formed.

Figure 29:
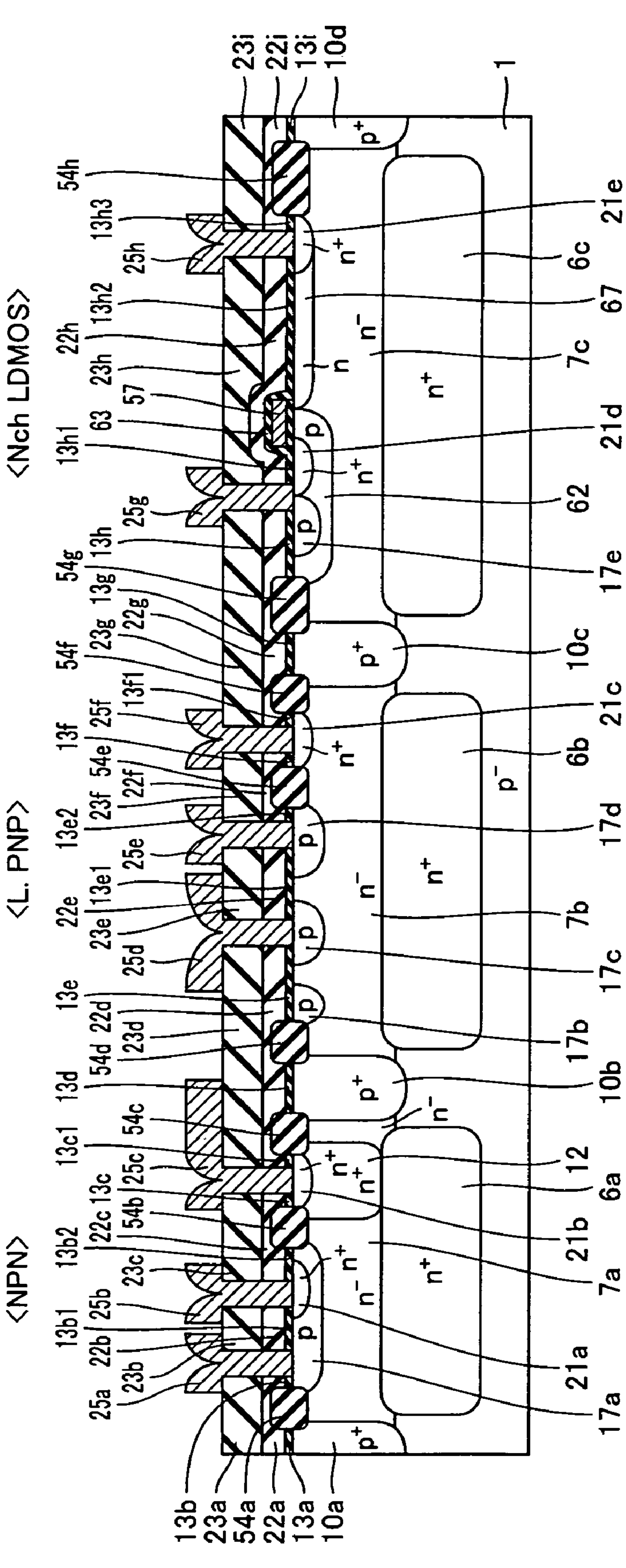

Then, a sputtering method or the like is performed to form, e.g., a metal film (conductive film), which is made of AlSi, AlCu or the like and has a thickness, e.g., of about 0.6 μm, over the whole surface. By patterning the metal film, first interconnections 25*a*–25*h* are formed as shown in FIG. 29. By this processing, first interconnections 25*i* and 25*j* are formed in the resistance portion shown in FIG. 33.

Figure 30:
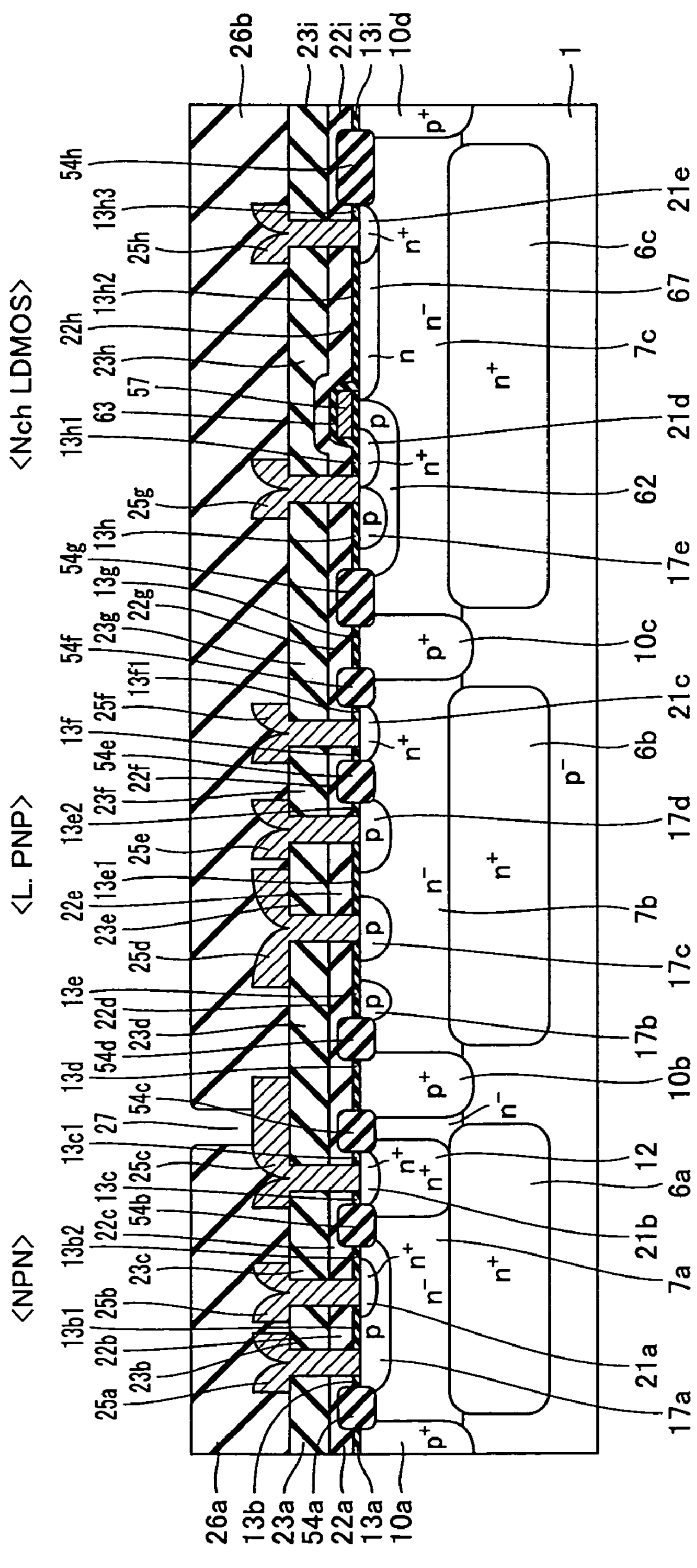

Then, a plasma CVD method or the like is performed to deposit a third interlayer insulating film, e.g., of about 0.8 μm made of a CVD oxide film. Photolithography and etching are performed to form a through hole 27 reaching first interconnection 25*c* in the third interlayer insulating film, as shown in FIG. 30. Consequently, third interlayer insulating films 26*a* and 26*b* remain around through hole 27.

Figure 31:
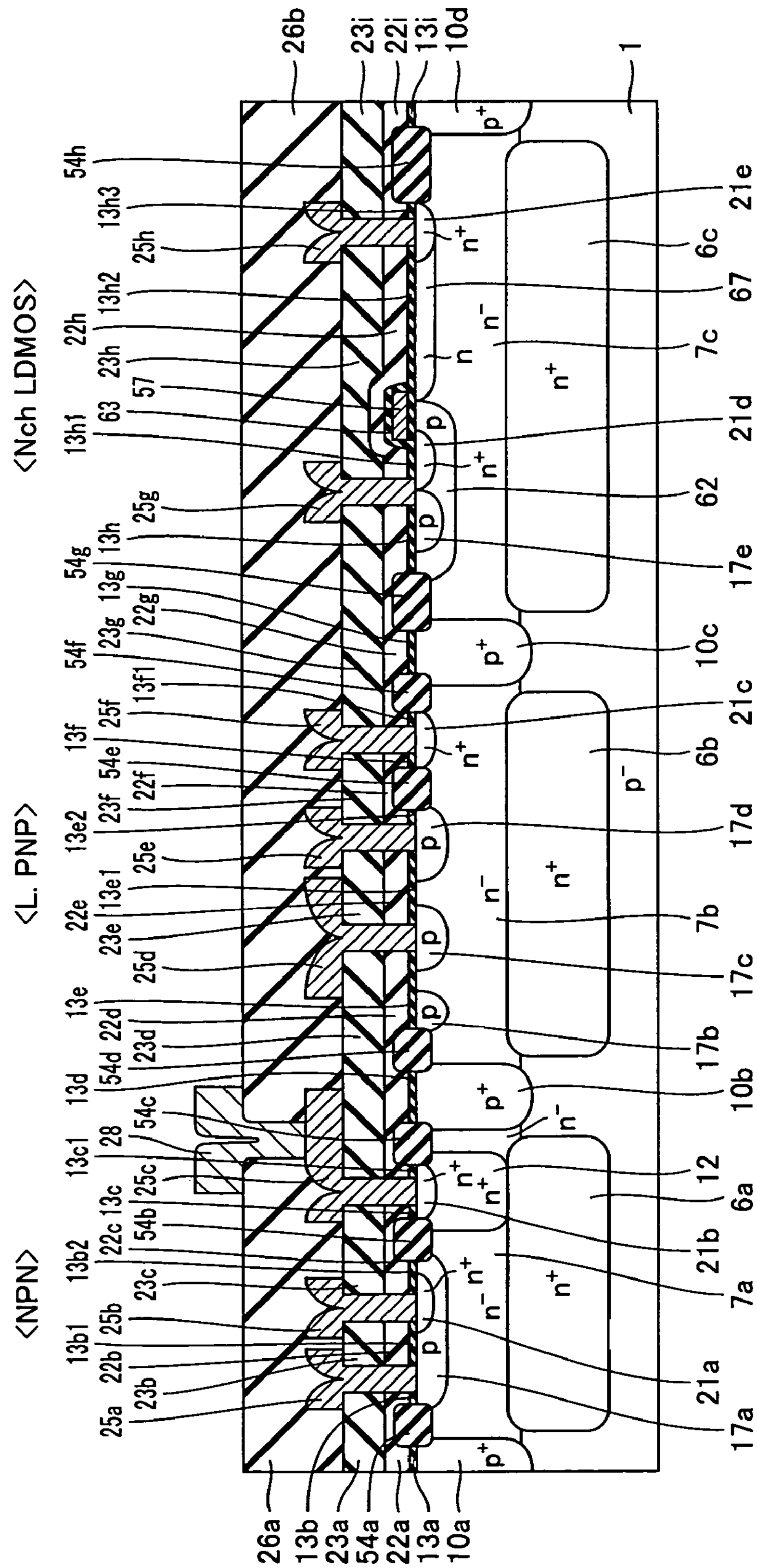

Then, a sputtering method or the like is performed to form a metal film (conductive film), which is made of AlSi, AlCu or the like and has a thickness, e.g., of about 1 μm, over the whole surface. By patterning the metal film, second interconnection 28 is formed as shown in FIG. 31. Then, a plasma CVD method or the like is performed to deposit a protection film (insulating film) 29, e.g., of about 0.8 μm in thickness made of a CVD nitride film. Through the steps described above, the semiconductor device shown in FIG. 32 is completed.

(Second Embodiment)

A second embodiment of the invention will now be described with reference to FIGS. 34 to 37.

In the first embodiment described above, contact resistances may rise due to miniaturization of the elements. Accordingly, a device, which can suppress rising of the contact resistance, will now be described as a second embodiment.

Figure 37:
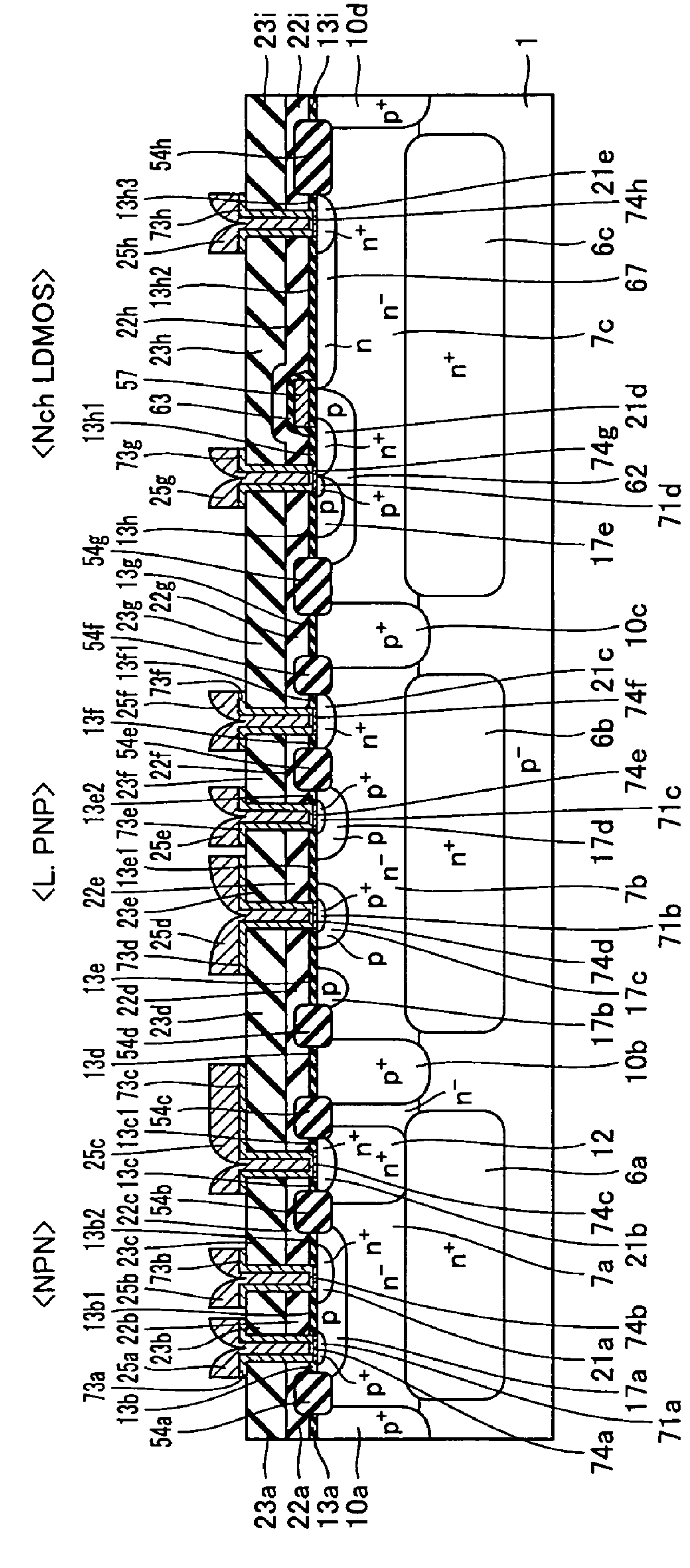
FIG. 37 is a cross section showing a distinctive structure of the semiconductor device according to the second embodiment of the invention.

FIG. 37 shows an example of a distinctive structure of the semiconductor device according to the second embodiment. As shown in FIG. 37, $p^+$-diffusion layers (heavily doped impurity diffusion layers) 71*a*, 71*b*, 71*c* and 71*d* are formed at the surface of p-type diffusion layers 17*a*, 17*c*, 17*d* and 17*e*, respectively. $p^+$-diffusion layers 71*a*–71*d* contain p-type impurities at higher concentrations than p-type diffusion layers 17*a*, 17*c*, 17*d* and 17*e*, respectively. The concentrations of p-type impurities contained in $p^+$-diffusion layers 71*a*–71*d* are substantially in a range from about $1\times10^{19}$ $cm^{-3}$ to about $1\times10^{21}$ $cm^{-3}$.

Silicide layers 74*a*–74*h* are formed at the surfaces of $p^+$-diffusion layers 71*a*–71*d* and $n^+$-diffusion layers 21*a*–21*e*. Silicide layers 74*a*–74*h* may be titanium silicide ($TiSi_2$) layers. Titanium nitride (TiN) layers 73*a*–73*h* extend continuously from silicide layers 74*a*–74*h* over the sidewalls of the contact holes, respectively. First interconnections 25*a*–25*h* are formed on titanium nitride layers 73*a*–73*h* and silicide layers 74*a*–74*h*, respectively. Structures other than the above are substantially the same as those of the first embodiment.

By forming silicide layers 74*a*–74*h* at the bottoms of the contact holes as described above, it is possible to reduce contact resistances between first interconnections 25*a*–25*h* and the impurity diffusion layers. By forming the heavily doped impurity diffusion layers such as $p^+$-diffusion layers 71*a*–71*d* at the surface of P-type impurity diffusion layers, it is possible to suppress rising of the contact resistance between the silicide layer and the silicon layer.

Description will now be given on a method of manufacturing the semiconductor device of the second embodiment having the foregoing structures with reference to FIGS. 34–37.

Figure 34:
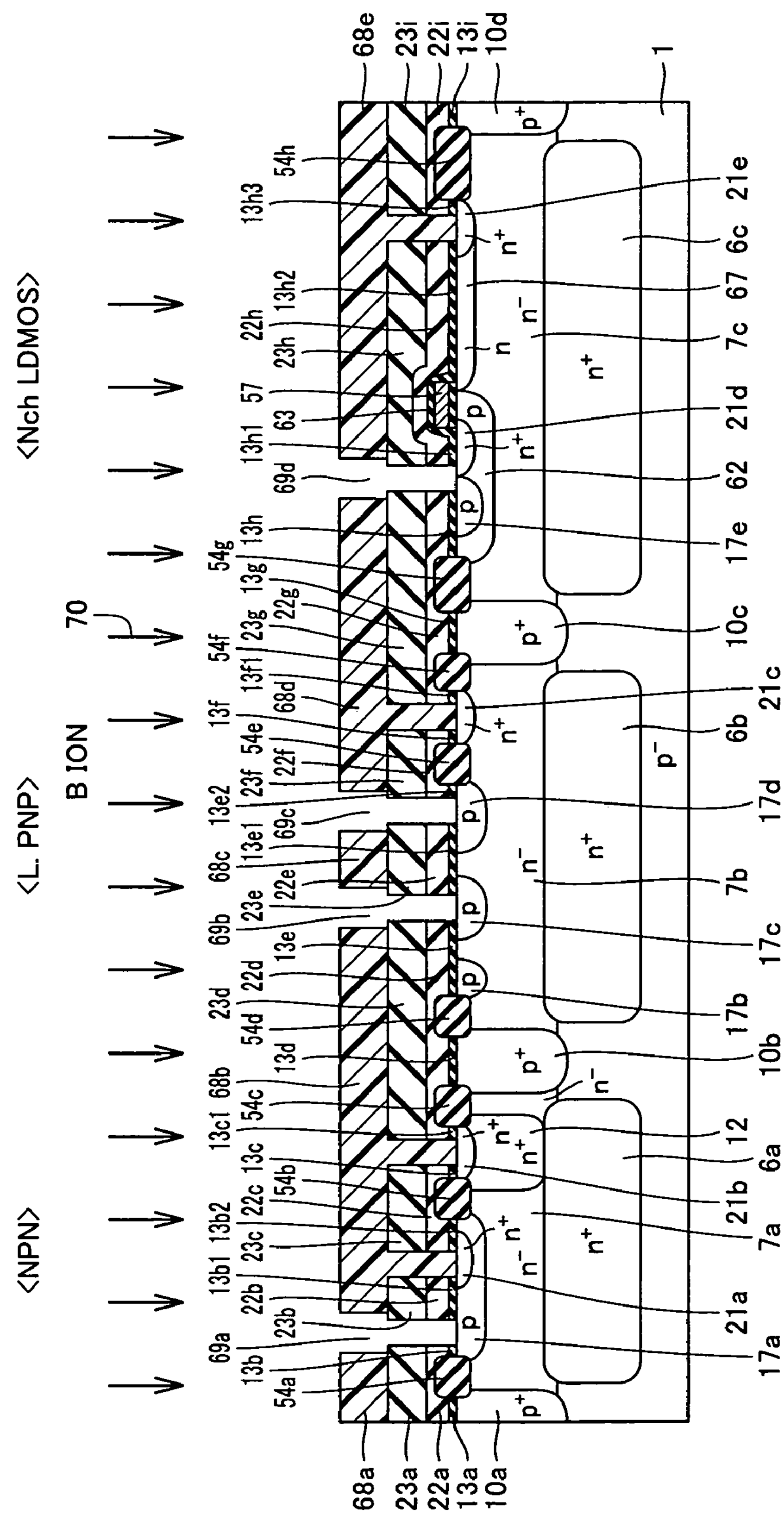
FIGS. 34 to 36 are cross sections showing distinctive 1st to 3rd steps in the manufacturing process of a semiconductor device according to a second embodiment of the invention, respectively.

As shown in FIG. 34, the structure having contact holes 24*a*–24*h* shown in FIG. 28 is formed through the steps similar to those in the first embodiment. Then, processing is performed to form photoresist patterns 68*a*–68*e* having openings 69*a*–69*d*, which continue to the contact holes on p-type diffusion layers 17*a*, 17*c*, 17*d* and 17*e*, respectively, on second interlayer insulating films 23*a*–23*i*. Using photoresist patterns 68*a*–68*e* as a mask, p-type impurities 70 such as boron are introduced into p-type diffusion layers 17*a*, 17*c*, 17*d* and 17*e*. In this processing, the p-type impurities are also introduced into the source of the lateral DMOS transistor. However, the source is already doped heavily with the n-type impurities. Therefore, no problem occurs in the characteristics of the lateral DMOS transistor.

For the following reason, the p-type diffusion layers 17*a*, 17*c*, 17*d* and 17*e* are doped with p-type impurities. When a titanium silicide layer is formed at the surfaces of p-type diffusion layers 17*a*, 17*c*, 17*d* and 17*e* formed by introducing boron (p-type impurities), such a phenomenon occurs that the boron on the silicon side moves to the silicide side. When the boron moves from the silicon side to the silicide side, a contact resistance between the silicon layer and the silicide layer rises.

For example, p-type diffusion layer 17*a* will form an intrinsic base of the vertical npn bipolar transistor, but the concentration of p-type impurities at the surface of p-type diffusion layer 17*a* is in a range from about $1\times10^{18}$ to about $1\times10^{19}$ $cm^{-3}$. Accordingly, the movement of impurities described above may disadvantageously increase the contact resistance.

In view of the above, boron (p-type impurities) is added in advance into the surfaces of p-type diffusion layers 17*a*, 17*c*, 17*d* and 17*e*. Thereby, the increase in contact resistance between the silicon layer and the silicide layer can be suppressed even when the p-type impurities move from the silicon side to the silicide side.

On the other hand, $n^+$-diffusion layers 21*a*–21*e* are doped with n-type impurities at a concentration, which is ten or more times as large as those of p-type diffusion layers 17*a*, 17*c*, 17*d* and 17*e*. Therefore, even when the silicide layers are formed directly on the surfaces of $n^+$-diffusion layers 21*a*–21*e*, this increases the contact resistance only to an ignorable extent. Therefore, it is not necessary to add n-type impurities to $n^+$-diffusion layers 21*a*–21*e*.

Figure 35:
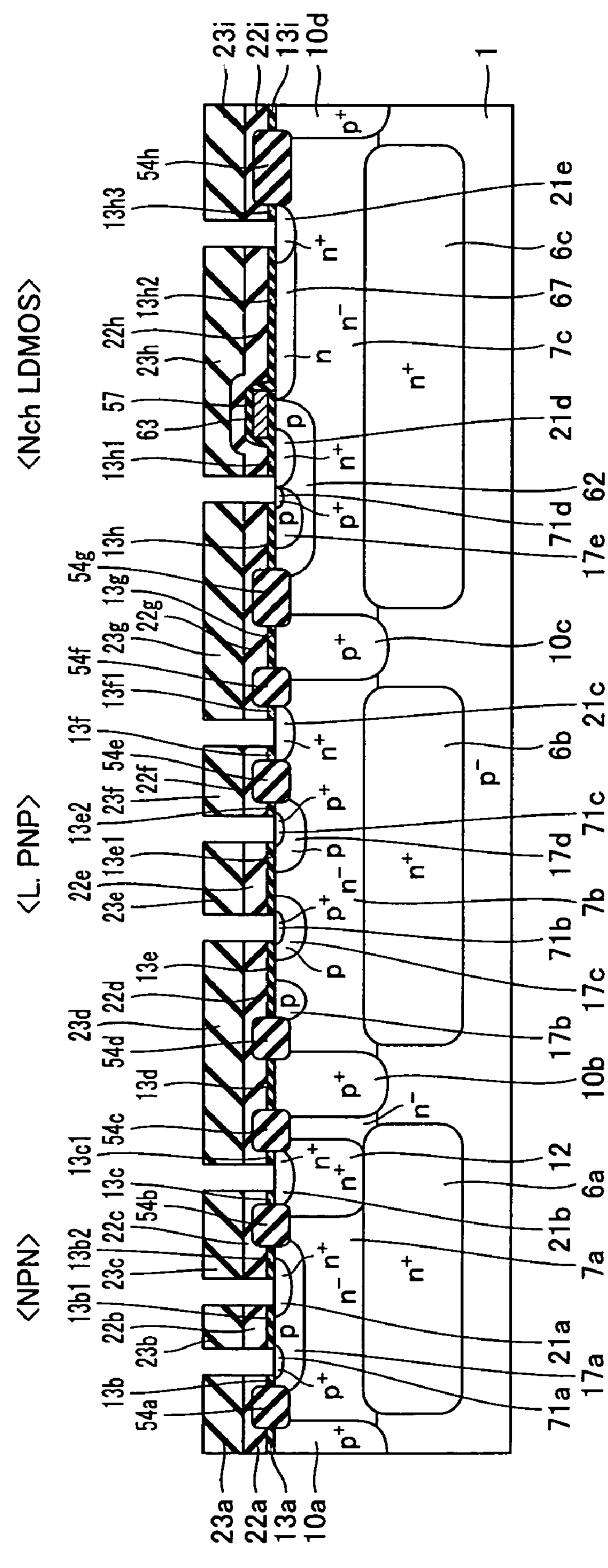

After introducing p-type diffusion layers 17*a*, 17*c*, 17*d* and 17*e* with p-type impurities, photoresist patterns 68*a*–68*e* are removed, and thermal processing is performed at a relatively low temperature, e.g., of about 850° C. in an $N_2$ atmosphere. Thereby, $p^+$-diffusion layers 71*a*–71*d* are formed at the surface of p-type diffusion layers 17*a*, 17*c*, 17*d* and 17*e*, respectively, as shown in FIG. 35.

Figure 36:
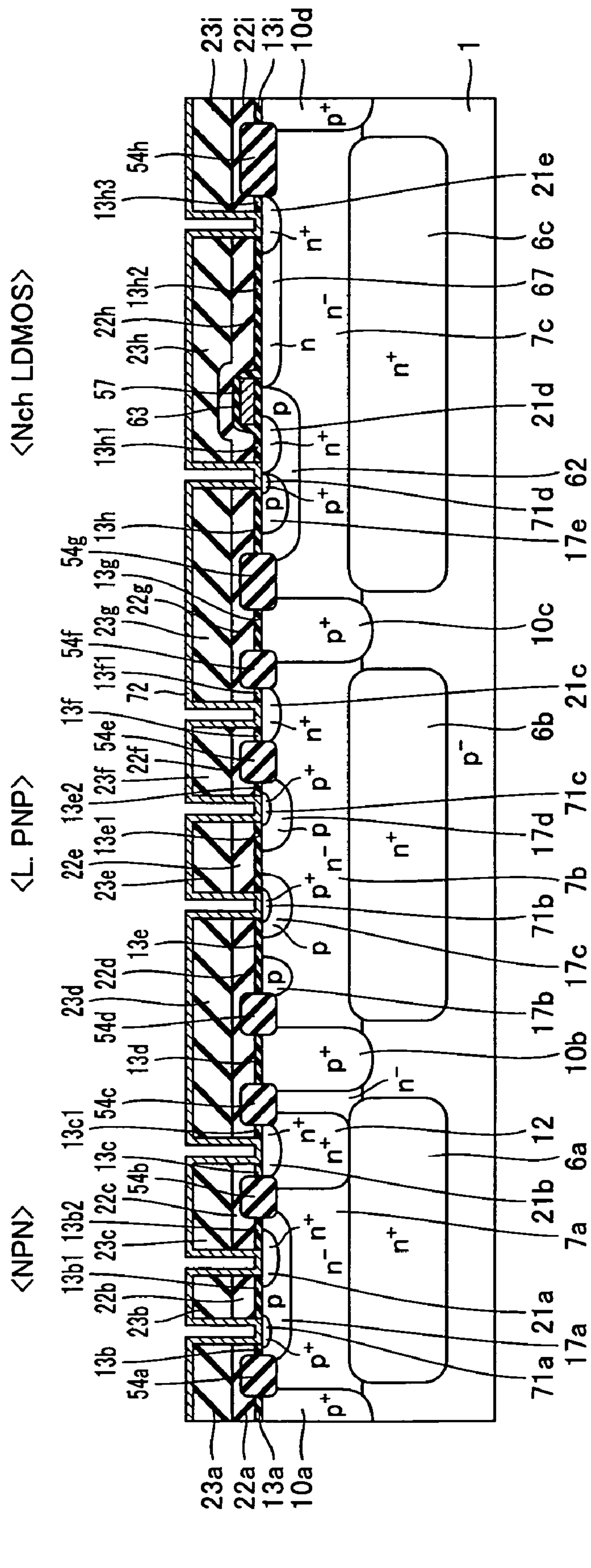

Then, as shown in FIG. 36, a titanium film 72 of about 0.06 $\mu$m in thickness is deposited by a sputtering method or the like. Thermal processing is effected on titanium film 72 for tens of seconds at a relatively low temperature, e.g., of about 800° C. in the $N_2$ atmosphere. As shown in FIG. 37, silicide layers (titanium silicide layers) 74*a*–74*h* are formed at the surfaces of $p^+$-diffusion layers 71*a*–71*d* and $n^+$-diffusion layers 21*a*–21*e*, and titanium nitride layers 73*a*–73*h* are formed on the sidewalls of the contact holes.

In a manner similar to that of the first embodiment, a metal film, e.g., of AlSi or AlCu having a thickness of 0.6 $\mu$m is then formed on the whole surface. Then, patterning is effected on this metal film and titanium nitride films 73*a*–73*h*. Thereafter, the semiconductor device of the second embodiment is completed through the steps similar to those in the first embodiment.

(Third Embodiment)

A third embodiment of the invention will now be described with reference to FIGS. 38–51.

A Hetero-junction Bipolar Transistor (HBT) of an SiGe base is a high-frequency bipolar transistor for use in the next generation of the ultra-high speed communication system (optical communication system of 10 Gb/s or higher, wireless LAN, mobile communication system and others).

For producing a high-frequency npn transistor, it is necessary to reduce a thickness of the base. However, if the thickness of the base is reduced, it is difficult to ensure a collector-emitter breakdown voltage. Conversely, the collector-emitter breakdown voltage can be ensured by increasing the concentration of impurities in the base. However, this impedes ensuring of an intended base-emitter breakdown voltage.

In view of the above, the base of the npn transistor may be made of an epitaxial growth layer (e.g., containing 10%–30% of Ge) of SiGe providing a narrower band gap than silicon. Thereby, the base-emitter breakdown voltage can be ensured even if the base has a high impurity concentration. Accordingly, it is possible to use the base having a small thickness and a high impurity concentration.

Further, there is SiGe:C technique, in which carbon (C) is added to SiGe (base). By adding carbon (C) to SiGe (base) at a rate not exceeding, e.g., 1%, it is possible to suppress external diffusion of boron during thermal processing. In other words, the performance and reliability can be further improved.

Sufficient reduction of the working or processing sizes of the semiconductor device can lower a cost owing to increase in number of integrated circuit chips yielded per silicon wafer, and can increase a performance. Therefore, such reduction has been aggressively proceeded. For example, a gate length in a MOS transistor is reduced if the semiconductor device is miniaturized.

The foregoing problem relating to the base in the npn transistor is similar to the problem relating to the channel region in an nMOS transistor. More specifically, for reducing the gate length, it is necessary to increase the channel concentration for ensuring a punch through breakdown voltage between the drain and the source. However, this makes it difficult to ensure the breakdown voltage between the drain and the channel region.

According to the third embodiment, therefore, an epitaxial growth layer of SiGe or SiGe:C is utilized in the channel region of the lateral DMOS transistor, and thereby the lateral DMOS transistor having a further reduced gate length is produced.

Description will now be given on an example of a specific structure of a semiconductor device according to the third embodiment with reference to FIG. 51.

Figure 51:
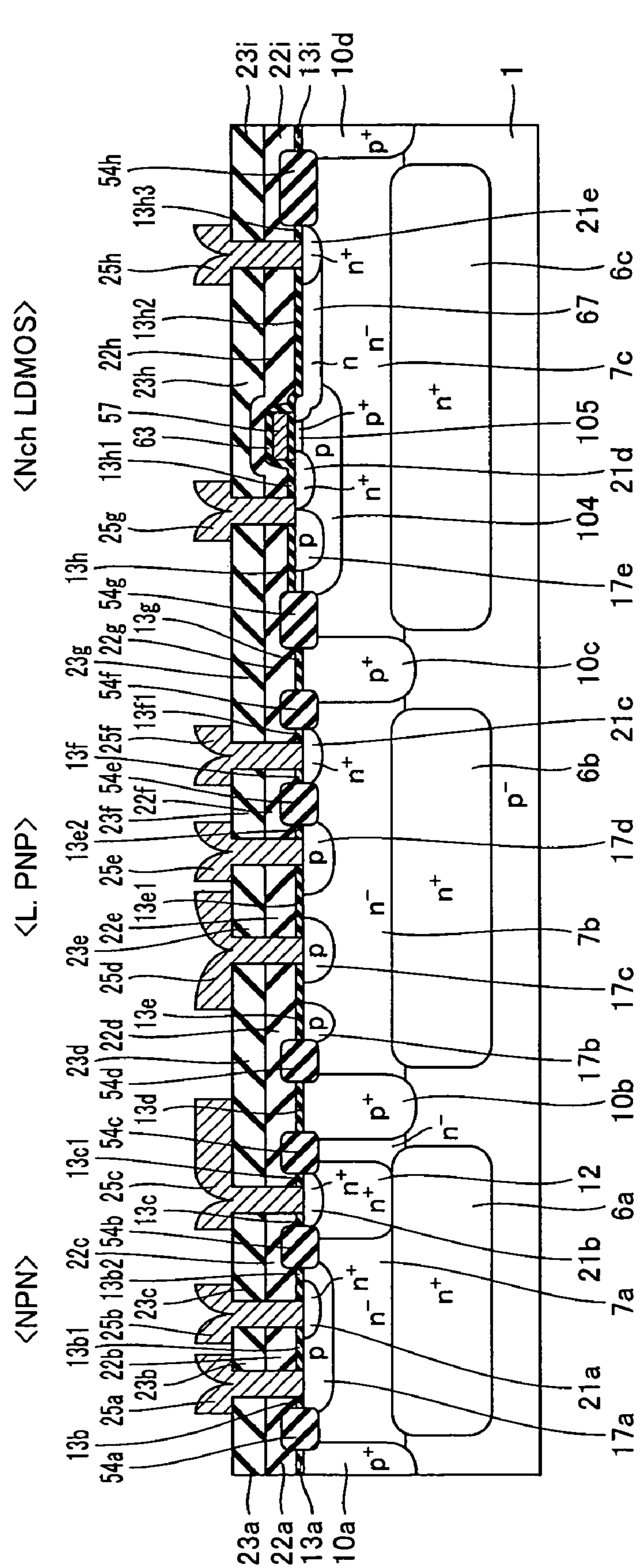
FIG. 51 is a cross section showing a distinctive structure of the semiconductor device according to the third embodiment of the invention.

In the third embodiment, as shown in FIG. 51, an epitaxial growth layer (compound semiconductor layer) 105 of SiGe or SiGe:C is formed at a surface of a p-type diffusion layer 104. This epitaxial growth layer 105 forms a channel region of the lateral DMOS transistor.

Epitaxial growth layer 105 has a thickness, e.g., from about 0.1 μm to about 0.3 μm, and contains p-type impurities at a concentration, e.g., from about $1\times10^{17}$ $cm^{-3}$ to $1\times10^{19}$ $cm^{-3}$.

By providing epitaxial growth layer 105 to form the channel region of the lateral DMOS transistor as described above, the channel region can be heavily doped with impurities so that the channel length and the gate length can be reduced. Thereby, the lateral DMOS transistor having a further reduced gate length can be produced. Structures other than the above are substantially the same as those of the first embodiment.

A method of manufacturing the semiconductor device of the third embodiment having the foregoing structure will now be described with reference to FIGS. 38 to 51.

Figure 38:
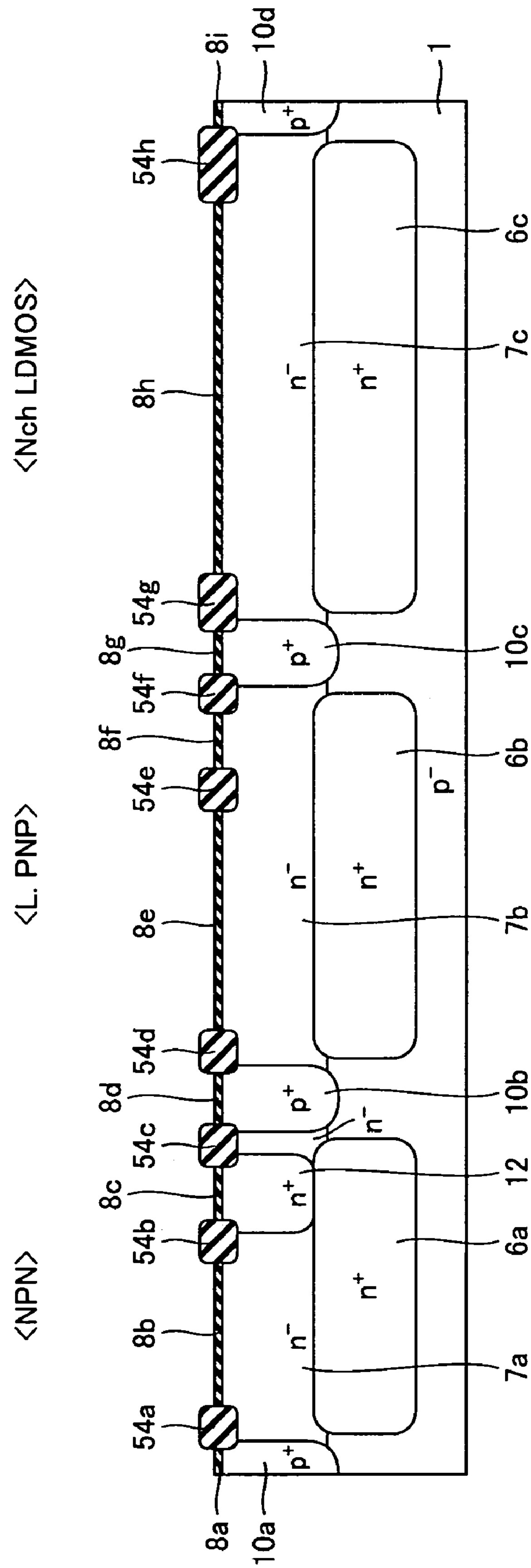
FIGS. 38 to 50 are cross sections showing 1st to 13th steps in the manufacturing process of a semiconductor device according to a third embodiment of the invention, respectively.
Figure 39:
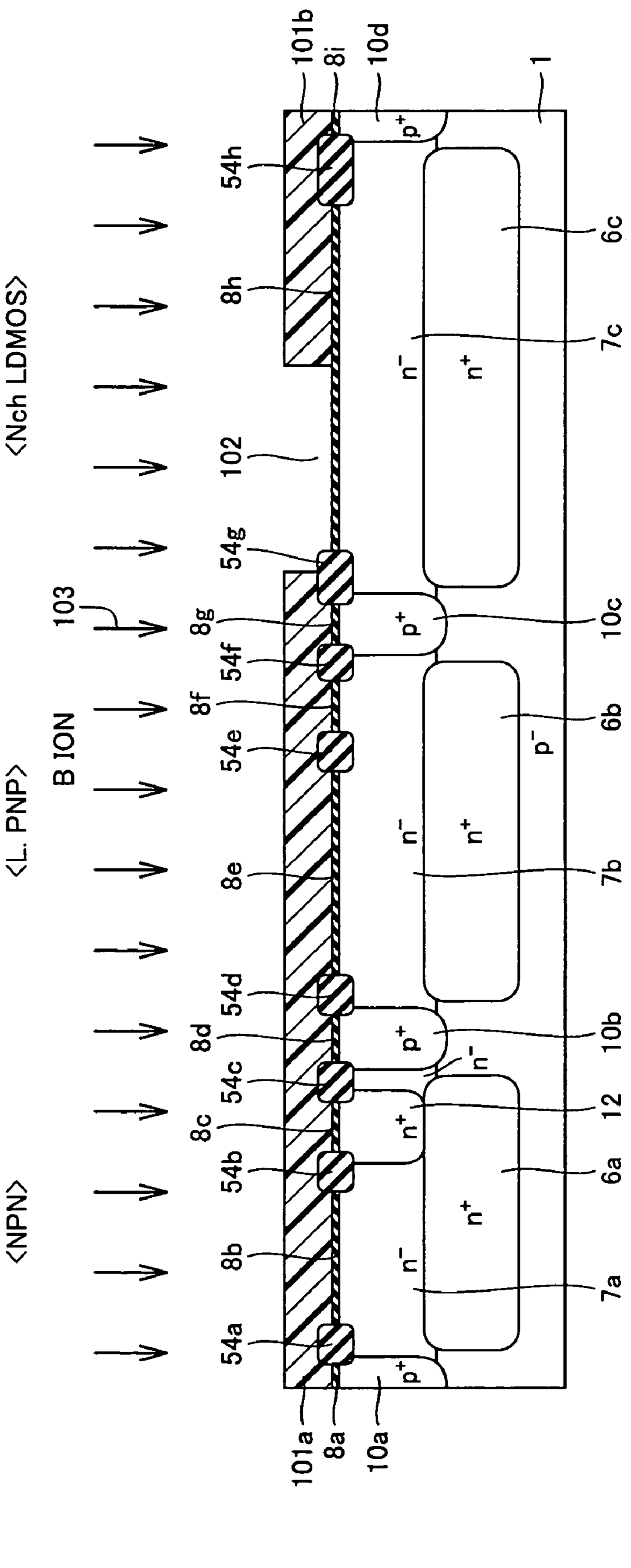

As shown in FIG. 38, structures having thermal oxide film 8*c* are formed through steps similar to those in the first embodiment, and thereafter, nitride films 56*a* and 56*b* shown in FIG. 14 are removed. Then, photoresist patterns 101*a* and 101*b* having opening 102 are formed on a region, in which p-type diffusion layer (p-well) 104 is to be formed. Using photoresist patterns 101*a* and 101*b* as a mask, p-type impurity ions 103 are implanted into $n^-$-epitaxial growth layer 7*c* by an ion implanting method as shown in FIG. 39.

Figure 40:
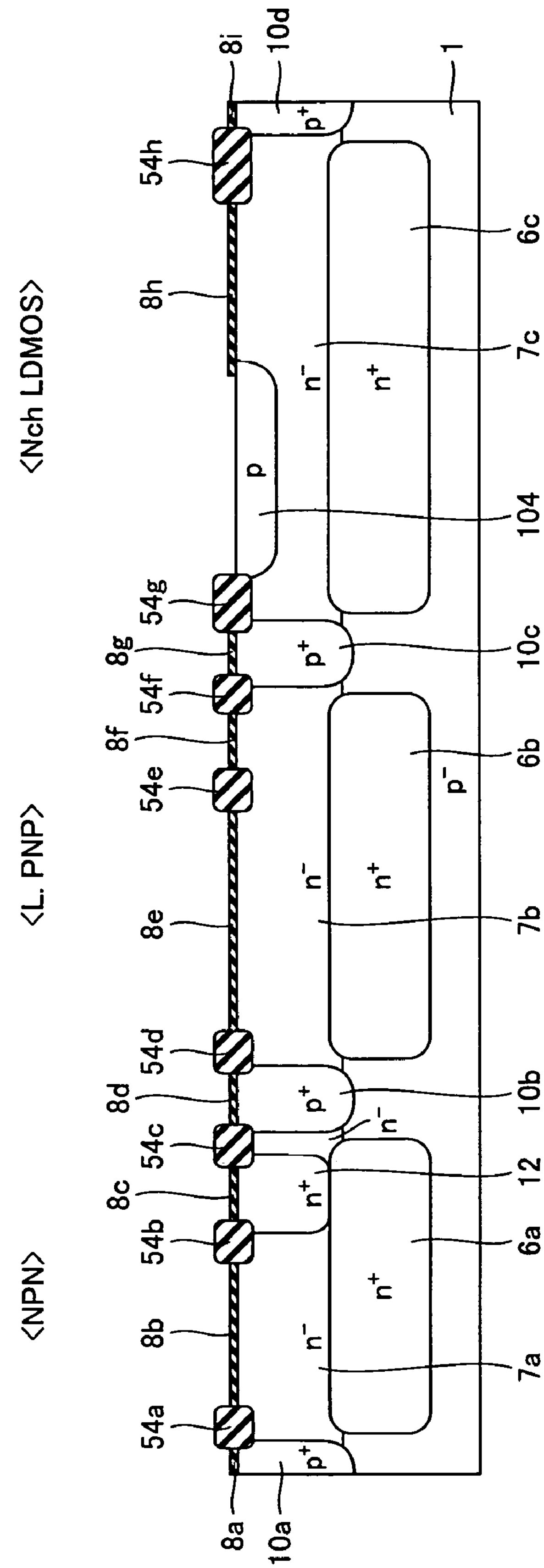

Etching is effected on thermal oxide film 8*h* masked with photoresist patterns 101*a* and 101*b*. Thereafter, photoresist patterns 101*a* and 101*b* are removed, and thermal processing is effected. This forms p-type diffusion layer 104 as shown in FIG. 40.

Figure 41:
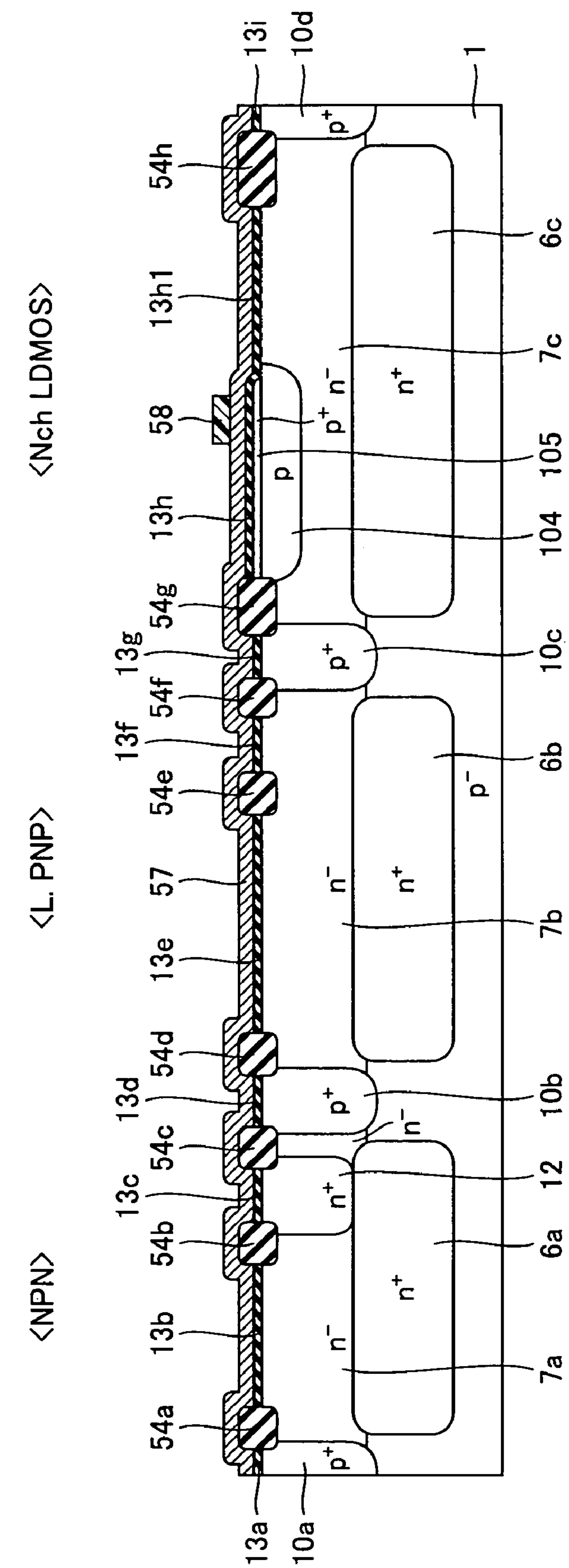

Then, as shown in FIG. 41, epitaxial growth layer 105 of SiGe or SiGe:C containing p-type impurities such as boron is formed on the exposed surface of p-type diffusion layer 104 by a selective epitaxial growth method. Epitaxial growth layer 105 has a thickness from about 0.1 μm to about 0.3 μm, and contains p-type impurities at a concentration from about $1\times10^{17}$ $cm^{-3}$ to $1\times10^{19}$ $cm^{-3}$.

Then, thermal oxide films 8*a*–8*i* are removed, and thermal oxide films 13*a*–13*i* from about 0.01 to about 0.02 μm in thickness are formed. A portion of thermal oxide films 13*a*–13*i* will form a gate oxide film of the lateral DMOS transistor.

Then, a low pressure CVD method is performed to deposit silicon film 57, which is about 0.2 μm in thickness and is made of polycrystalline silicon or amorphous silicon doped with phosphorus. Photoresist pattern 58 is formed on a portion of silicon film 57, in which the gate electrode of the lateral DMOS transistor is to be formed.

Figure 42:
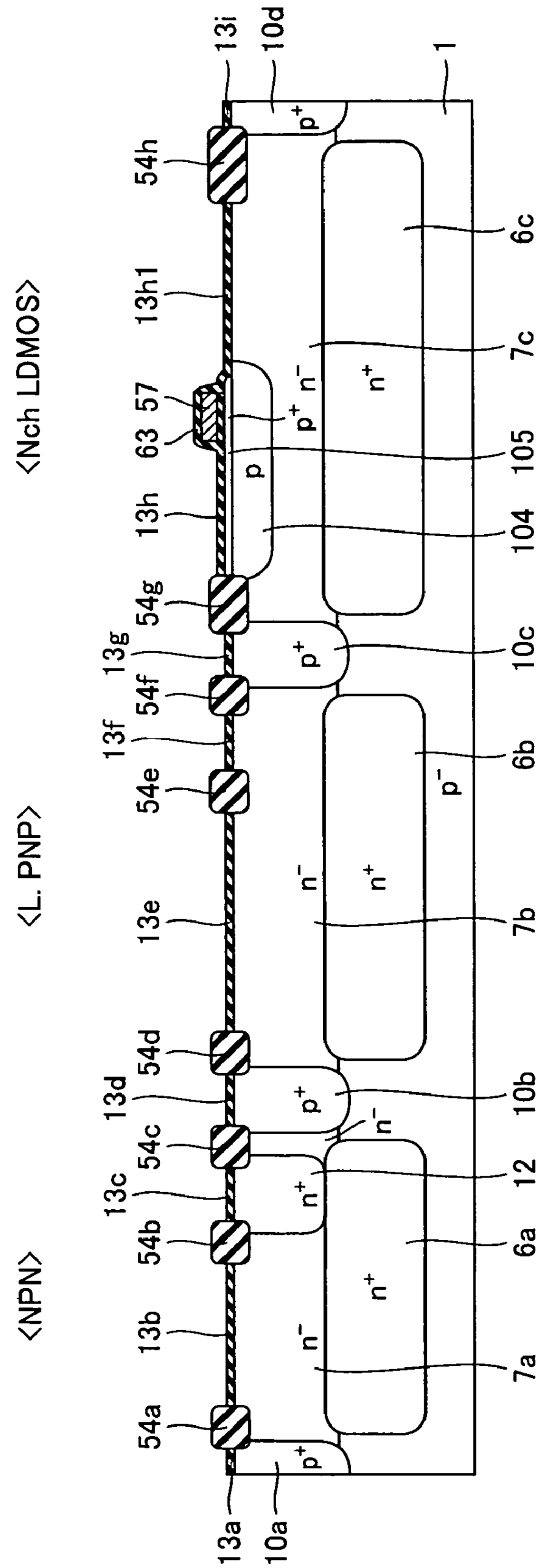

Etching is effected on silicon film 57 masked with photoresist pattern 58. Thereby, gate electrode 57 is formed as shown in FIG. 42. Gate electrode 57 is thermally oxidized to form oxide film 63.

Figure 43:
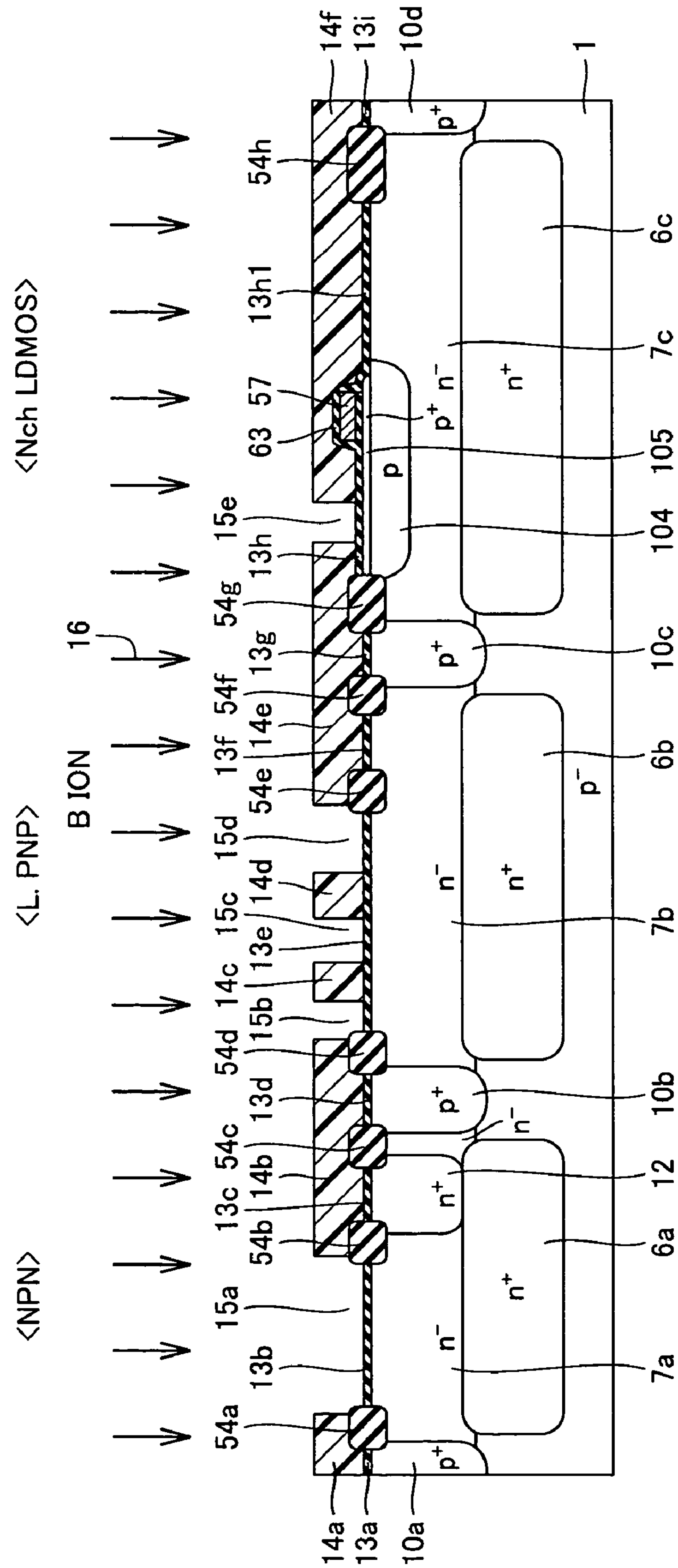

Then, as shown in FIG. 43, processing is performed to form photoresist patterns 14*a*–14*f* having opening 15*a* located on a region, in which p-type diffusion layer 17*a* forming the base of the vertical npn bipolar transistor is to be formed, openings 15*b*–15*d* located on regions, in which p-type diffusion layers 17*b*–17*d* forming the collector and emitter of the lateral pnp bipolar transistor are to be formed, and opening 15*e* located on a region, in which p-type diffusion layer 17*e* forming the back gate of the lateral DMOS transistor is to be formed. Using photoresist patterns 14*a*–14*f* as a mask, an ion implanting method is performed to introduce boron ions 16 into $n^-$-epitaxial growth layers 7*a*–7*c*.

Figure 44:
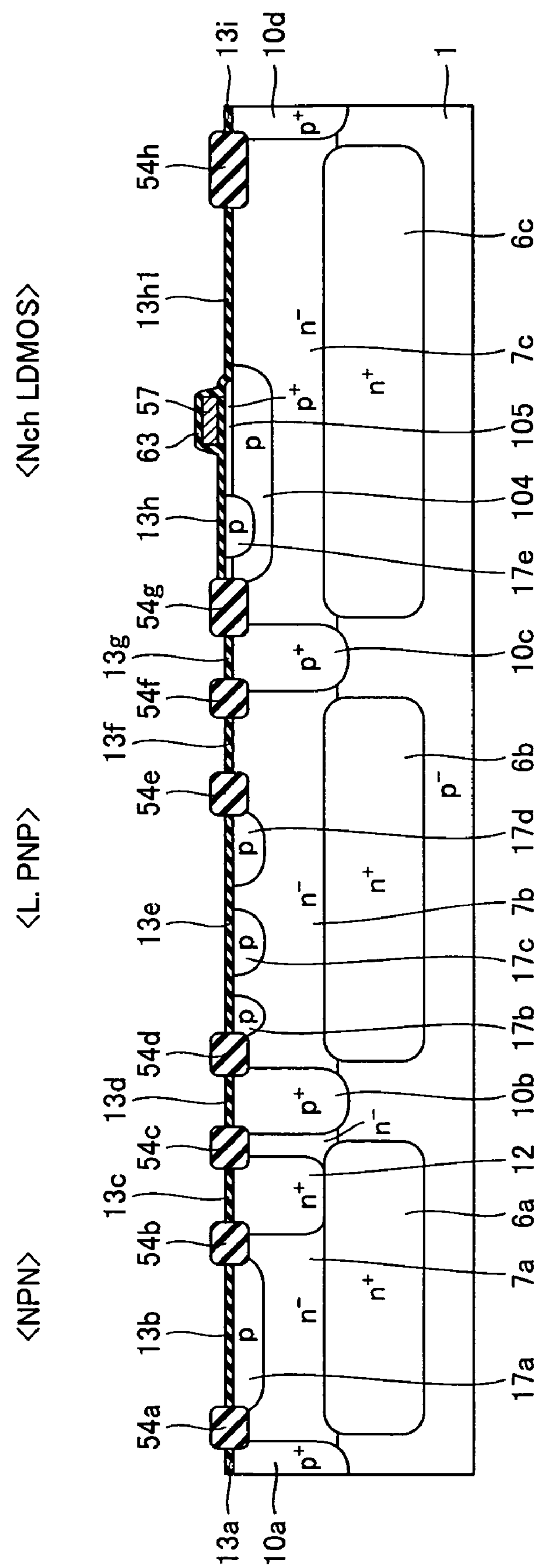

After removing photoresist patterns 14*a*–14*f*, thermal processing is performed. Thereby, p-type diffusion layers 17*a*–17*e* are formed as shown in FIG. 44. Thus, the base of the vertical npn bipolar transistor, the collector and emitter of the lateral pnp bipolar transistor and the back gate of the lateral DMOS transistor are simultaneously formed.

Figure 45:
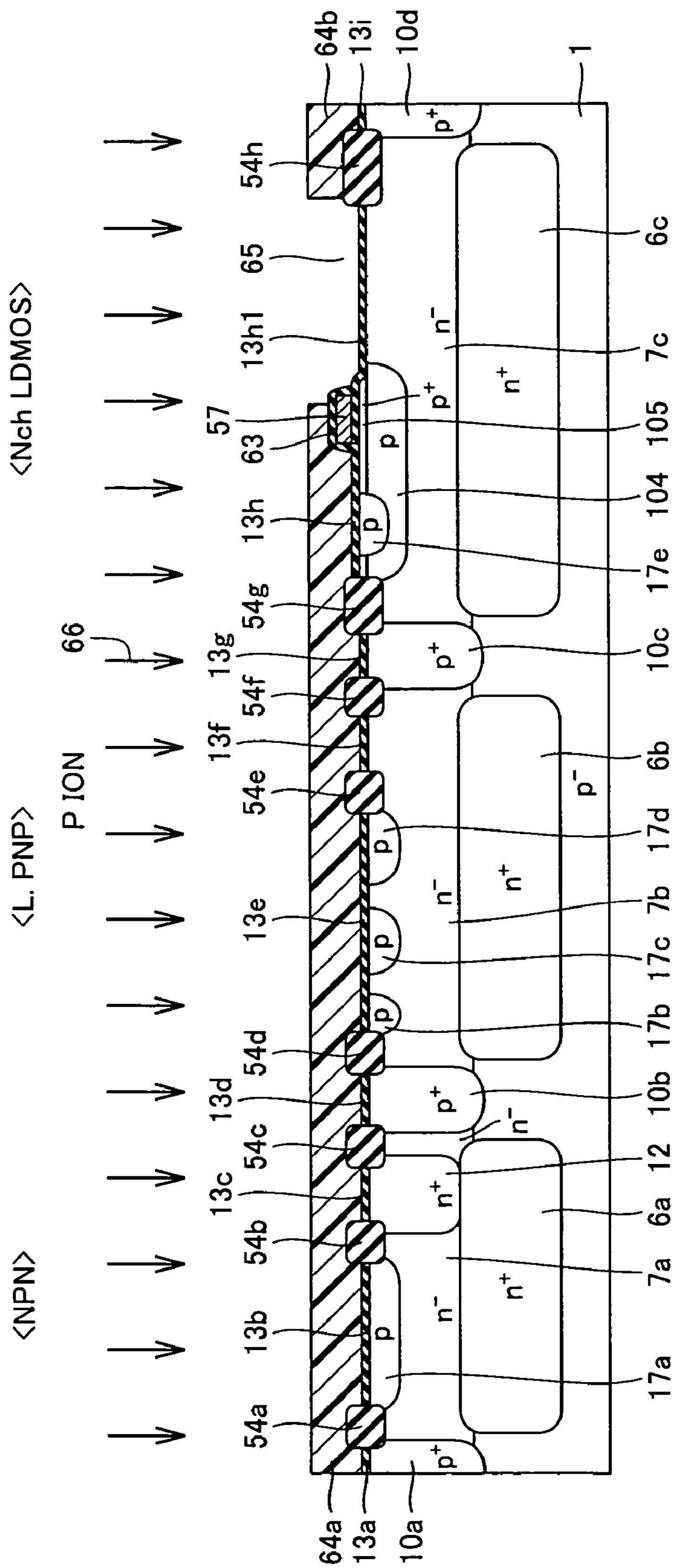
Figure 46:
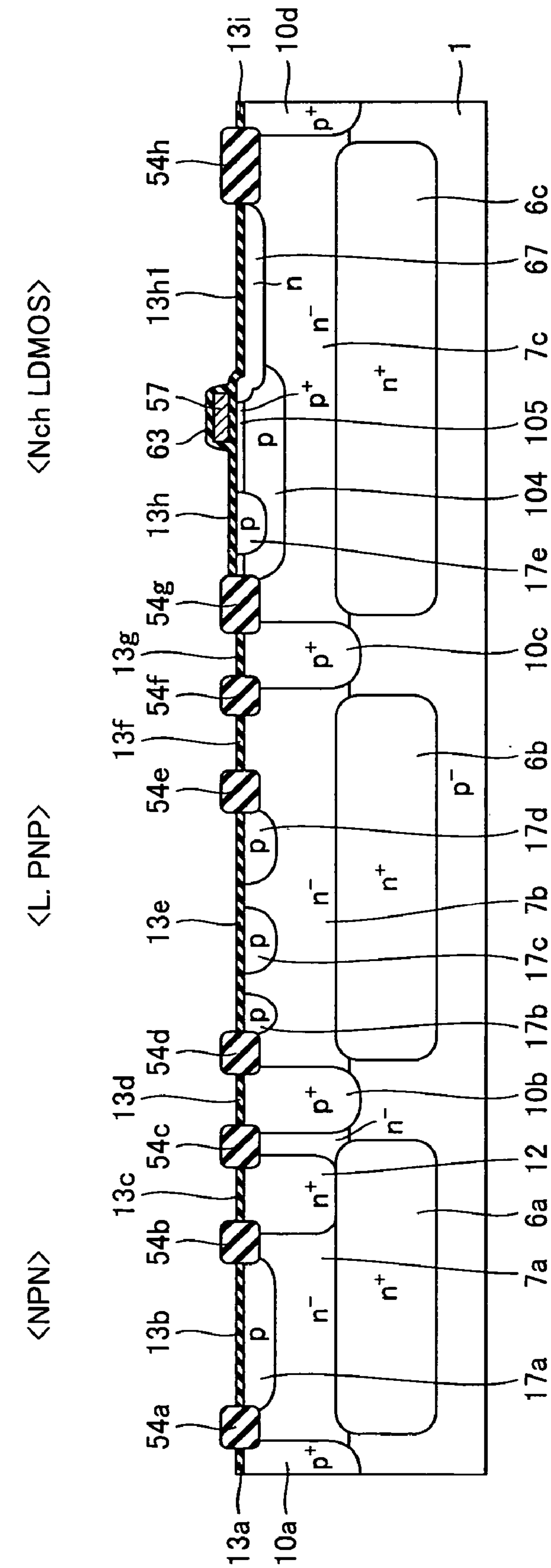

As shown in FIG. 45, processing is performed to form photoresist patterns 64*a* and 64*b* having opening 65 on a region, in which the drain of the lateral DMOS transistor is to be formed. Using photoresist patterns 64*a* and 64*b* as a mask, phosphorus ions 66 are introduced into $n^-$-epitaxial growth layer 7*c* by an ion implanting method. After removing photoresist patterns 64*a* and 64*b*, thermal processing is performed. Thereby, n-type diffusion layer ($n^-$-drain) 67 is formed as shown in FIG. 46.

Figure 47:
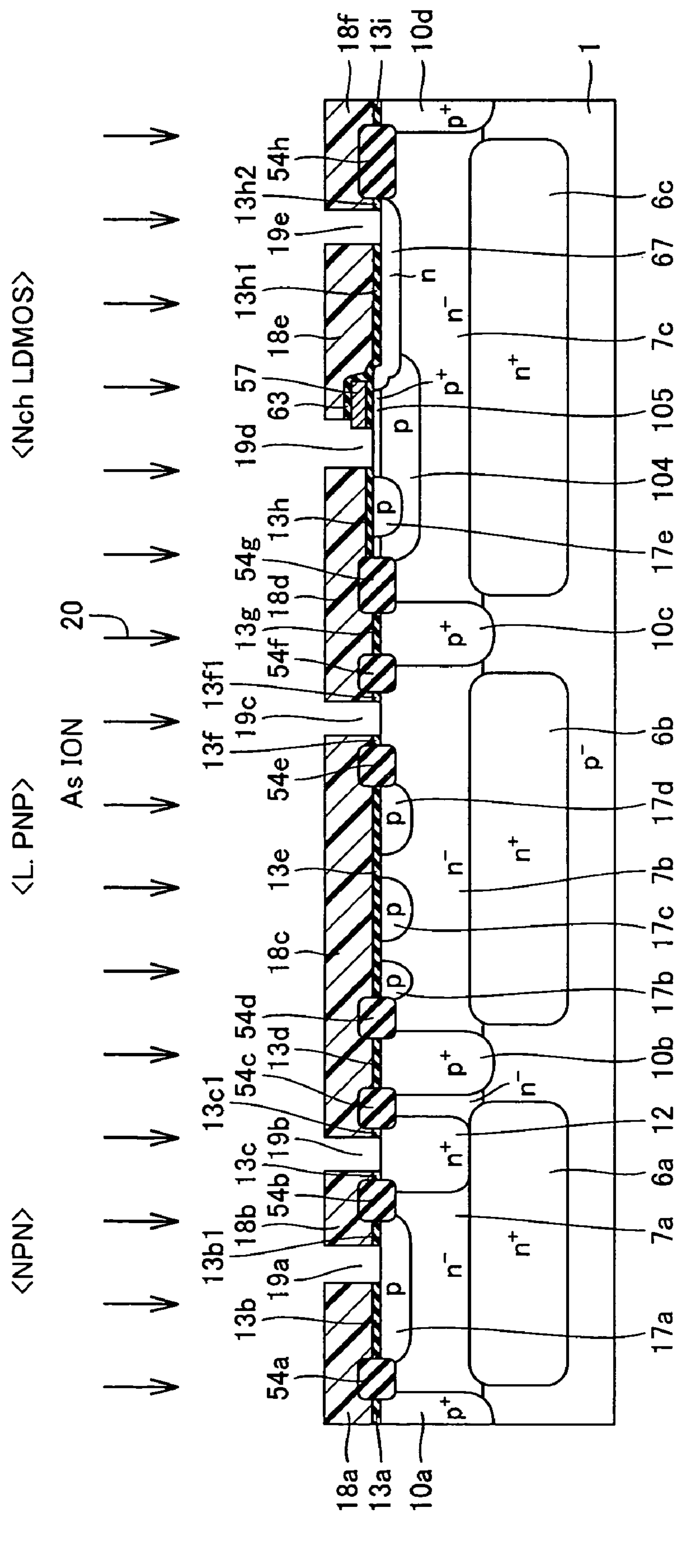

Then, as shown in FIG. 47, processing is performed to form photoresist patterns 18*a*–18*f* having openings located on p-type diffusion layer 17*a* and $n^+$-diffusion layer 12 of the vertical npn bipolar transistor, on a region, in which the base of the lateral pnp bipolar transistor is to be formed, and on regions, in which the source and drain of the lateral DMOS transistor are to be formed. Using photoresist patterns 18*a*–18*f* as a mask, thermal oxide films 13*b*, 13*c*, 13*f*, 13*h* and 13*h*1 are etched to form openings 19*a*–19*e*. This etching leaves thermal oxide films 13*b*1, 13*c*1, 13*f*1 and 13*h*2 at the positions neighboring to openings 19*a*–19*e*.

Figure 48:
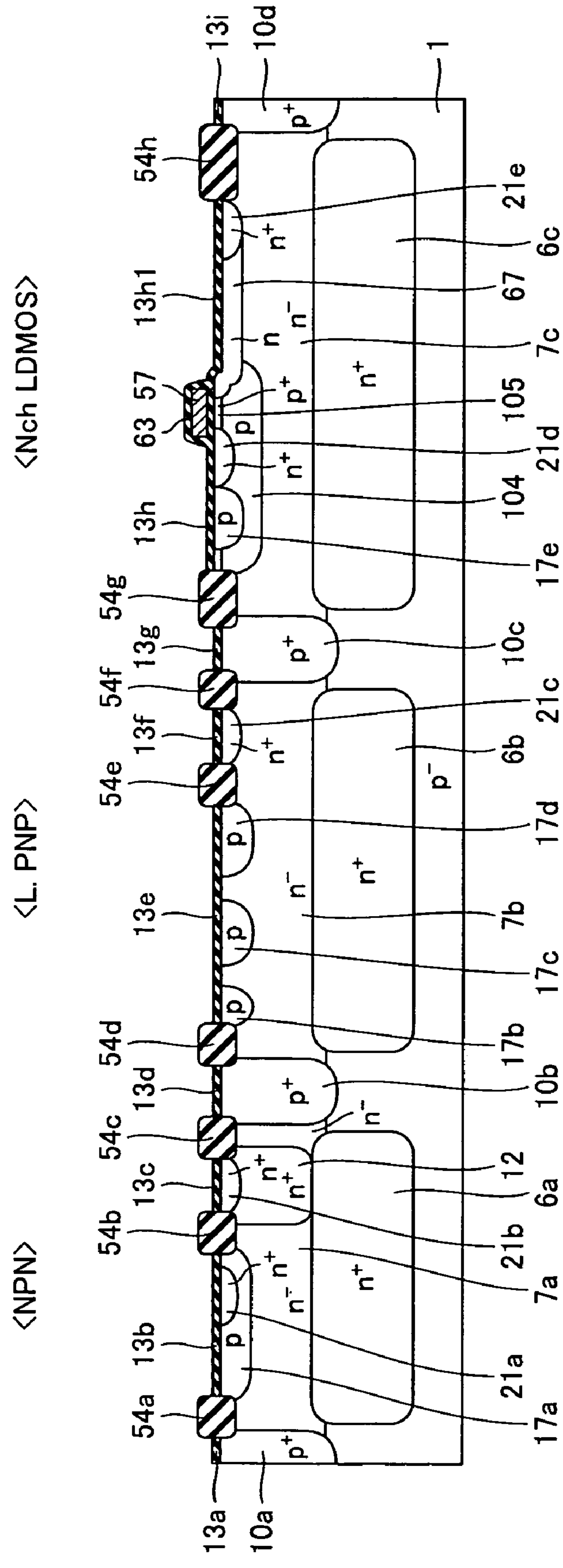

Thereafter, using photoresist patterns 18*a*–18*f* as a mask, n-type impurity ions of arsenic, phosphorus or the like are introduced into $n^-$-epitaxial growth layers 7*a*–7*c* by an ion implanting method. After removing photoresist patterns 18*a*–18*f*, thermal processing is performed. This forms $n^+$-diffusion layers 21*a*–21*e* as shown in FIG. 48. Thus, the emitter and the collector of the vertical npn bipolar transistor, the base of the lateral pnp bipolar transistor, and the source and drain of the lateral DMOS transistor are simultaneously formed. This thermal processing also forms oxide films on implantation openings 19*a*–19*e*.

Figure 49:
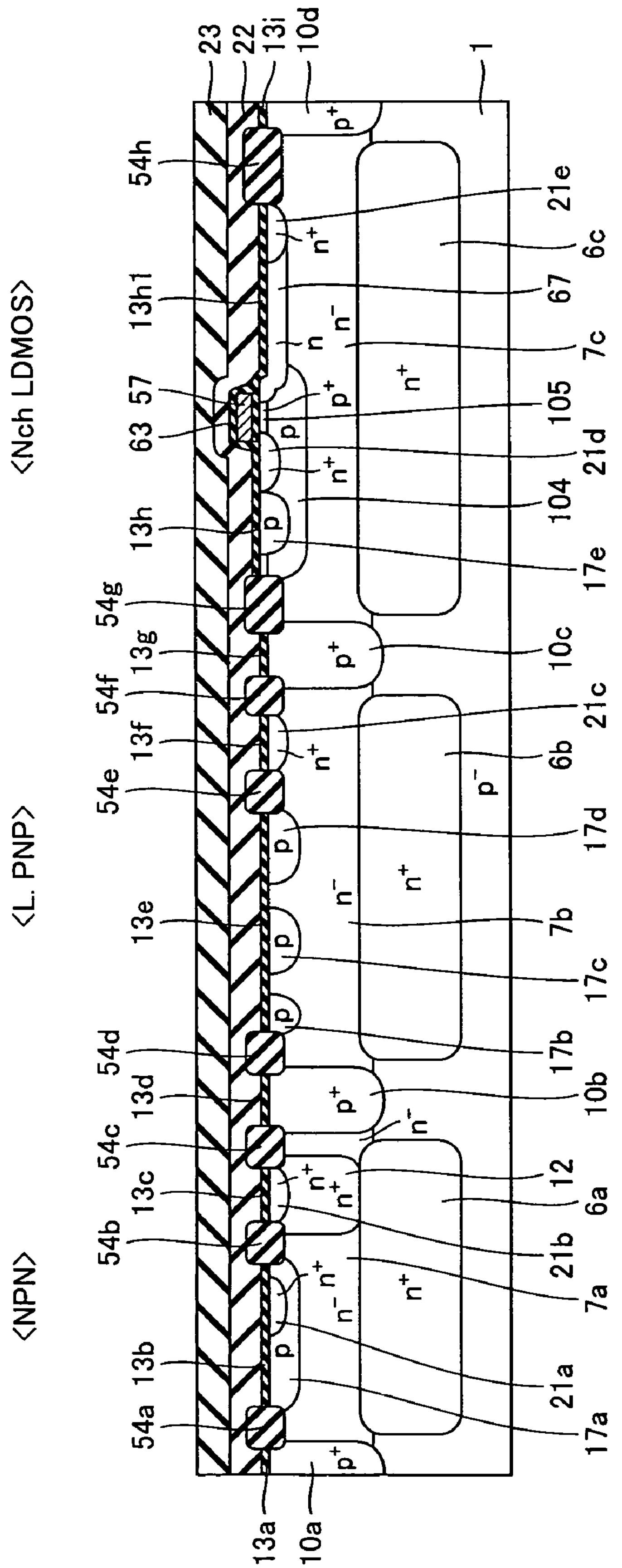

As shown in FIG. 49, a CVD method is then performed to deposit first interlayer insulating film 22 formed of a CVD oxide film, which has a thickness of about 0.2 μm and is, for example, not doped with impurities. Further, a CVD method is performed to deposit second interlayer insulating film 23 formed of a CVD oxide film, which has a thickness of about 0.6 μm and is doped with, e.g., boron or phosphorus. Then, appropriate thermal processing is performed to fluidize second interlayer insulating film 23 for flattening the wafer surface.

Figure 50:
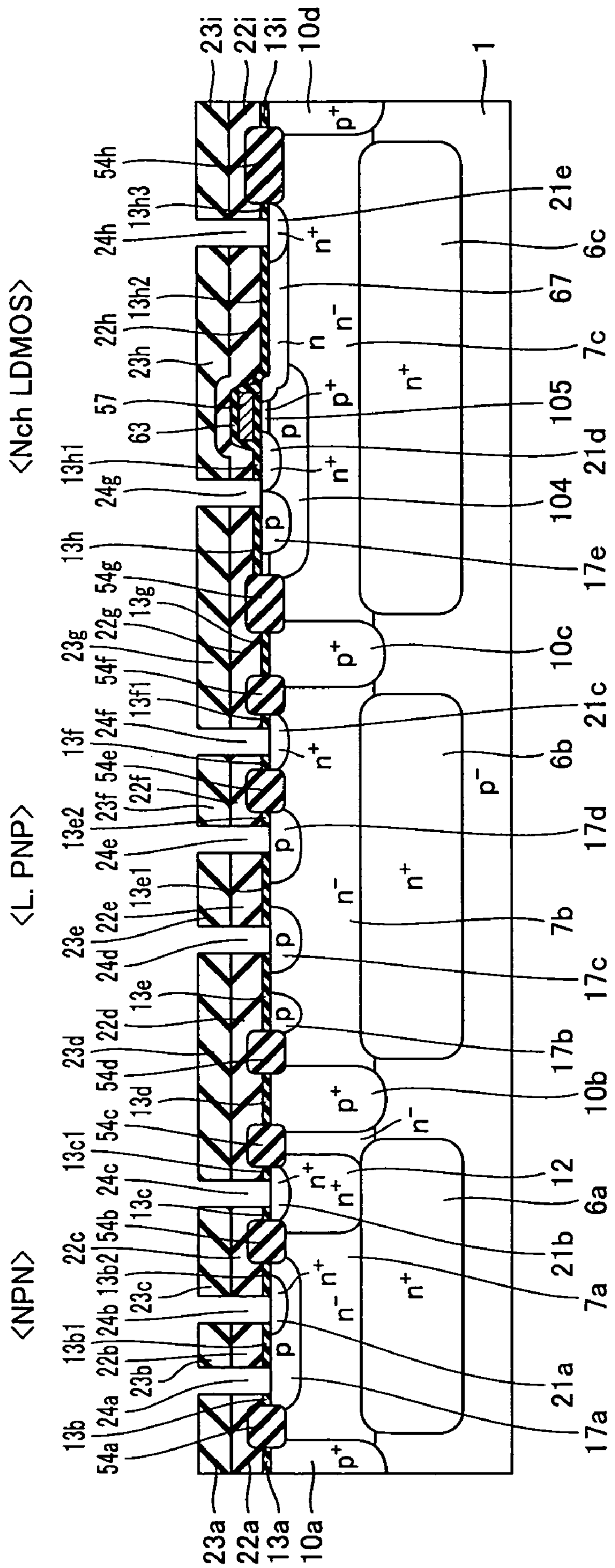

Then, a photoresist pattern (not shown) of a predetermined configuration is formed on second interlayer insulating film 23. Using this photoresist pattern as a mask, dry etching with reactive ions is performed. This forms contact holes 24*a*–24*h* as shown in FIG. 50.

First and second interlayer insulating films 22*a*–22*i* and 23*a*–23*i* remain around contact holes 24*a*–24*h*, and also thermal oxide films 13*b*2, 13*e*1 and 13*e*2 remain. Although not shown, a contact hole for gate electrode 57 is formed at the same time.

Then, a sputtering method or the like is performed to form a metal film, which is made of AlSi, AlCu or the like, and has a thickness, e.g., of about 0.6 μm, over the whole surface. By patterning the metal film, first interconnections 25*a*–25*h* are formed as shown in FIG. 51. Thereafter, the semiconductor device of the third embodiment is completed through the steps similar to those in the first embodiment.

(Fourth Embodiment)

Description will now be given on a fourth embodiment of the invention with reference to FIGS. 52 to 79.

An SOI (Silicon On Insulator) structure or a trench isolation structure may be employed for reducing a capacitance between the collector and $p^-$-type silicon substrate 1, and thereby improving high-frequency characteristics. In the fourth embodiment, the SOI structure and the trench isolation structure are employed in the semiconductor device equipped with bipolar transistors and lateral DMOS transistors prepared by using an epitaxial growth layer of SiGe or SiGe:C.

Figure 79:
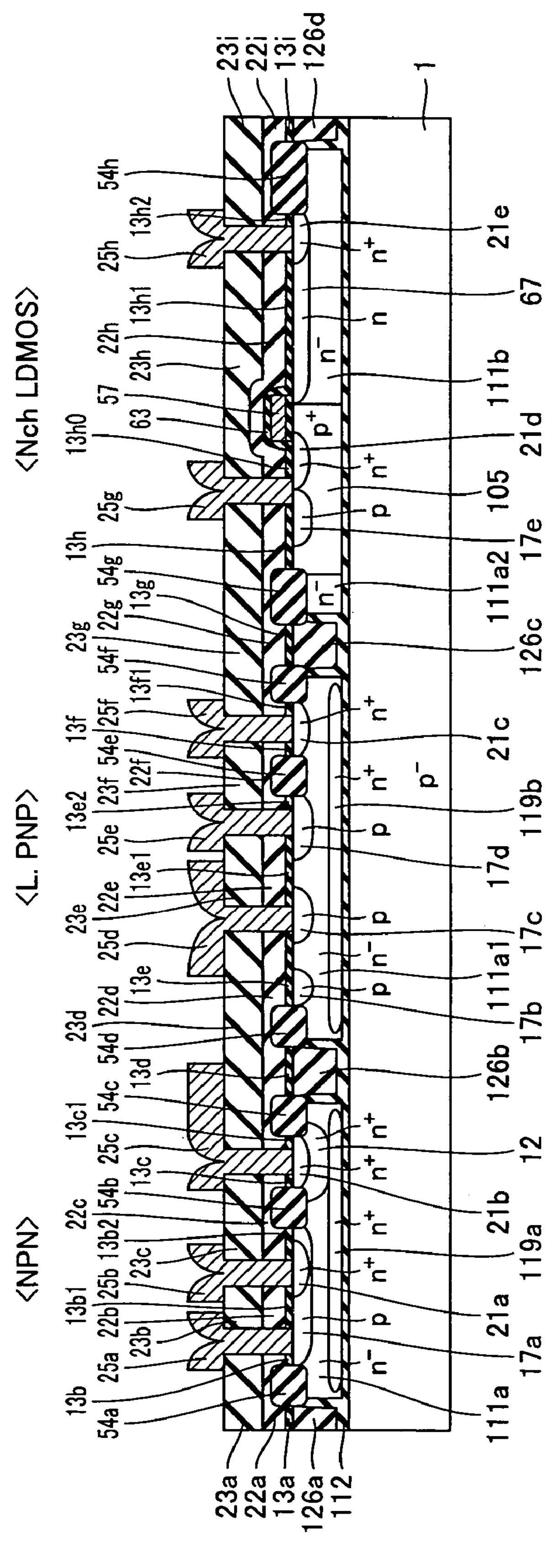
FIG. 79 is a cross section showing a distinctive structure of the semiconductor device according to the fourth embodiment of the invention.

FIG. 79 shows an example of a distinctive structure of the semiconductor device of the fourth embodiment. In the fourth embodiment, as shown in FIG. 79, $n^-$-silicon substrates (semiconductor layers) 111*a*, 111*a*1, 111*a*2 and 111*b* as well as an epitaxial growth layer ($p^+$-epitaxial growth layer: semiconductor layer) 105 are formed on $p^-$-silicon substrate 1 with a thermal oxide film (insulating film) 112 therebetween. $n^-$-silicon substrates 111*a*, 111*a*1, 111*a*2 and 111*b* as well as epitaxial growth layer 105 correspond to the semiconductor layer in the SOI structure, and thermal oxide film 112 serves as the buried insulating film in the SOI structure.

Epitaxial growth layer 105 is formed at the $n^-$-silicon substrate, and reaches thermal oxide film 112. Epitaxial growth layer 105 is made of SiGe or SiGe:C containing p-type impurities such as boron. By forming the epitaxial growth layer extending through the silicon substrate (semiconductor layer) to the buried insulating film as described above, the p-well can be formed in a self-aligning manner.

Epitaxial growth layer 105 forms a channel region of the lateral DMOS transistor. Epitaxial growth layer 105 contains p-type impurities at a concentration from about $1\times10^{17}$ cm$^{-3}$ to $1\times10^{19}$ cm$^{-3}$.

A trench reaching thermal oxide film 112 is formed in the $n^-$-silicon substrate, and is filled with oxide films 126*a*–126*d* serving as isolating and insulating films. Further, $n^+$-buried diffusion layers 119*a* and 119*b* reaching thermal oxide film 112 are formed at the bottoms of $n^-$-silicon substrates 111*a* and 111*a*1. Structures other than the above are basically the same as those in the first embodiment.

Referring to FIGS. 52–79, description will now be given on a method of manufacturing the semiconductor device according to the fourth embodiment.

Figure 52:
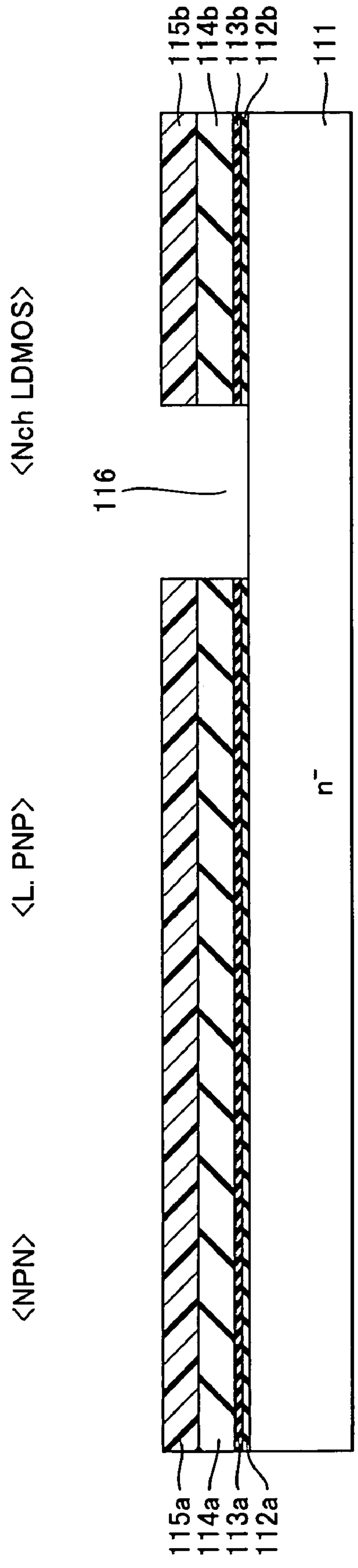
FIGS. 52 to 78 are cross sections showing 1st to 27th steps in the manufacturing process of a semiconductor device according to a fourth embodiment of the invention, respectively.

As shown in FIG. 52, a thermal oxide film, e.g., of about 0.1 μm in thickness is formed on $n^-$-silicon substrate 111, and a nitride film, e.g., of about 0.1 μm in thickness is formed on this thermal oxide film by a low pressure CVD method. By a low pressure CVD method, oxide films 114*a* and 114*b*, e.g., of about 1 μm in thickness are formed on this nitride film, and photoresist patterns 115*a* and 115*b* are formed on oxide films 114*a* and 114*b*.

Using photoresist patterns 115*a* and 115*b* as a mask, etching is performed to form an opening 116. As a result, thermal oxide films 112*a* and 112*b*, nitride films 113*a* and 113*b*, and oxide films 114*a* and 114*b* are formed around opening 116.

Figure 53:
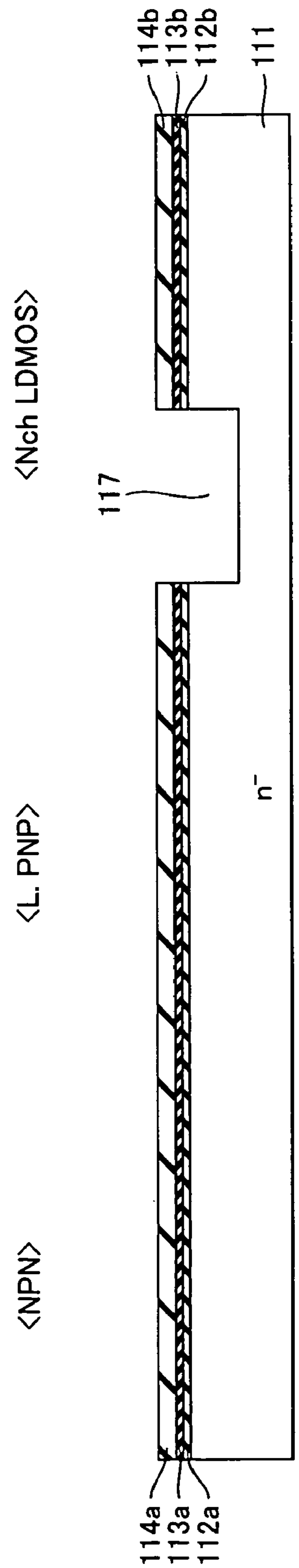

Photoresist patterns 115*a* and 115*b* are removed, and etching is effected on $n^-$-silicon substrate 111 masked with oxide films 114*a* and 114*b* by an RIE method. This etching forms a trench 117 as shown in FIG. 53. Trench 117 provides a region for forming a well of the lateral DMOS transistor, and therefore must have a depth corresponding to a required performance of the lateral DMOS transistor. For example, it requires a depth from about 0.5 μm to about 2 μm. Since epitaxial growth will take place in this region, the region must have a sufficiently larger width as compared with the depth thereof so that the direction of the surface of the grown layer may coincide with that of $n^-$-silicon substrate 111. For example, trench 117 must have a width one or more times as large as the depth.

Figure 54:
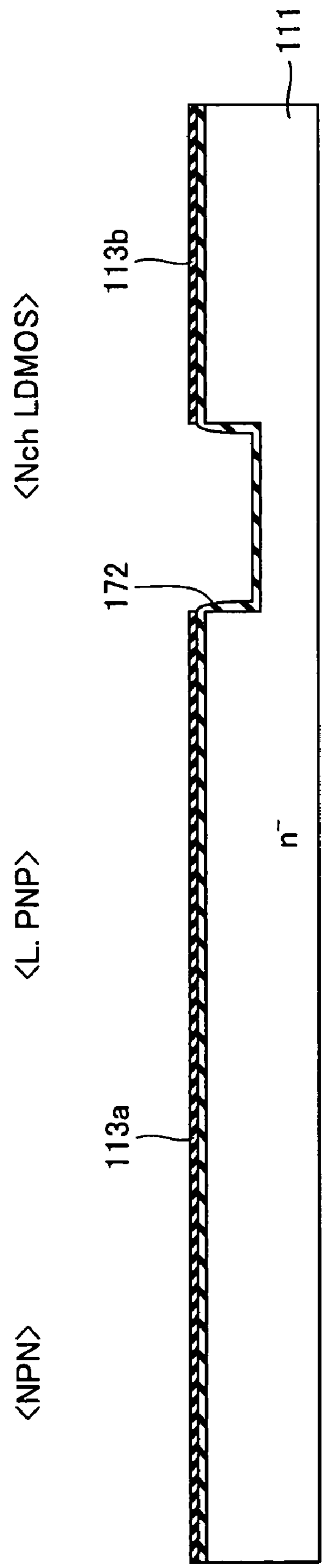

After removing oxide films 114*a* and 114*b* described above, thermal oxidation is performed. This oxidation forms a thermal oxide film 172 of about 0.1 μm in thickness over the surface of trench 117 as shown in FIG. 54. This thermal oxidation is so-called sacrificial oxidation, and is performed for removing etching damages at the surface of trench 117. Using nitride films 113*a* and 113*b* as a mask, thermal oxide film 172 is removed from trench 117.

Figure 55:
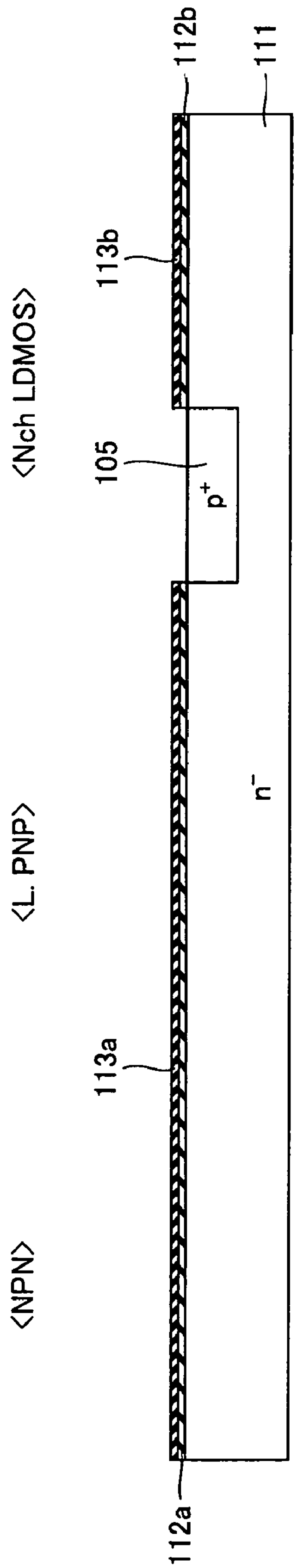
Figure 56:
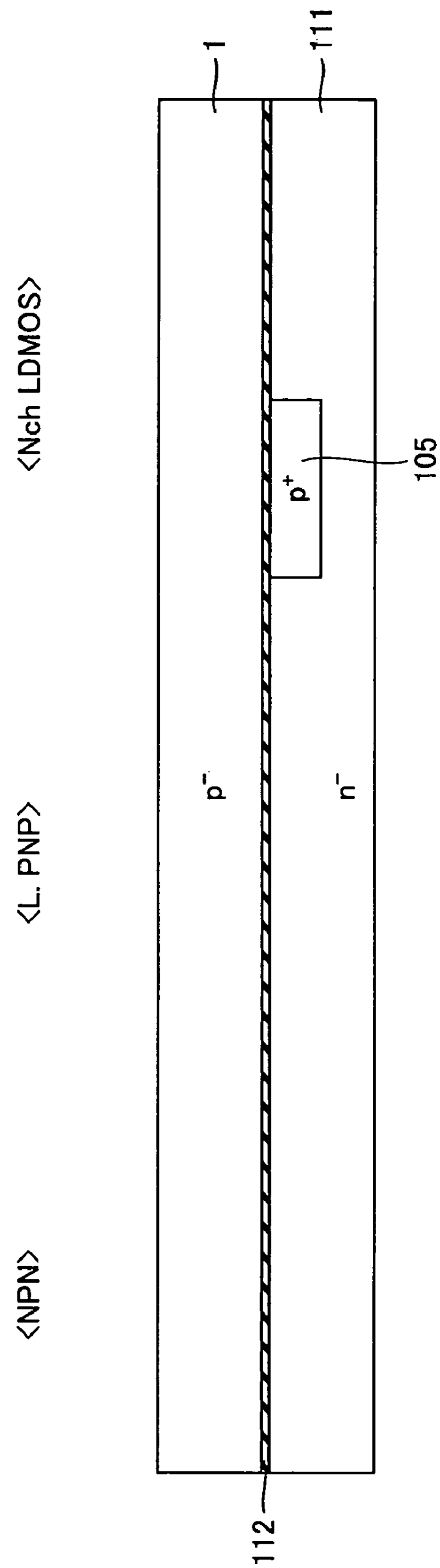

Then, a selective epitaxial growth method is performed to form epitaxial growth layer ($p^+$-epitaxial growth layer: semiconductor layer) 105 of SiGe or SiGe:C containing p-type impurities such as boron as shown in FIG. 55. Thereafter, nitride films 113*a* and 113*b* as well as thermal oxide film 112*a* and 112*b* are removed.

Figure 57:
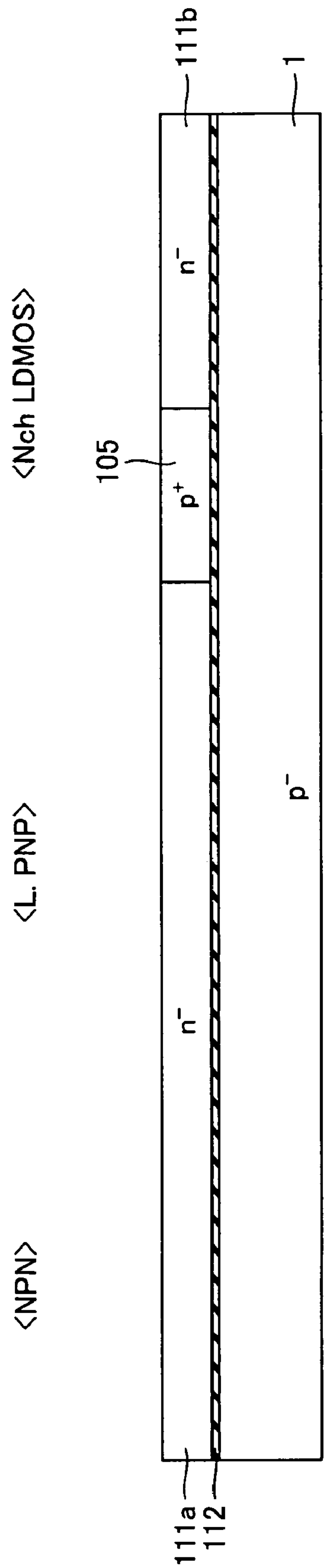

Then, $p^-$-silicon substrate 1, which is provided at its surface with thermal oxide film 112 of about 0.1 μm in thickness, is joined to $n^-$-silicon substrate 111. As shown in FIG. 57, the surface of $n^-$-silicon substrate 111 is polished by a CMP (Chemical Mechanical Polishing) method to expose epitaxial growth layer 105. As a result, $n^-$-silicon substrates (semiconductor layers) 111*a* and 111*b* are left around epitaxial growth layer 105.

Figure 58:
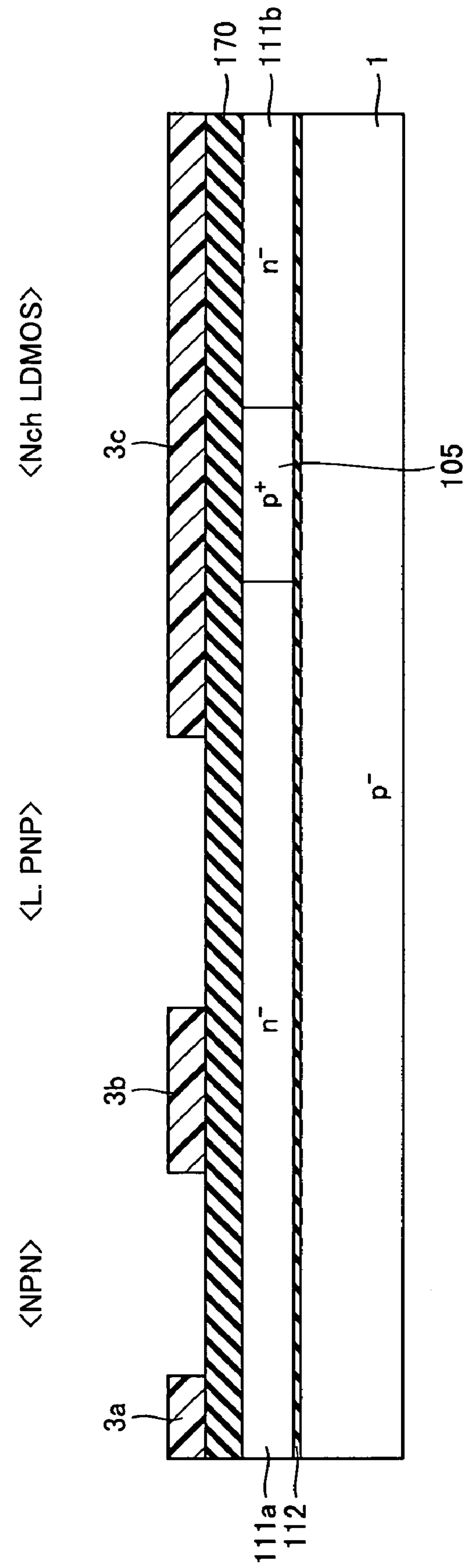

Then, as shown in FIG. 58, an oxide film 170 of about 1 μm in thickness is formed by a CVD method on epitaxial growth layer 105 and $n^-$-silicon substrates 111*a* and 111*b*. Photoresist patterns 3*a*–3*c* having openings at predetermined positions are formed on oxide film 170.

Figure 59:
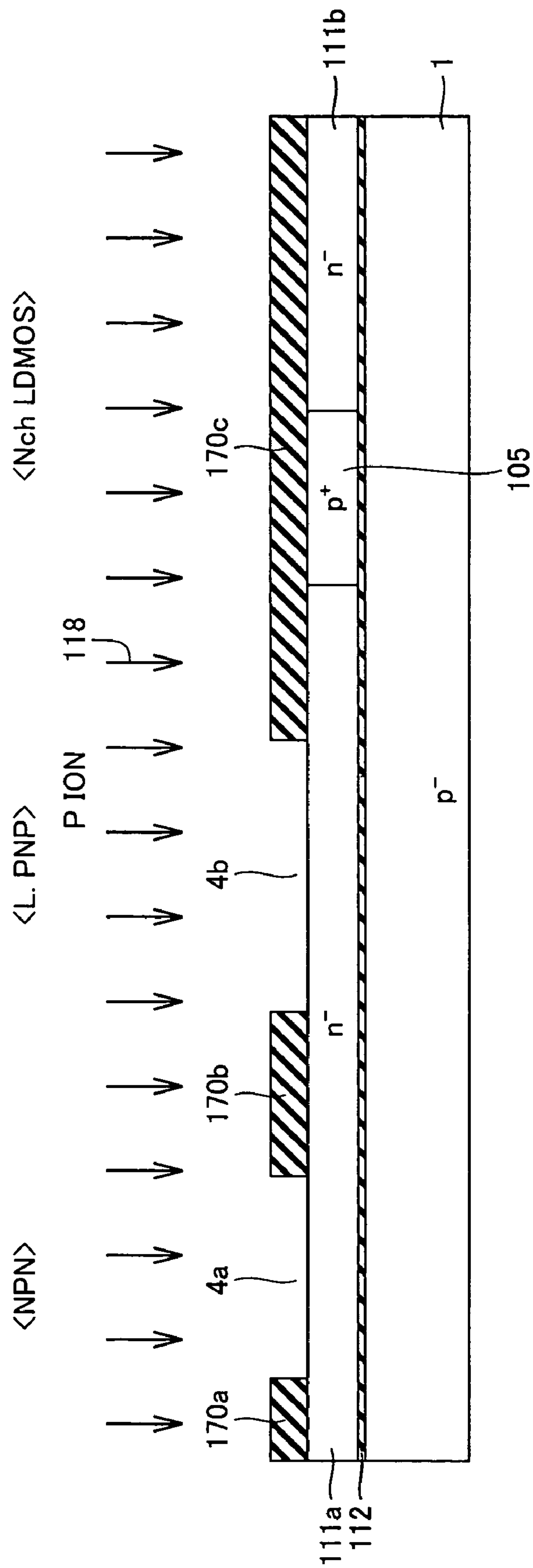

The wafer is immersed in an aqueous solution of hydrogen fluoride (HF), and etching is effected on the structure masked with photoresist patterns 3*a*–3*c*. Thereby, openings 4*a* and 4*b* are formed in oxide film 170 as shown in FIG. 59. As a result, oxide films 170*a*–170*c* are left around openings 4*a* and 4*b*. After removing photoresist patterns 3*a*–3*c*, n-type impurity ions such as phosphorus or arsenic are implanted into $n^-$-silicon substrate 111*a* including its bottom with a high acceleration voltage from about 1 to about 2 MeV.

Figure 60:
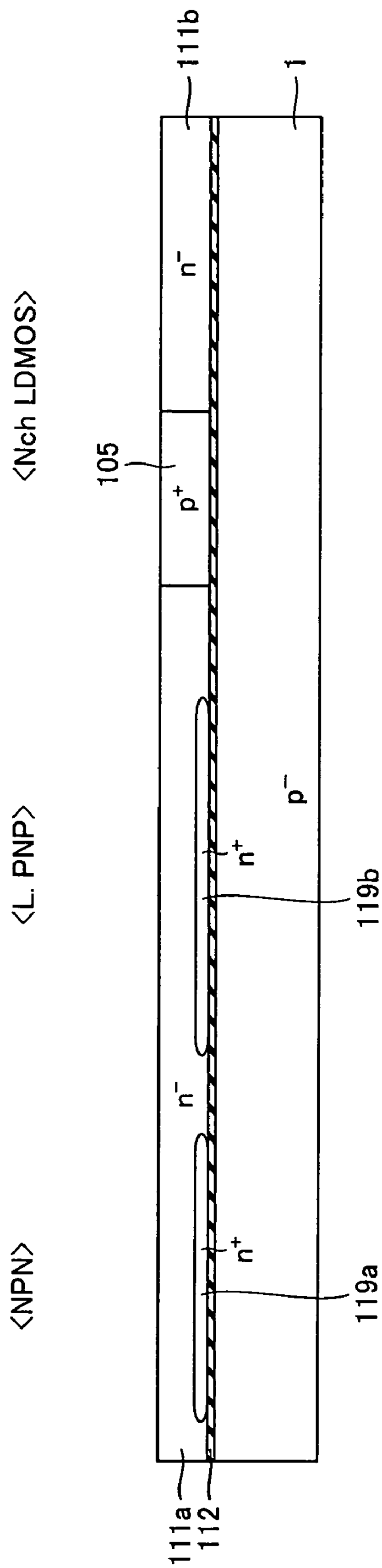

After removing oxide films 170a–170c, thermal processing is performed to diffuse the n-type impurities. Thereby, $n^+$-buried diffusion layers 119a and 119b are formed at the bottom of $n^-$-silicon substrate 111a as shown in FIG. 60.

Figure 61:
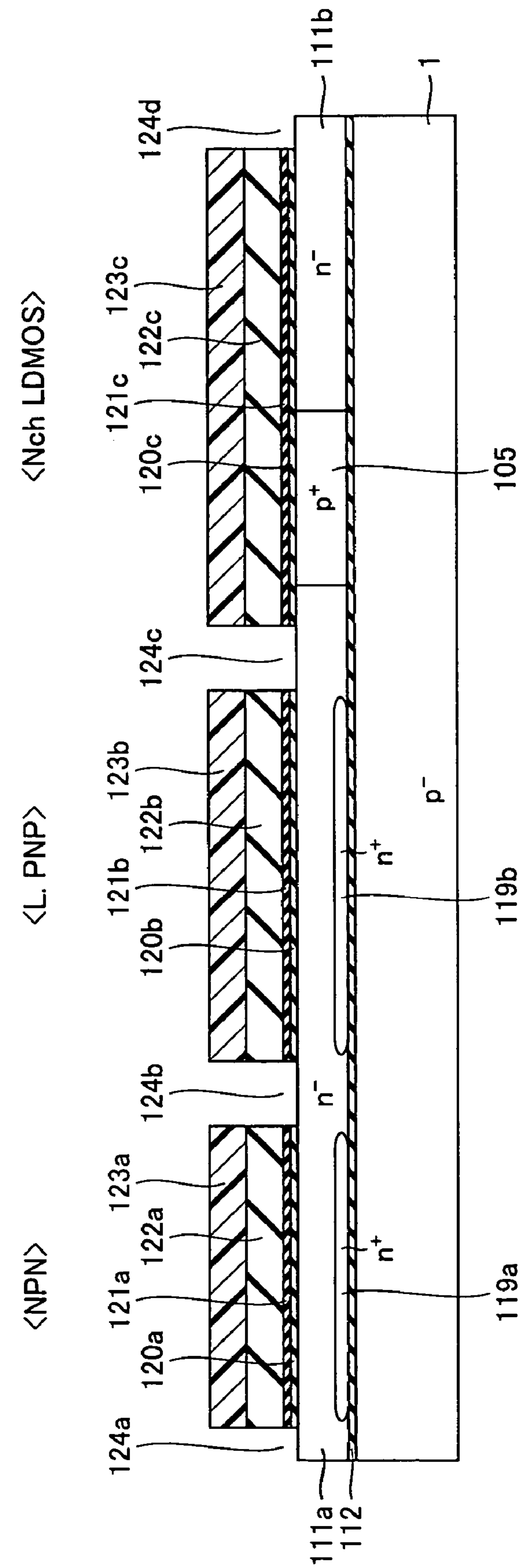

On $n^-$-silicon substrates 111a and 111b, as shown in FIG. 61, processing is performed to form thermal oxide films 120a–120c of about 0.1 μm in thickness, to form nitride films 121a–121c of about 0.1 μm in thickness by a low pressure CVD method, and to form oxide films 122a–122c of about 1 μm in thickness by a low pressure CVD method. Photoresist patterns 123a–123c having openings are formed on oxide films 122a–122c, respectively. Etching is effected on these oxide films and nitride films masked with photoresist patterns 123a–123c. This etching forms openings 124a–124d for trench isolation. Each of openings 124a–124d has a width of about 0.5 μm.

By forming openings 124a–124d as described above, thermal oxide films 120a–120c, nitride films 121a–121c and oxide films 122a–122c are left around openings 124a–124d.

Figure 62:
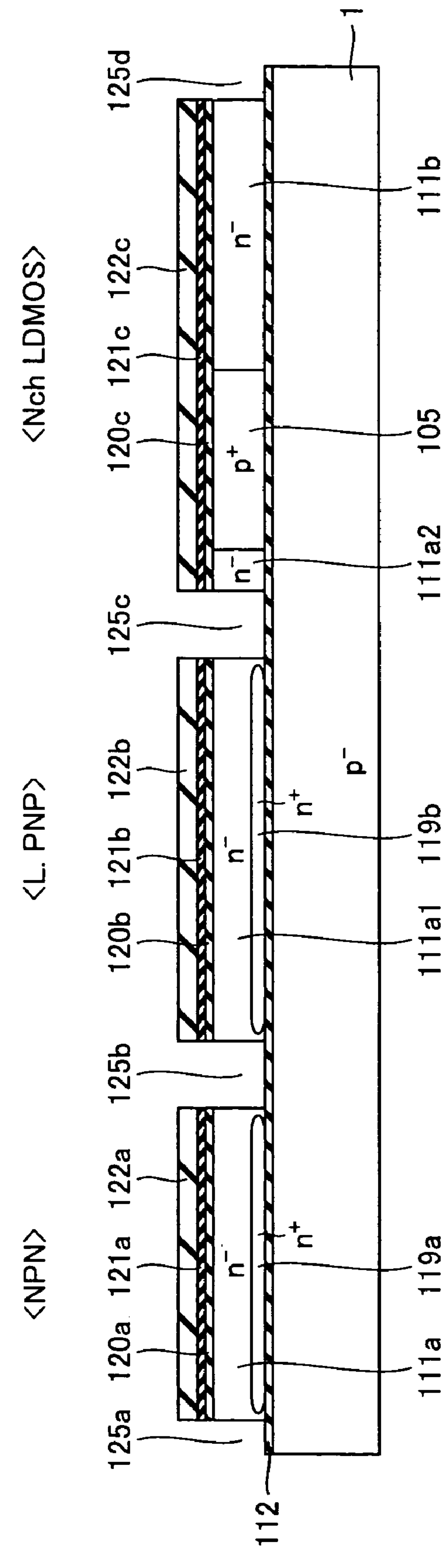
Figure 63:
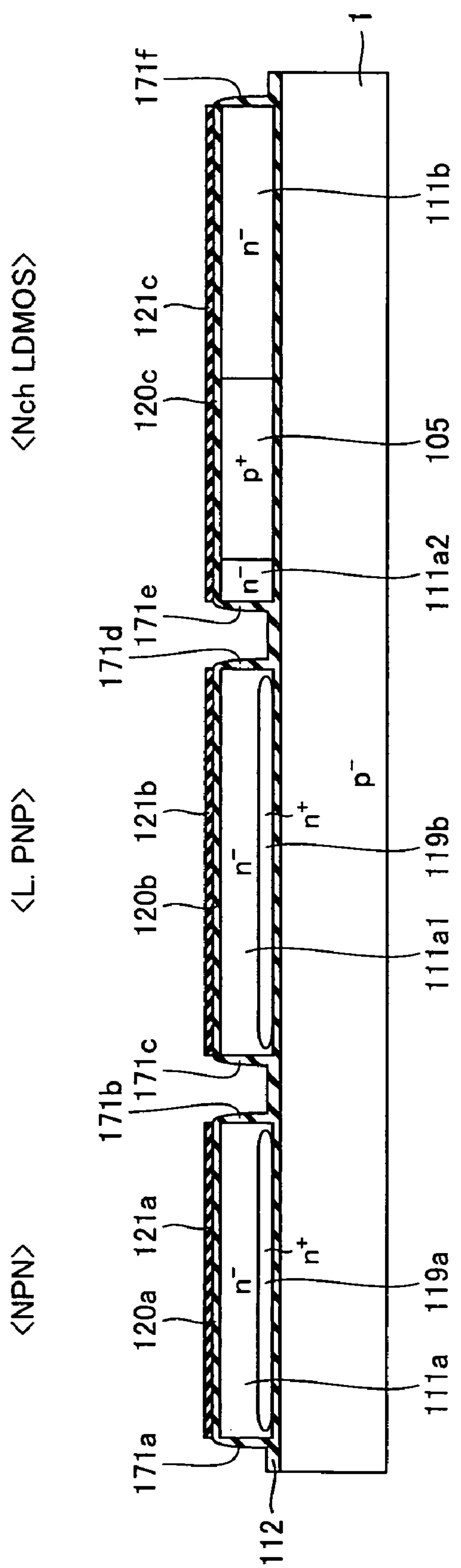

Photoresist patterns 123a–123c are removed, and etching is effected on $n^-$-silicon substrates 111a and 111b masked with oxide films 122a–122c by an RIE method. This forms trenches 125a–125d reaching thermal oxide film 112 as shown in FIG. 62. By forming trenches 125a–125d, $n^-$-silicon substrates 111a1 and 111a2 are left around trenches 125a–125d.

After removing oxide films 122a–122c, thermal oxidation is performed at a depth of about 0.1 μm. This forms oxide films 171a–171f at the surfaces of trenches 125a–125d.

Figure 64:
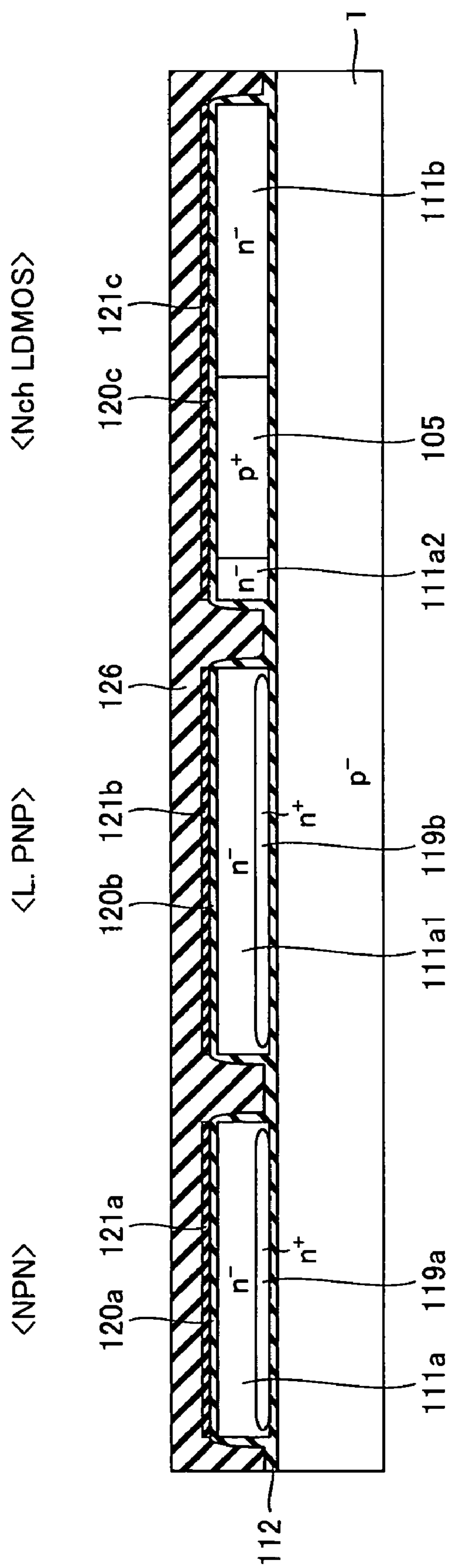

As shown in FIG. 64, a CVD method is performed to form an oxide film 126 of about 1 μm in thickness covering $n^-$-silicon substrates 111a, 111a1, 111a2 and 111b. Instead of oxide film 126, a semiconductor film of polycrystalline silicon or amorphous silicon may be used.

Figure 65:
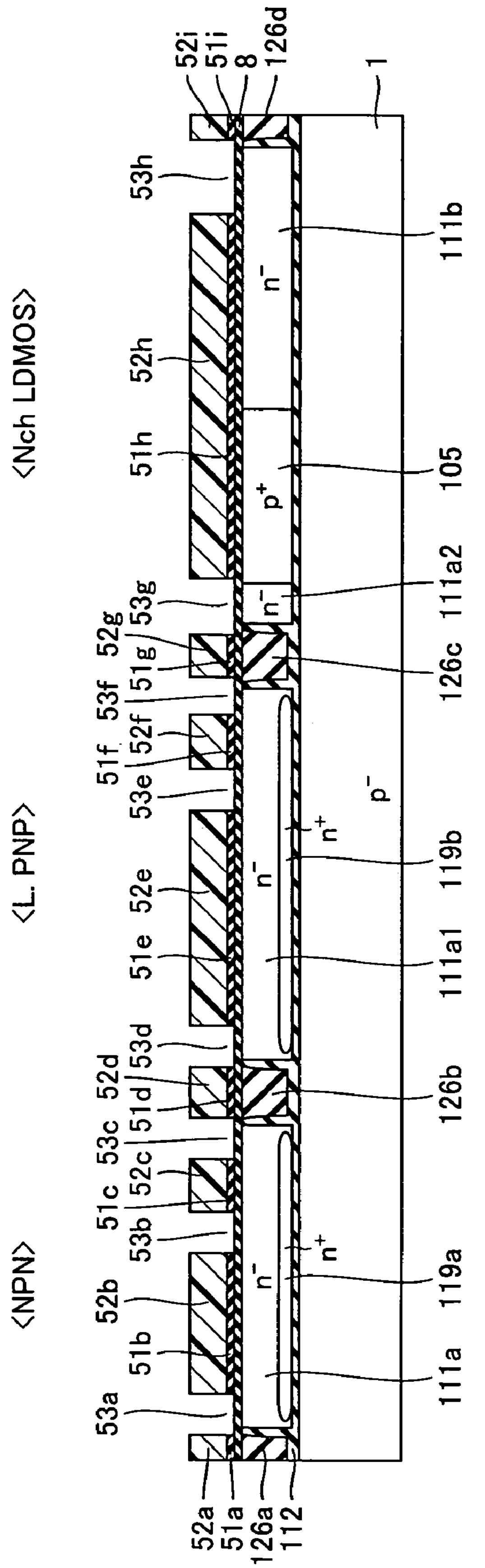

The surface of oxide film 126 is polished by a CPM method, and this polishing is stopped when nitride films 121a–121c are exposed. Thereby, the trenches are filled with oxide films 126a–126d as shown in FIG. 65. Thereafter, nitride films 121a–121c and thermal oxide films 120a–120c are removed.

Thermal oxidation is performed to form thermal oxide film 8, e.g., of about 0.05 μm in thickness. Thermal oxide film 8 extends over $n^-$-silicon substrates 111a, 111a1, 111a2 and 111b, and also extends over oxide films 126a–126d. A CVD method is performed to deposit a nitride film, e.g., of about 0.1 μm in thickness on thermal oxide film 8.

On the nitride film thus deposited, photoresist patterns 52a–52i having openings at predetermined positions are formed. Using photoresist patterns 52a–52i as a mask, etching is effected on the nitride film located on a region, in which field oxide films are to be formed. This etching forms openings 53a–53h in the nitride film. Thereby, nitride films 51a–51i are left around openings 53a–53h. Thereafter, photoresist patterns 52a–52i are removed.

Figure 66:
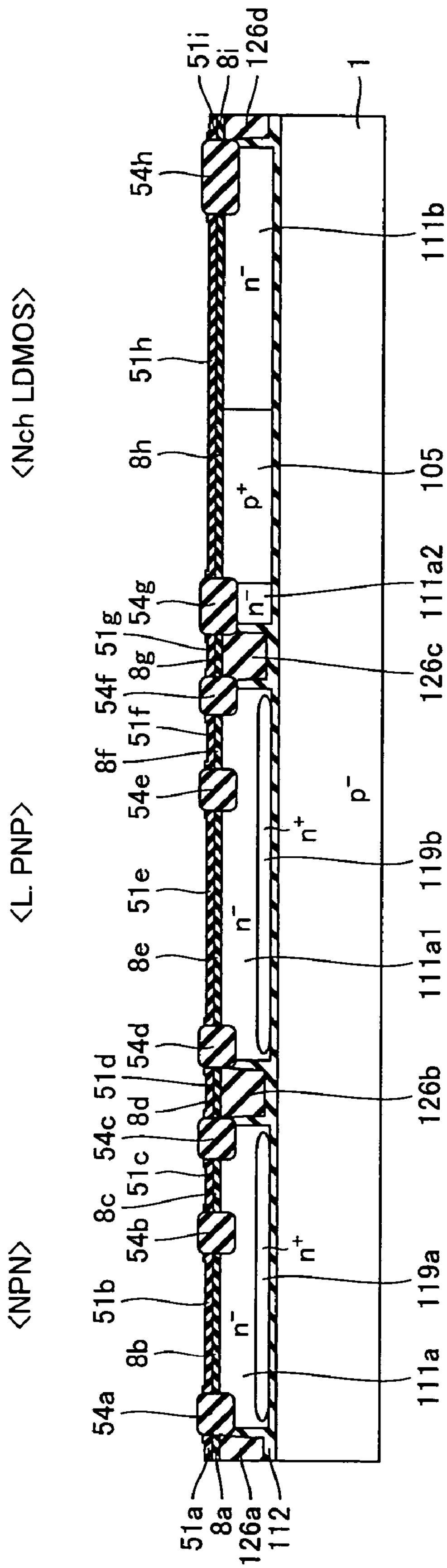

Using nitride films 51a–51i as a mask, thermal oxidation is performed. This forms field oxide films 54a–54h, e.g., of about 0.2 μm in thickness as shown in FIG. 66. Thereby, thermal oxide films 8a–8i are left around field oxide films 54a–54h.

Figure 67:
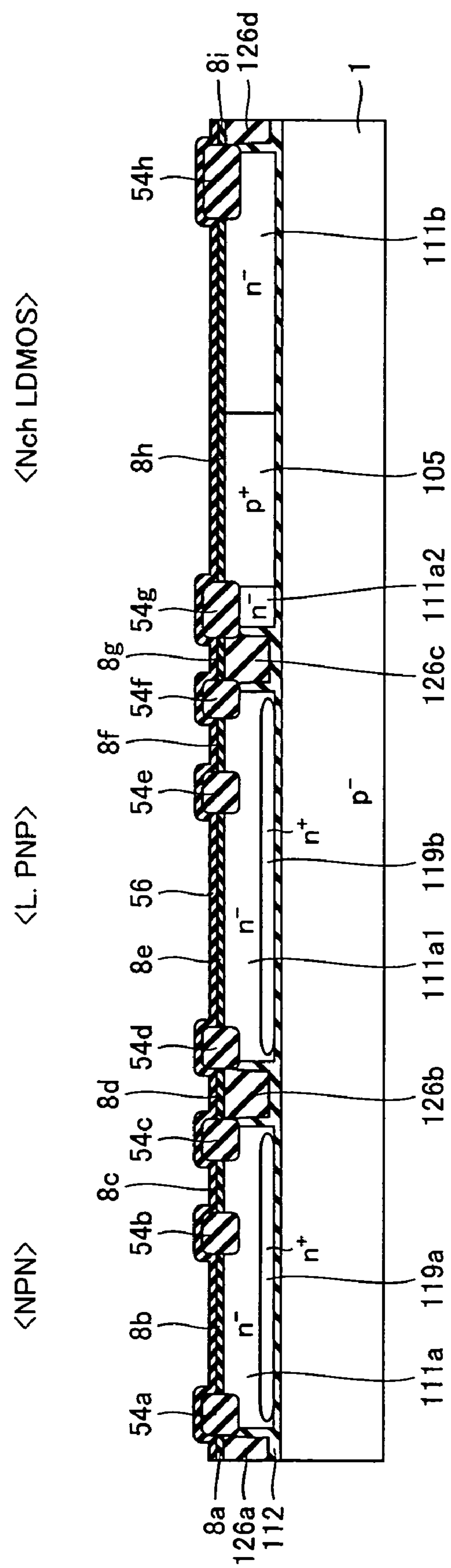
Figure 68:
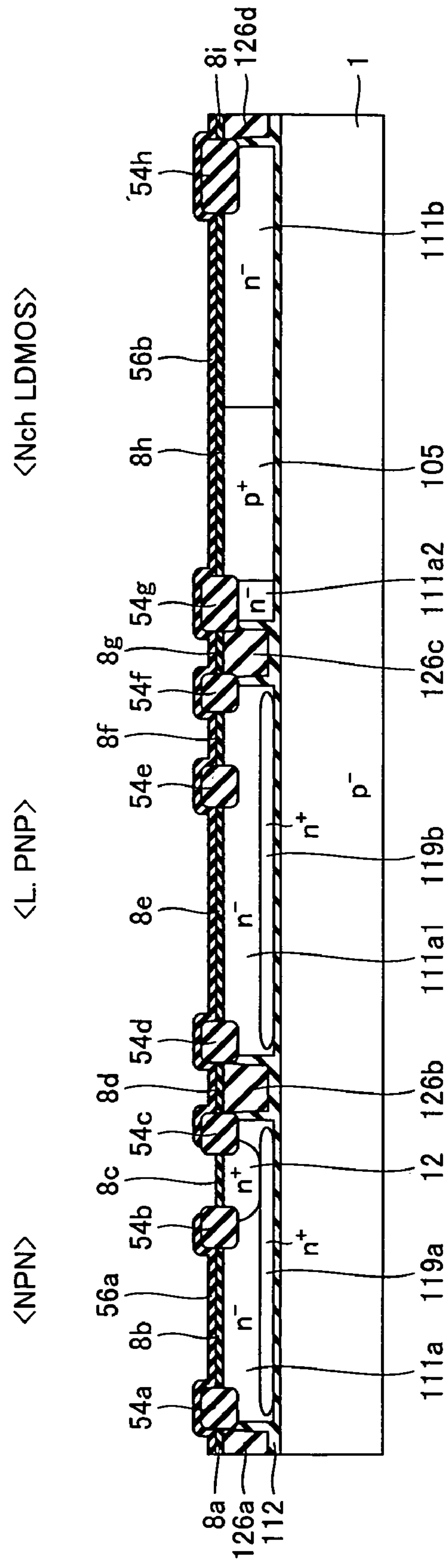

After removing nitride films 51a–51i with hot phosphoric acid or the like, a CVD method is performed to deposit nitride film 56 of about 0.1 μm in thickness on thermal oxide films 8a–8i as shown in FIG. 67. A photoresist pattern (not shown) is formed on nitride film 56, and etching is effected on nitride film 56 and thermal oxide film 8c masked with this photoresist pattern. This forms a diffusion window used when forming a diffusion layer for leading out the collector of the vertical npn bipolar transistor. Nitride films 56a and 56b remain around the diffusion window thus formed as shown in FIG. 68. Thereafter, the photoresist pattern is removed.

Then, a gas diffusion method using a phosphorus gas is performed to introduce phosphorus into $n^-$-silicon substrate 111a to form collector-leading $n^+$-diffusion layer 12, and phosphorus glass deposited on the wafer during the processing by the diffusion method is removed. Then, thin thermal oxide film 8c, e.g., of about 0.1 μm in thickness is formed on the surface of $n^+$-diffusion layer 12.

Figure 69:
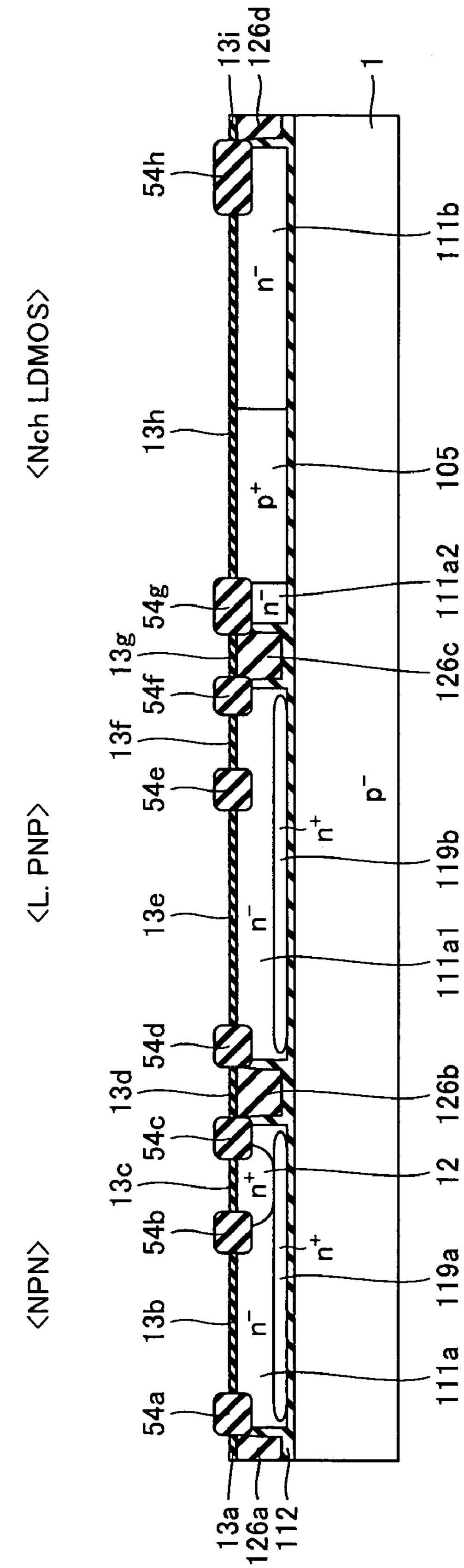

Nitride films 56a and 56b as well as thermal oxide films 8a–8i are removed, and thermal oxide films 13a–13i, e.g., from about 0.01 to about 0.02 μm in thickness are formed as shown in FIG. 69. Portions of thermal oxide films 13a–13i form a gate oxide film of the lateral DMOS transistor.

Figure 70:
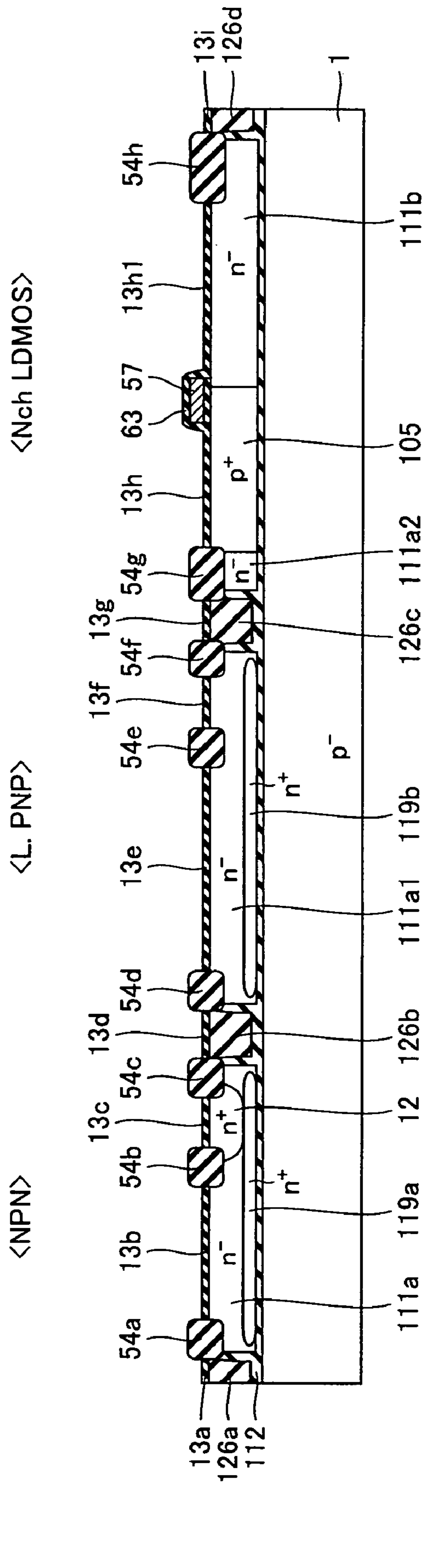

Then, a low pressure CVD method is performed to deposit a silicon film (semiconductor film), which has a thickness, e.g., of about 0.2 μm and is made of polycrystalline silicon or amorphous silicon containing phosphorus. A photoresist pattern is formed on this silicon film and particularly at a position, where the gate electrode of the lateral DMOS transistor is to be formed. Etching is effected on the silicon film masked with the photoresist pattern thus formed. This forms gate electrode 57 as shown in FIG. 70. Thermal oxidation is effected on the surface of gate electrode 57 to form oxide film 63.

Figure 71:
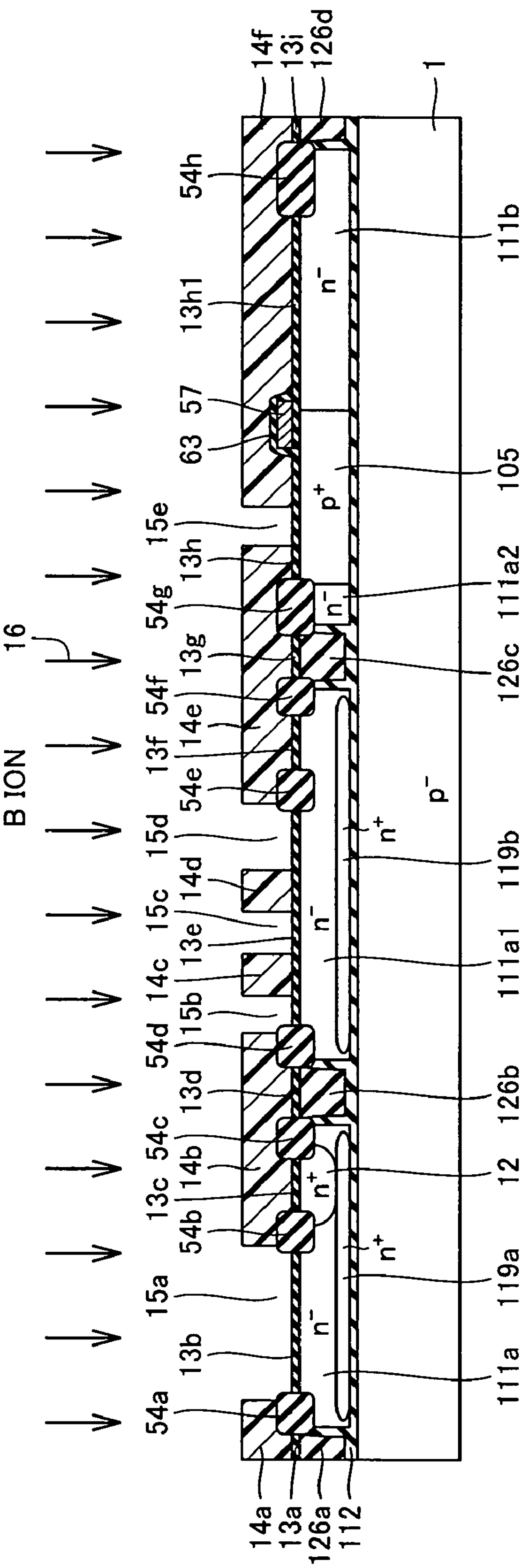

Then, as shown in FIG. 71, processing is performed to form photoresist patterns 14a–14f having opening 15a located on a region, in which p-type diffusion layer 17a forming a base of the vertical npn bipolar transistor is to be formed, openings 15b–15d located on regions, in which p-type diffusion layers 17b–17d forming the collector and emitter of the lateral pnp bipolar transistor are to be formed, and opening 15e located on a region, in which p-type diffusion layer 17e forming the back gate of the lateral DMOS transistor is to be formed. Using photoresist patterns 14a–14f as a mask, an ion implanting method is performed to introduce boron ions into $n^-$-silicon substrates 111a and 111a1 as well as epitaxial growth layer 105.

Figure 72:
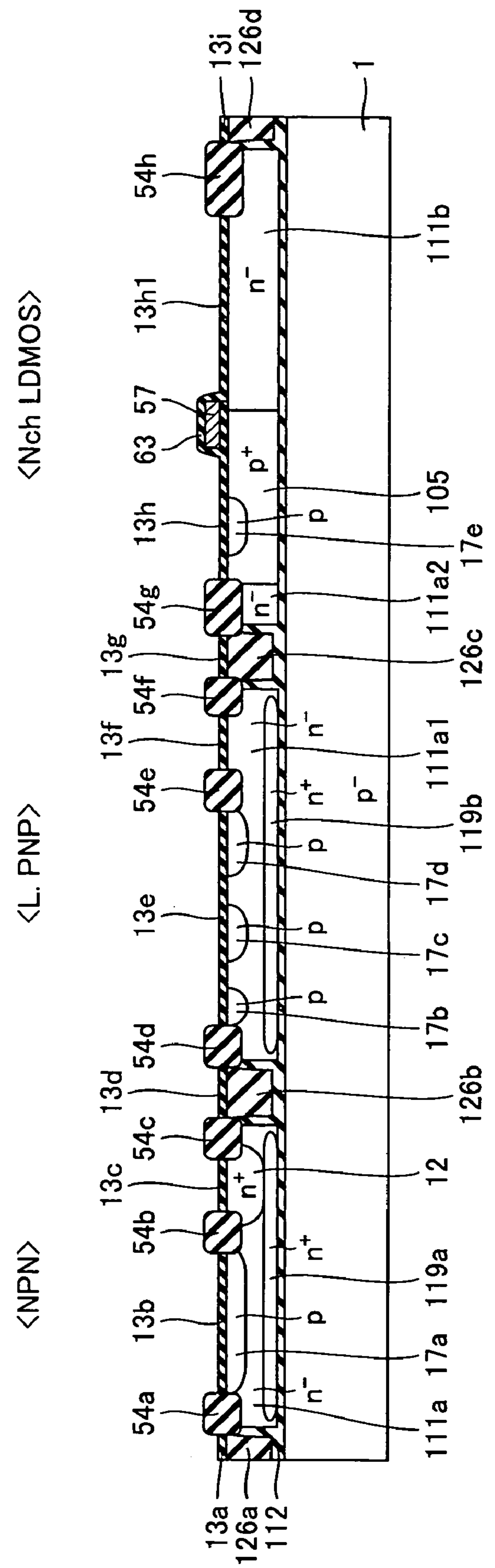

After removing photoresist patterns 14a–14f, thermal processing is performed. This forms p-type diffusion layers 17a–17e as shown in FIG. 72. Thus, the base of the vertical npn bipolar transistor, the collector and emitter of the lateral pnp bipolar transistor and the back gate of the lateral DMOS transistor are formed at the same time.

Figure 73:
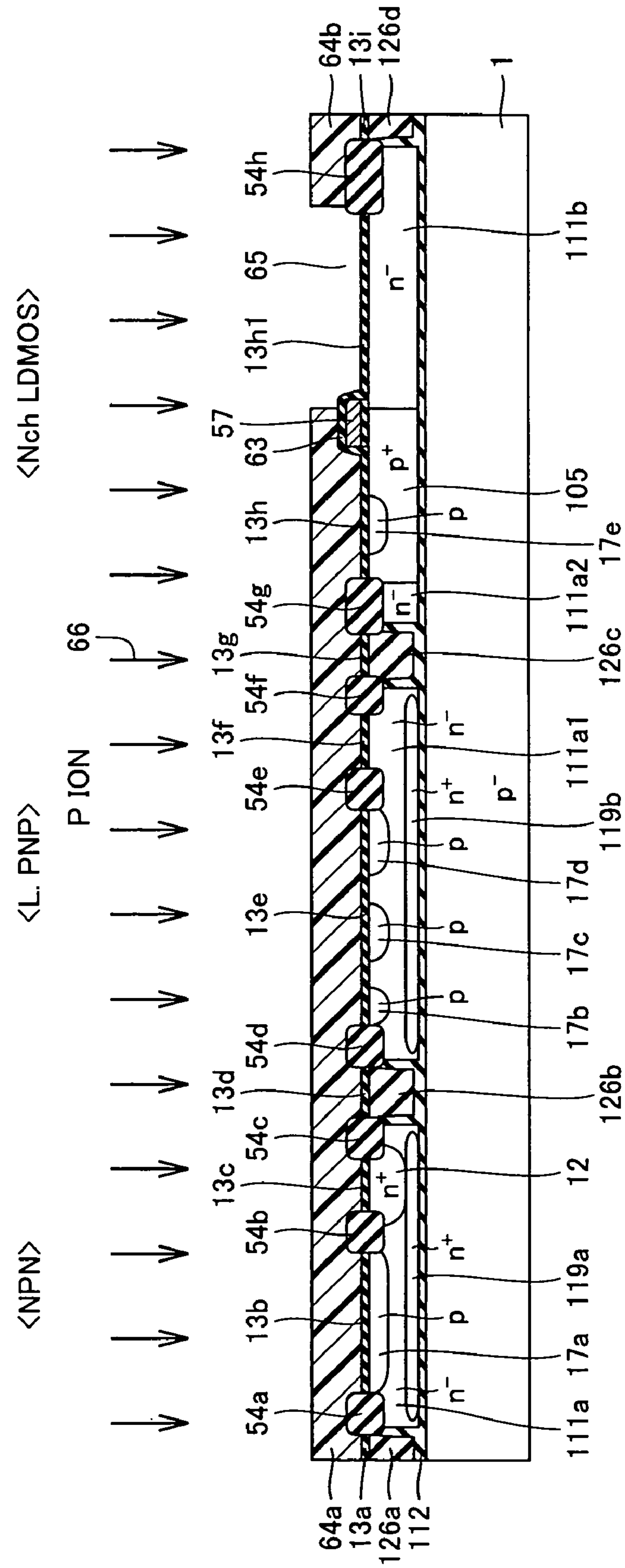
Figure 74:
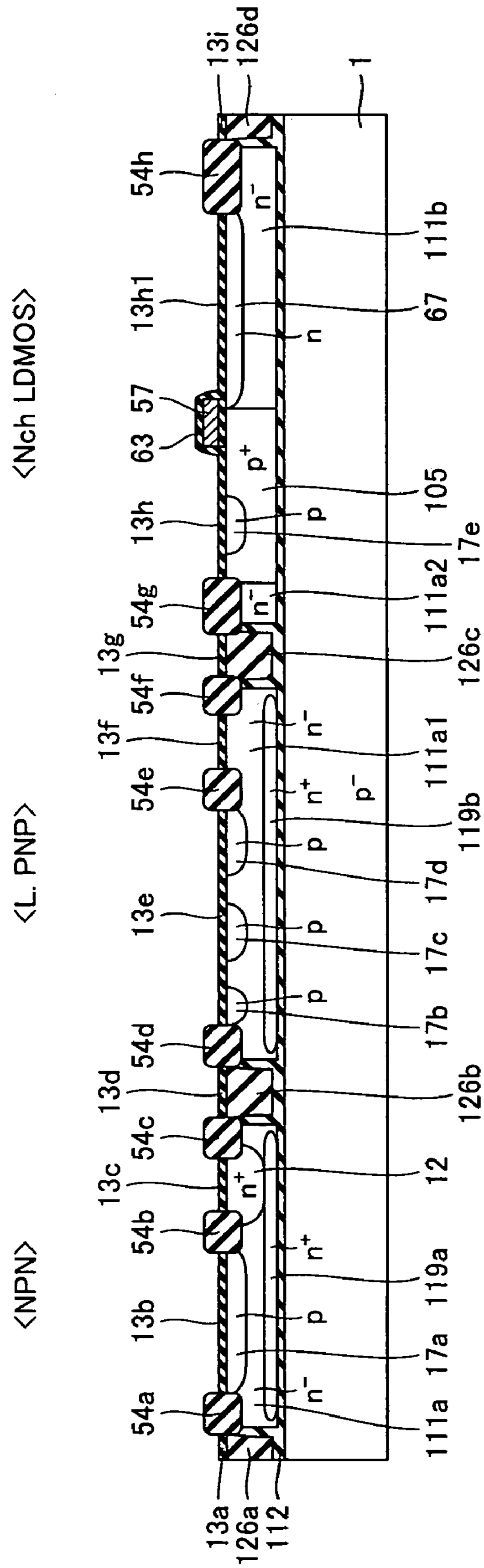

As shown in FIG. 73, processing is performed to form photoresist patterns 64a and 64b having opening 65 on a region, in which the drain of the lateral DMOS transistor is to be formed. Using photoresist patterns 64a and 64b as a mask, phosphorus ions 66 introduced is introduced into $n^-$-silicon substrate 111b by an ion implanting method. After removing photoresist patterns 64a and 64b, thermal processing is performed. This forms n-type diffusion layer ($n^-$-drain) 67 as shown in FIG. 74.

Figure 75:
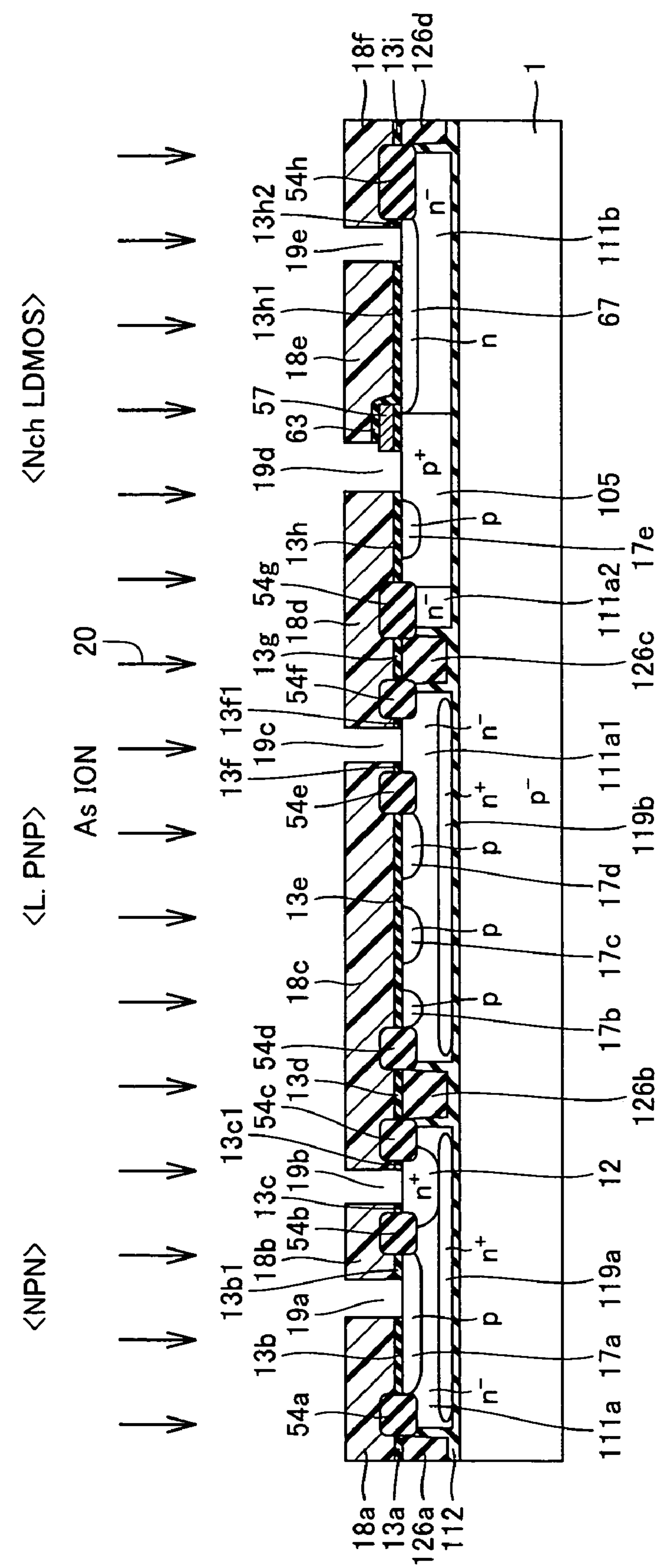

Then, as shown in FIG. 75, processing is performed to form photoresist patterns 18a–18f having openings on p-type diffusion layer 17a and $n^+$-diffusion layer 12 of the vertical npn bipolar transistor, on a region, in which the base of the lateral pnp bipolar transistor is to be formed, and regions, in which the source and drain of the lateral DMOS transistor are to be formed. Using photoresist patterns 18a–18f as a mask, etching is effected on thermal oxide films 13b, 13c, 13f, 13h and 13h1 to form openings 19a–19e. This etching leaves thermal oxide films 13b1, 13c1, 13f1 and 13h2 at positions neighboring to openings 19a–19e.

Figure 76:
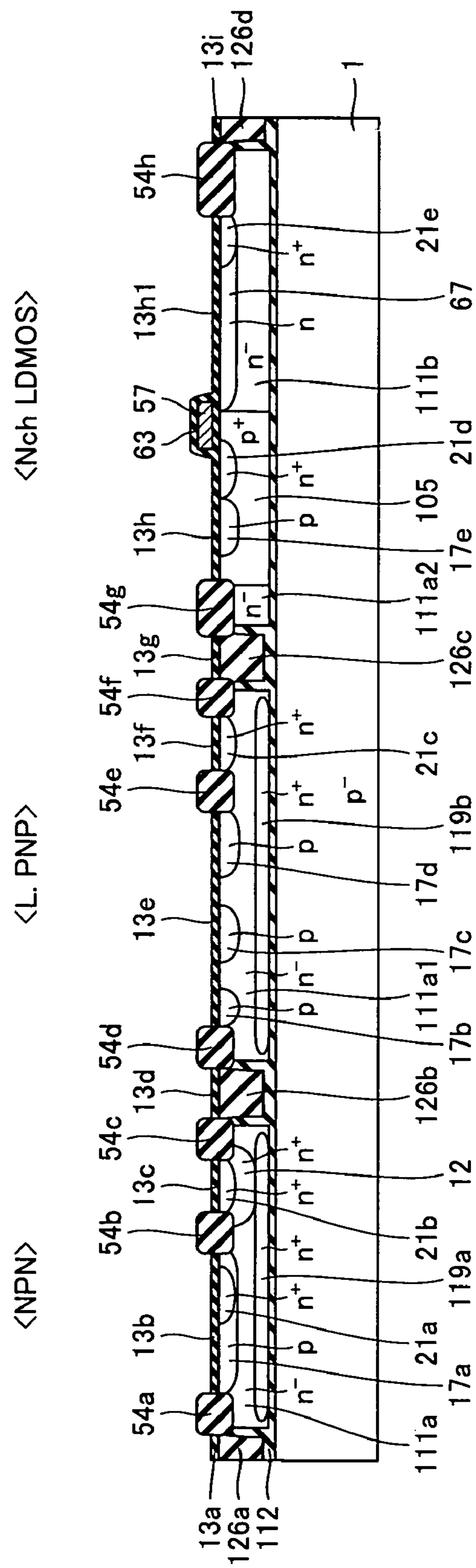

Using photoresist patterns 18a–18f as a mask, n-type impurity ions 20 such as arsenic or phosphorus ions are then introduced into $n^-$-silicon substrates 111a, 111a1 and 111b as well as epitaxial growth layer 105 by an ion implanting method. After removing photoresist patterns 18a–18f, thermal processing is performed. This forms $n^+$-diffusion layers 21a–21e as shown in FIG. 76. Thus, the thermal processing simultaneously forms the emitter and the collector of the vertical npn bipolar transistor, the base of the lateral pnp bipolar transistor, and the source and drain of the lateral DMOS transistor. Also, the thermal processing forms oxide films on openings 19a–19e for implantation.

Figure 77:
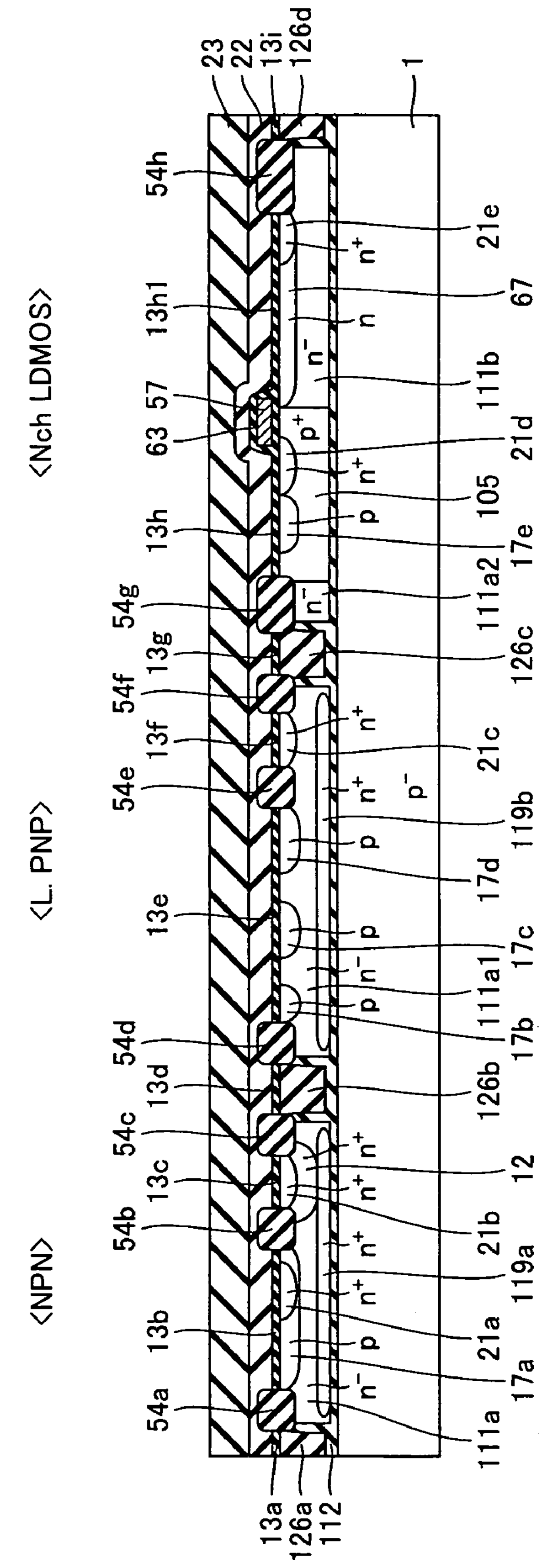

Then, as shown in FIG. 77, a CVD method is performed to deposit first interlayer insulating film 22 made of a CVD oxide film, which is, e.g., not doped with impurities and has a thickness of about 0.2 μm. Further, a CVD method is performed to deposit second interlayer insulating film 23 made of a CVD oxide film, which is doped with, e.g., boron or phosphorus and has a thickness of about 0.6 μm. Thereafter, appropriate thermal processing is performed to fluidize second interlayer insulating film 23 for flattening the wafer surface.

Figure 78:
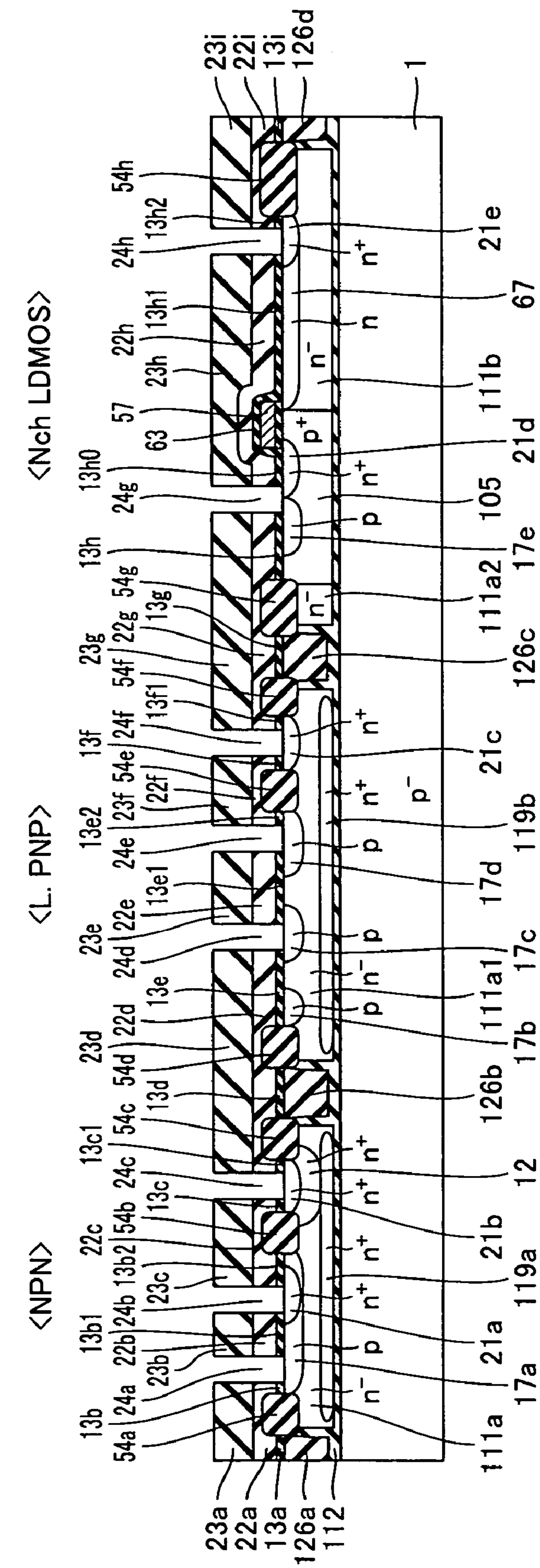

Then, a photoresist pattern (not shown) of a predetermined configuration is formed on second interlayer insulating film 23. Using this photoresist pattern as a mask, dry etching is performed by an RIE method. This forms contact holes 24a–24h as shown in FIG. 78.

First and second interlayer insulating films 22a–22i and 23a–23i remain around contact holes 24a–24h, and also thermal oxide films 13b1, 13b2, 13c1, 13e1, 13e2, 13f1, 13h0 and 13h2 remain. Although not shown, a contact hole for gate electrode 57 is formed at the same time.

Then, a sputtering method or the like is performed to form a metal film, which is made of AlSi, AlCu or the like, and has a thickness, e.g., of about 0.6 μm, over the whole surface. By patterning the metal film, first interconnections 25a–25h are formed as shown in FIG. 79. Thereafter, the semiconductor device of the fourth embodiment is completed through the steps similar to those in the first embodiment.

(Fifth Embodiment)

Description will now be given on a fifth embodiment of the invention with reference to FIGS. 80 to 105.

In the fifth embodiment, the lateral npn bipolar transistor is employed, and a selective epitaxial growth technique of SiGe or SiGe:C is applied to the lateral npn bipolar transistor and the lateral pnp bipolar transistor.

An epitaxial growth layer of SiGe or SiGe:C is used in the base of the lateral npn bipolar transistor, whereby a capacitance between the collector and the base can be significantly reduced, and the lateral npn bipolar transistor capable of operation with a higher frequency than the vertical type can be achieved.

Further, the epitaxial growth layer of SiGe or SiGe:C is used in the emitter and the collector of the lateral npn bipolar transistor, whereby a layer doped with p-type impurities more heavily than a silicon layer can be employed, and a higher current drive performance can be achieved.

Since the SOI structure and the trench isolation structure are employed similarly to the case of the fourth embodiment, effects similar to those of the fourth embodiment can be achieved.

Figure 105:
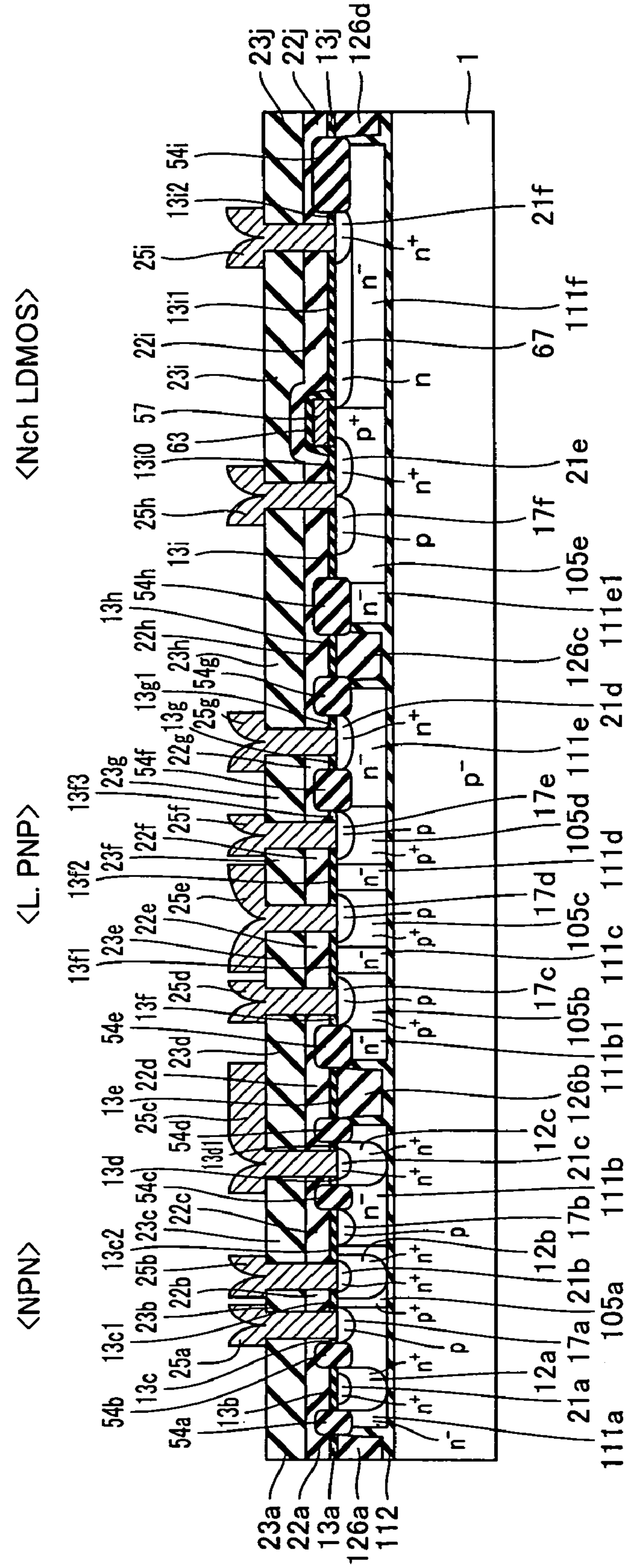
FIG. 105 is a cross section showing a distinctive structure of the semiconductor device according to the fifth embodiment of the invention.

FIG. 105 shows an example of a distinctive structure of the semiconductor device of the fifth embodiment. In the fifth embodiment, as shown in FIG. 105, $n^-$-silicon substrates (semiconductor layers) 111a, 111b, 111b1, 111c, 111d, 111e, 111e1 and 111f as well as epitaxial growth layers ($p^+$-epitaxial growth layers: semiconductor layers) 105a–105e are formed on $p^-$-silicon substrate 1 with thermal oxide film 112 therebetween. $n^-$-silicon substrates (semiconductor layers) 111a, 111b, 111b1, 111c, 111d, 111e, 111e1 and 111f as well as epitaxial growth layers 105a–105e correspond to the semiconductor layer in the SOI structure, and thermal oxide film 112 serves as the buried insulating film in the SOI structure.

Epitaxial growth layers 105a–105e are formed at the $n^-$-silicon substrate, and reach thermal oxide film 112. Epitaxial growth layers 105a–105e are made of SiGe or SiGe:C containing p-type impurities such as boron.

The base of the lateral npn bipolar transistor is formed at the surface of epitaxial growth layer 105a, the collector of the lateral pnp bipolar transistor is formed at the surfaces of epitaxial growth layers 105b and 105d, and the emitter of lateral pnp bipolar transistor is formed at the surface of the epitaxial growth layer 105c. Further, epitaxial growth layer 105e forms the channel region of the lateral DMOS transistor. The concentration of p-type impurities contained in epitaxial growth layers 105a–105e is substantially in a range, e.g., from about $1\times10^{17}$ cm$^{-3}$ to about $1\times10^{19}$ cm$^{-3}$.

Trenches reaching thermal oxide film 112 are formed in the $n^-$-silicon substrate, and are filled with oxide films 126a–126d serving as the isolating and insulating films. Further, $n^+$-diffusion layers 12a–12c reaching thermal oxide film 112 are formed in $n^-$-silicon substrates 111a and 111b. $n^+$-diffusion layers 21a–21c are formed at the surfaces of $n^+$-diffusion layers 12a–12c, respectively.

$n^+$-diffusion layers 21a and 21c form the collectors of the lateral npn bipolar transistor, and $n^+$-diffusion layer 21b forms the emitter of the lateral npn bipolar transistor. $n^+$-diffusion layer 21d is formed at the surface of $n^-$-silicon substrate 111e, $n^+$-diffusion layer 21e is formed at the surface of epitaxial growth layer 105e, and an $n^+$-diffusion layer 21f is formed at the surface of $n^-$-silicon substrate 111f. $n^+$-diffusion layers 21e and 21f form the source and drain of the lateral DMOS transistor, respectively. Structures other than the above are basically the same as those of the fourth embodiment.

Referring to FIGS. 80–105, description will now be given on a method of manufacturing the semiconductor device according to the fifth embodiment.

Figure 80:
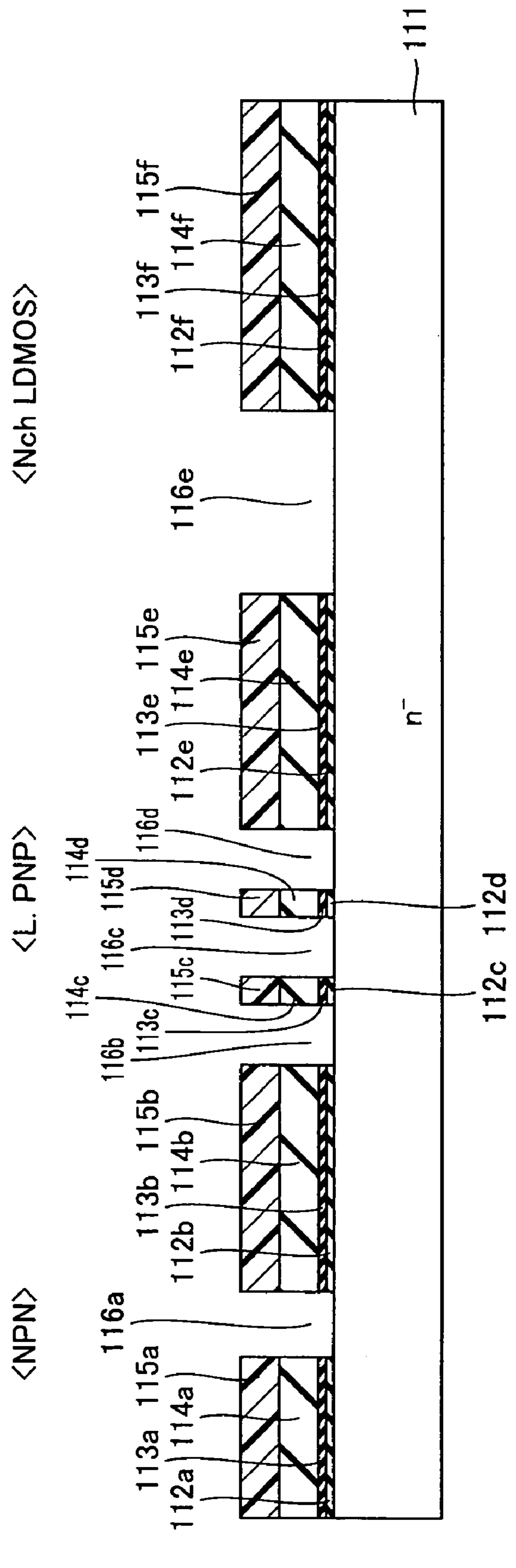
FIGS. 80 to 101 are cross sections showing 1st to 22nd steps in the manufacturing process of a semiconductor device according to a fifth embodiment of the invention, respectively.

As shown in FIG. 80, a thermal oxide film, e.g., of about 0.1 μm in thickness is formed on $n^-$-silicon substrate 111, and a nitride film, e.g., of about 0.1 μm in thickness is formed on this thermal oxide film by a low pressure CVD method. By a low pressure CVD method, an oxide film, e.g., of about 1 μm in thickness is formed on this nitride film, and photoresist patterns 115a–115f are formed on this oxide film.

Using photoresist patterns 115a–115f as a mask, etching is performed to form openings 116a–116e. As a result, thermal oxide films 112a–112f, nitride films 113a–113f and oxide films 114a–114f are formed around openings 116a–116e.

Figure 81:
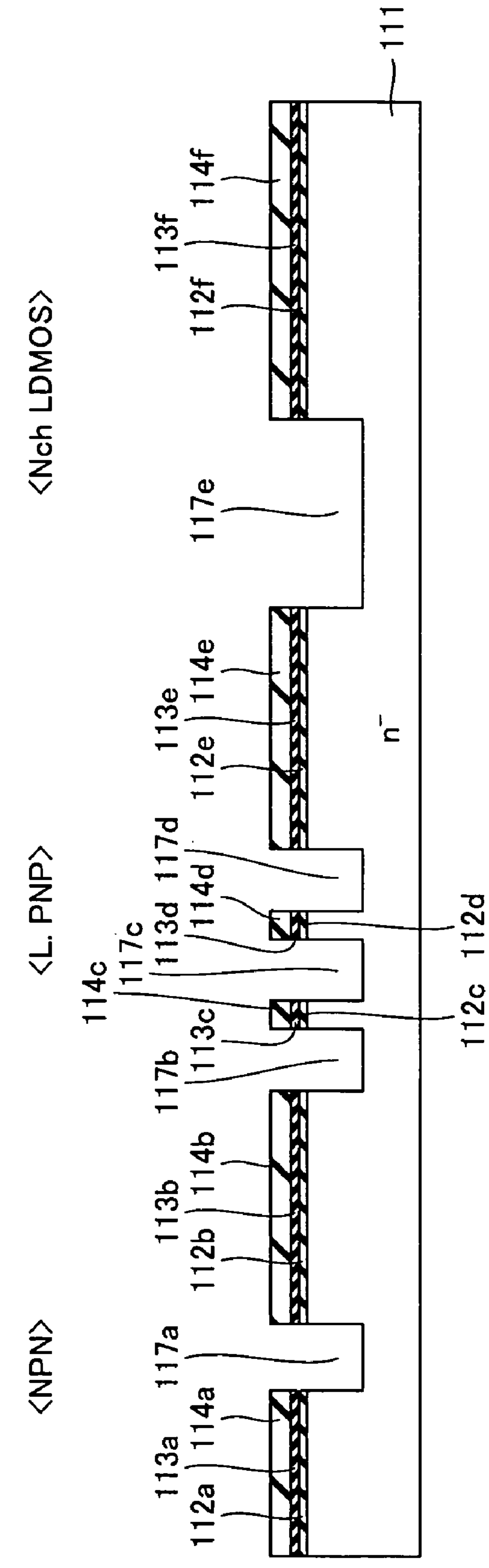

Photoresist patterns 115a–115f are removed, and etching is effected on $n^-$-silicon substrate 111 masked with oxide films 114a–114f by an RIE method. This forms trenches 117a–117e as shown in FIG. 81. Trenches 117a–117e are regions for forming the well of the lateral DMOS transistor as well as the base, emitter and collector of the bipolar transistors, and therefore must have a depth corresponding to required performances of these transistors. For example, a depth from 0.5 μm to 2 μm is required.

Figure 82:
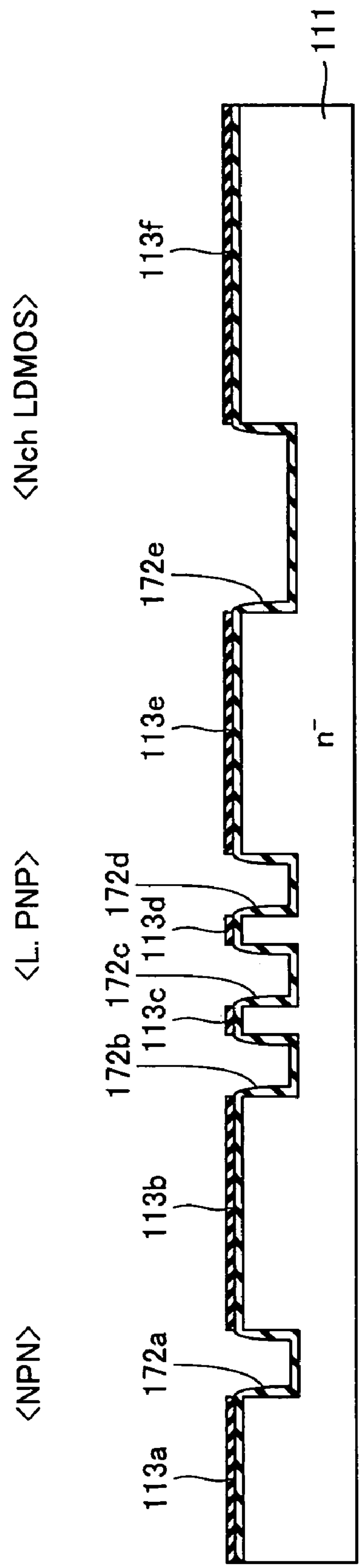

After removing oxide films 114a–114f, thermal oxidation is performed. As shown in FIG. 82, this thermal oxidation forms thermal oxide films 172a–172e of about 0.1 μm in thickness at the surfaces of trenches 117$a$ to 117$e$, respectively. Thereby, etching damages at the surfaces of trenches 117$a$–117$e$ can be removed. Thereafter, etching is performed to remove thermal oxide films 172$a$–172$e$ on trenches 117$a$–117$e$ using nitride films 113$a$–113$f$ as a mask.

Figure 83:
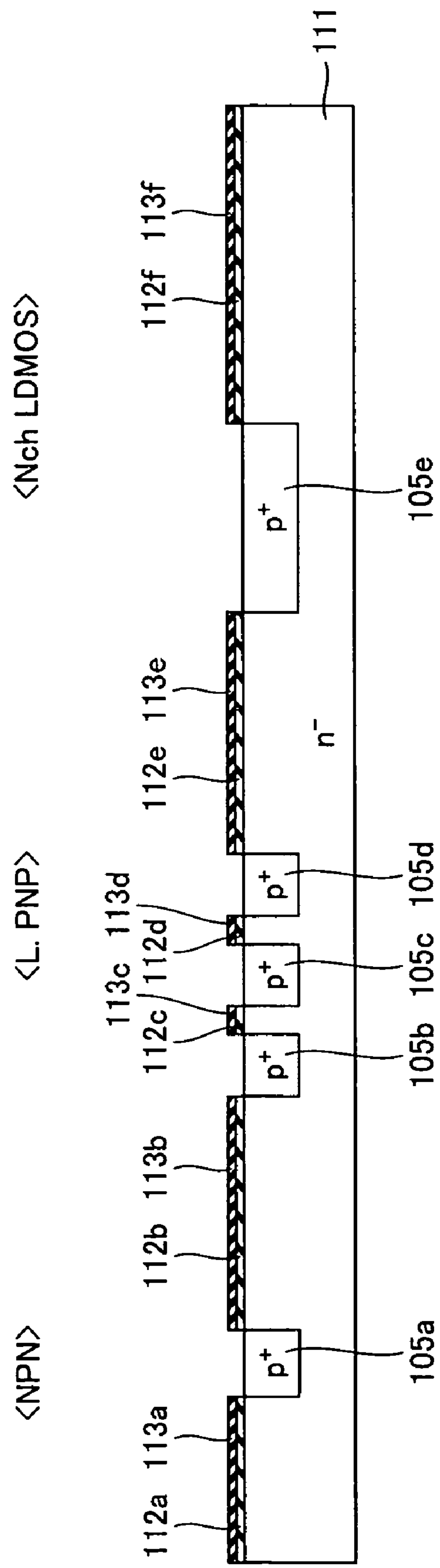

Then, as shown in FIG. 83, a selective epitaxial growth method is performed to form epitaxial growth layers ($p^+$-epitaxial growth layers) 105$a$ –105$e$ of SiGe or SiGe:C containing p-type impurities such as boron. The concentration of p-type impurities contained in epitaxial growth layers 105$a$–105$e$ is substantially in a range from about $1\times10^{17}$ $cm^{-3}$ to about $1\times10^{19}$ $cm^{-3}$.

Epitaxial growth layer 105$a$ provides a region for forming the base of the lateral npn bipolar transistor, and epitaxial growth layers 105$b$ and 105$d$ provide a region for forming the collector of the lateral pnp bipolar transistor. Also, epitaxial growth layer 105$c$ provides a region for forming the emitter of the lateral pnp bipolar transistor, and epitaxial growth layer 105$e$ provides a region for forming the p-well of the lateral DMOS transistor.

Figure 84:
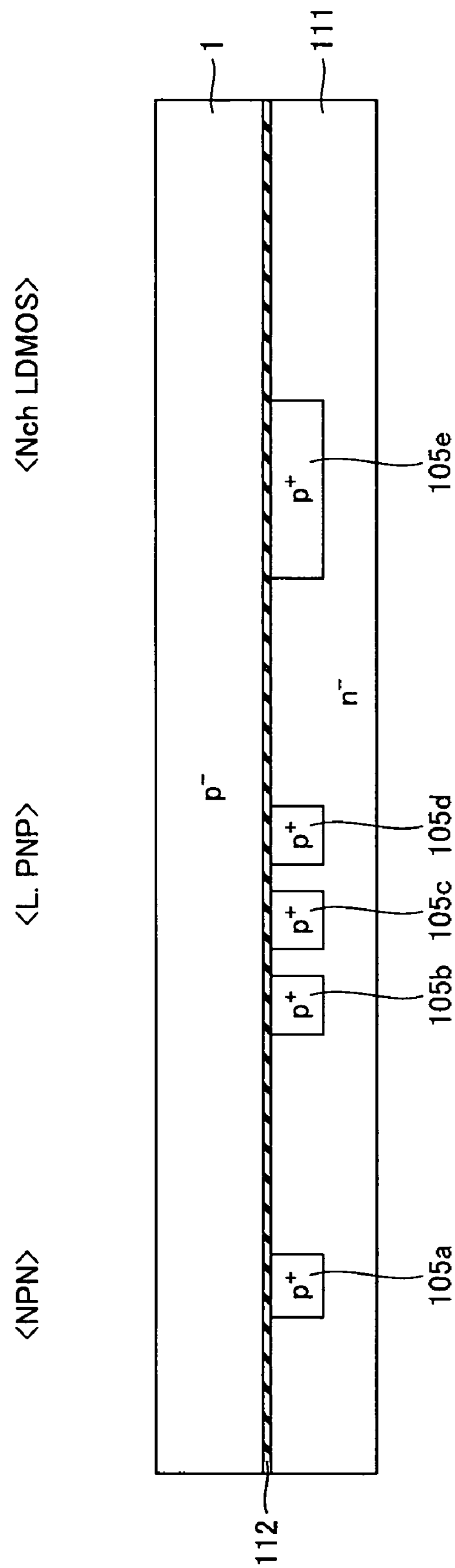

Then, nitride films 113$a$–113$f$ and thermal oxide films 112$a$–112$f$ are removed. Thereafter, as shown in FIG. 84, $p^-$-silicon substrate 1 provided at its surface with thermal oxide film 112 of about 0.1 $\mu$m in thickness is bonded to $n^-$-silicon substrate 111.

Figure 85:
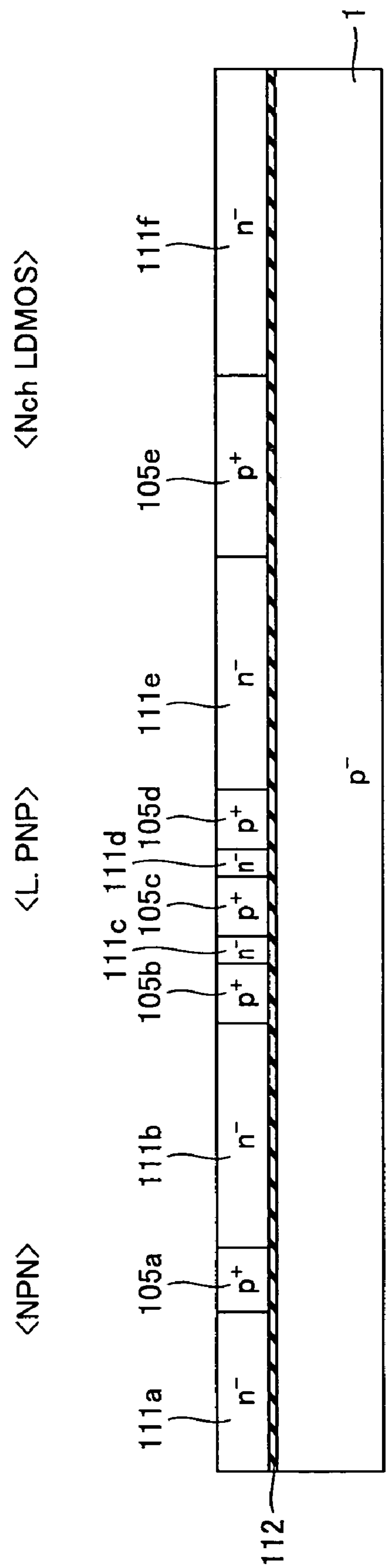

As shown in FIG. 85, the surface of $n^-$-silicon substrate 111 is polished by a CMP method, and this polishing stops when epitaxial growth layers 105$a$–105$e$ achieve an intended thickness. For example, the polishing is stopped to provide epitaxial growth layers 105$a$–105$e$ having a thickness, e.g., from about 0.1 $\mu$m to about 0.2 $\mu$m. Consequently, epitaxial growth layers 105$a$–105$e$ are exposed, and $n^-$-silicon substrates (semiconductor layers) 111$a$–111$f$ remain around epitaxial growth layers 105$a$–105$e$.

Figure 86:
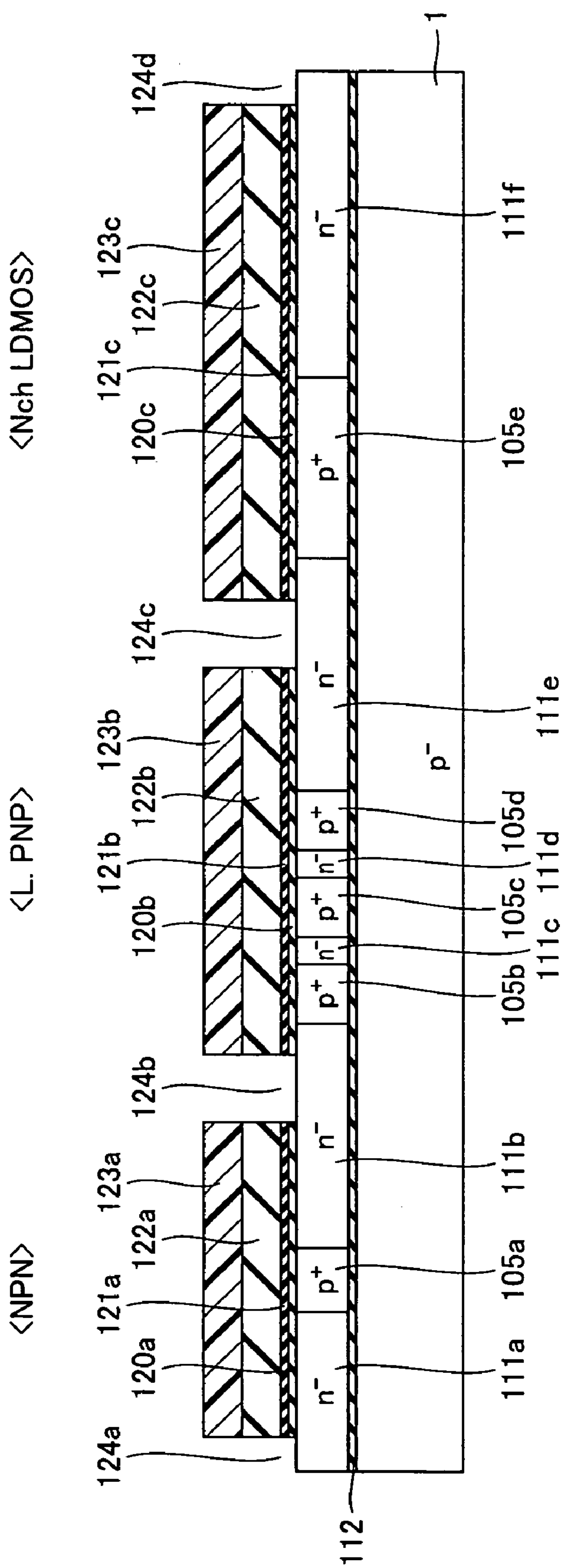

On epitaxial growth layers 105$a$–105$e$ and $n^-$-silicon substrates 111$a$–111$f$, as shown in FIG. 86, processing is them performed to form thermal oxide films 120$a$–120$c$ of about 0.1 $\mu$m in thickness, to form nitride films 121$a$–121$c$ of about 0.1 $\mu$m in thickness by a low pressure CVD method, and to form oxide films 122$a$–122$c$ of about 1 $\mu$m in thickness by a low pressure CVD method. Photoresist patterns 123$a$–123$c$ having openings on oxide films 122$a$–122$c$ are formed. Using photoresist patterns 123$a$–123$c$ as a mask, etching is effected on the oxide films and the nitride films. Thereby, openings 124$a$–124$d$ for trench isolation are formed. Each of openings 124$a$–124$d$ has a width of about 0.5 $\mu$m.

By forming openings 124$a$–124$d$ as described above, thermal oxide films 120$a$–120$c$, nitride films 121$a$–121$c$ and oxide films 122$a$–122$c$ are left around openings 124$a$–124$d$.

Figure 87:
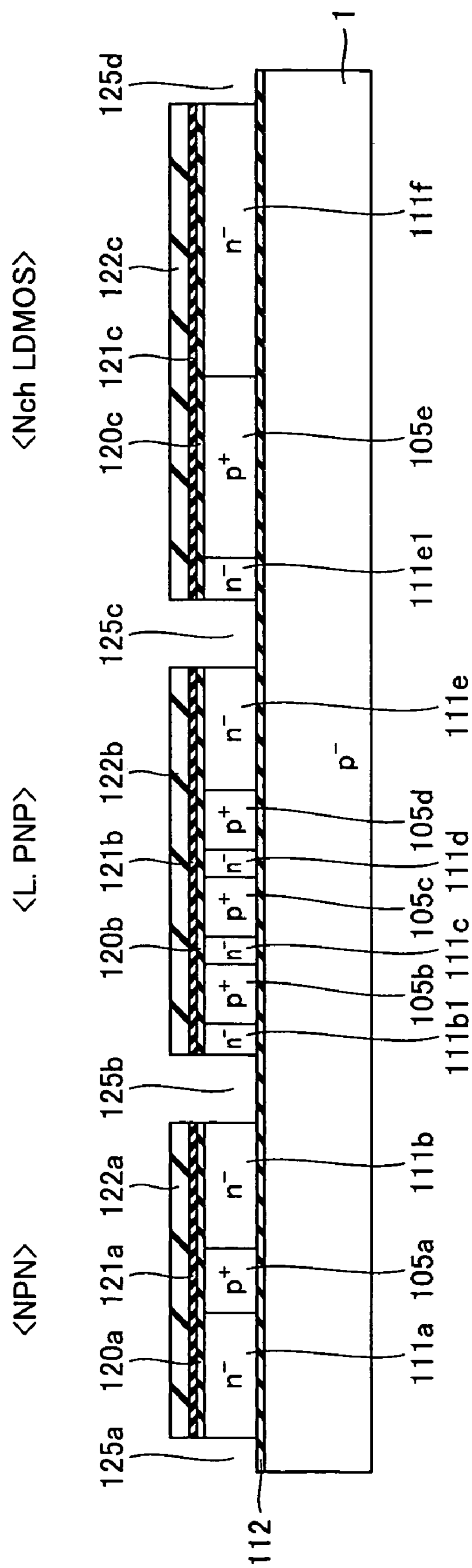

Photoresist patterns 123$a$–123$c$ are removed, and etching is effected on $n^-$-silicon substrates 111$a$, 111$b$, 111$e$ and 111$f$ masked with oxide films 122$a$–122$c$ by an RIE method. This forms trenches 125$a$–125$d$ reaching thermal oxide film 112 as shown in FIG. 87. By forming trenches 125$a$–125$d$, $n^-$-silicon substrates 111$b$1 and 111$e$1 are left around trenches 125$a$–125$d$.

Figure 88:
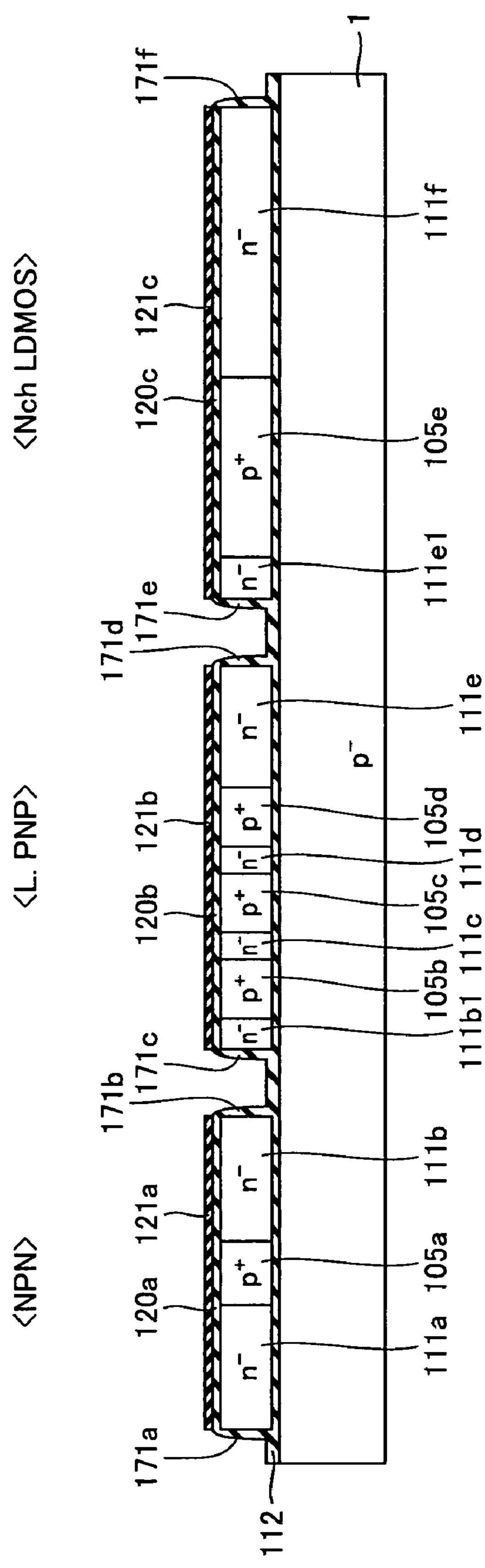

After removing oxide films 122$a$–122$c$, thermal oxidation is performed at a depth of about 0.1 $\mu$m. This forms oxide films 171$a$–171$f$ at the surfaces of trenches 125$a$–125$d$ as shown in FIG. 88.

Figure 89:
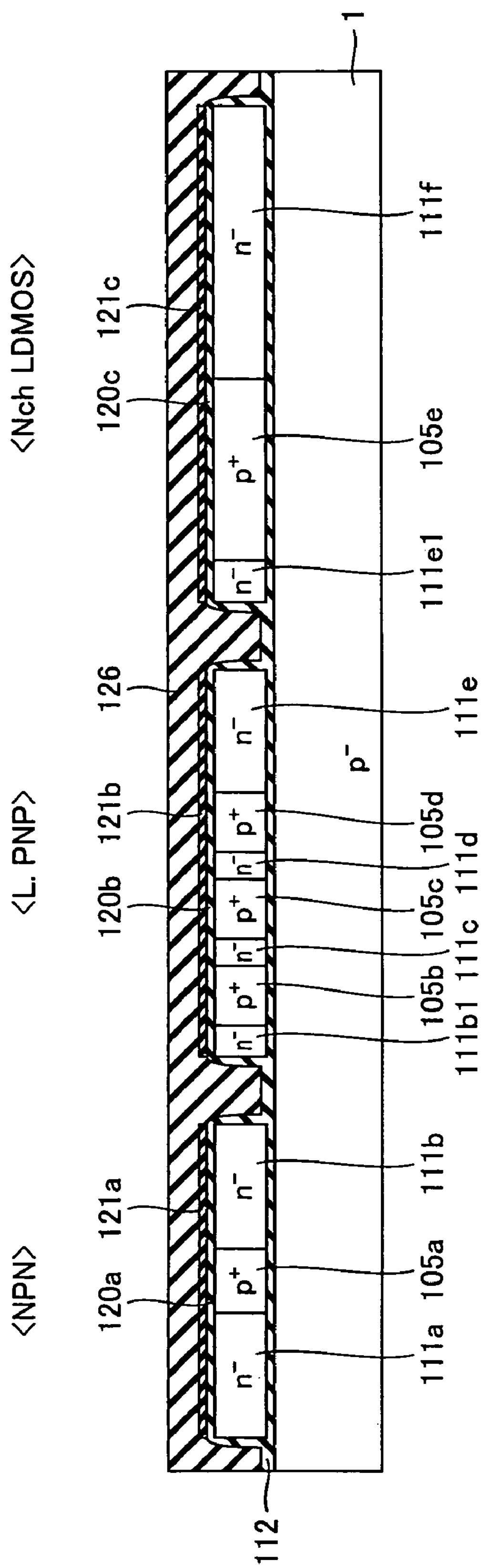

Then, as shown in FIG. 89, a CVD method is performed to form oxide film 126 of about 1 $\mu$m in thickness covering $n^-$-silicon substrates 111$a$–111$f$. Instead of oxide film 126, a semiconductor film, e.g., of polycrystalline silicon or amorphous silicon may be used.

Figure 90:
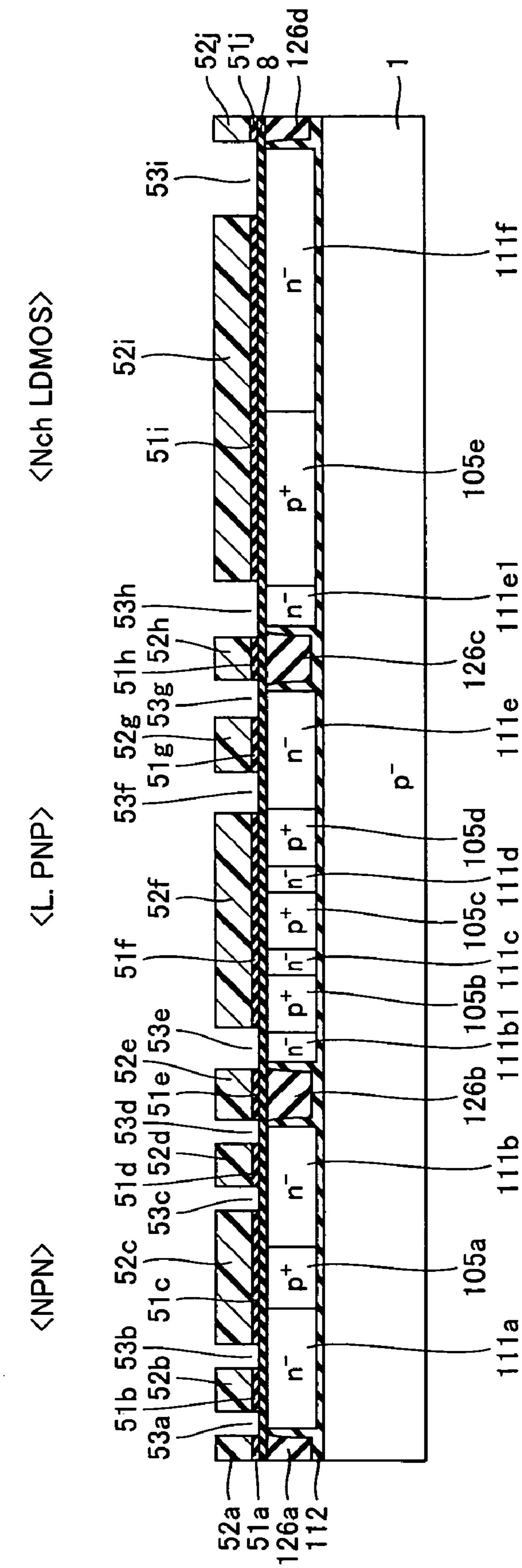

The surface of oxide film 126 is polished by a CPM method, and this polishing is stopped when nitride films 121$a$–121$c$ are exposed. Thereby, the trenches are filled with oxide films 126$a$–126$d$ as shown in FIG. 90. Thereafter, nitride films 121$a$–121$c$ and thermal oxide films 120$a$–120$c$ are removed.

Further, thermal oxidation is performed to form thermal oxide film 8 of about 0.5 $\mu$m in thickness. Thermal oxide film 8 is formed not only on $n^-$-silicon substrates 111$a$–111$f$ but also on oxide films 126$a$–126$d$. On thermal oxide film 8, a nitride film of about 0.1 $\mu$m in thickness is formed by a CVD method.

On the nitride film thus formed, photoresist patterns 52$a$–52$j$ having openings at predetermined positions are formed. Using photoresist patterns 52$a$–52$j$ as a mask, etching is effected on the nitride film located on the region, in which the field oxide film is to be formed. This forms openings 53$a$–53$i$ in the nitride film. Thereby, nitride films 51$a$–51$j$ are left around openings 53$a$–53$i$. Thereafter, photoresist patterns 52$a$–52$j$ are removed.

Figure 91:
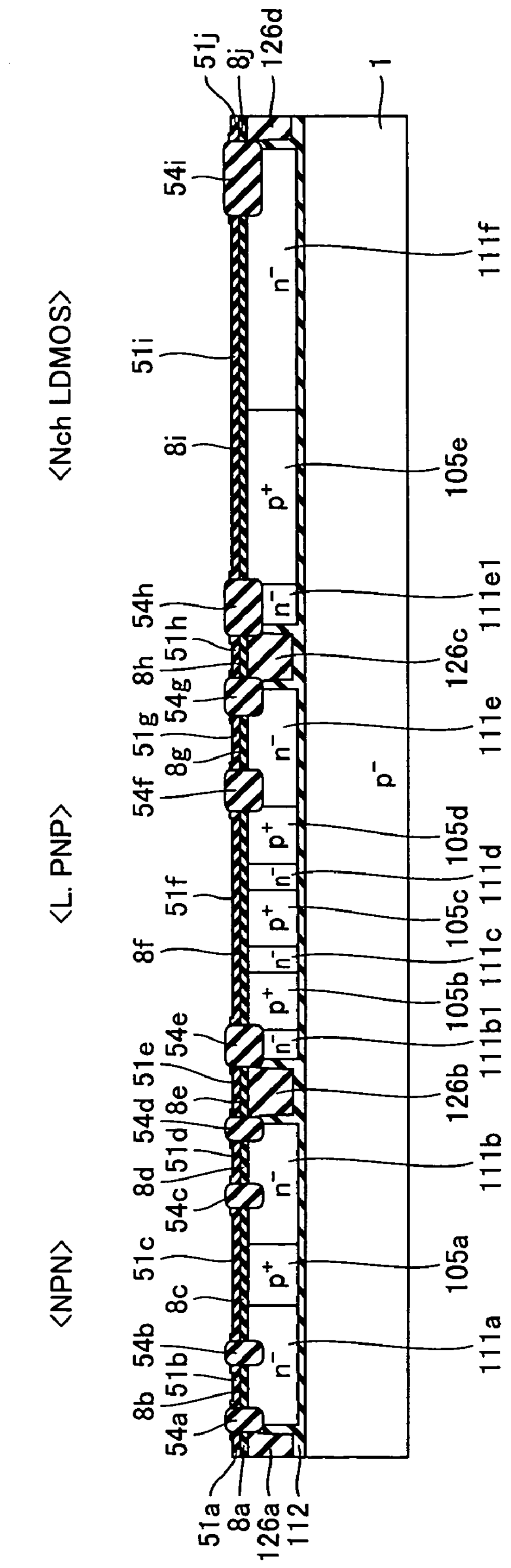

Using nitride films 51$a$–51$j$ as a mask, thermal oxidation is performed. This forms field oxide films 54$a$–54$i$ of about 0.2 $\mu$m in thickness as shown in FIG. 91. Thereby, thermal oxide films 8$a$–8$j$ are left around field oxide films 54$a$–54$i$.

Figure 92:
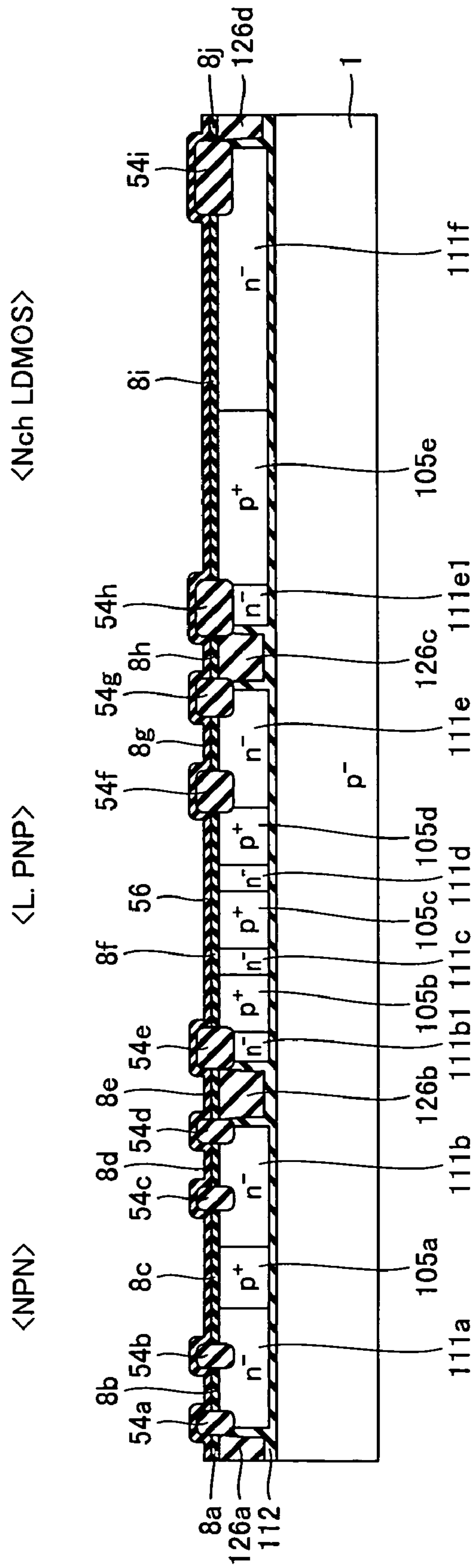
Figure 93:
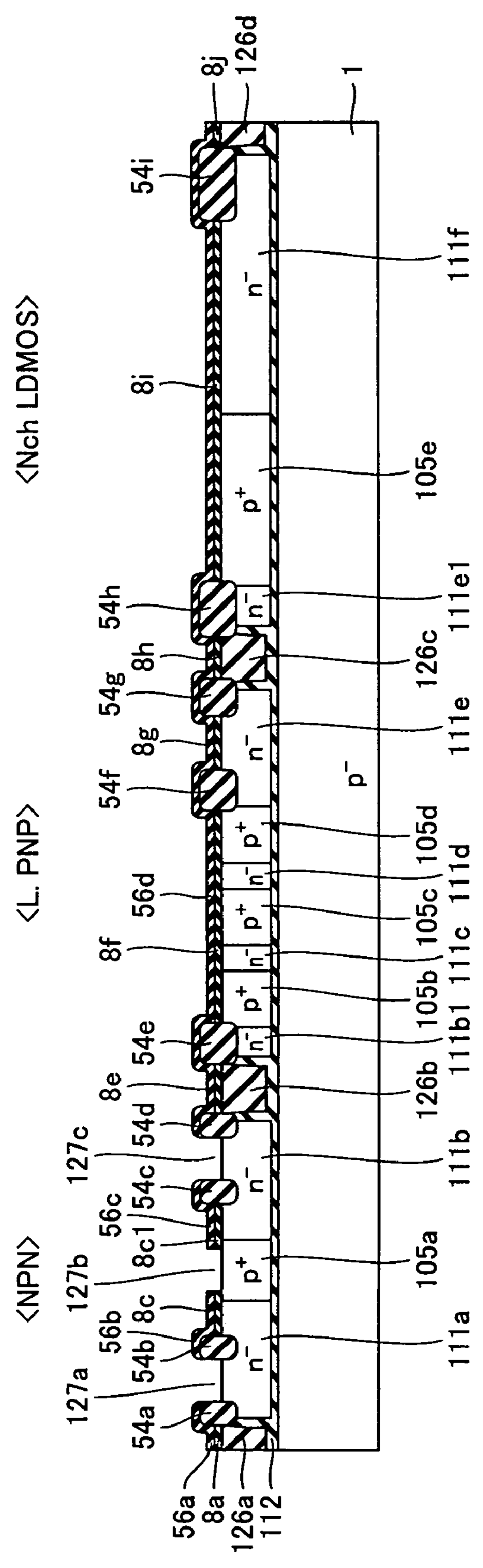

After removing nitride films 51$a$–51$j$, e.g., with hot phosphoric acid, a CVD method is performed to form nitride film 56 of about 0.1 $\mu$m in thickness on thermal oxide films 8$a$–8$j$ as shown in FIG. 92. A photoresist pattern (not shown) is formed on nitride film 56, and etching is effected on nitride film 56 and thermal oxide films 8$b$–8$d$ masked with the photoresist pattern thus formed. This forms diffusion windows 127$a$–127$c$ for forming diffusion layers used for leading out the emitter and the collector of the lateral npn bipolar transistor. Around these diffusion windows, nitride films 56$a$–56$d$ remain as shown in FIG. 93. Thereafter, the photoresist patterns are removed.

Figure 94:
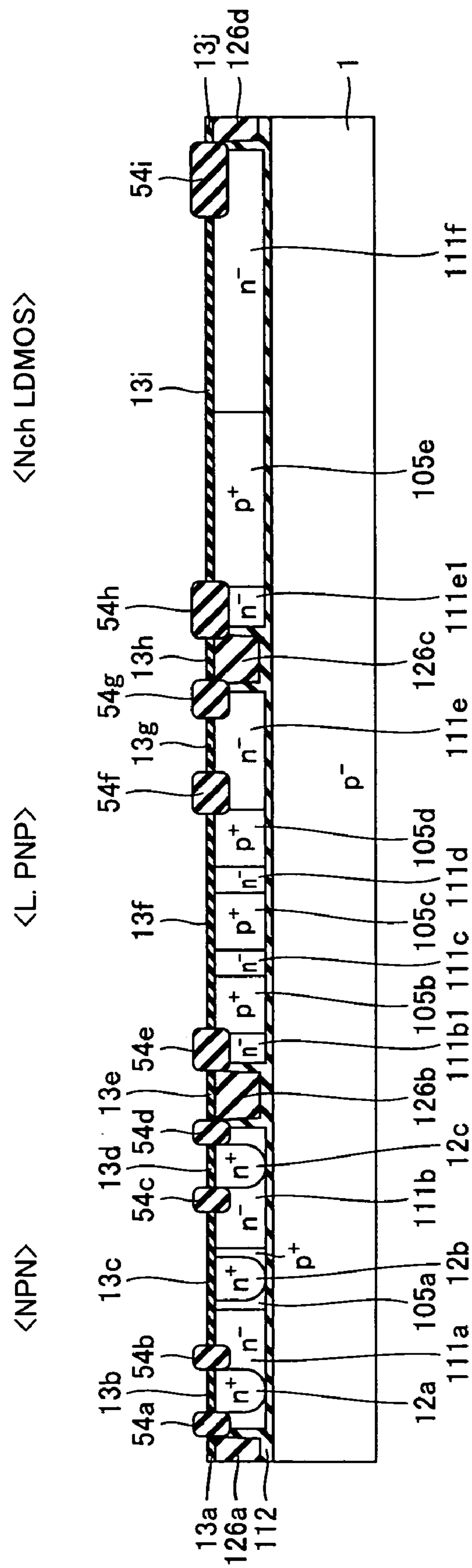

Then, a gas diffusion method using phosphorus is performed to introduce the phosphorus through diffusion windows 127$a$–127$c$ into $n^-$-silicon substrates 111$a$ and 111$b$ as well as epitaxial growth layer 105$a$. Thereby, $n^+$-diffusion layer 12$b$ for leading out the emitter and $n^+$-diffusion layers 12$a$–12$c$ for leading out the collector are formed as shown in FIG. 94. Then, processing is performed to remove phosphorus glass, which was deposited on the wafer during execution of the gas diffusion method. Subsequently, a thermal oxide film of about 0.1 $\mu$m in thickness is formed at the surface of $n^+$-diffusion layers 12$a$–12$c$.

Then, nitride films 56$a$–56$d$ as well as thermal oxide films 8$a$–8$j$ are removed, and thermal oxide films 13$a$–13$j$, e.g., from about 0.01 to about 0.02 $\mu$m in thickness are formed as shown in FIG. 94. Portions of thermal oxide films 13$a$–13$j$ will form the gate oxide film of the lateral DMOS transistor.

Figure 95:
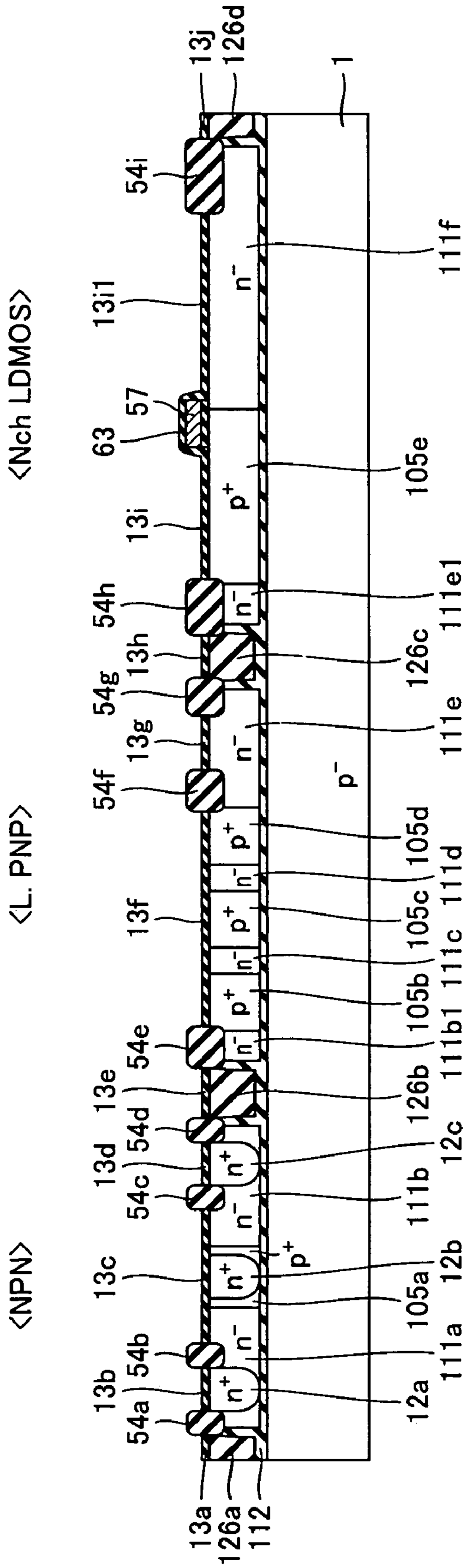

Then, a low pressure CVD method is performed to deposit a silicon film (semiconductor film), which is, e.g., 0.2 $\mu$m in thickness and is made of polycrystalline silicon or amorphous silicon doped with phosphorus. A photoresist pattern is formed on a portion of this silicon film, in which the gate electrode of the lateral DMOS transistor is to be formed. Etching is effected on the silicon film masked with this photoresist pattern. This forms gate electrode 57 as shown in FIG. 95. The surface of gate electrode 57 is thermally oxidized to form oxide film 63.

Figure 96:
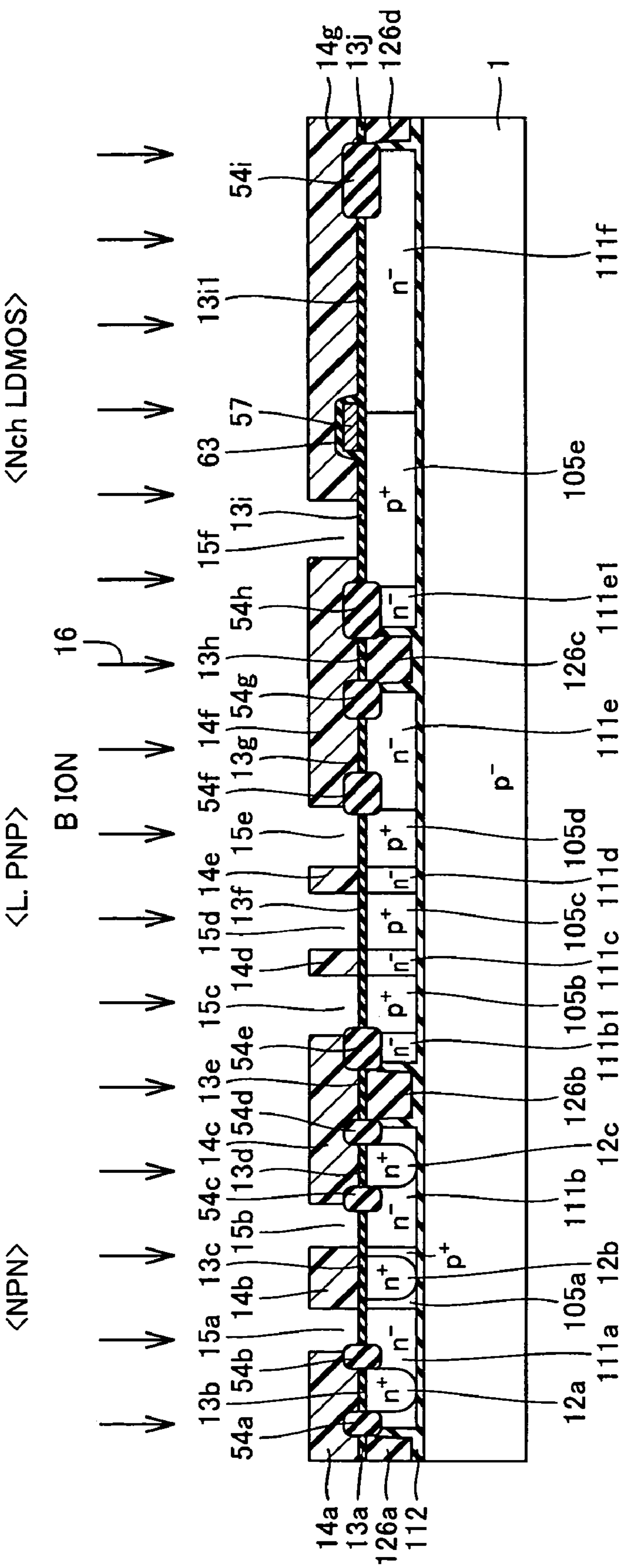

Then, as shown in FIG. 96, processing is performed to form photoresist patterns 14$a$–14$g$ having openings 15$a$ and 15$b$ located on a region, in which the base-leading layer (17$a$ and 17$b$) of the lateral npn bipolar transistor is to be formed, openings 15$c$–15$e$ located on a region, in which p-type diffusion layers 17*c*–17*e* forming the collector and emitter of the lateral pnp bipolar transistor are to be formed, and opening 15*f* located on a region, in which p-type diffusion layer 17*f* forming the back gate of the lateral DMOS transistor is to be formed. Using photoresist patterns 14*a*–14*g* as a mask, an ion implanting method is performed to introduce boron ions into $n^-$-silicon substrates 111*a* and 111*b* as well as epitaxial growth layers 105*a*, 105*c*, 105*d* and 105*e*.

Figure 97:
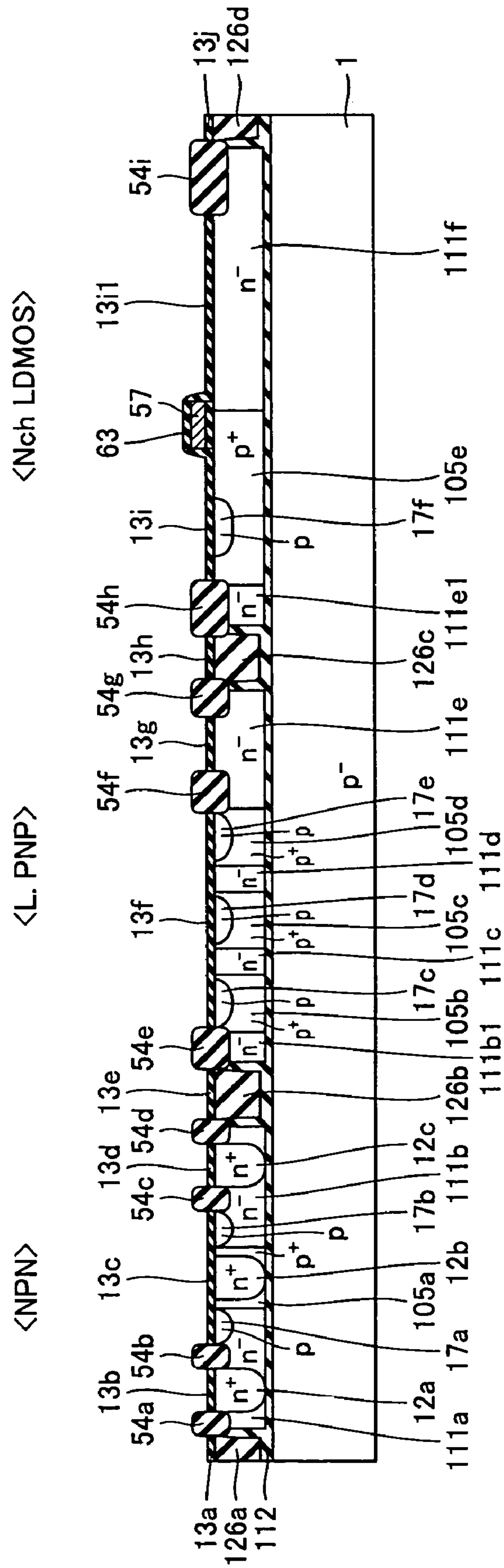

After removing photoresist patterns 14*a*–14*g*, thermal processing is performed. This forms p-type diffusion layers 17*a*–17*f* as shown in FIG. 97. Thus, the base of the lateral npn bipolar transistor, the collector and emitter of the lateral pnp bipolar transistor and the back gate of the lateral DMOS transistor are simultaneously formed.

Figure 98:
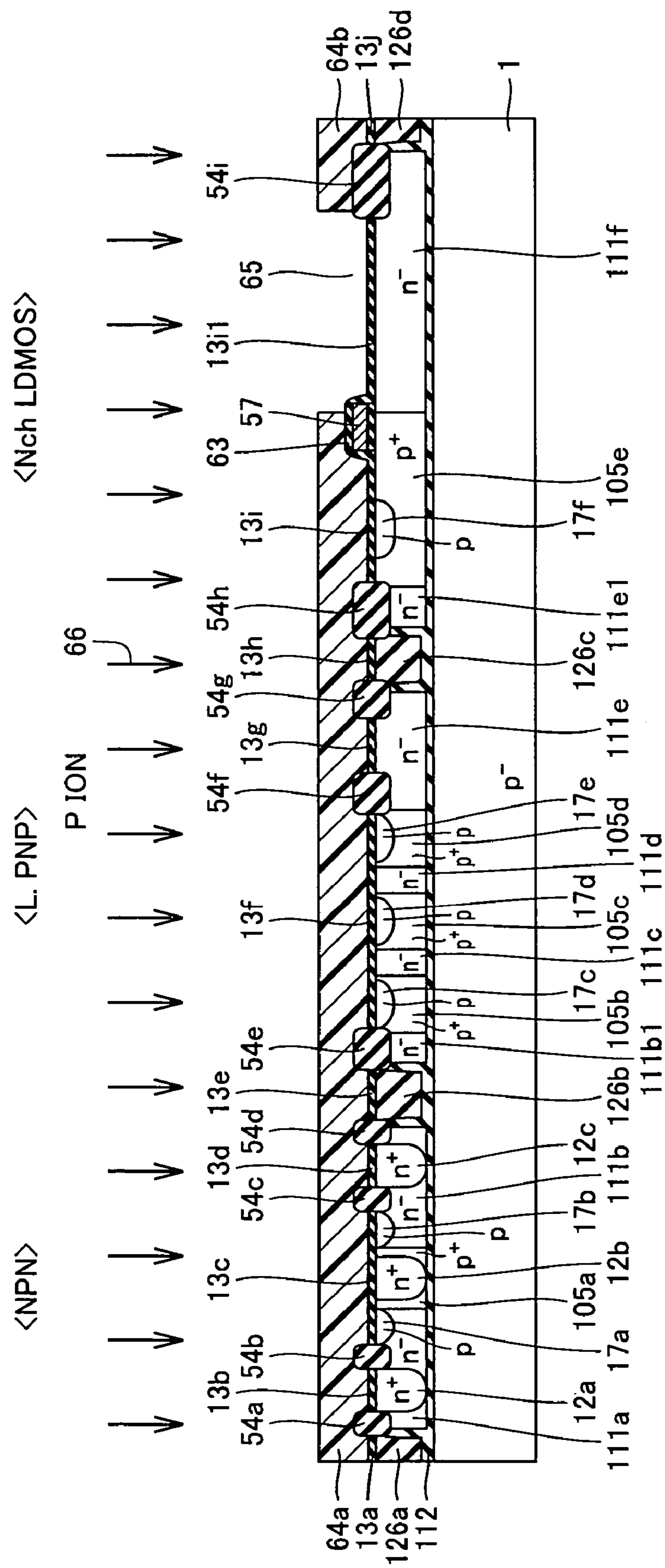
Figure 99:
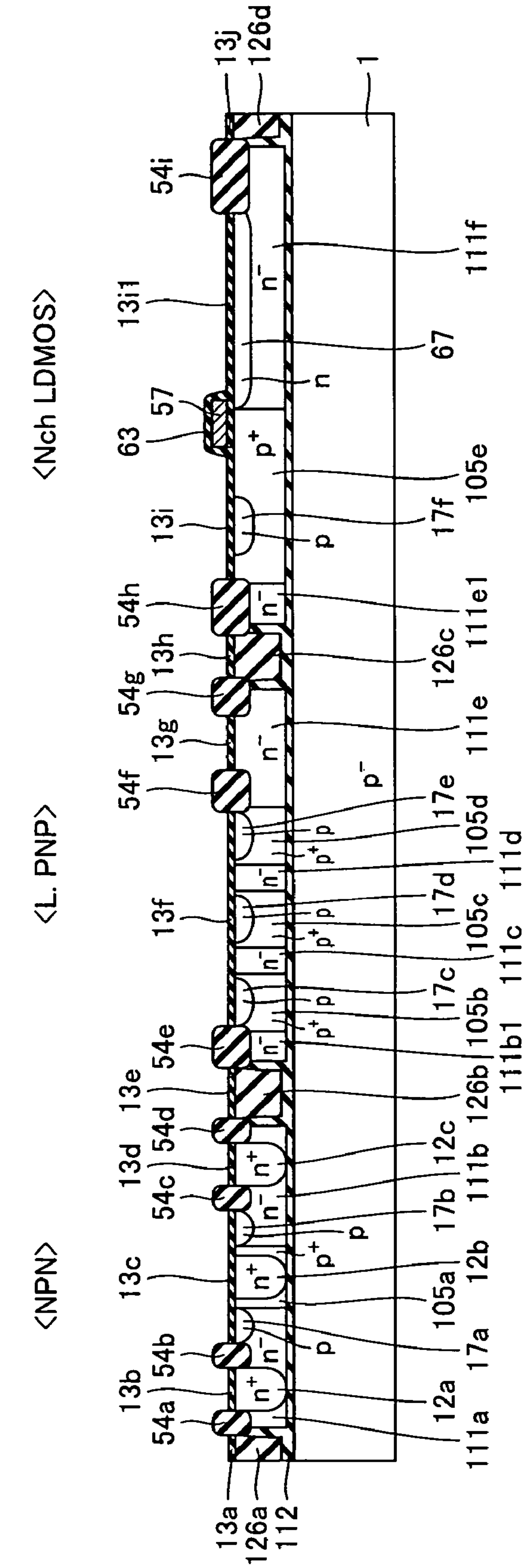

As shown in FIG. 98, processing is performed to form photoresist patterns 64*a* and 64*b* having opening 65 located on a region, in which the drain of the lateral DMOS transistor is to be formed. Using photoresist patterns 64*a* and 64*b* as a mask, an ion implanting method is performed to introduce phosphorus ions into $n^-$-silicon substrate 111*f*. After removing photoresist patterns 64*a* and 64*b*, thermal processing is performed. This forms n-type diffusion layer ($n^-$-drain) 67 as shown in FIG. 99.

Figure 100:
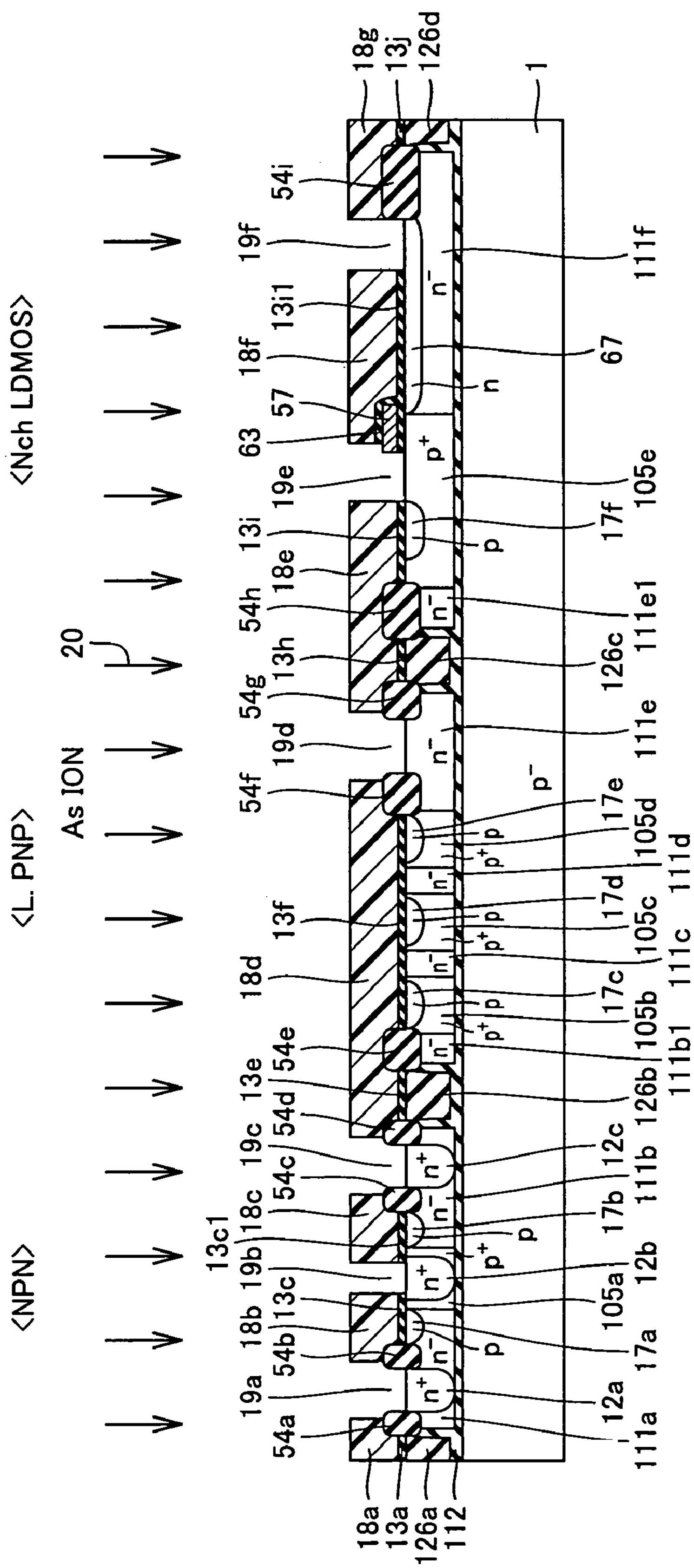

As shown in FIG. 100, processing is performed to form photoresist patterns 18*a*–18*g* having openings located on $n^+$-diffusion layers 12*a*–12*c* of the lateral npn bipolar transistor, on a region, in which the base of the lateral pnp bipolar transistor is to be formed, and on regions, in which the source and drain of the lateral DMOS transistor are to be formed. Using photoresist patterns 18*a*–18*g* as a mask, etching is effected on thermal oxide films 13*b*, 13*c*, 13*d*, 13*g*, 13*i* and 13*i*1 to form openings 19*a*–19*f*.

Figure 101:
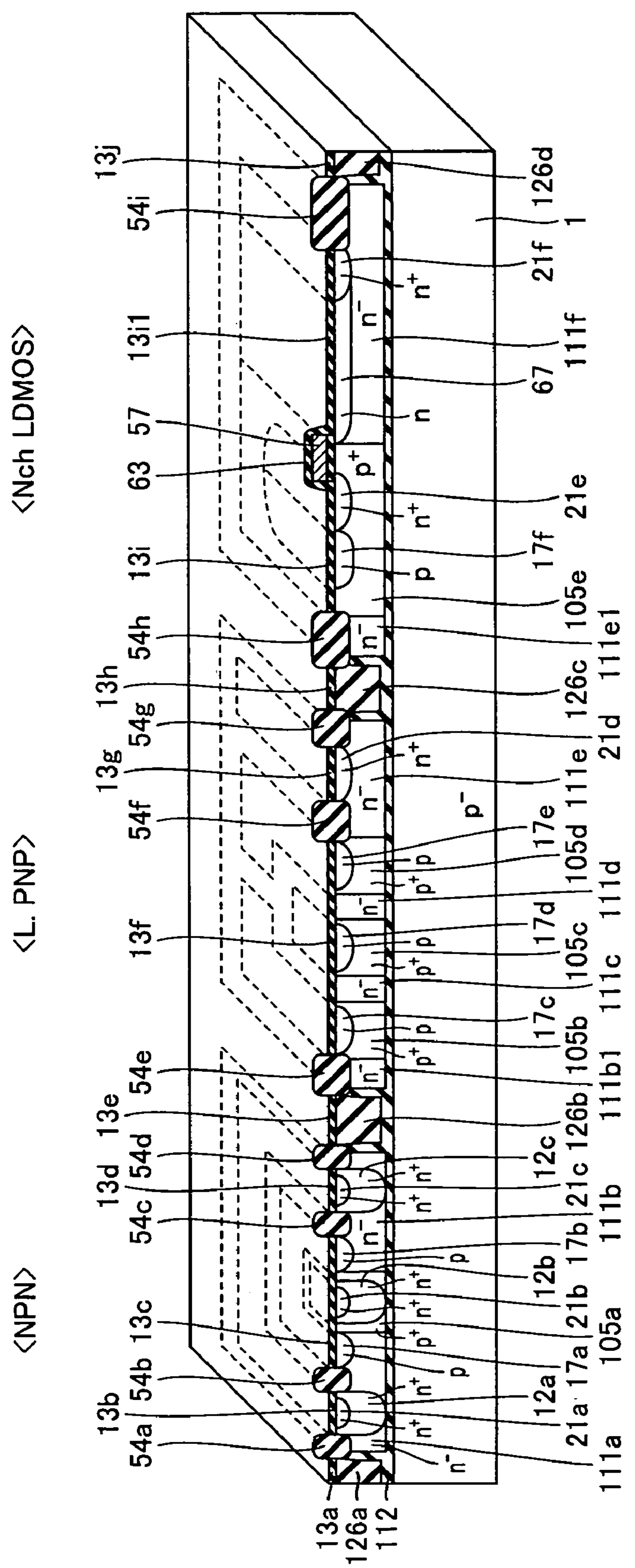

Using photoresist patterns 18*a*–18*g* as a mask, an ion implanting method is performed to introduce n-type impurity ions such as arsenic ions or phosphorus ions into $n^-$-silicon substrates 111*a*, 111*b*, 111*e* and 111*f* as well as epitaxial growth layers 105*a* and 105*e*. After removing photoresist patterns 18*a*–18*g*, thermal processing is performed. This forms $n^+$-diffusion layers 21*a*–21*f* as shown in FIG. 101. Thus, the emitter and collector of the lateral npn bipolar transistor, the base of the lateral pnp bipolar transistor, and the source and drain of the lateral DMOS transistor are simultaneously formed. This thermal processing also forms oxide films on implantation openings 19*a*–19*f*.

Figure 102:
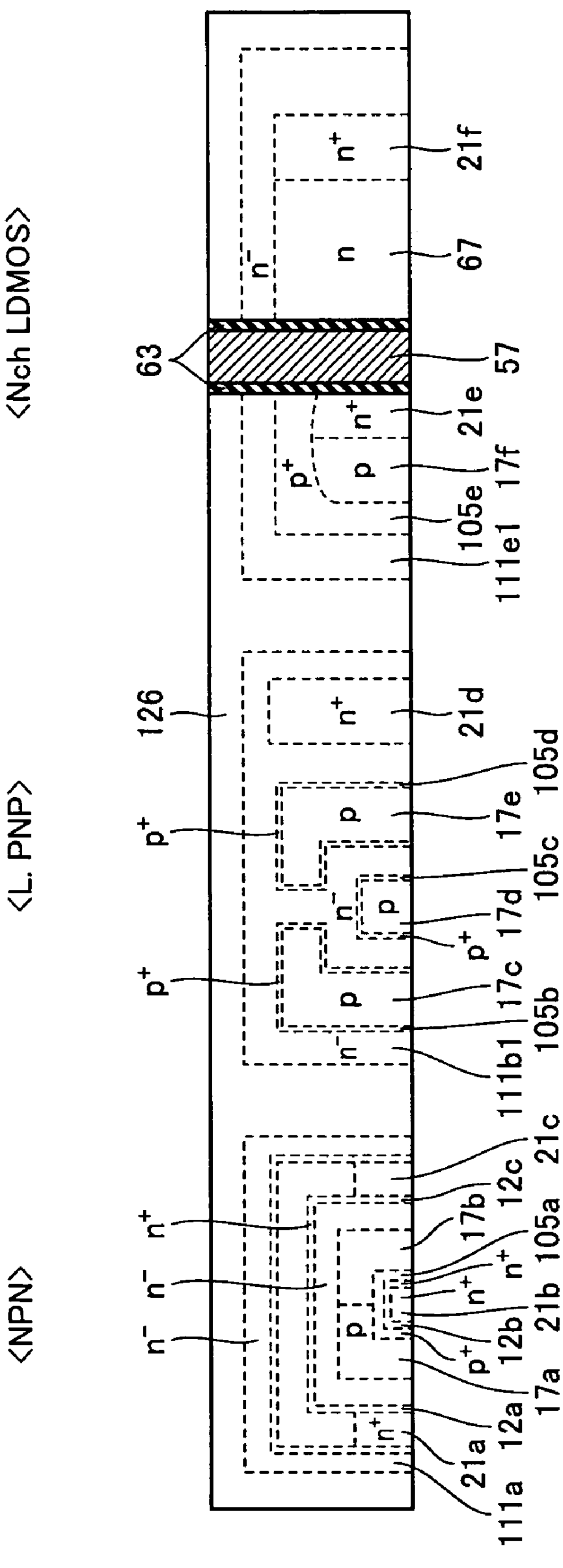
FIG. 102 is a plan of the semiconductor device in the state shown in FIG. 101.

FIG. 102 is a plan of the semiconductor device in the state shown in FIG. 101. As shown in FIGS. 101 and 102, $n^+$-diffusion layers 12*a* and 12*c* are the collector of the lateral npn bipolar transistor, and p-type diffusion layers 17*a* and 17*b* are the base of the lateral npn bipolar transistor.

Epitaxial growth layers 105*b* and 105*d* are isolated, and both form the collector of the lateral pnp bipolar transistor. A leading electrode must be provided for each of epitaxial growth layers 105*b* and 105*d*. The collector may have a form shown in FIG. 142.

Figure 103:
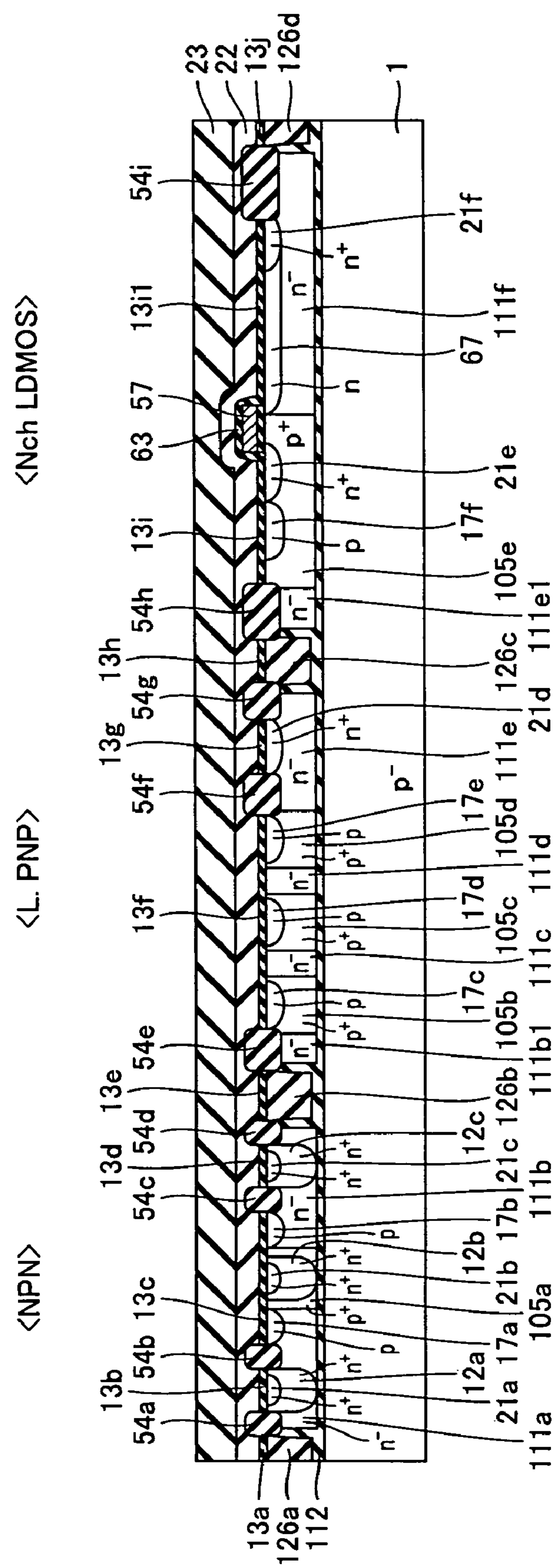
FIGS. 103 and 104 are cross sections showing 23rd and 24th steps in the manufacturing process of a semiconductor device according to a fifth embodiment of the invention.

Then, as shown in FIG. 103, a CVD method is performed to deposit first interlayer insulating film 22 made of a CVD oxide film, which is, e.g., not doped with impurities and has a thickness of about 0.2 $\mu$m. Further, a CVD method is performed to deposit second interlayer insulating film 23 made of a CVD oxide film, which is doped with, e.g., boron or phosphorus and has a thickness of about 0.6 $\mu$m. Thereafter, appropriate thermal processing is performed to fluidize second interlayer insulating film 23 for flattening the wafer surface.

Figure 104:
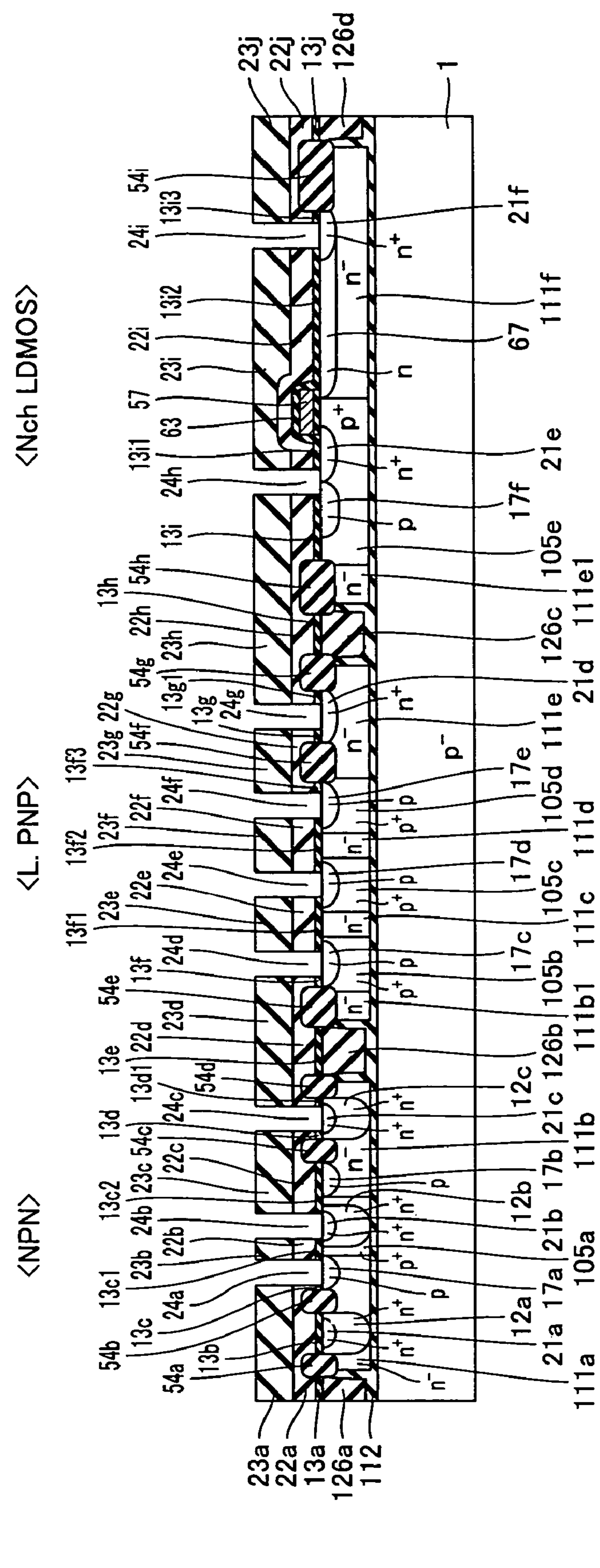

Then, a photoresist pattern (not shown) of a predetermined configuration is formed on second interlayer insulating film 23. Using this photoresist pattern as a mask, dry etching is performed by an RIE method. This etching forms contact holes 24*a*–24*i* as shown in FIG. 104.

First and second interlayer insulating films 22*a*–22*j* and 23*a*–23*j* remain around contact holes 24*a*–24*i*, and also thermal oxide films 13*c*2, 13*f*1, 13*f*2 and 13*f*3 remain. Although not shown, a contact hole for gate electrode 57 is formed at the same time.

Then, a sputtering method or the like is performed to form a metal film, which is, e.g., about 0.6 $\mu$m in thickness and is made of AlSi, AlCu or the like, over the whole surface. By patterning the metal film, first interconnections 25*a*–25*i* are formed as shown in FIG. 105. Thereafter, the semiconductor device of the fifth embodiment is completed through the steps similar to those in the first embodiment.

(Sixth Embodiment)

Description will now be given on a sixth embodiment of the invention with reference to FIGS. 106 to 125.

In a vertical bipolar transistor capable of a high-frequency operation, it is preferable to employ a DPSA (Double Polysilicon Self-Align) technique, in which an emitter electrode and a base electrode are partially formed of polycrystalline silicon or amorphous silicon, and a position of an emitter opening is determined in a self-aligning manner.

In the sixth embodiment, therefore, the emitter electrode and the base electrode of the lateral npn bipolar transistor are partially made of silicon films (semiconductor films) of polycrystalline silicon or amorphous silicon. For minute contact sizes, polycrystalline silicon or amorphous silicon is advantageous because it exhibits a small particle diameter and allows easy working, as compared with metal materials.

Figure 125:
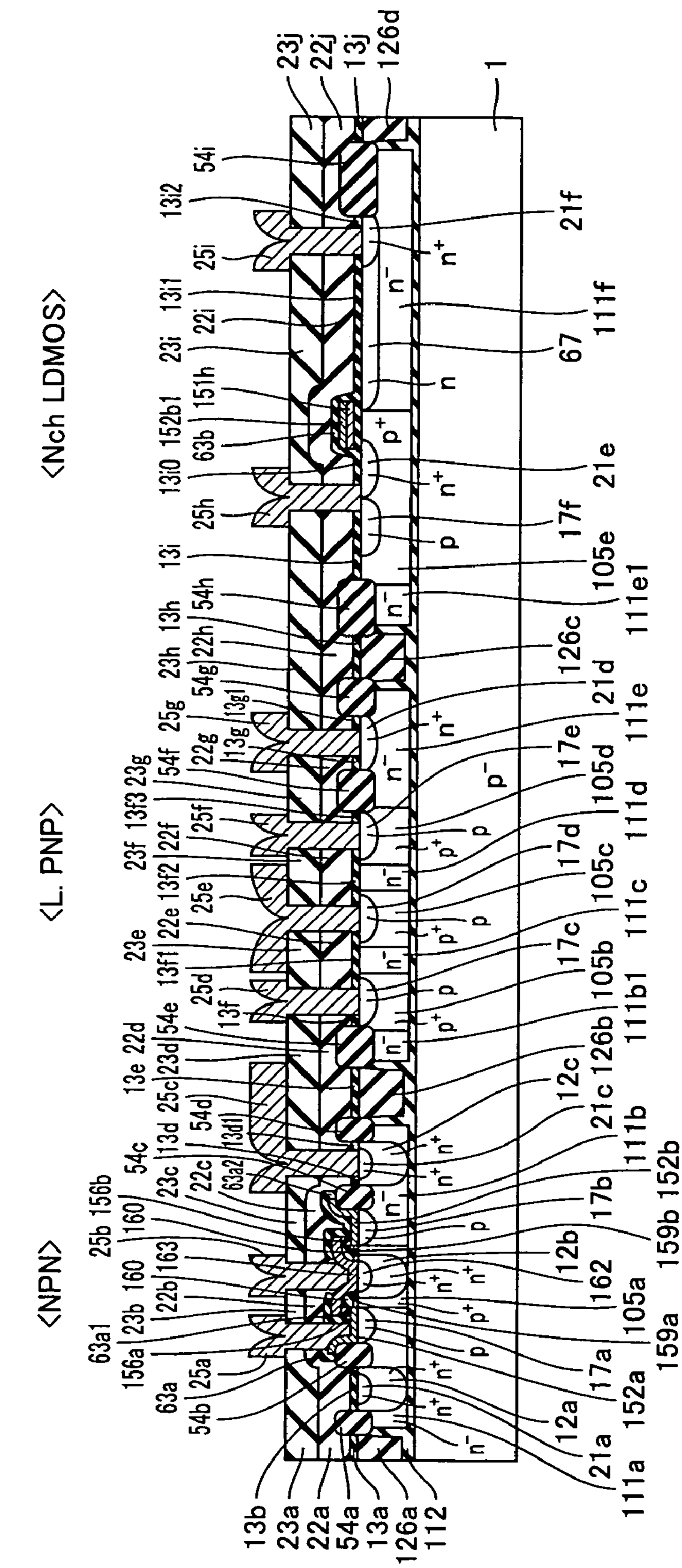
FIG. 125 is a cross section showing a distinctive structure of the semiconductor device according to the sixth embodiment of the invention.

FIG. 125 shows an example of a distinctive structure of a semiconductor device according to a sixth embodiment. In the sixth embodiment, as shown in FIG. 125, an emitter electrode of the lateral npn bipolar transistor is formed of first interconnection 25*b* and an emitter-leading pad layer 163, and a base electrode is formed of first interconnection 25*a* and a base-leading pad layer (152*a* and 152*b*). An $n^+$-diffusion layer (heavily doped impurity diffusion layer) 162 is formed under emitter-leading pad layer 163.

Emitter-leading pad layer 163 extends over the base-leading pad layer (152*a* and 152*b*) with oxide films 156*a*, 156*b* and 160 therebetween, and these oxide films electrically insulate and isolate emitter-leading pad layer 163 from the base-leading pad layer.

The gate electrode of the lateral DMOS transistor is formed of a multilayer structure of the silicon films. By patterning these silicon films, the silicon film forming an upper layer of the gate electrode and the base-leading pad layer are formed. Structures other than the above are basically the same as those in the fifth embodiment.

Referring to FIGS. 106 to 125, description will now be given on a method of manufacturing the semiconductor device according to the sixth embodiment.

Figure 106:
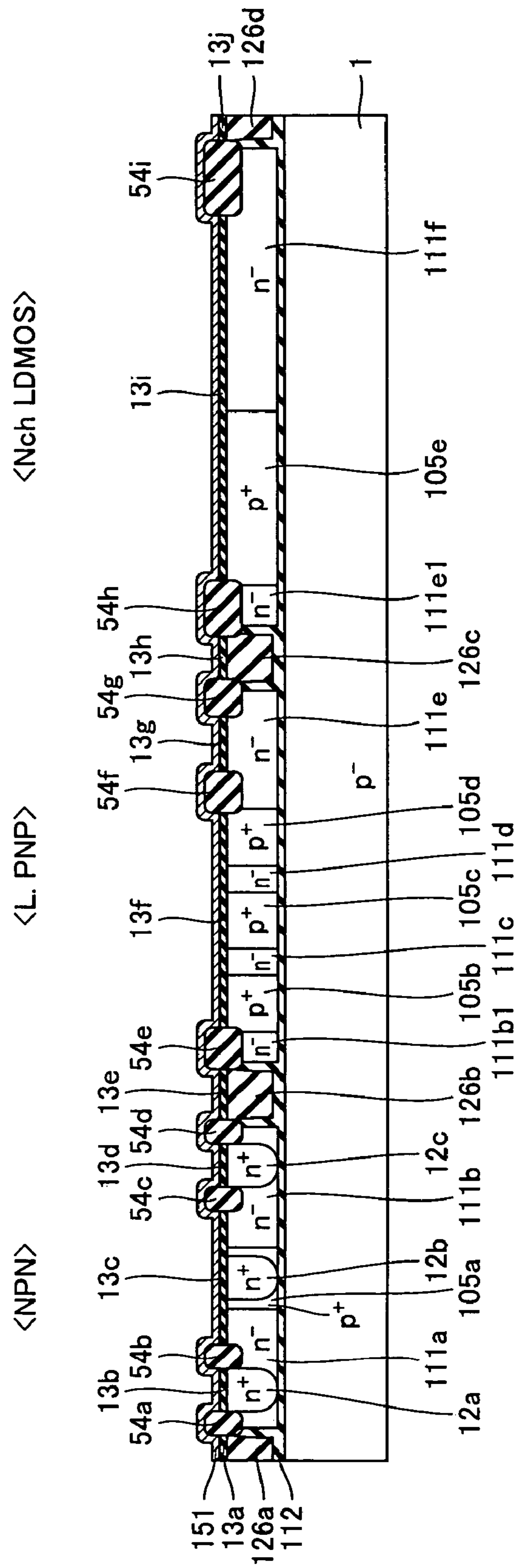
FIGS. 106 to 124 are cross sections showing 1st to 19th steps in the manufacturing process of a semiconductor device according to a sixth embodiment of the invention, respectively.
Figure 107:
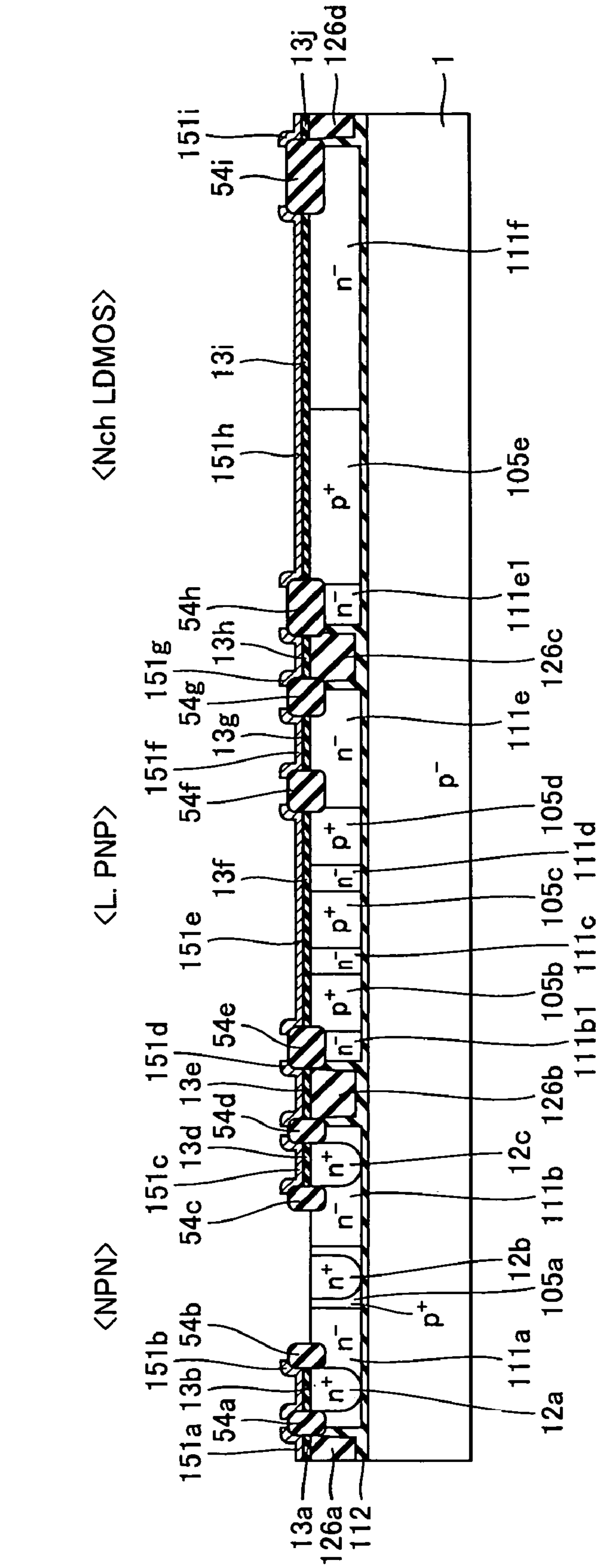

As shown in FIG. 106, structures including thermal oxide films 13*a*–13*j* are formed through steps similar to those in the fifth embodiment. Thereafter, a low pressure CVD method is performed to deposit a silicon film (semiconductor film) 151, which has a thickness, e.g., of about 0.1 $\mu$m and is made of polycrystalline silicon or amorphous silicon doped with phosphorus. A photoresist pattern (not shown) of a predetermined configuration is formed on silicon film 151. Using the photoresist pattern as a mask, silicon film 151 is etched. Thereby, silicon films 151*a*–151*i* are left on the trench isolating region, the collector of the lateral npn bipolar transistor, the lateral pnp bipolar transistor and the lateral DMOS transistor as shown in FIG. 107.

Figure 108:
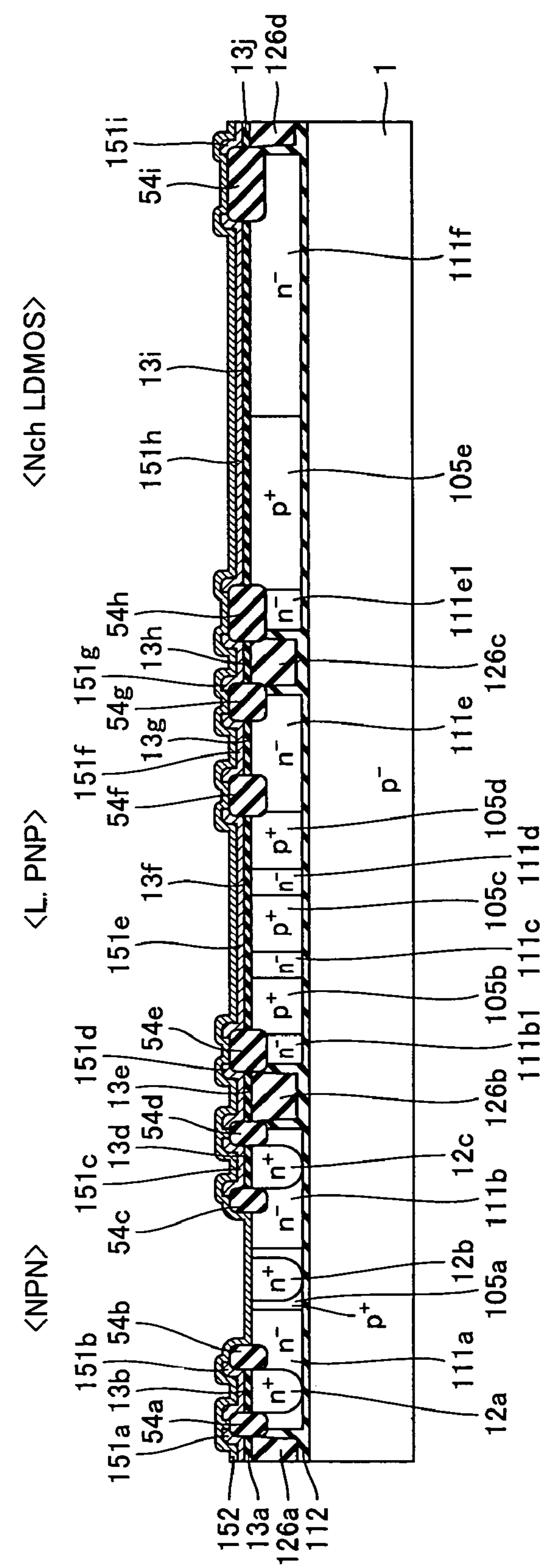

Then, as shown in FIG. 108, processing is performed to deposit a silicon film (semiconductor layer) 152, e.g., of about 0.1 μm in thickness, which is made of polycrystalline silicon or amorphous silicon not doped with impurities.

Figure 109:
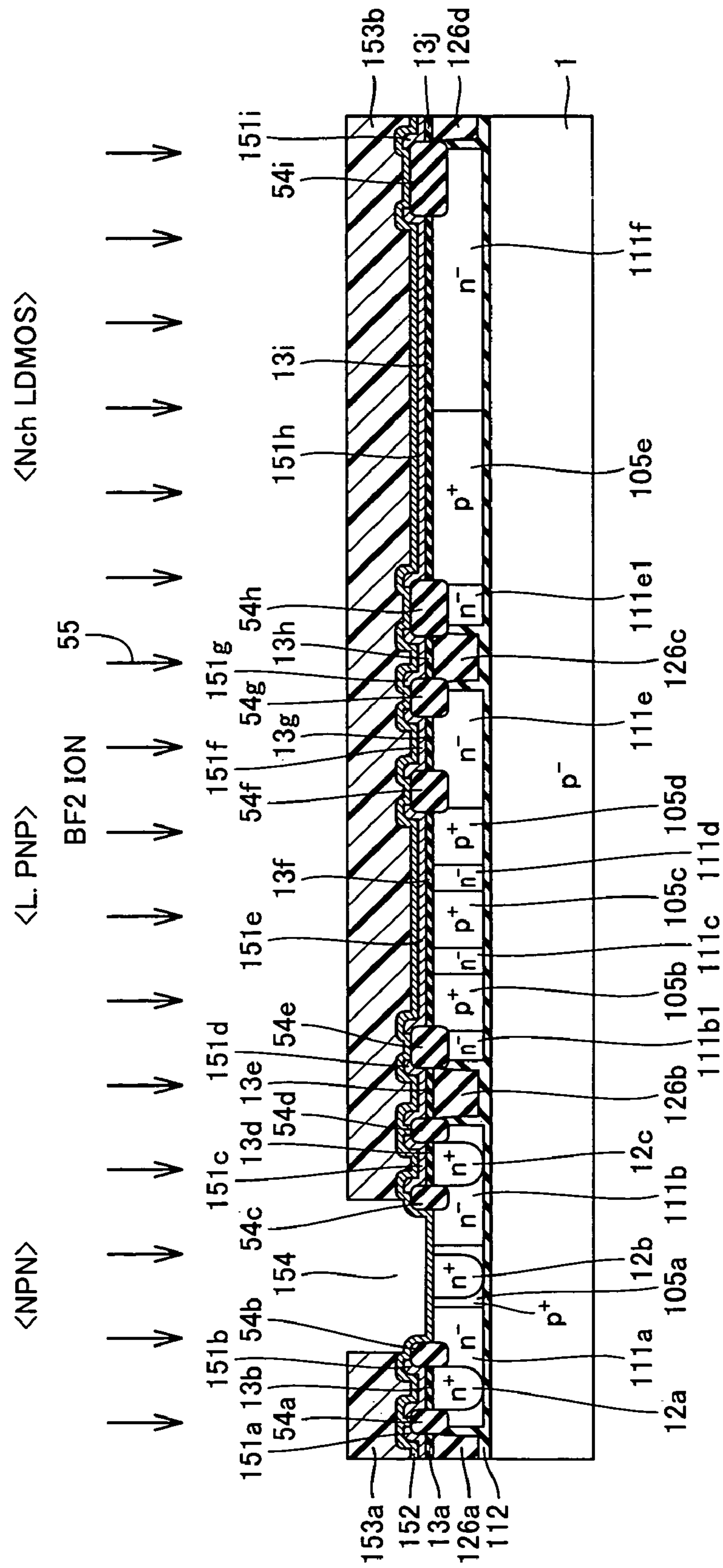

As shown in FIG. 109, photoresist patterns 153*a* and 153*b* having opening 154 located on a region, in which the base and emitter of the lateral npn bipolar transistor are to be formed, is formed on silicon film 152. Using photoresist patterns 153*a* and 153*b* as a mask, p-type impurities 55 such as $BF_2$ ions are introduced into silicon film 152 by an ion implanting method. In this processing, an acceleration voltage is controlled to prevent the implanted ions from penetrating silicon film 152.

The p-type impurity ions may be introduced into silicon film 152 without using a mask. In this case, steps for mask alignment or the like can be eliminated so that the steps can be simplified.

However, silicon film 152 will form a part of the gate electrode of the lateral DMOS transistor. In such a case that phosphorus (n-type impurities) introduced into silicon film 151*h* forming a lower layer is diffused into silicon film 152 for operating it as an n-type gate electrode, it is therefore necessary to determine the concentrations of p-type impurities and phosphorus (n-type impurities) so that the concentration of p-type impurities may be much lower than that of phosphorus (n-type impurities).

Figure 110:
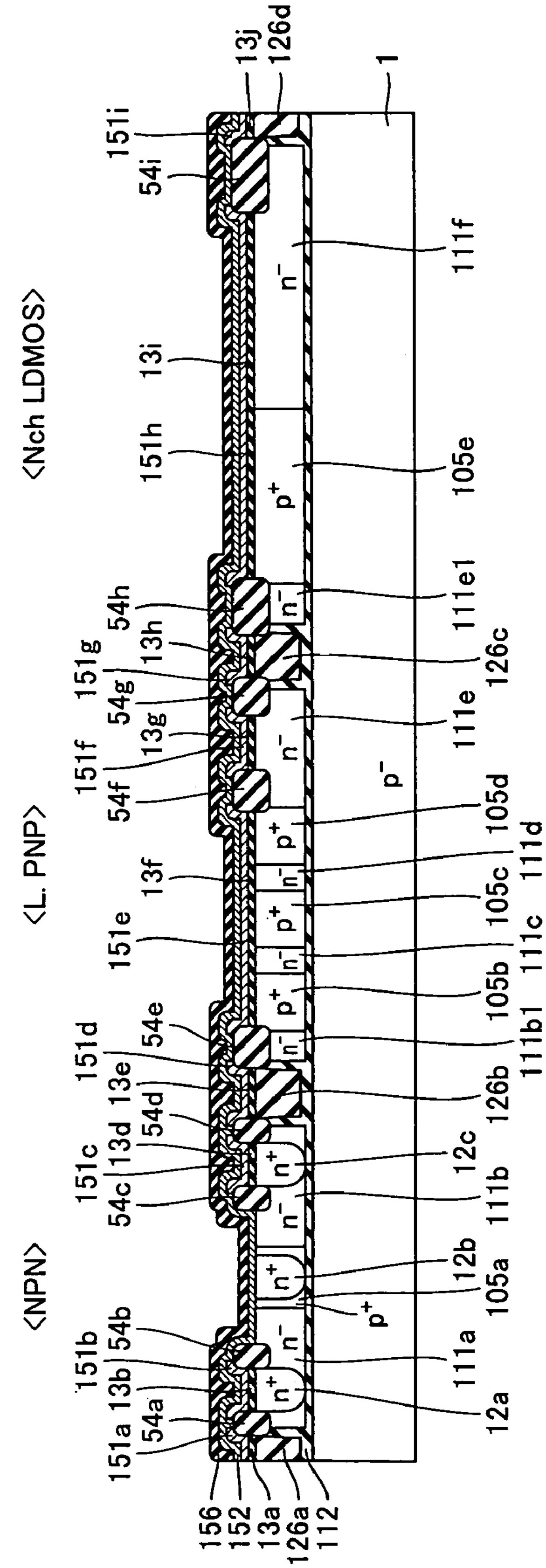
Figure 111:
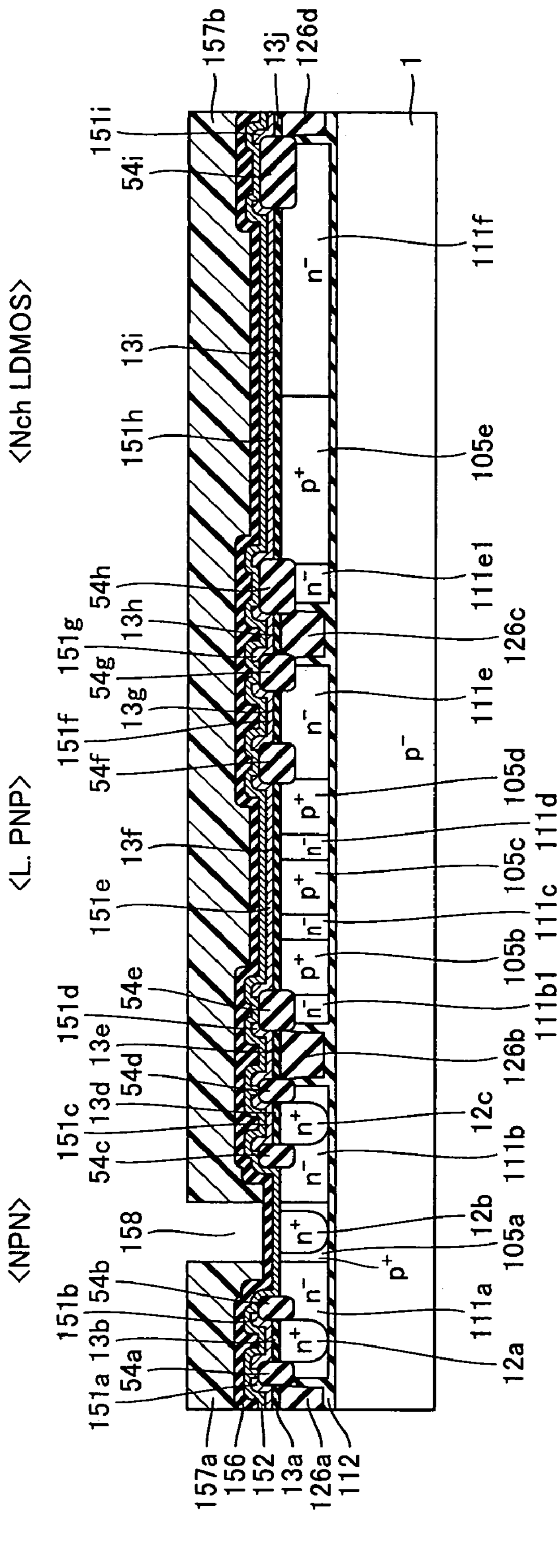

Then, as shown in FIG. 110, a low pressure CVD method is performed to deposit oxide film 156, e.g., of about 0.1 μm in thickness. As shown in FIG. 111, photoresist patterns 157*a* and 157*b* having an opening 158 located on a region (epitaxial growth layer 105*a*), in which the emitter of the lateral npn bipolar transistor is to be formed, is formed on oxide film 156.

Using photoresist patterns 157*a* and 157*b* as a mask, etching is effected on oxide film 156 and silicon film 152. This forms an opening exposing the surface of epitaxial growth layer 105*a*. Around this opening, oxide films 156*a* and 156*b* as well as silicon films 152*a* and 152*b* are left as shown in FIG. 112.

Figure 112:
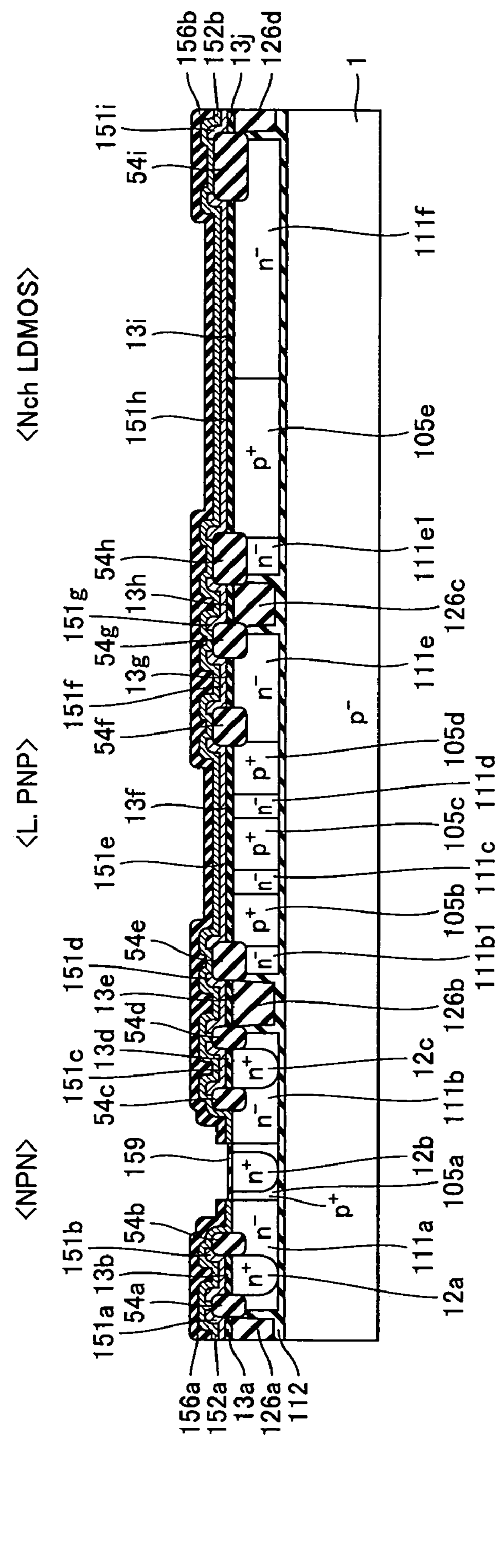
Figure 113:
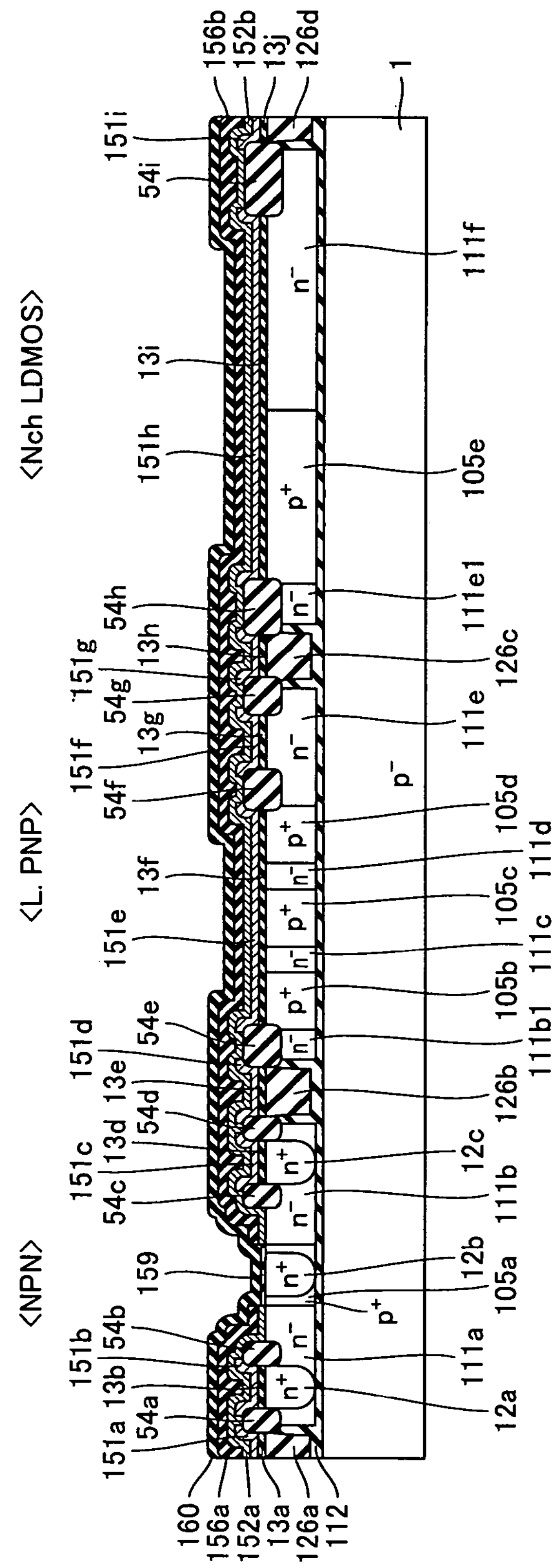

After removing photoresist patterns 157*a* and 157*b*, a thermal oxide film 159, e.g., of about 0.01 μm in thickness is formed at the surface of epitaxial growth layer 105*a* as shown in FIG. 112. Thereafter, as shown in FIG. 113, a low pressure CVD method is performed to deposit an oxide film 160, e.g., of about 0.1 μm in thickness.

Figure 114:
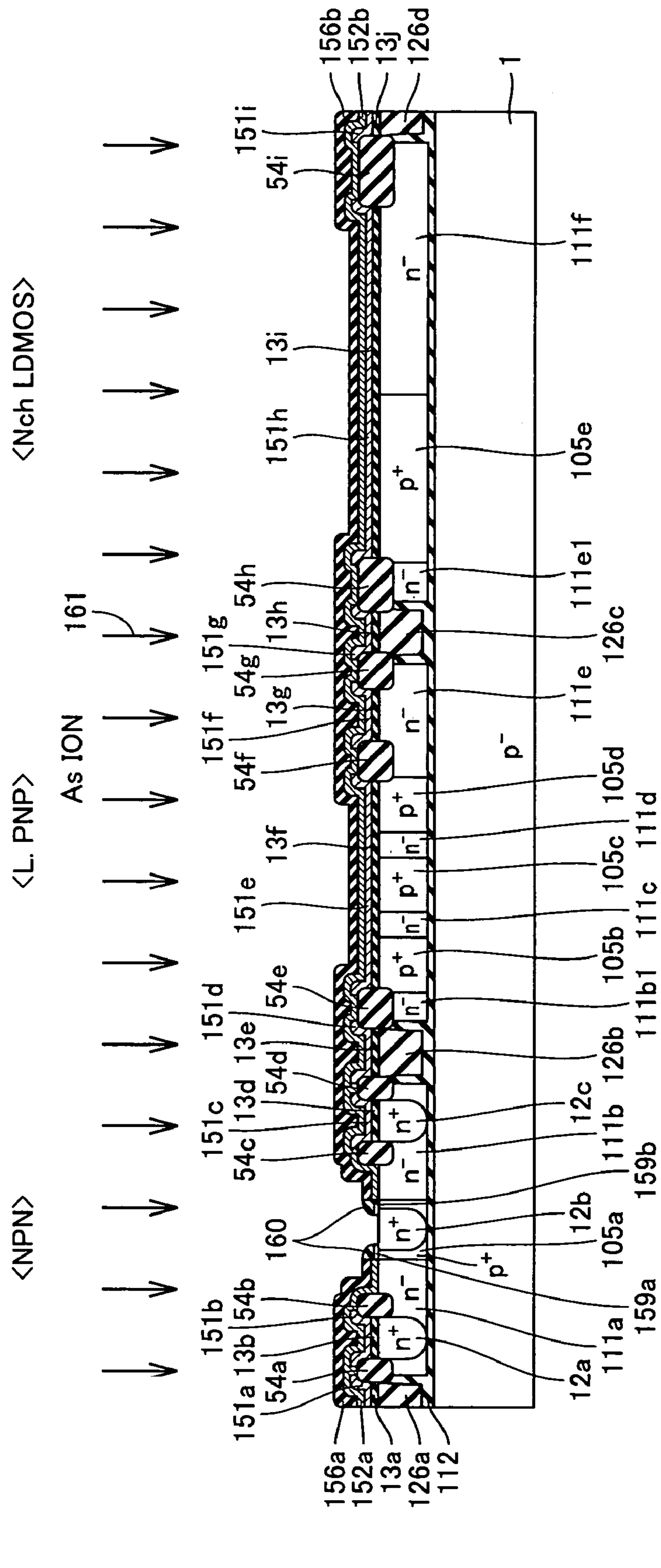

Then, as shown in FIG. 114, etching is effected on oxide film 160 and thermal oxide film 159 by an RIE method to form an opening exposing the surface of epitaxial growth layer 105*a*. Thereby, a sidewall insulating film made of oxide film 160 is formed on sidewalls of oxide films 156*a* and 156*b* defining the opening.

Figure 115:
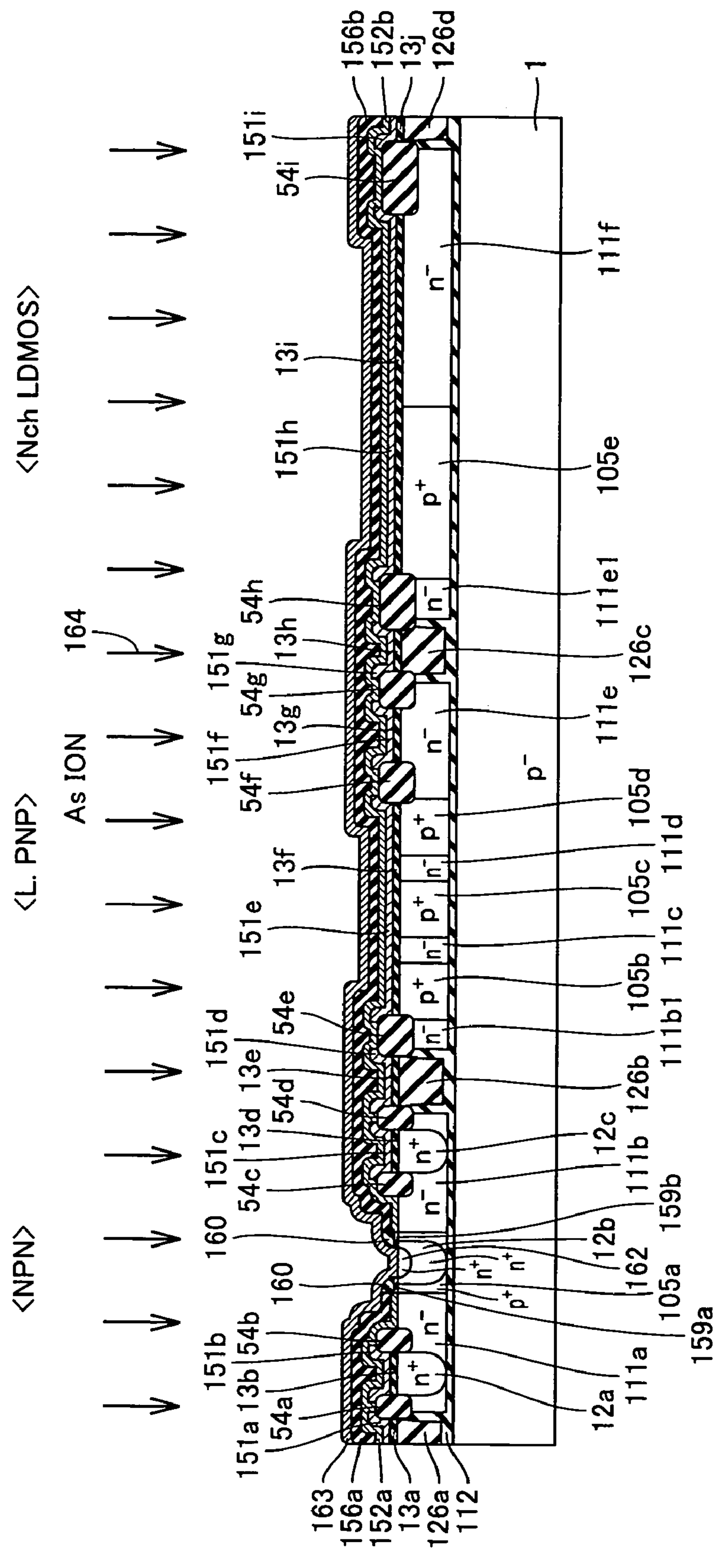

Using oxide films 156*a* and 156*b* as a mask, arsenic ions are introduced into the surface of epitaxial growth layer 105*a*. Thereafter, thermal processing is performed to form $n^+$-diffusion layer 162 forming the emitter of the lateral npn bipolar transistor at the surface of epitaxial growth layer 105*a* (i.e., the surface of $n^+$-diffusion layer 12*b*)as shown in FIG. 115.

Figure 116:
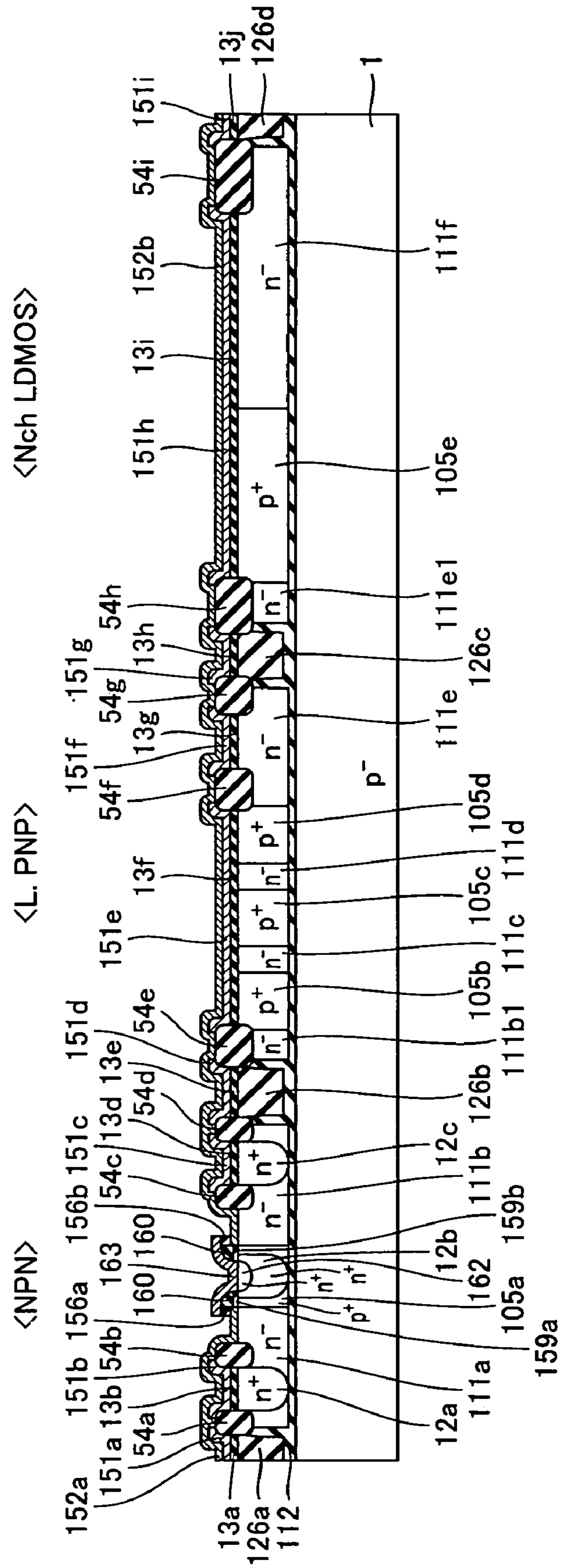

Then, a low pressure CVD method is performed to deposit a silicon film (semiconductor film) 163, e.g., of about 0.1 μm in thickness made of polycrystalline silicon or amorphous silicon. Then, arsenic ions are implanted into silicon film 163. A photoresist pattern of a predetermined configuration is formed on silicon film 163, and etching is effected on silicon film 163 and oxide films 156*a* and 156*b* masked with this photoresist pattern by an RIE method. Thereby, as shown in FIG. 116, silicon film 163 and oxide films 156*a* and 156*b* are patterned to form a pad layer 163 for leading out the emitter. Oxide films 156*a* and 156*b* remain under emitter-leading pad layer 163.

Figure 117:
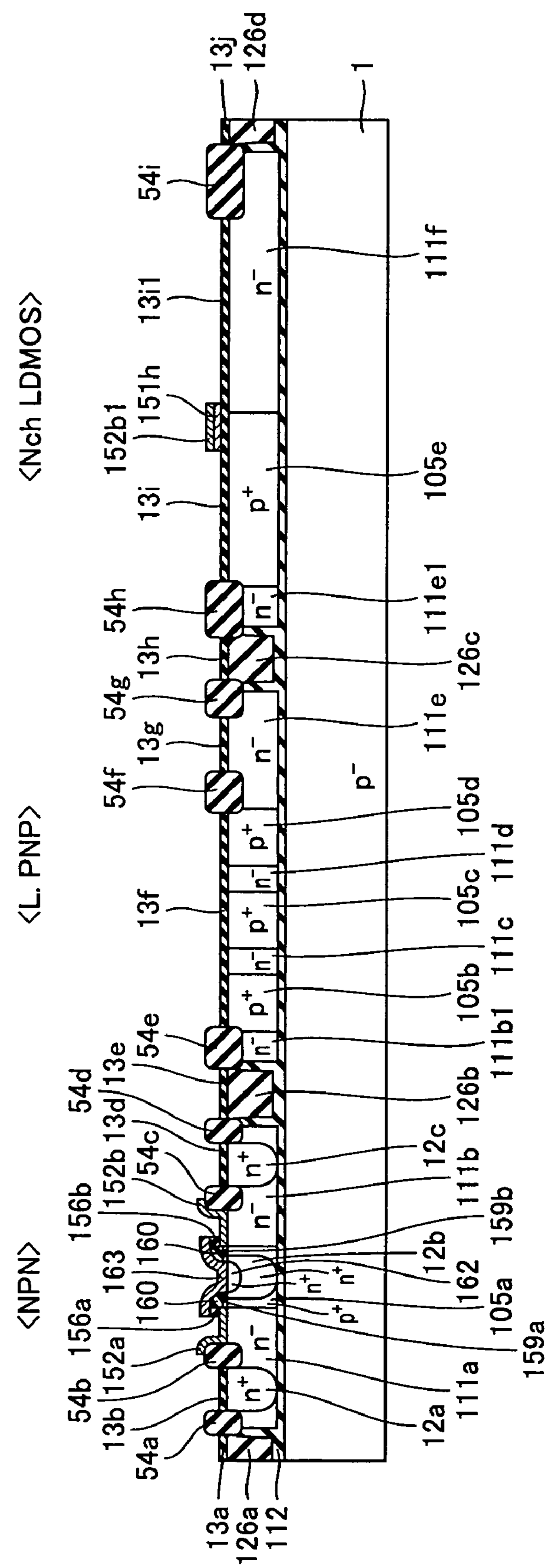

Then, a photoresist pattern of a predetermined configuration is formed on silicon films 152*a* and 152*b*, and etching is effected on silicon films 152*a* and 152*b* masked with this photoresist pattern by an RIE method. Thereby, silicon films 152*a* and 152*b* are patterned to form pad layer (152*a* and 152*b*) for leading out the base as shown in FIG. 117. By this processing, a multilayer structure of silicon films 151*h* and 152*b*1 is left on epitaxial growth layer 105*e*. This multilayer structure forms the gate electrode of the lateral DMOS transistor. Thereafter, photoresist pattern is removed.

Figure 118:
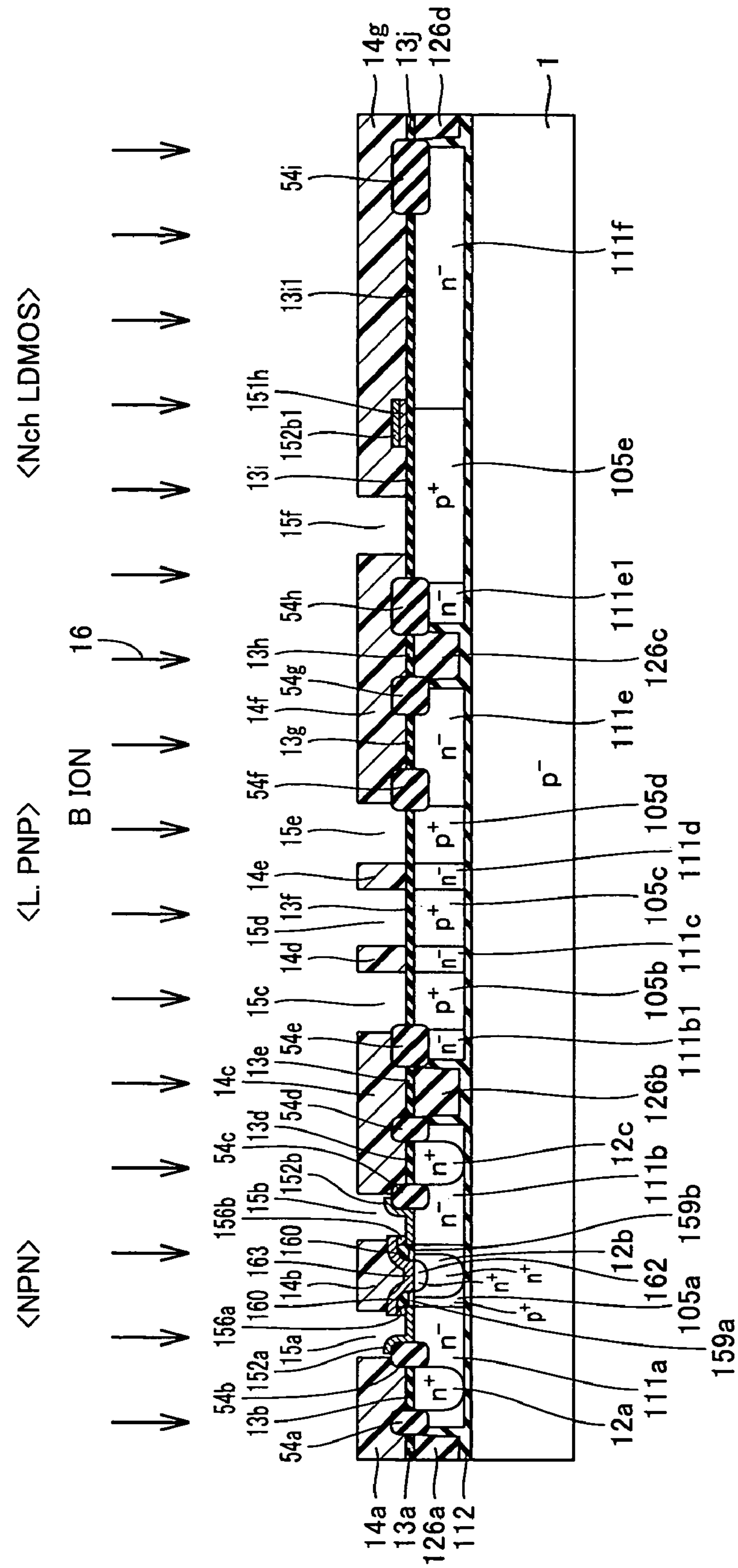

As shown in FIG. 118, processing is then performed to form photoresist patterns 14*a*–14*g* having openings 15*a* and 15*b* located on a region, in which the base-leading layer (17*a* and 17*b*) of the lateral npn bipolar transistor is to be formed, openings 15*c*–15*e* located on a region, in which p-type diffusion layers 17*c*–17*e* forming the collector and emitter of the lateral pnp bipolar transistor are to be formed, and opening 15*f* located on a region, in which p-type diffusion layer 17*f* forming the back gate of the lateral DMOS transistor is to be formed. Using photoresist patterns 14*a*–14*g* as a mask, boron ions are introduced by an ion implanting method into $n^-$-silicon substrates 111*a* and 111*b* as well as epitaxial growth layers 105*b*, 105*c*, 105*d* and 105*e*.

Figure 119:
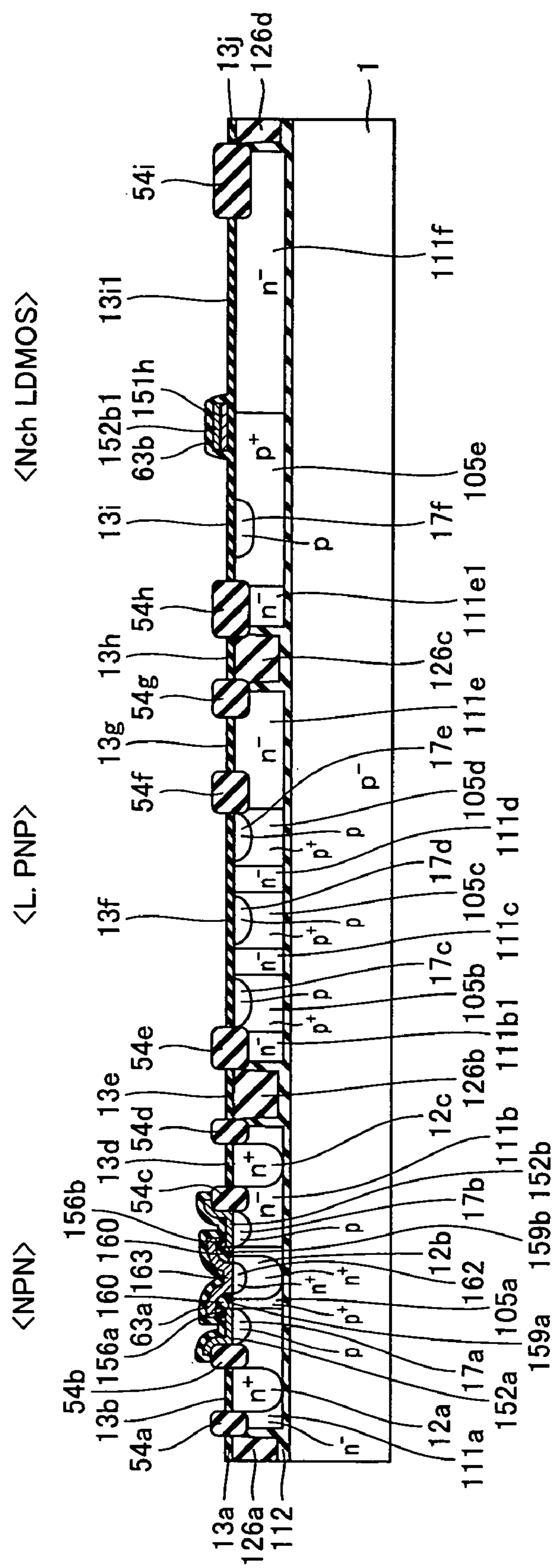

After removing photoresist patterns 14*a*–14*g*, thermal processing is performed. This forms p-type diffusion layers 17*a*–17*f* as shown in FIG. 119. Thus, the thermal processing simultaneously forms the base of the lateral npn bipolar transistor, the collector and emitter of the lateral pnp bipolar transistor, and the back gate of the lateral DMOS transistor.

This thermal processing also forms thermal oxide film 63*a* covering emitter-leading pad layer 163 and the base-leading pad layer (152*a* and 152*b*), and forms thermal oxide film 63*b* covering the gate electrode (151*h* and 152*b*1) of the lateral DMOS transistor.

Figure 120:
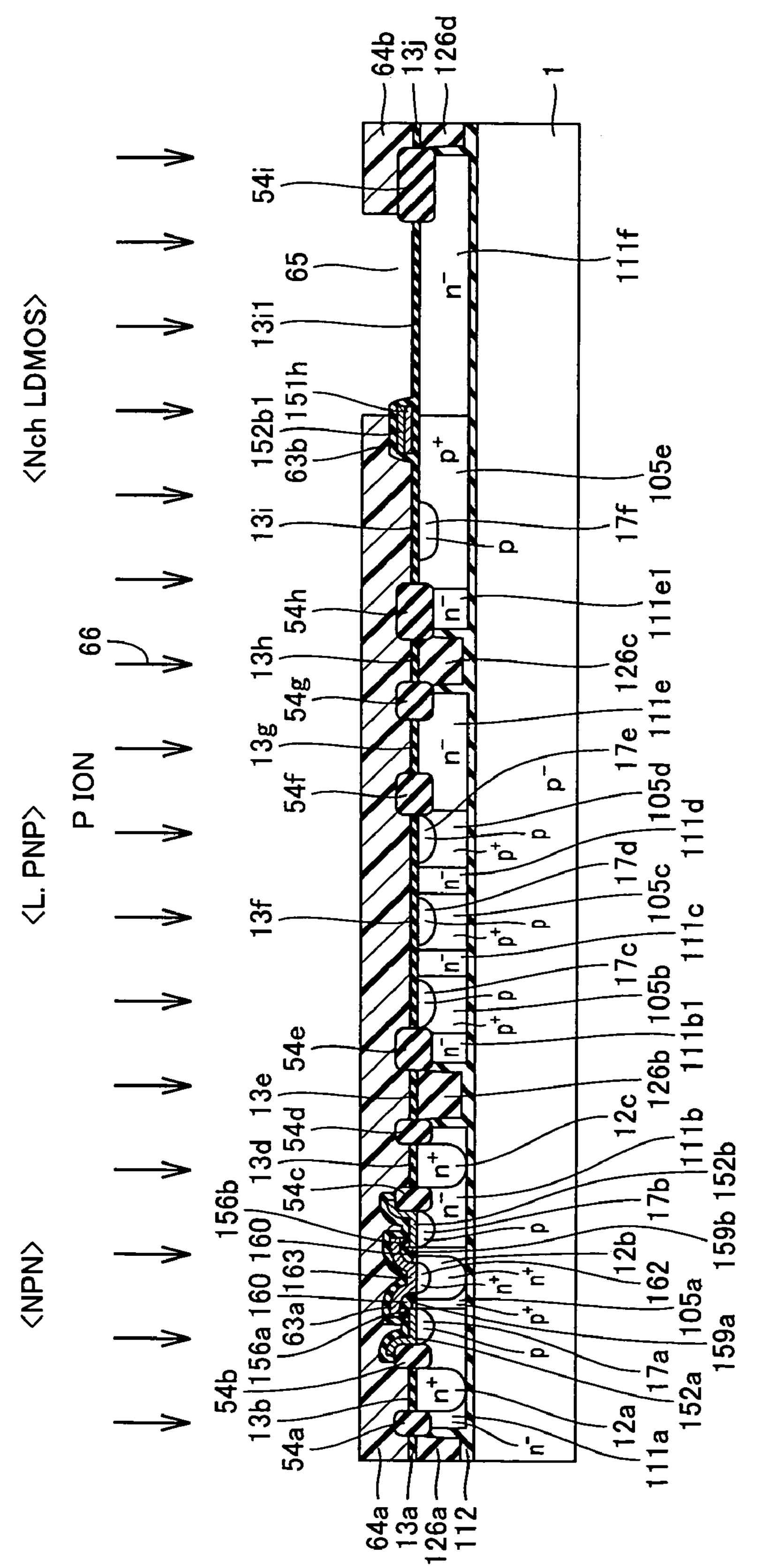
Figure 121:
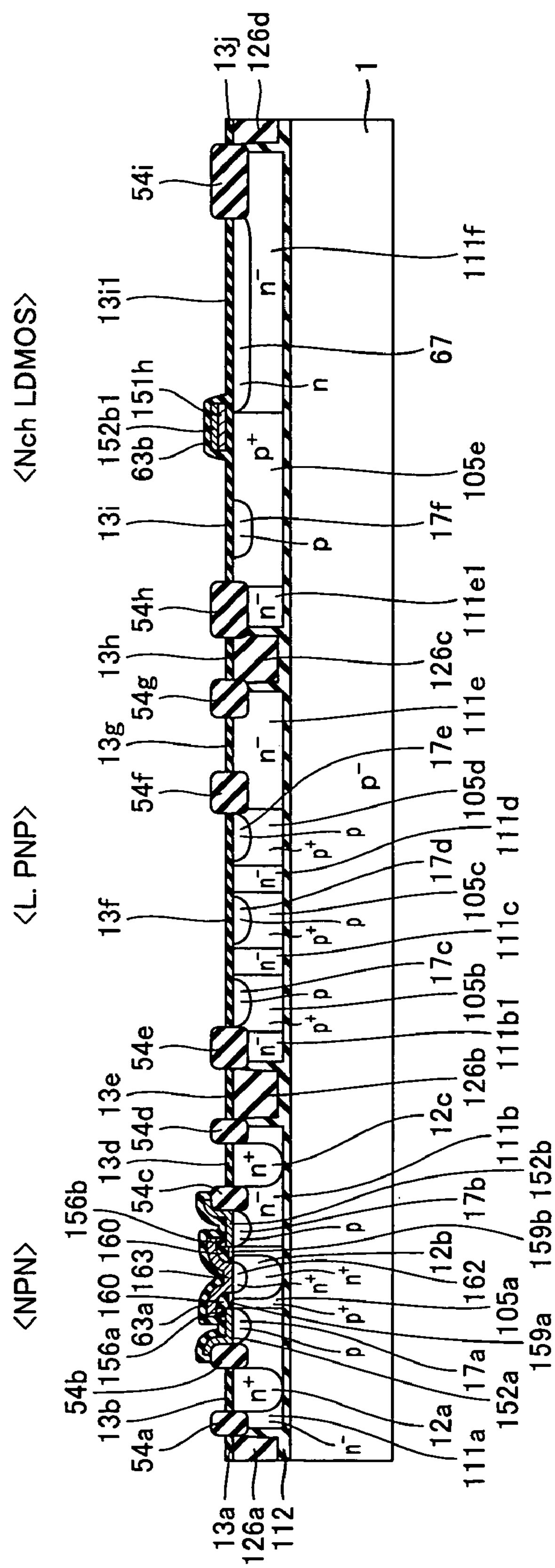

As shown in FIG. 120, photoresist patterns 64*a* and 64*b* having opening 65 are formed on a region, in which the drain of the lateral DMOS transistor is to be formed. Using photoresist patterns 64*a* and 64*b* as a mask, phosphorus ions 66 are introduced into $n^-$-silicon substrate 111*f* by an ion implanting method. After removing photoresist patterns 64*a* and 64*b*, thermal processing is performed. This forms n-type diffusion layer ($n^-$-drain) 67 as shown in FIG. 121.

Figure 122:
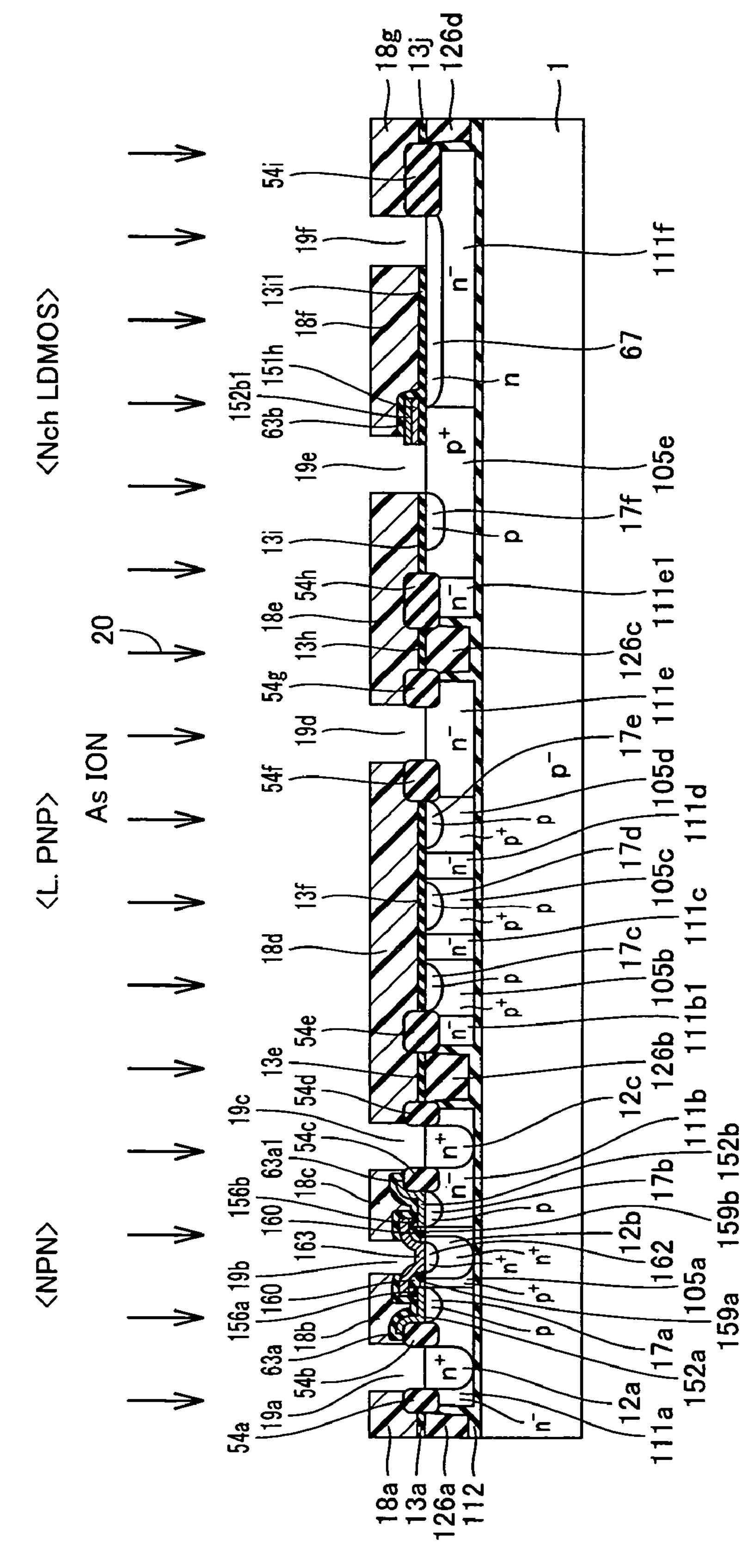

As shown in FIG. 122, processing is performed to form photoresist patterns 18*a*–18*g* having openings located on $n^+$-diffusion layers 12*a*–12*c* of the lateral npn bipolar transistor, on a region, in which the base of the lateral npn bipolar transistor is to be formed, and on regions, in which the source and drain of the lateral DMOS transistor are to be formed. Etching is effected on thermal oxide films 13*b*, 63*a*, 13*d*, 13*g*, 13*i* and 13*i*1 masked with photoresist patterns 18*a*–18*g* to form openings 19*a*–19*f*.

Figure 123:
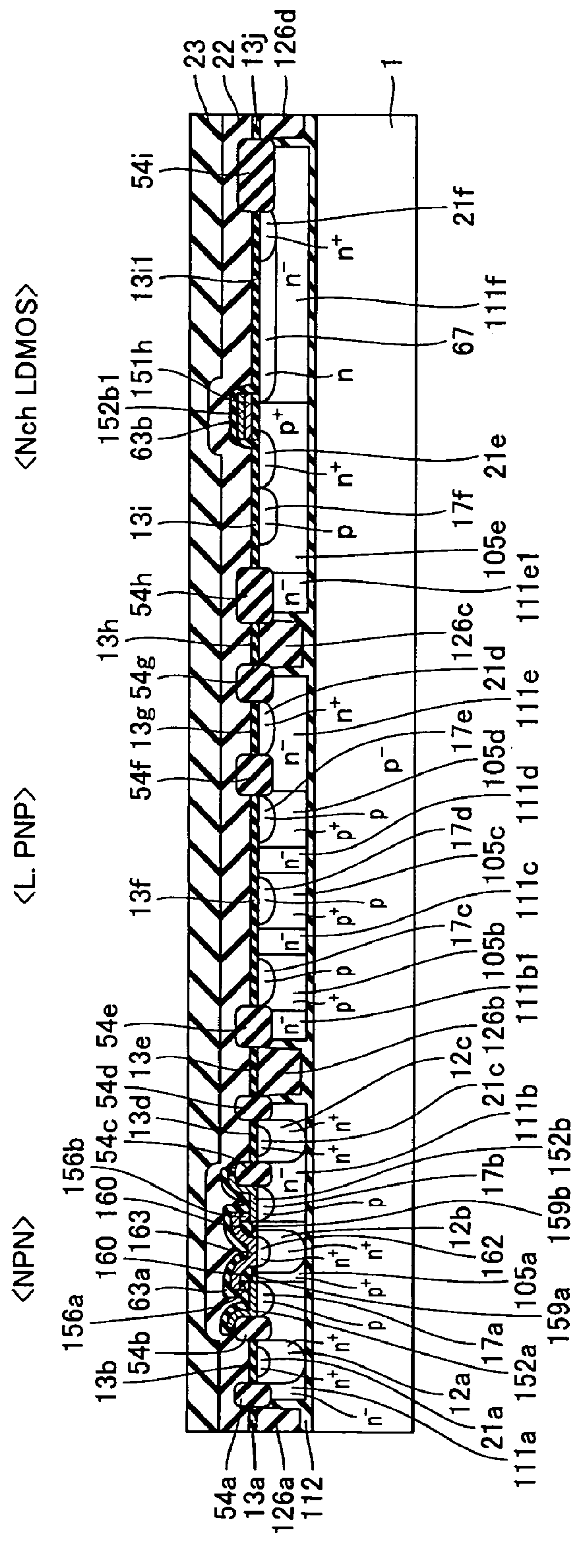

Using photoresist patterns 18*a*–18*g* as a mask, n-type impurity ions 20 such as arsenic or phosphorus ions are then introduced by an ion implanting method into $n^-$-silicon substrates 111*a*, 111*b*, 111*e* and 111*f*, epitaxial growth layer 105*e* and emitter-leading pad layer 163. After removing photoresist patterns 18*a*–18*g*, thermal processing is performed. This forms $n^+$-diffusion layers 21*a* and 21*c*–21*f* as shown in FIG. 123. Thus, the thermal processing simultaneously forms the collector of the lateral npn bipolar transistor, the base of the lateral pnp bipolar transistor, and the source and drain of the lateral DMOS transistor. This thermal processing also forms a thermal oxide film on implantation openings 19*a*–19*f*.

Then, a CVD method is performed to deposit first interlayer insulating film 22 made of a CVD oxide film, which is, e.g., not doped with impurities and has a thickness of about 0.2 μm. Further, a CVD method is performed to deposit second interlayer insulating film 23 made of a CVD oxide film, which is doped with, e.g., boron and phosphorus, and has a thickness of about 0.6 μm. Thereafter, appropriate thermal processing is performed to fluidize second interlayer insulating film 23 for flattening the wafer surface.

Figure 124:
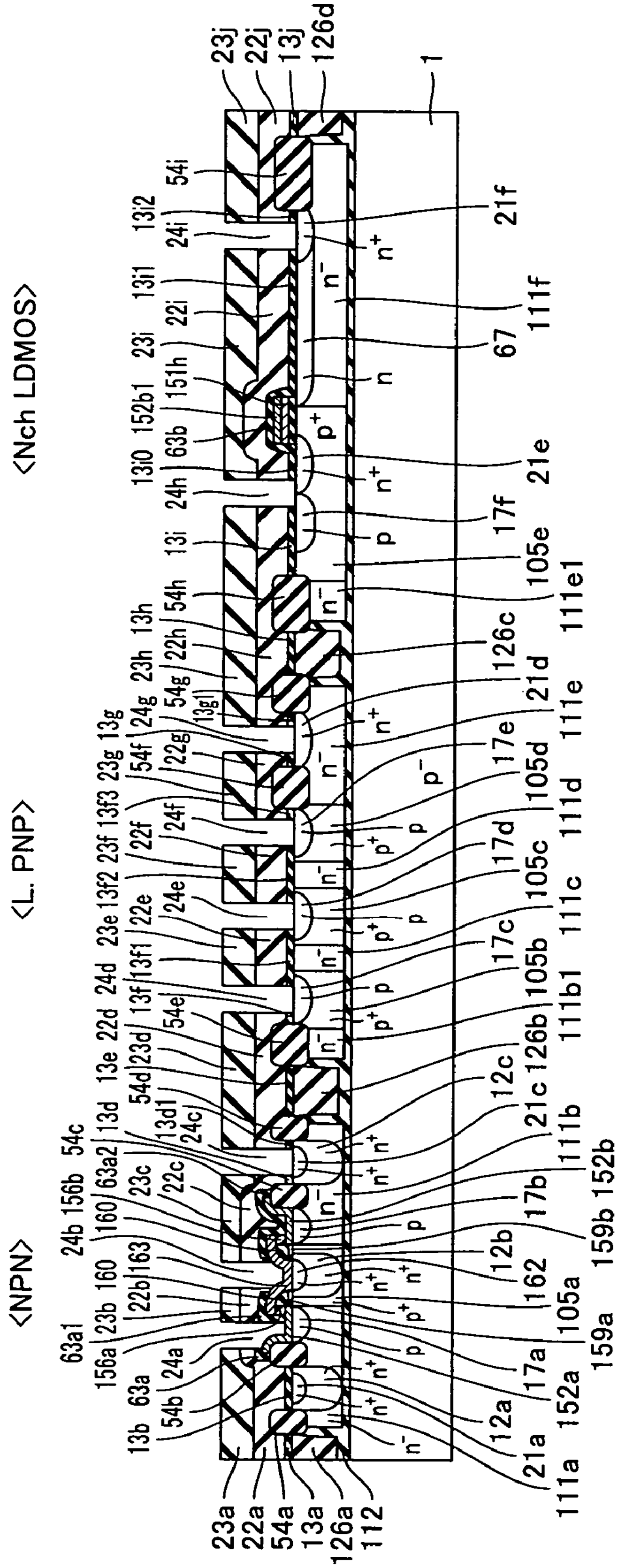

Then, a photoresist pattern (not shown) of a predetermined configuration is formed on second interlayer insulating film 23. Using this photoresist pattern as a mask, dry etching is performed by an RIE method. This forms contact holes 24*a*–24*i* as shown in FIG. 124.

First and second interlayer insulating films 22*a*–22*j* and 23*a*–23*j* remain around contact holes 24*a*–24*i*, and also thermal oxide films 63*a*, 63*a*1, 63*a*2, 13*d*1, 13*f*1, 13*f*2, 13*f*3, 13*g*1, 13*i*0 and 13*i*2 remain. Although not shown, a contact hole for the gate electrode (152*b*1 and 151*h*) is formed at the same time.

Then, a sputtering method or the like is performed to form a metal film, which is, e.g., about 0.6 μm in thickness and is made of AlSi, AlCu or the like, over the whole surface. By patterning the metal film, first interconnections 25*a*–25*i* are formed as shown in FIG. 125. Thereafter, the semiconductor device of the sixth embodiment is completed through the steps similar to those in the first embodiment.

(Seventh Embodiment)

A seventh embodiment will now be described with reference to FIGS. 126 to 146.

In the seventh embodiment, the lateral npn bipolar transistor is likewise employed, and a selective epitaxial growth technique of SiGe or SiGe:C is applied to the lateral npn bipolar transistor and the lateral pnp bipolar transistor. In this seventh embodiment, the epitaxial growth layer of SiGe or SiGe:C has a reduced thickness, and the impurity diffusion layers and the electrodes forming the bipolar transistors have devised planar configurations.

Figure 146:
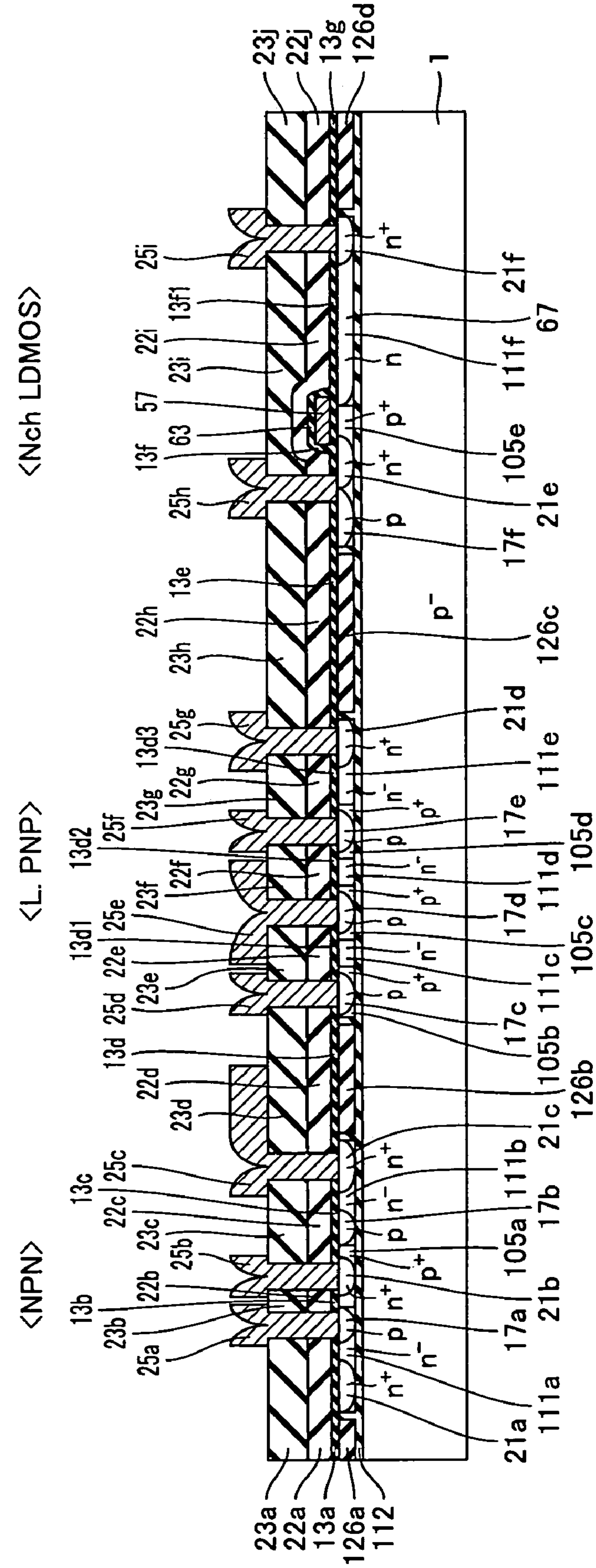
FIG. 146 is a cross section showing a distinctive structure of the semiconductor device according to the seventh embodiment of the invention.

In the seventh embodiment, as shown in FIG. 146, epitaxial growth layers 105*a*–105*e* of SiGe or SiGe:C and $n^-$-silicon substrates 111*a*–111*f* have reduced thicknesses in a range from about 0.2 μm to about 0.4 μm. This facilitates working and processing (opening, filling and others) of the trenches. Also, provision of $n^+$-diffusion layers 12*a*–12*c* is eliminated. This can reduce steps. Further, $n^+$-diffusion layers 21*a*–21*f* and p-type diffusion layers 17*a*–17*f* reach thermal oxide film 112, which is the buried insulating film. Thereby, the lateral transistor can be formed.

Figure 141:
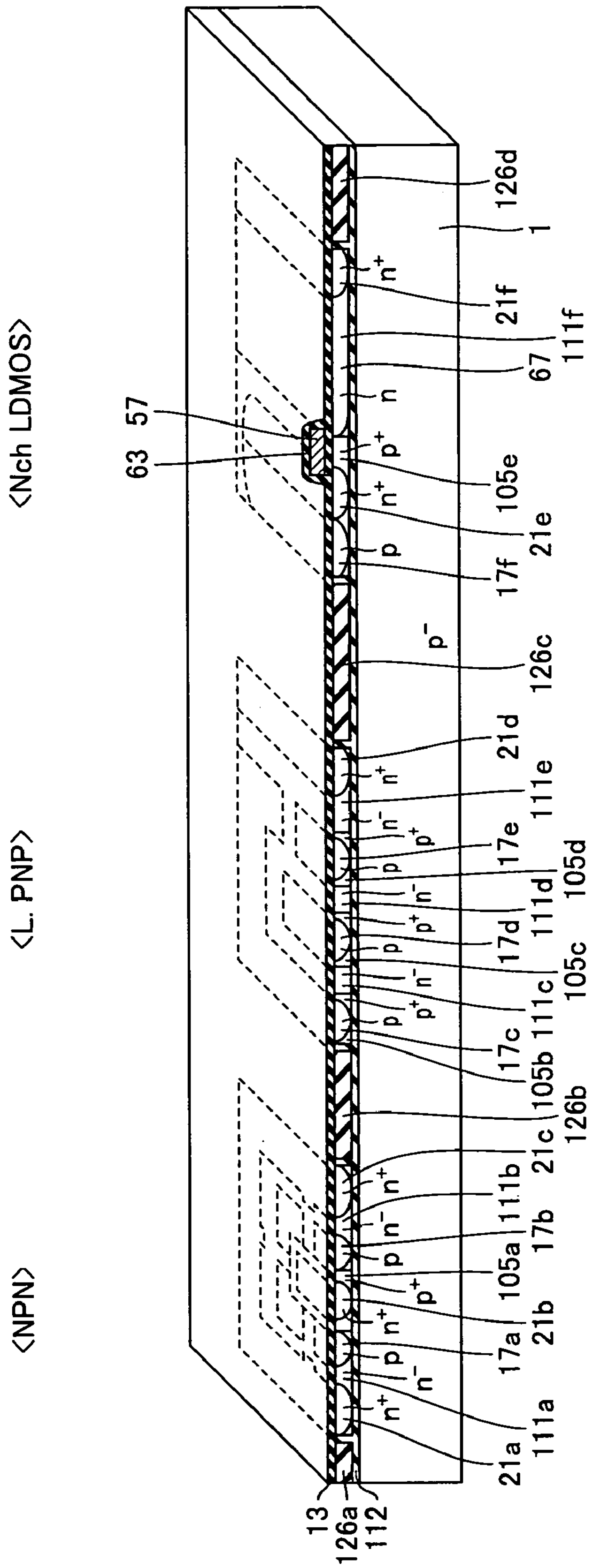
Figure 142:
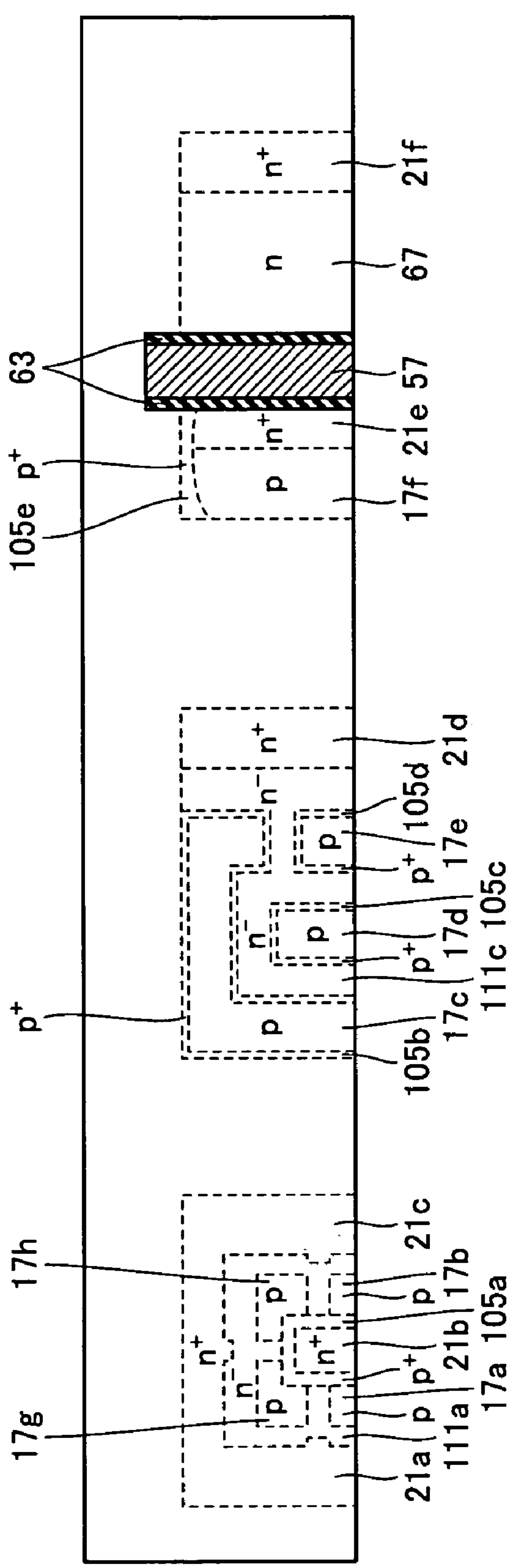
FIG. 142 is a plan of the semiconductor device shown in FIG. 141.

Further, as shown in FIGS. 141 and 142, $n^+$-diffusion layers 21*a* and 21*c* form the collector of the lateral npn bipolar transistor, and p-type diffusion layers 17*a*, 17*b*, 17*g* and 17*h* form the base of the lateral npn bipolar transistor. In the example of FIG. 142, p-type diffusion layers 17*a*, 17*b*, 17*g* and 17*h* are arranged on the four corners of epitaxial growth layer 105*a*. In this manner, the plurality of p-type diffusion layers 17*a*, 17*b*, 17*g* and 17*h* spaced from each other are arranged along the outer periphery of epitaxial growth layer 105*a* so that true base 105*a* can be opposed to collectors 21*a* and 21*c*. Since external base (17*a*, 17*b*, 17*g* and 17*h*) are electrode-leading layers of true base 105*a*, these portions do not substantially affect the transistor operation.

As shown in FIG. 142, $n^+$-diffusion layers 21*a* and 21*c* partially protrude inward (i.e., toward $p^+$-diffusion layer 105*a*). For ensuring an intended collector-base breakdown voltage, collectors 21 and 21*c*, true base 105*a* and external base (17*a*, 17*b*, 17*g* and 17*h*) are spaced by different distances. By partially protruding the collector, it is possible to determine the distance from the collector to the external base and the distance from the collector to the true base independently of each other.

Epitaxial growth layers 105*b* and 105*d* are isolated from each other. Each of epitaxial growth layers 105*b* and 105*d* is the collector of the lateral pnp bipolar transistor, and requires the leading electrode. The collector may have a configuration shown in FIG. 102.

Figure 143B:
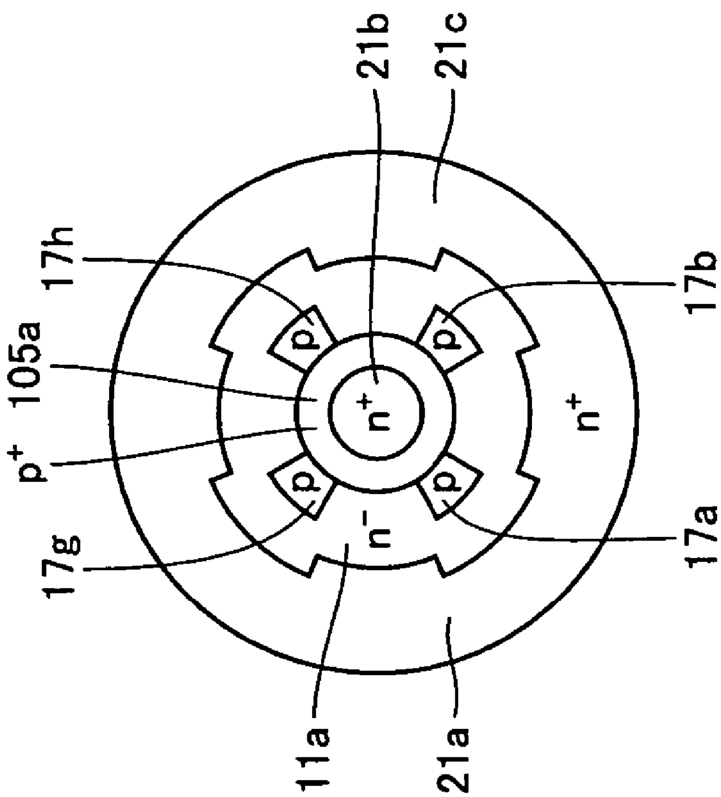
FIGS. 143A and 143B are plans of an npn bipolar transistor in the semiconductor device shown in FIG. 141.
Figure 143A:
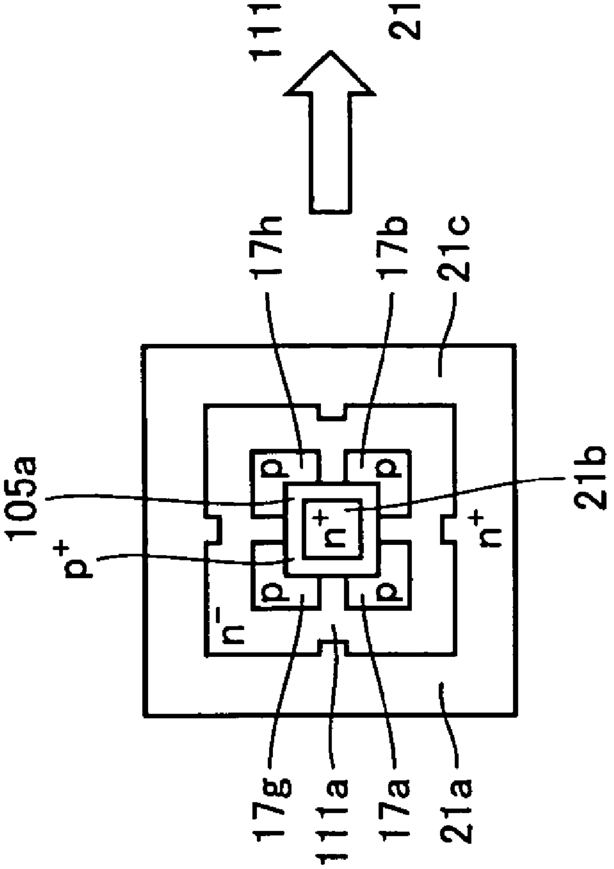

FIGS. 143A and 143B show a modification of a layout of the lateral npn bipolar transistor. As shown in FIGS. 143A and 143B, $n^+$-diffusion layer 21*b* forming the emitter of the lateral npn bipolar transistor has a circular planar form, and each of epitaxial growth layer 105*a*, $n^-$-silicon substrate 111*a* and $n^+$-diffusion layers 21*a* and 21*c* has an annular planar form. Along the outer periphery of epitaxial growth layer 105*a*, p-type diffusion layers 17*a*, 17*b*, 17*g* and 17*h* are arranged with spaces therebetween, and $n^+$-diffusion layers 21*a* and 21*c* located between p-type diffusion layers 17*a*, 17*b*, 17*g* and 17*h* protrude inward.

As described above, the respective regions have substantially concentric outer peripheries so that it is possible to suppress variations in characteristics due to misalignment of masks. Structures other than the above are substantially the same as those of the fifth embodiment.

Referring to FIGS. 126 to 146, description will now be given on a method of manufacturing the semiconductor device according to the seventh embodiment.

Figure 126:
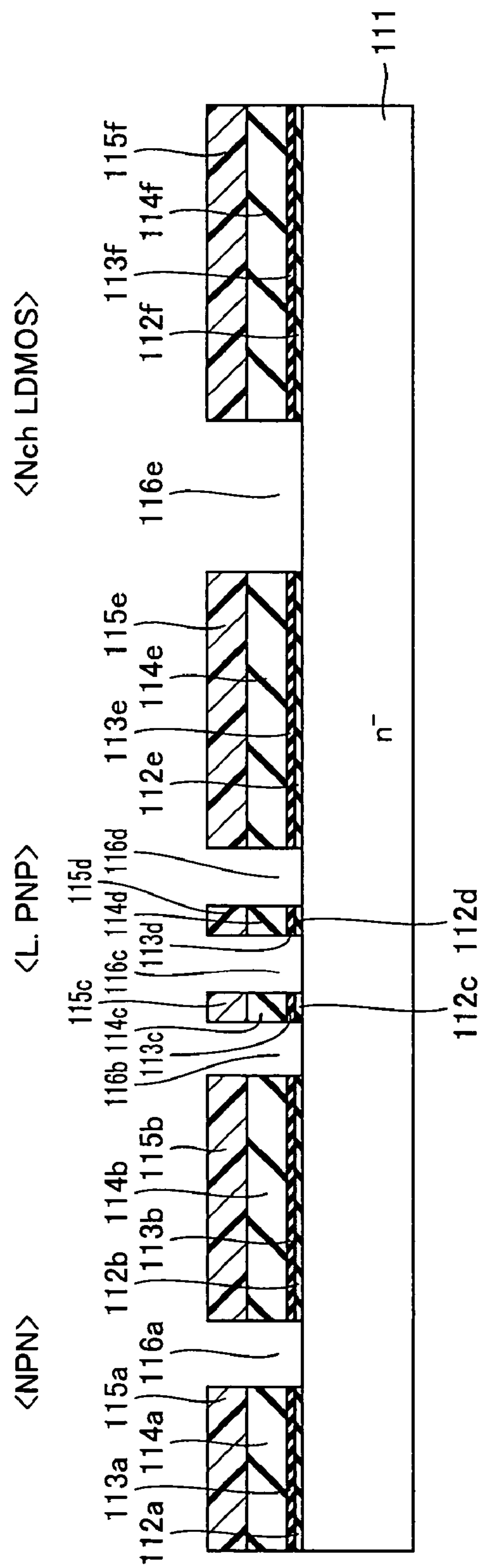
FIGS. 126 to 141 are cross sections showing 1st to 16th steps in the manufacturing process of a semiconductor device according to a seventh embodiment of the invention, respectively.

As shown in FIG. 126, a thermal oxide film, e.g., of about 0.1 μm in thickness is formed on $n^-$-silicon substrate 111, and a nitride film, e.g., of about 0.1 μm in thickness is formed on the thermal oxide film thus formed by a low pressure CVD method. On this nitride film, an oxide film, e.g., of about 1 μm in thickness is formed on this nitride film, and photoresist patterns 115*a*–115*f* are formed on this oxide film.

Using photoresist patterns 115*a*–115*f* as a mask, etching is performed to form openings 116*a*–116*e*. As a result, thermal oxide films 112*a*–112*f*, nitride films 113*a*–113*f* and oxide films 114*a*–114*f* are left around openings 116*a*–116*e*.

Figure 127:
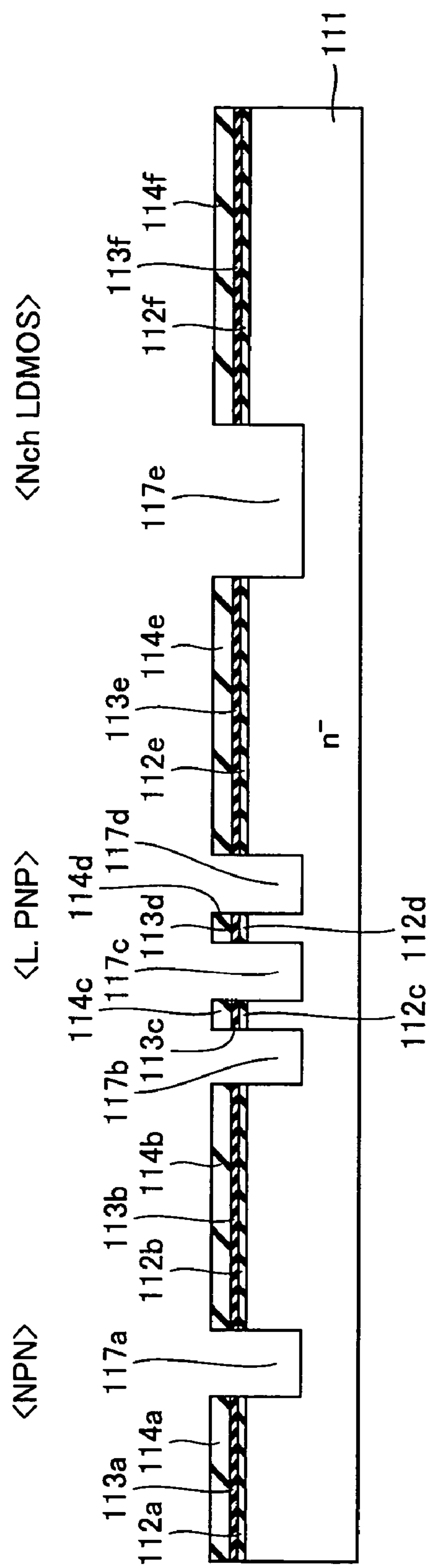

After removing photoresist patterns 115*a*–115*f*, etching is effected on $n^-$-silicon substrate 111 masked with oxide films 114*a*–114*f* by an RIE method. This forms trenches 117*a*–117*e* as shown in FIG. 127. Trenches 117*a*–117*e* have a depth, which is required for the epitaxial growth layer to be formed in a later step, and is, e.g., in a range from about 0.5 μm to about 2 μm.

Figure 128:
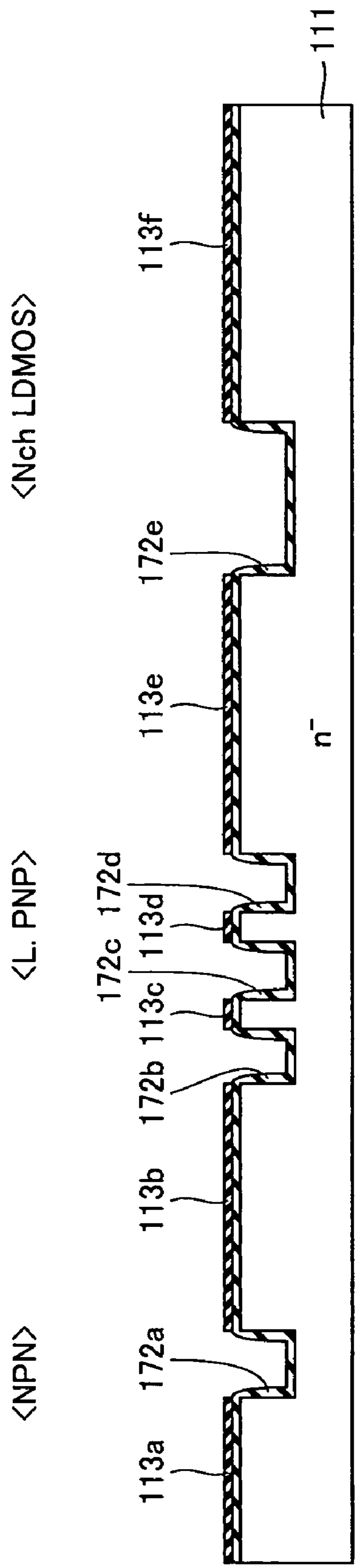

After removing oxide films 114*a*–114*f*, thermal oxidation is performed. This oxidation forms thermal oxide films 172*a*–172*e* of about 0.1 μm in thickness at the surfaces of trenches 117*a*–117*e* as shown in FIG. 128. Thereby, etching damages at the surfaces of trenches 117*a*–117*e* can be removed. Using nitride films 113*a*–113*f* as a mask, etching is then performed to remove thermal oxide films 172*a*–172*e* on trenches 117*a*–117*e*.

Figure 129:
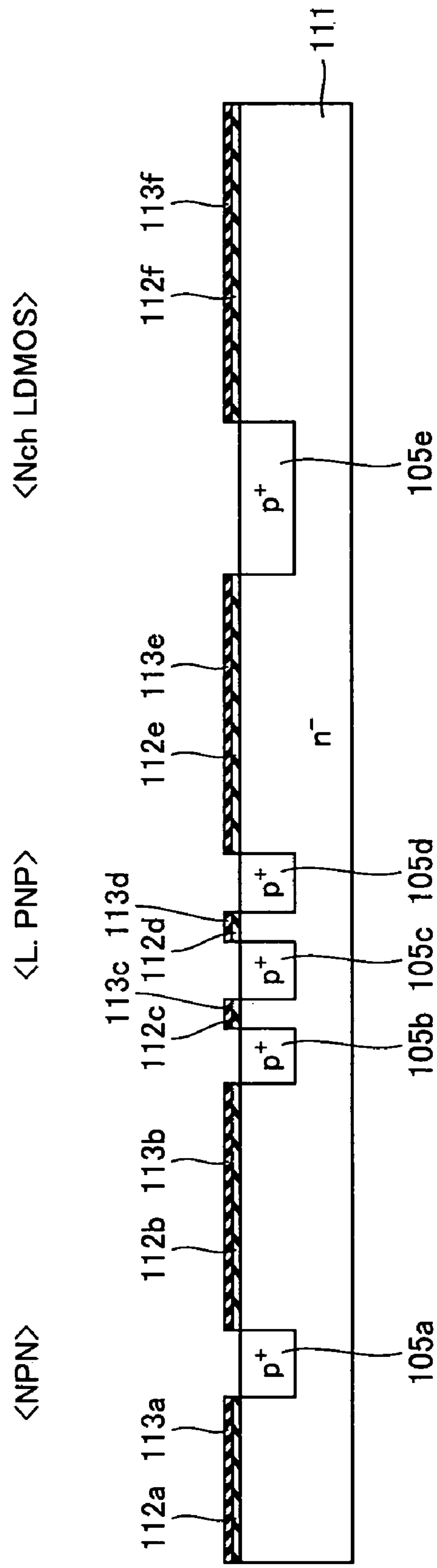

Then, a selective epitaxial growth method is performed to form epitaxial growth layers ($p^+$-epitaxial growth layers) 105*a*–105*e* of SiGe or SiGe:C containing p-type impurities such as boron as shown in FIG. 129. The concentration of p-type impurities contained in epitaxial growth layers 105*a*–105*e* is substantially in a range from about $1\times0^{17}$ $cm^{-3}$ to about $1\times10^{19}$ $cm^{-3}$.

Epitaxial growth layer 105*a* provides a region for forming the base of the lateral npn bipolar transistor, epitaxial growth layers 105*b* and 105*d* provide a region for forming the collector of the lateral pnp bipolar transistor, epitaxial growth layer 105*c* provides a region for forming the emitter of the lateral pnp bipolar transistor, and epitaxial growth layer 105*e* provides a region for forming the p-well of the lateral DMOS transistor.

Figure 130:
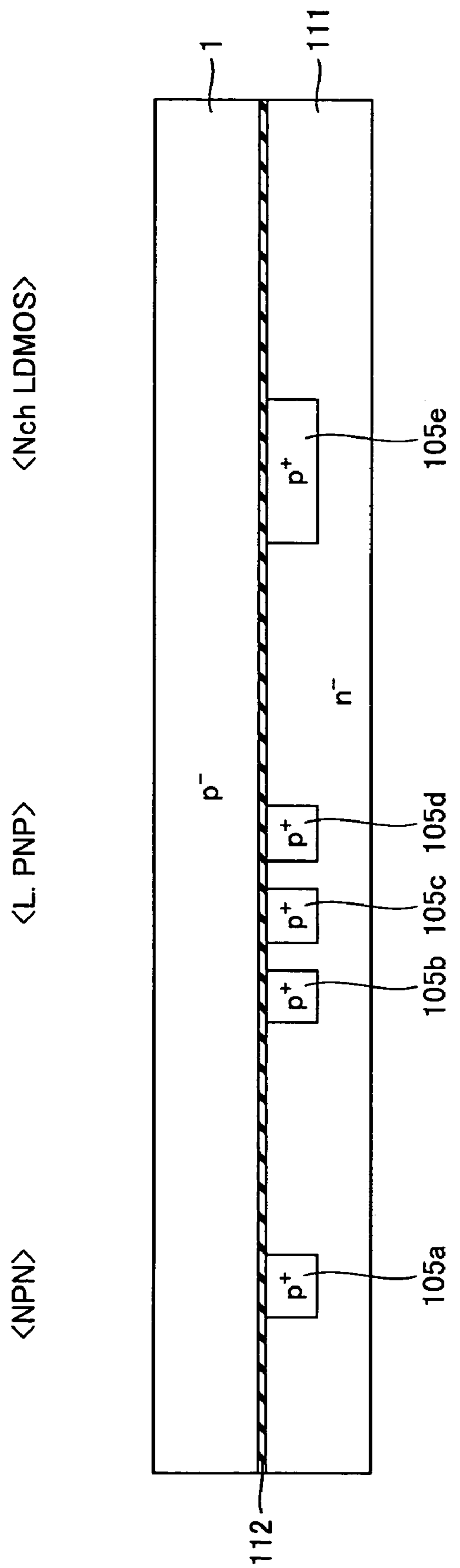

Then, nitride films 113*a*–113*f* and thermal oxide films 112*a*–112*f* are removed. Thereafter, as shown in FIG. 130, $p^-$-silicon substrate 1 provided at its surface with thermal oxide film 112 of about 0.1 μm in thickness is bonded to $n^-$-silicon substrate 111.

Figure 131:
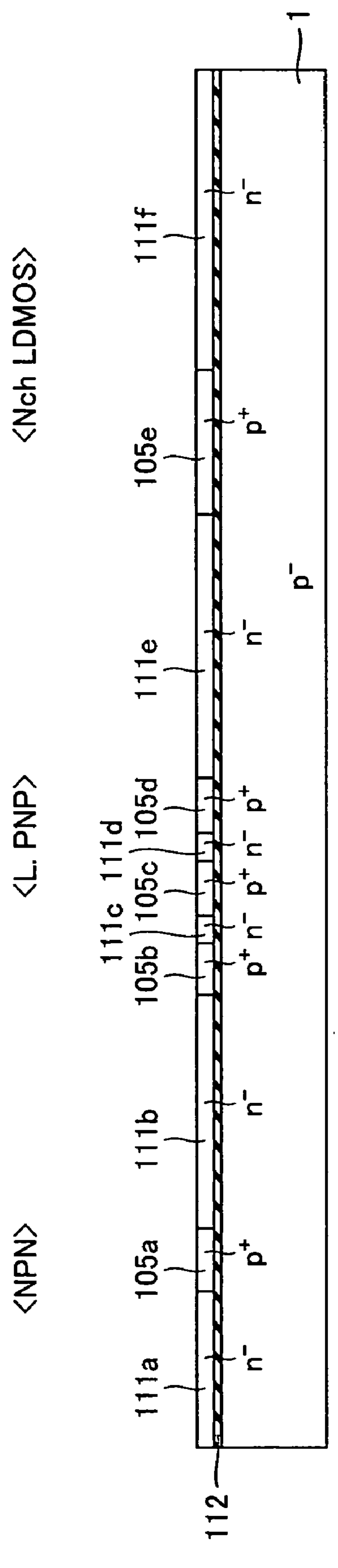

As shown in FIG. 131, the surface of $n^-$-silicon substrate 111 is polished by a CMP method, and this polishing stops when epitaxial growth layers 105*a*–105*e* achieve an intended thickness. According to the seventh embodiment, epitaxial growth layers 105*a*–105*e* have a reduced thickness, e.g., from about 0.2 μm to about 4 μm. Consequently, $n^-$-silicon substrates (semiconductor layers) 111*a*–111*f* are left around epitaxial growth layers 105*a*–105*e*.

Figure 132:
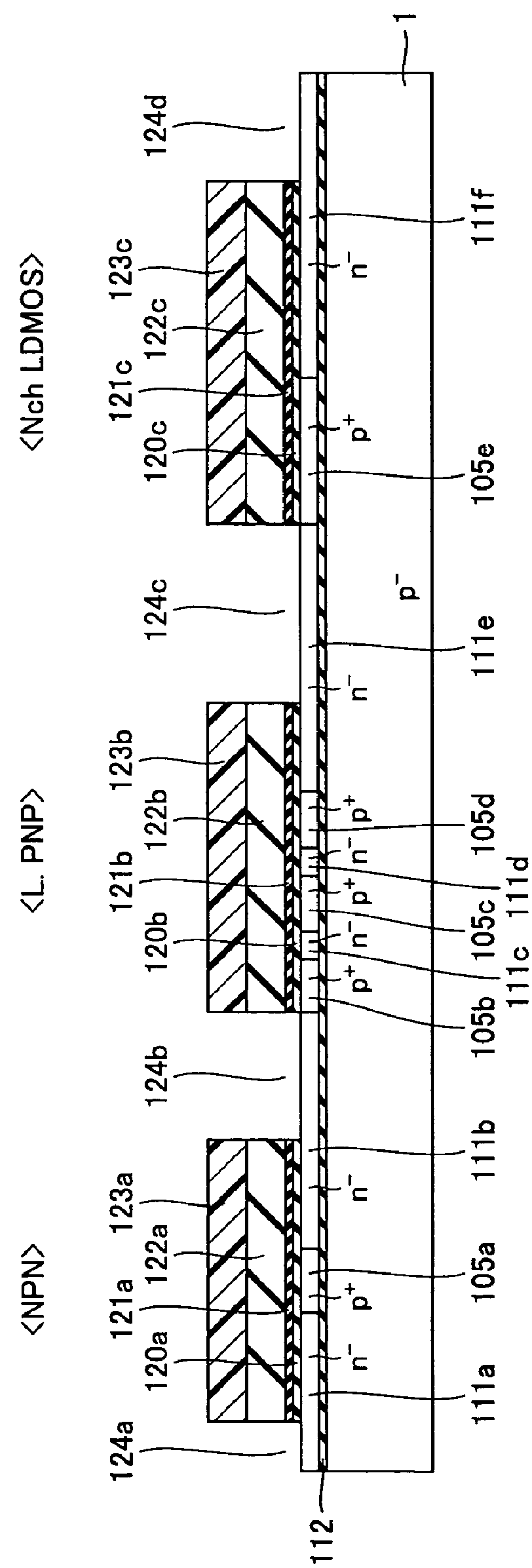

On epitaxial growth layers 105*a*–105*e* and $n^-$-silicon substrates 111*a*–111*f*, as shown in FIG. 132, processing is them performed to form thermal oxide films of about 0.1 μm in thickness, to form nitride films of about 0.1 μm in thickness by a low pressure CVD method, and to form oxide films of about 1 μm in thickness by a low pressure CVD method. Photoresist patterns 123*a*–123*c* having openings on these oxide films are formed. Using photoresist patterns 123*a*–123*c* as a mask, etching is effected on the oxide films and the nitride films. Thereby, openings 124*a*–124*d* for trench isolation are formed. Each of openings 124*a*–124*d* has a width of about 0.5 μm.

By forming openings 124*a*–124*d* as described above, thermal oxide films 120*a*–120*c*, nitride films 121*a*–121*c* and oxide films 122*a*–122*c* are left around openings 124*a*–124*d*.

Figure 133:
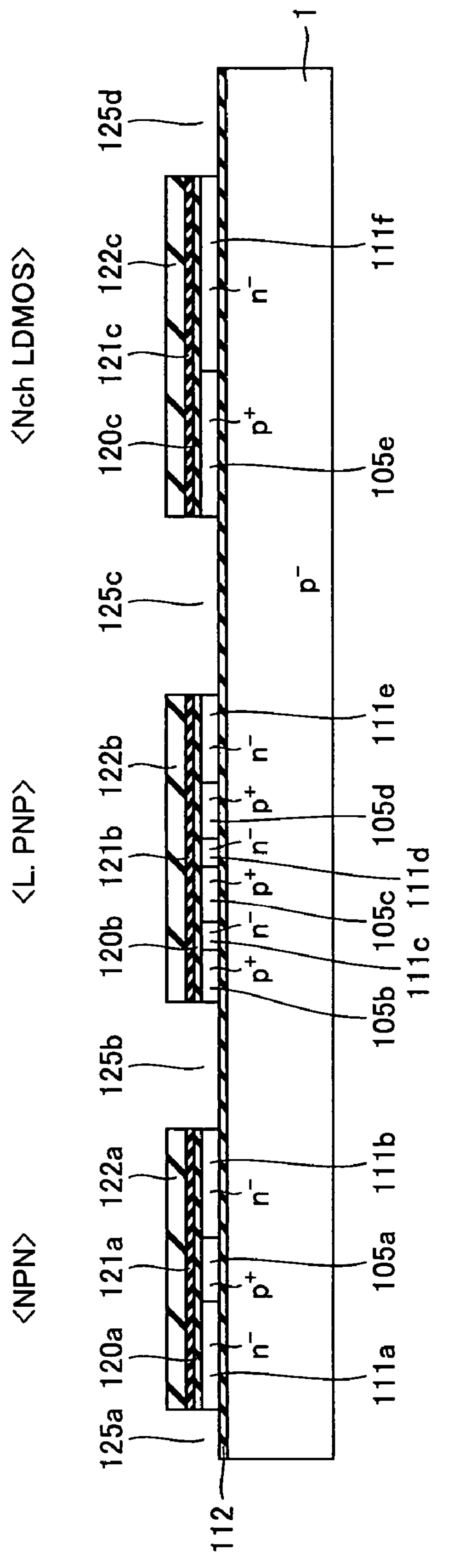

Photoresist patterns 123*a*–123*c* are removed, and etching is effected on $n^-$-silicon substrates 111*a*, 111*b*, 111*e* and 111*f* masked with oxide films 122*a*–122*c* by an RIE method. This forms trenches 125*a*–125*d* reaching thermal oxide film 112 as shown in FIG. 133. By forming trenches 125*a*–125*d*, $n^-$-silicon substrates 111*b*1 and 111*e*1 are left around trenches 125*a*–125*d*.

Figure 134:
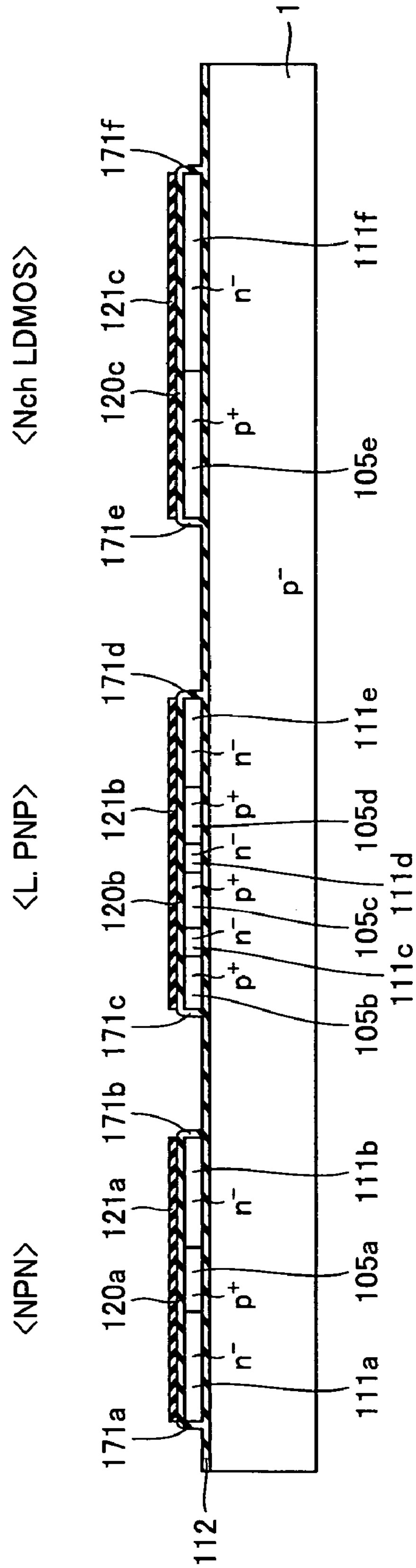

After removing oxide films 122*a*–122*c*, thermal oxidation is performed at a depth of about 0.1 μm. This forms oxide films 171*a*–171*f* at the surfaces of trenches 125*a*–125*d* as shown in FIG. 134.

Figure 135:
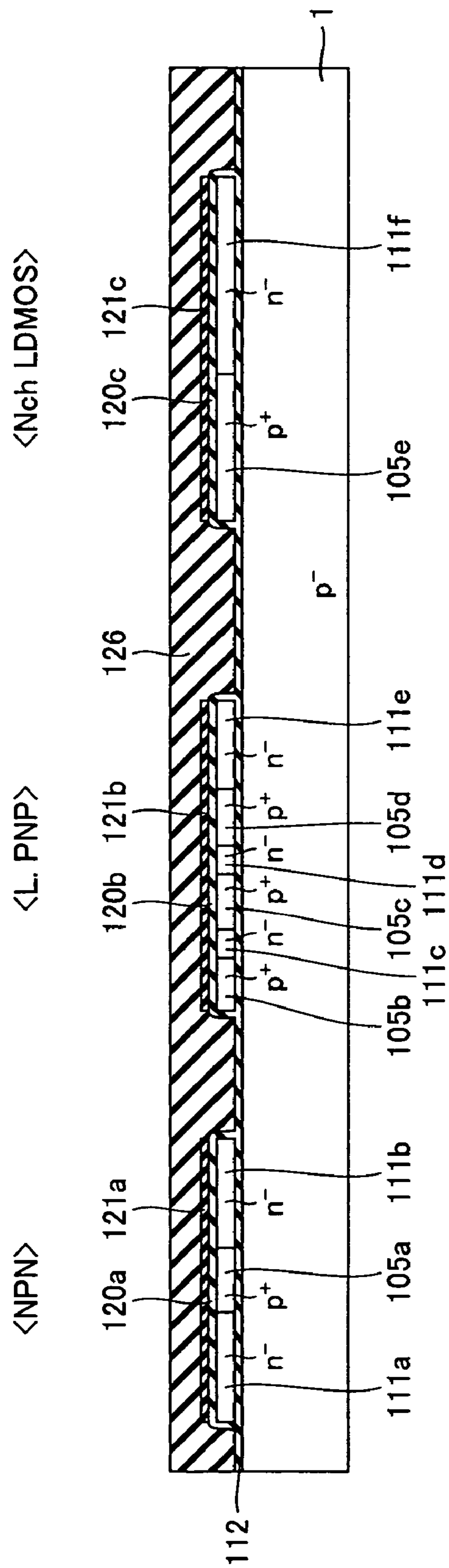

Then, as shown in FIG. 135, a CVD method is performed to form oxide film 126 of about 1 μm in thickness covering $n^-$-silicon substrates 111*a*–111*f*. Instead of oxide film 126, a semiconductor film, e.g., of polycrystalline silicon or amorphous silicon may be used.

Figure 136:
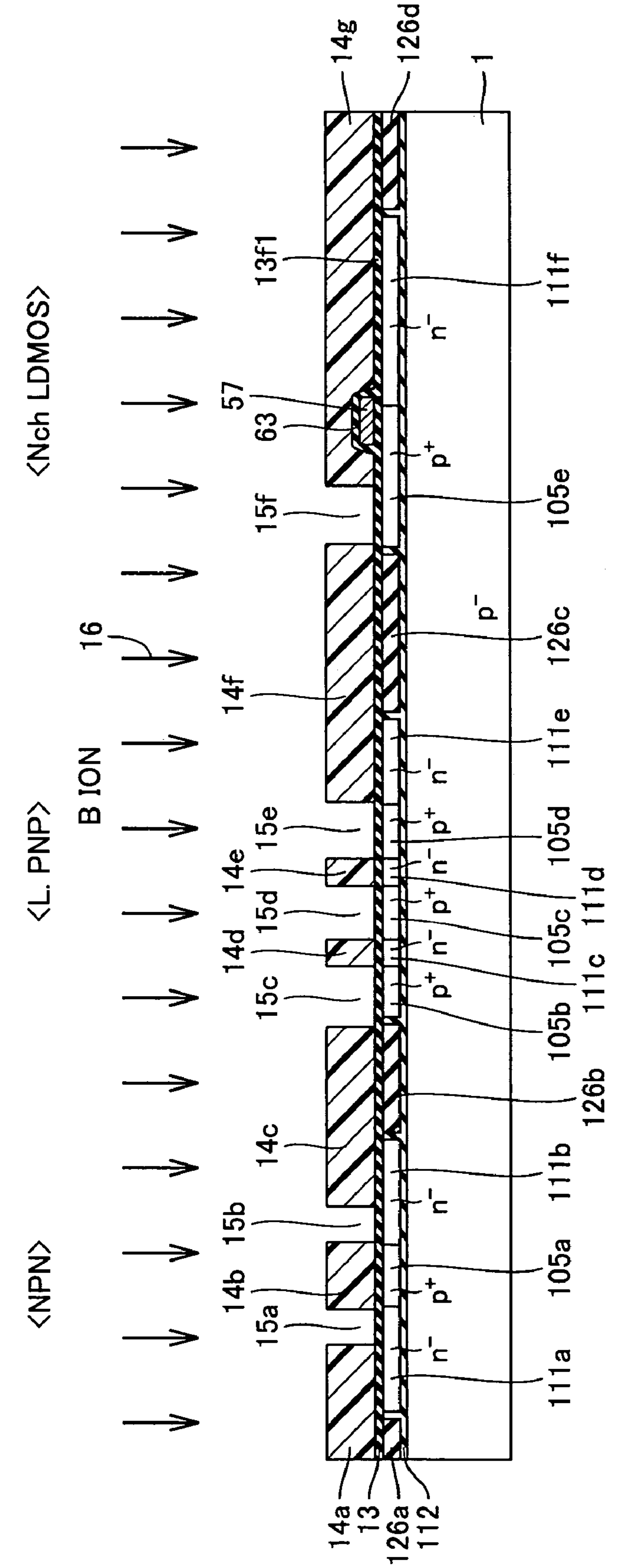

The surface of oxide film 126 is polished by a CPM method, and this polishing is stopped when nitride films 121*a*–121*c* are exposed. Thereby, the trenches are filled with oxide films 126*a*–126*d* as shown in FIG. 136. Thereafter, nitride films 121*a*–121*c* and thermal oxide films 120*a*–120*c* are removed.

Further, thermal oxidation is performed to form thermal oxide film 13, e.g., of about 0.01 μm to about 0.02 μm in thickness. Thermal oxide film 13 is formed not only on $n^-$-silicon substrates 111*a*–111*f* but also on oxide films 126*a*–126*d*. Thermal oxide film 13 will partially form the gate oxide film of the lateral DMOS transistor.

Then, a low pressure CVD method is performed to deposit a silicon film (semiconductor film), which is about 0.2 μm in thickness and is made of polycrystalline silicon or amorphous silicon doped with phosphorus. A photoresist pattern (not shown) is formed on a portion of this silicon film, in which the gate electrode of the lateral DMOS transistor is to be formed. Etching is effected on the silicon film masked with this photoresist pattern. This forms gate electrode 57 as shown in FIG. 136. The surface of gate electrode 57 is thermally oxidized to form oxide film 63.

Then, processing is performed to form photoresist patterns 14*a*–14*g* having openings 15*a* and 15*b* located on a region, in which the base-leading layer (17*a* and 17*b*) of the lateral npn bipolar transistor is to be formed, openings 15*c*–15*e* located on a region, in which p-type diffusion layers 17*c*–17*e* forming the collector and emitter of the lateral pnp bipolar transistor are to be formed, and an opening 15*f* located on a region, in which p-type diffusion layer 17*f* forming the back gate of the lateral DMOS transistor is to be formed. Using photoresist patterns 14*a*–14*g* as a mask, an ion implanting method is performed to introduce boron ions into $n^-$-silicon substrates 111*a* and 111*b* as well as epitaxial growth layers 105*a*, 105*c*, 105*d* and 105*e*.

Figure 137:
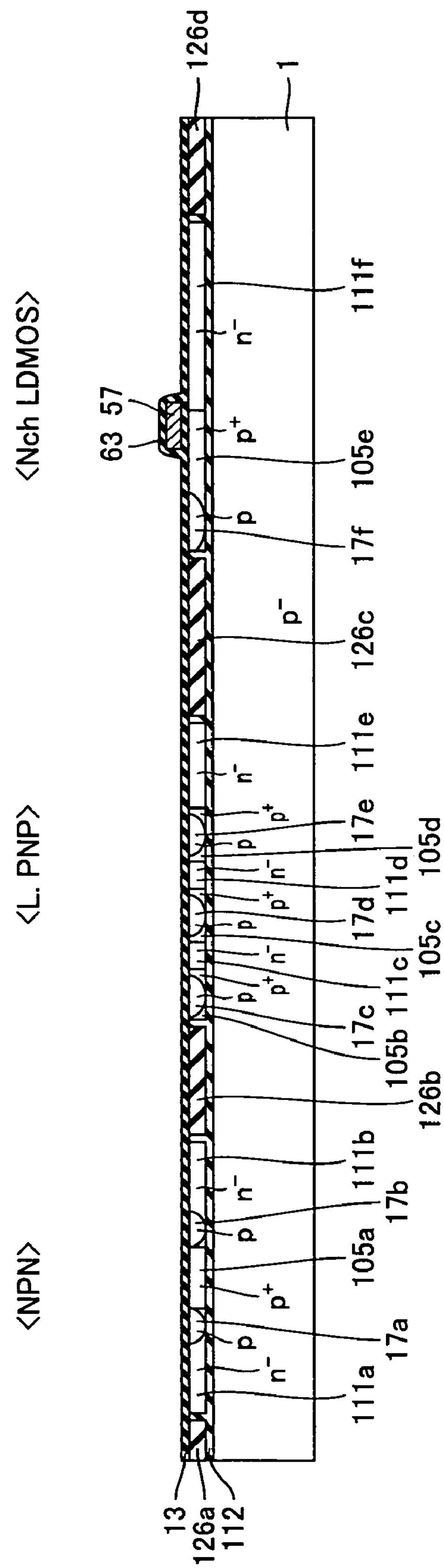

After removing photoresist patterns 14*a*–14*g*, thermal processing is performed. This forms p-type diffusion layers 17*a*–17*h* as shown in FIG. 137. Thus, the base of the lateral npn bipolar transistor, the collector and emitter of the lateral pnp bipolar transistor and the back gate of the lateral DMOS transistor are simultaneously formed.

Figure 138:
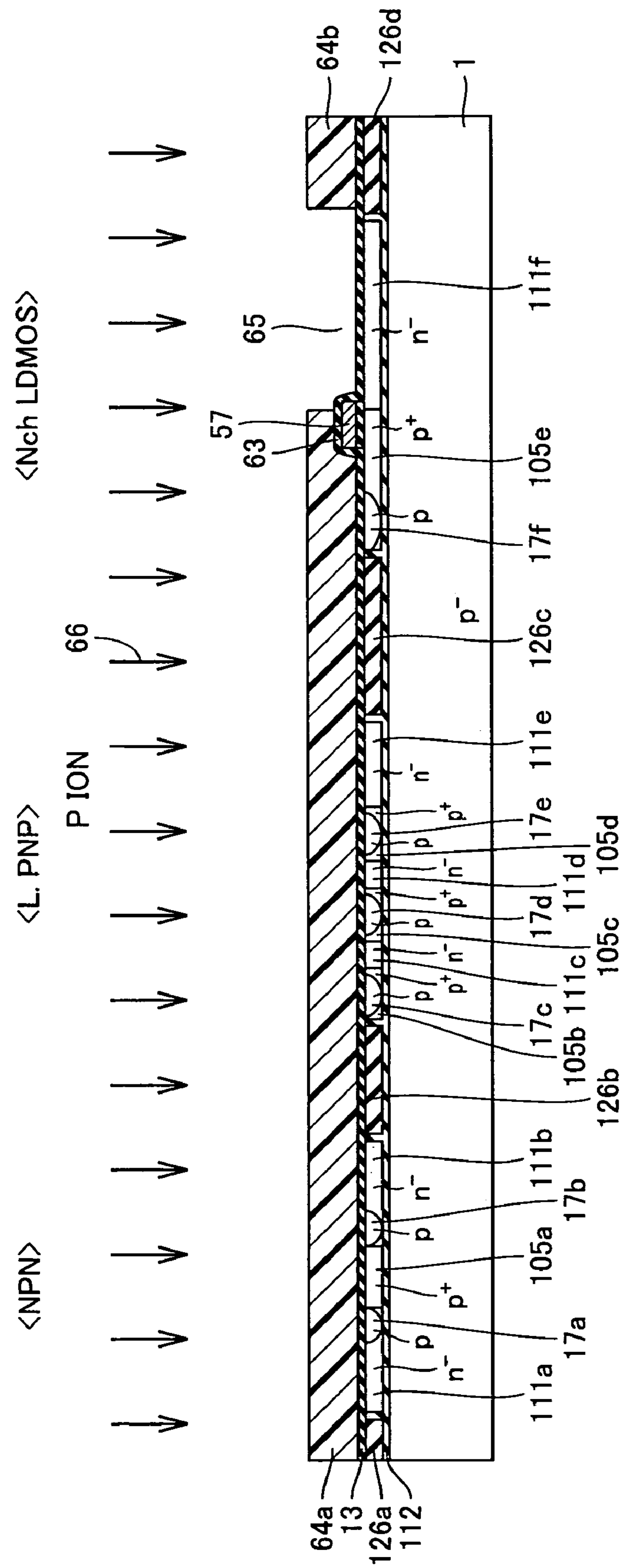
Figure 139:
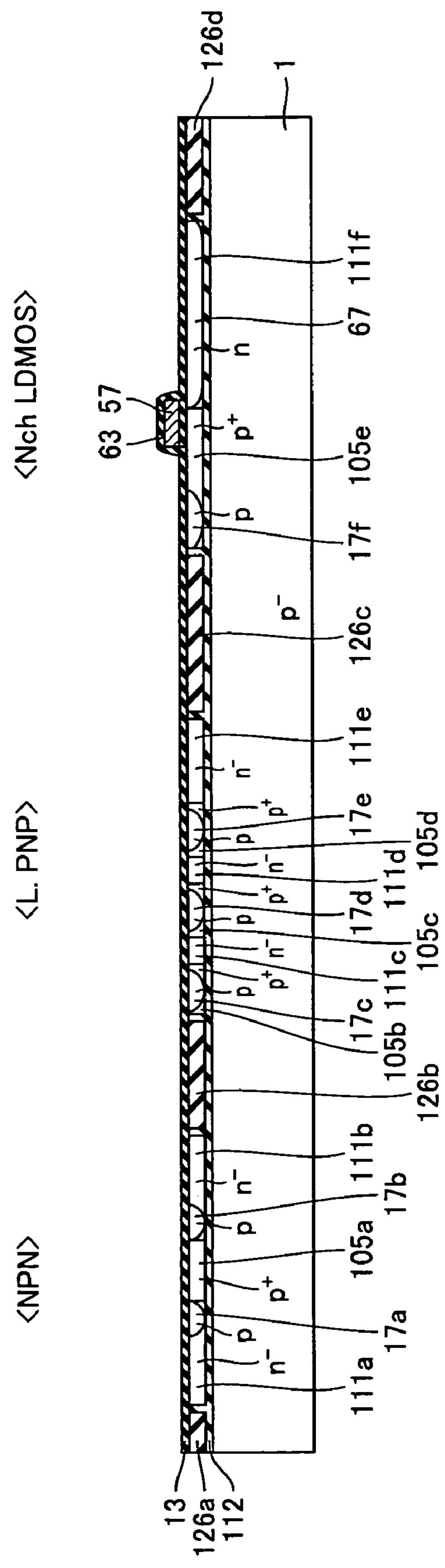

As shown in FIG. 138, processing is performed to form photoresist patterns 64*a* and 64*b* having opening 65 located on a region, in which the drain of the lateral DMOS transistor is to be formed. Using photoresist patterns 64*a* and 64*b* as a mask, an ion implanting method is performed to introduce phosphorus ions into $n^-$-silicon substrate 111*f*. After removing photoresist patterns 64*a* and 64*b*, thermal processing is performed. This forms n-type diffusion layer ($n^-$drain) 67 as shown in FIG. 139.

Figure 140:
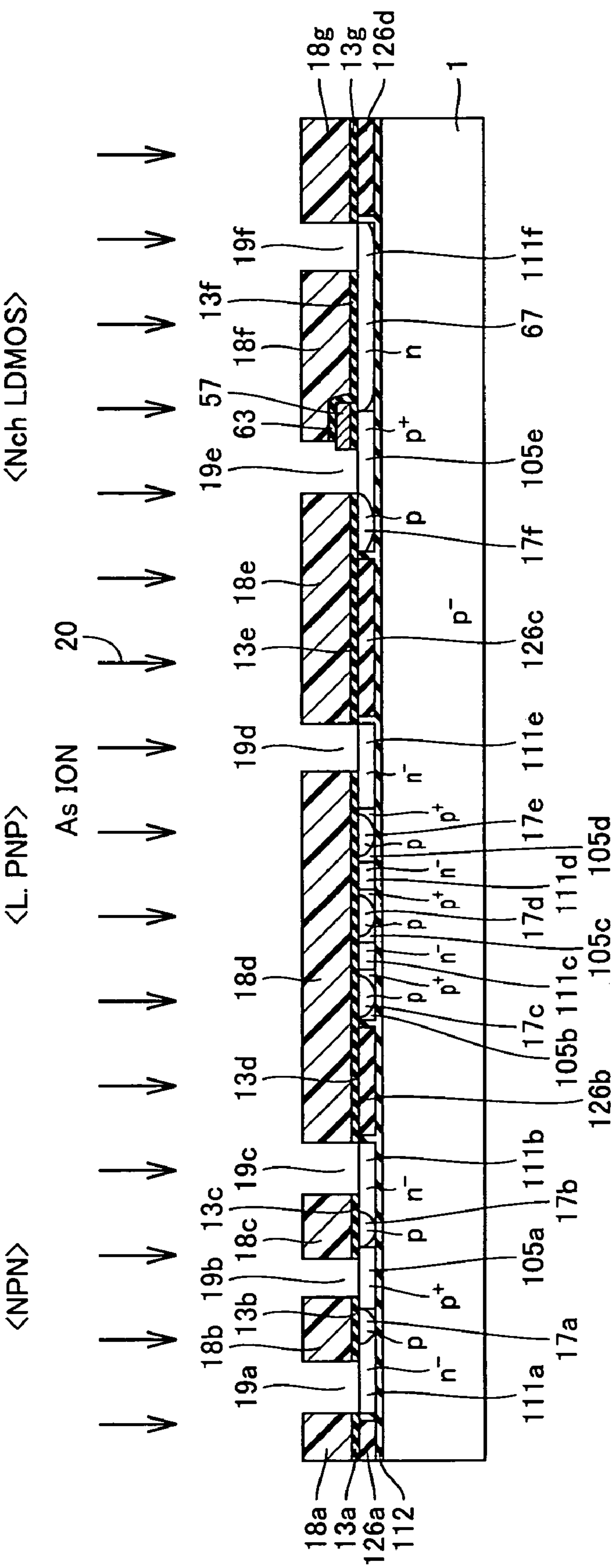

As shown in FIG. 140, processing is performed to form photoresist patterns 18*a*–18*g* having openings located on regions, in which $n^+$-diffusion layers 12*a*–12*c* of the lateral npn bipolar transistor are to be formed, on a region, in which the base of the lateral pnp bipolar transistor is to be formed, and on regions, in which the source and drain of the lateral DMOS transistor are to be formed. Using photoresist patterns 18*a*–18*g* as a mask, etching is effected on thermal oxide film 13 to form openings 19*a*–19*f* This leaves thermal oxide films 13*a*, 13*b*, 13*b*1, 13*c*, 13*d*, 13*e* and 13*f* around openings 19*a*–19*f*.

Using photoresist patterns 18*a*–18*g* as a mask, an ion implanting method is performed to introduce n-type impurity ions such as arsenic ions or phosphorus ions into $n^-$-silicon substrates 111*a*, 111*b*, 111*e* and 111*f* as well as epitaxial growth layers 105*a* and 105*e*. After removing photoresist patterns 18*a*–18*g*, thermal processing is performed. This forms $n^+$-diffusion layers 21*a*–21*f* as shown in FIG. 141. Thus, the emitter and collector of the lateral npn bipolar transistor, the base of the lateral pnp bipolar transistor, and the source and drain of the lateral DMOS transistor are simultaneously formed. This thermal processing also forms oxide films on implantation openings 19*a*–19*f*. FIG. 142 is a plan of the semiconductor device shown in FIG. 141.

Figure 144:
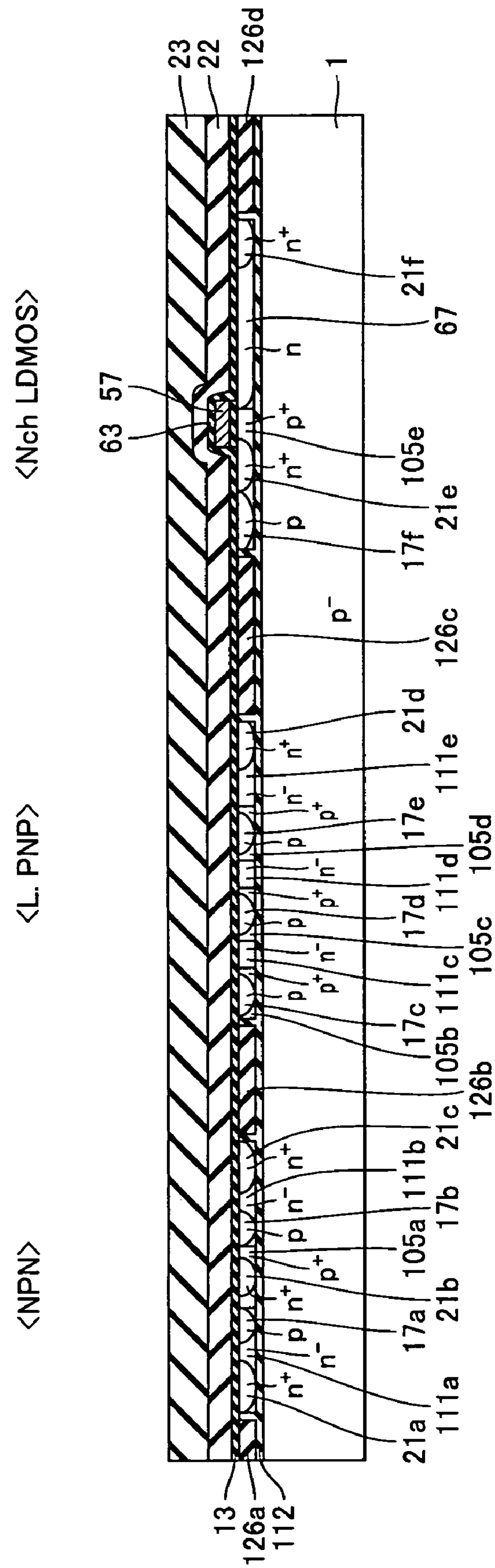
FIGS. 144 and 145 are cross sections showing 17th and 18th steps in the manufacturing process of a semiconductor device according to a seventh embodiment of the invention.

Then, as shown in FIG. 144, a CVD method is performed to deposit first interlayer insulating film 22 made of a CVD oxide film, which is, e.g., not doped with impurities and has a thickness of about 0.2 μm. Further, a CVD method is performed to deposit second interlayer insulating film 23 made of a CVD oxide film, which is doped with, e.g., boron and phosphorus, and has a thickness of about 0.6 μm.

Thereafter, appropriate thermal processing is performed to fluidize second interlayer insulating film 23 for flattening the wafer surface.

Figure 145:
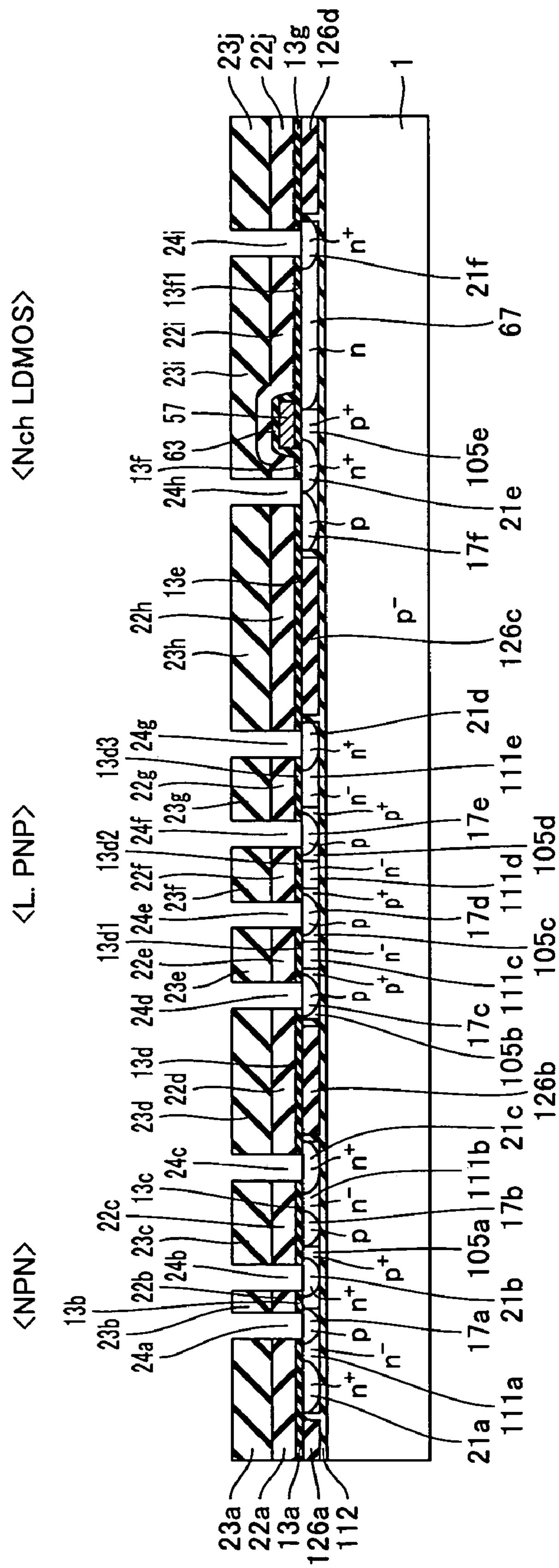

Then, a photoresist pattern (not shown) of a predetermined configuration is formed on second interlayer insulating film 23. Using this photoresist pattern as a mask, dry etching is performed by an RIE method. This forms contact holes 24*a*–24*i* as shown in FIG. 145.

First and second interlayer insulating films 22*a*–22*j* and 23*a*–23*j* remain around contact holes 24*a*–24*i*, and also thermal oxide films 13*a*, 13*b*, 13*c*, 13*d*, 13*d*1, 13*d*2, 13*d*3, 13*e*, 13*f*, 13*f*1 and 13*g* remain. Although not shown, a contact hole for gate electrode 57 is formed at the same time.

Then, a sputtering method or the like is performed to form a metal film, which is, e.g., about 0.6 μm in thickness and is made of AlSi, AlCu or the like, over the whole surface. By patterning the metal film, first interconnections 25*a*–25*i* are formed as shown in FIG. 146. Thereafter, the semiconductor device of the seventh embodiment is completed through the steps similar to those in the first embodiment.

(Eighth Embodiment)

An eighth embodiment will now be described with reference to FIGS. 147 to 166.

In the eighth embodiment, the DPSA technique is applied to the lateral npn bipolar transistor of the seventh embodiment already described. More specifically, the emitter electrode and the base electrode of the lateral npn bipolar transistor are partially formed of a silicon film (semiconductor film) of polycrystalline silicon, amorphous silicon or the like.

Figure 166:
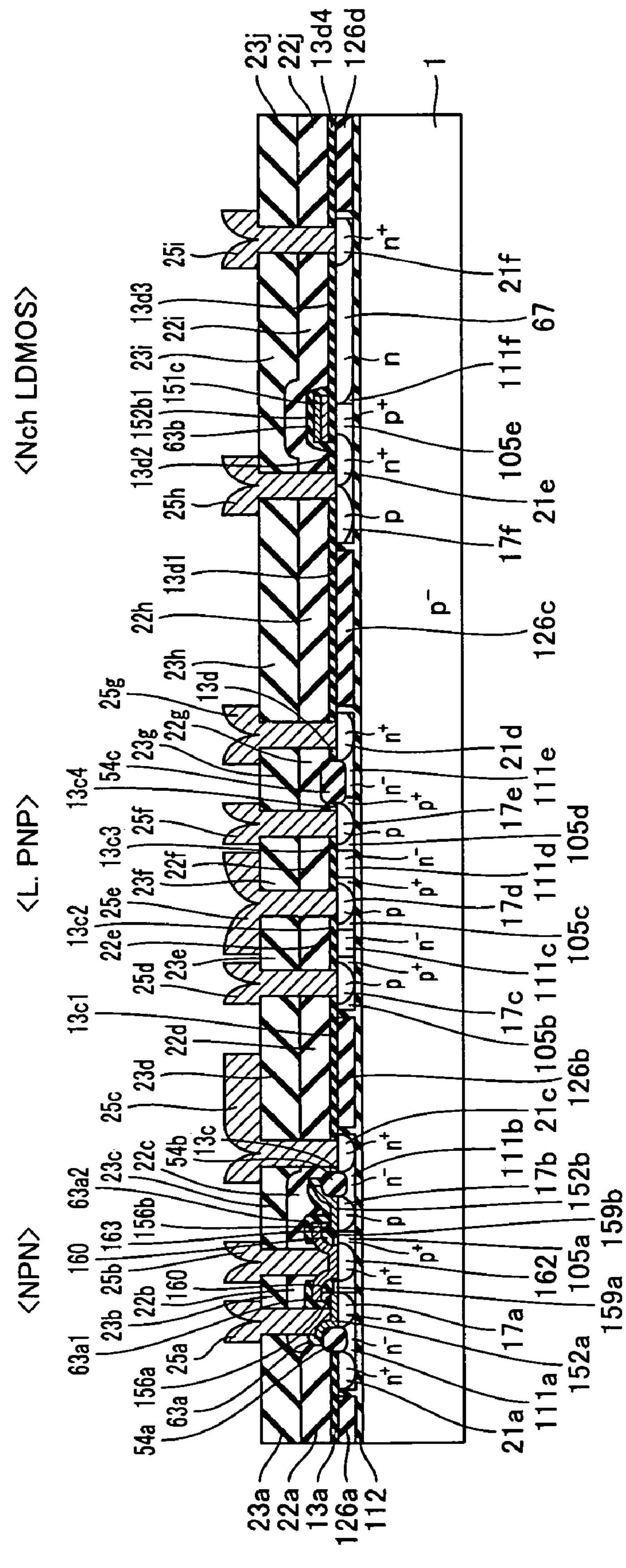
FIG. 166 is a cross section showing a distinctive structure of the semiconductor device according to the eighth embodiment of the invention.

According to the eighth embodiment, as shown in FIG. 166, the emitter electrode of the lateral npn bipolar transistor is formed of first interconnection 25*b* and emitter-leading pad layer 163, and the base electrode is formed of first interconnection 25*a* and the base-leading pad layer (152*a* and 152*b*). Further, $n^+$-diffusion layer 162 is formed under emitter-leading pad layer 163.

Emitter-leading pad layer 163 extends over the base-leading pad layer (152*a* and 152) with oxide films 156*a*, 156*b* and 160 therebetween, and these oxide films electrically isolate emitter-leading pad layer 163 from the base-leading pad layer. Structures other than the above are basically the same as those of the seventh embodiment.

Referring to FIGS. 147–166, description will now be given on a method of manufacturing the semiconductor device of the eighth embodiment.

Through the steps similar to those in the seventh embodiment, the trenches are filled with oxide films 126*a*–126*d*. Thereafter, nitride films 121*a*–121*c* and thermal oxide films 120*a*–120*c* are removed.

Figure 147:
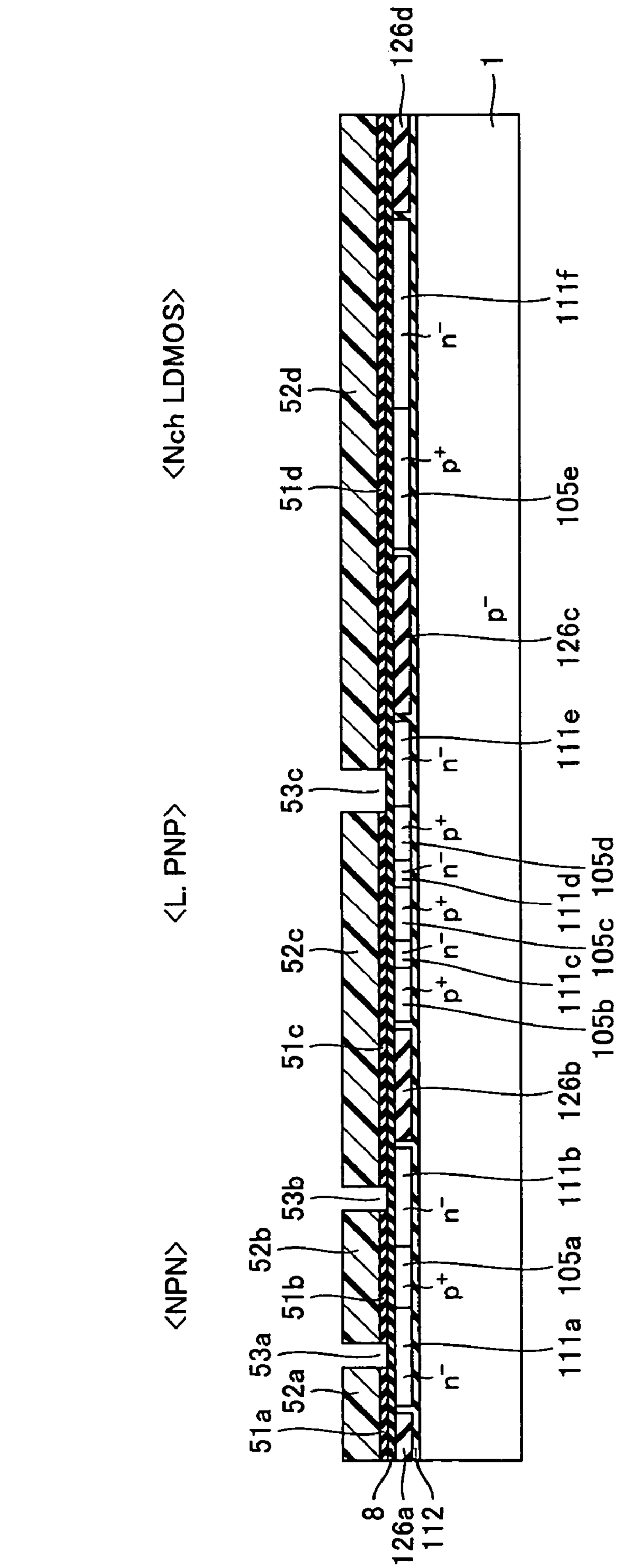
FIGS. 147 to 165 are cross sections showing 1st to 19th steps in the manufacturing process of a semiconductor device according to an eighth embodiment of the invention, respectively.

Thermal oxidation is further performed to form thermal oxide film 8, e.g., of about 0.5 μm in thickness as shown in FIG. 147. Thermal oxide film 8 is formed not only on $n^-$-silicon substrate 111*a*–111*f* but also on oxide films 126*a*–126*d*. A CVD method or the like is performed to deposit a nitride film, e.g., of about 0.1 μm in thickness on thermal oxide film 8, and photoresist patterns 52*a*–52*d* of a predetermined configuration are formed on the nitride film.

Using photoresist patterns 52*a*–52*d* as a mask, etching is effected on the nitride film to form openings 53*a*–53*c* located on a region, in which the field oxide film is to be formed. Nitride films 51*a*–51*d* remain around openings 53*a*–53*c*. Thereafter, photoresist patterns 52*a*–52*d* are removed.

Figure 148:
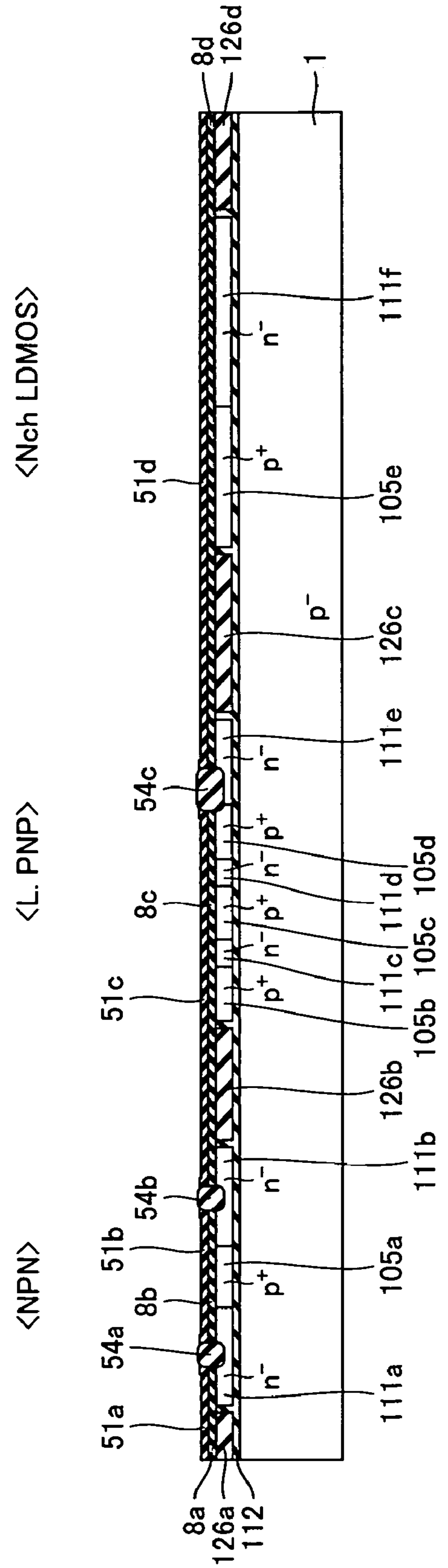

Using nitride films 51*a*–51*d* as a mask, thermal oxidation is performed to form field oxide films 54*a*–54*c*, e.g., of about 0.2 μm in thickness as shown in FIG. 148. Thereafter, nitride films 51*a*–51*d* and thermal oxide films 8*a*–8*d* are removed.

Figure 149:
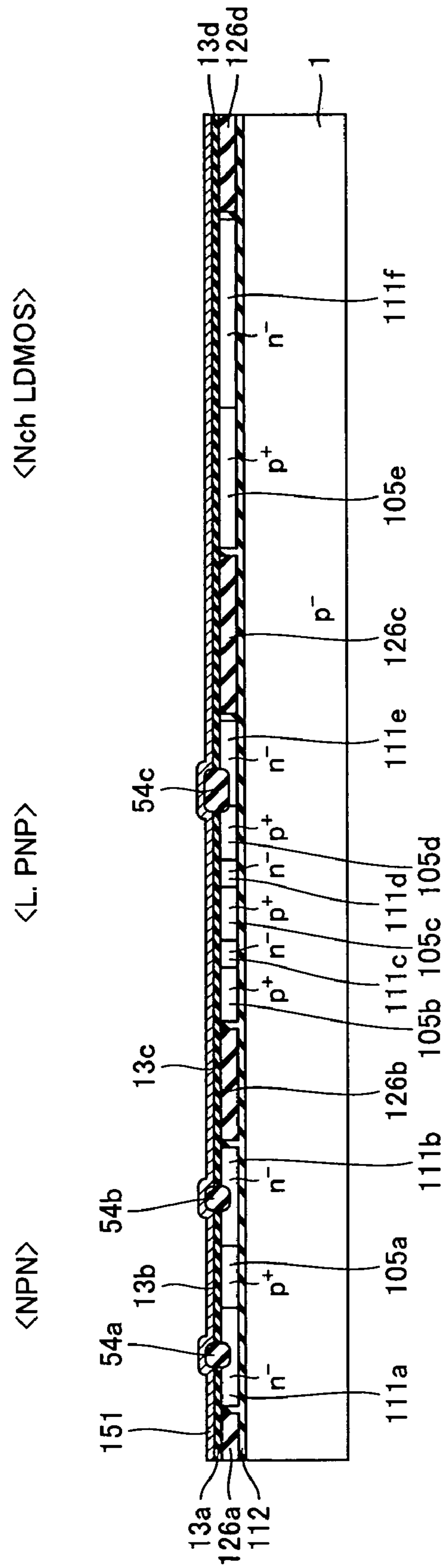

Then, thermal oxidation is performed to form thermal oxide films 13*a*–13*d*, e.g., from about 0.01 to about 0.02 μm in thickness as shown in FIG. 149. A portion of thermal oxide film 13*d* forms the gate oxide film of the lateral DMOS transistor. On thermal oxide films 13*a*–13*d*, a low pressure CVD method is performed to deposit silicon film (semiconductor film) 151, e.g., of about 0.2 μm in thickness, which is made of polycrystalline silicon or amorphous silicon doped with phosphorus.

Figure 150:
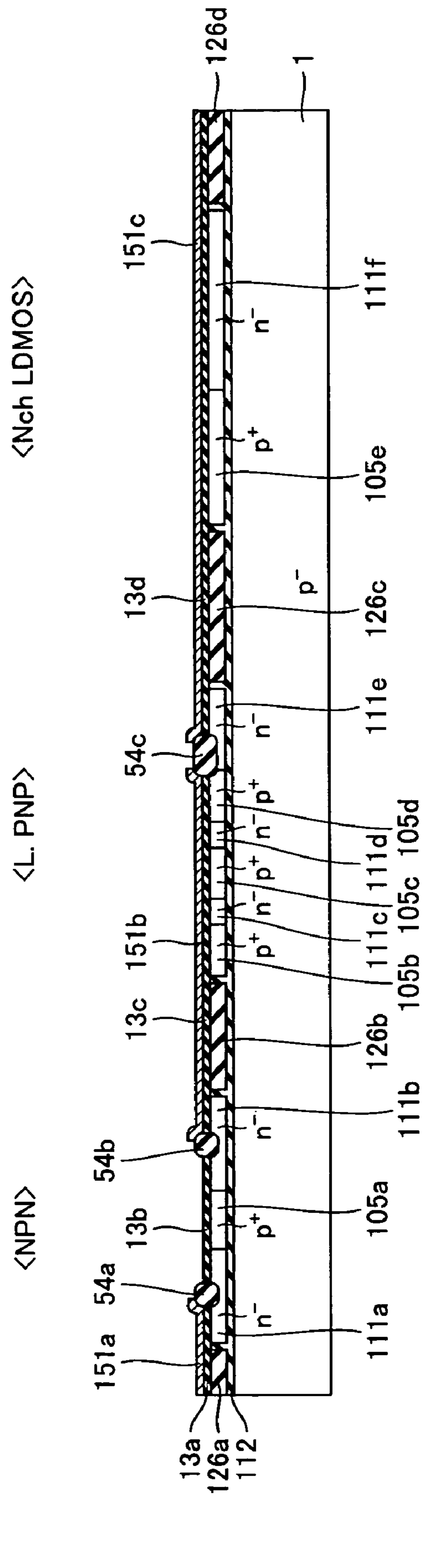

On silicon film 151, a photoresist pattern (not shown) of a predetermined configuration is formed. Using this photoresist pattern as a mask, silicon film 151 is etched. Thereby, as shown in FIG. 150, silicon films 151*a*–151*a* are left on the trench isolating region, the collector of the lateral npn bipolar transistor, the lateral pnp bipolar transistor and the lateral DMOS transistor.

Figure 151:
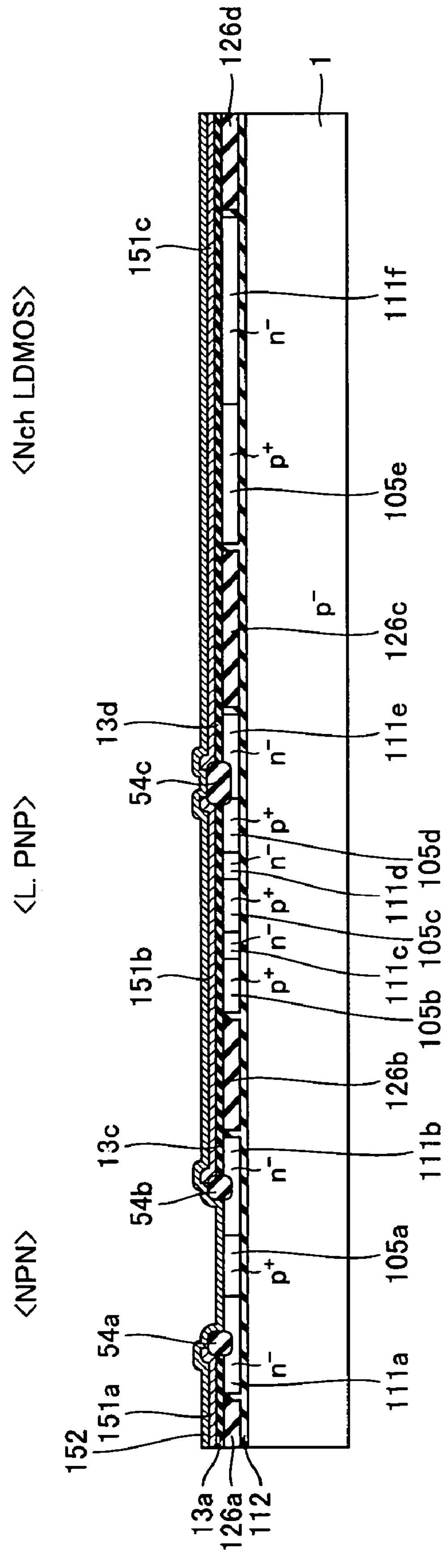

Then, as shown in FIG. 151, processing is performed to deposit silicon film (semiconductor film) 152, which is made of polycrystalline silicon or amorphous silicon not doped with impurities, and has a thickness, e.g., of about 0.1 μm in thickness.

Figure 152:
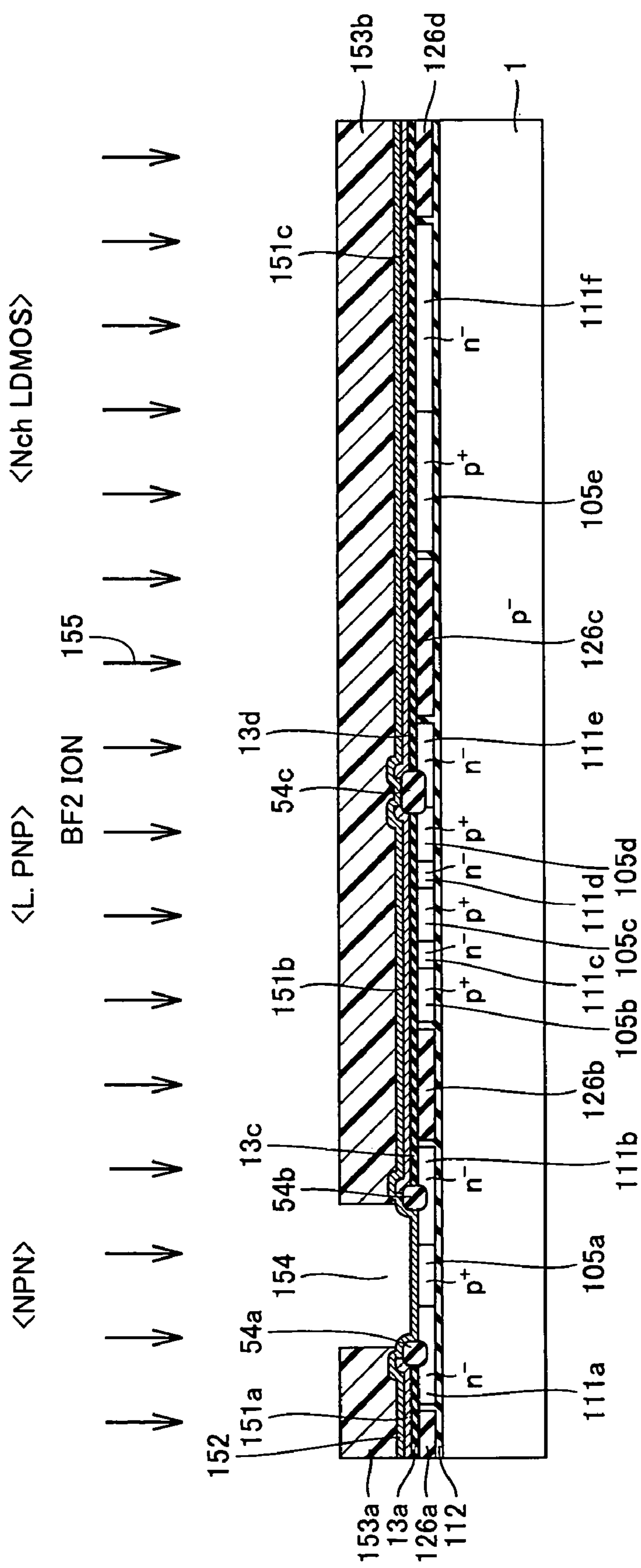

As shown in FIG. 152, photoresist patterns 153*a* and 153*b* having opening 154 located on a region, in which the base and emitter of the lateral npn bipolar transistor are to be formed, is formed on silicon film 152. Using photoresist patterns 153*a* and 153*b* as a mask, p-type impurity ions such as $BF_2$ ions are introduced into silicon film 152 by an ion implanting method. In this processing, an acceleration voltage is controlled to prevent the implanted ions from penetrating silicon film 152.

The p-type impurity ions may be introduced into silicon film 152 without using a mask. In this case, steps for mask alignment or the like can be eliminated, and the steps can be simplified.

However, silicon film 152 will form a part of the gate electrode of the lateral DMOS transistor. In such a case that phosphorus (n-type impurities) introduced into silicon film 151*c* forming a lower layer is diffused into silicon film 152 for operating it as an n-type gate electrode, it is therefore necessary to determine the concentrations of p-type impurities and phosphorus (n-type impurities) so that the concentration of p-type impurities may be much lower than that of phosphorus (n-type impurities).

Figure 153:
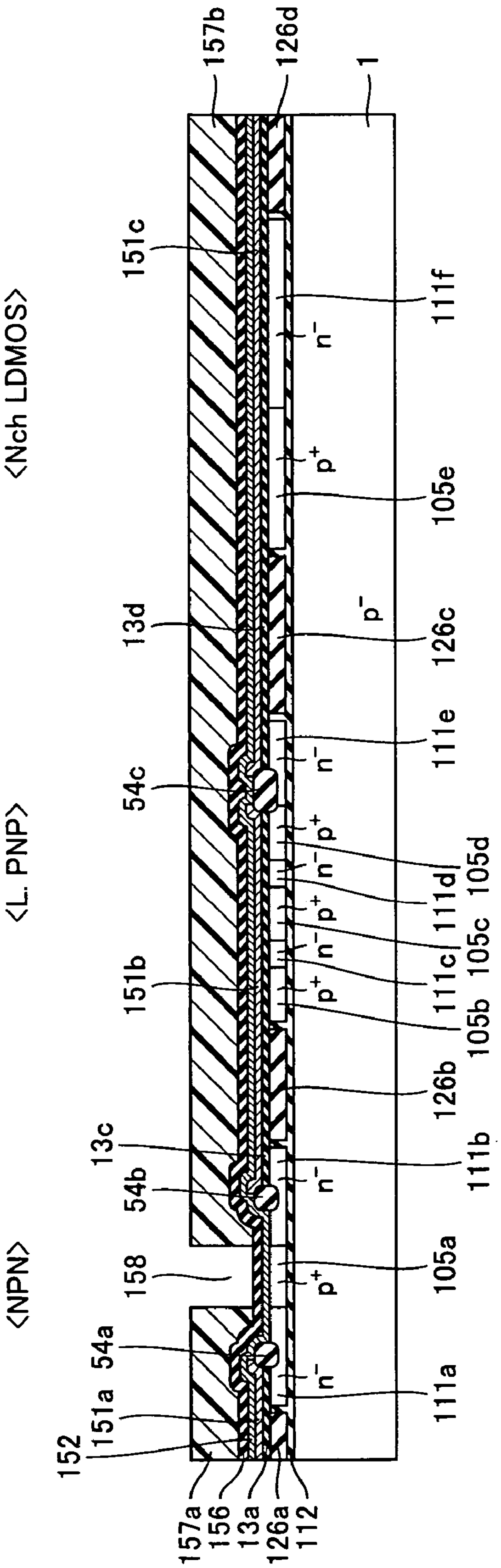

Then, as shown in FIG. 153, a low pressure CVD method is performed to deposit oxide film 156, e.g., of about 0.1 μm in thickness. Photoresist patterns 157*a* and 157*b* having opening 158 on a region (epitaxial growth layer 105*a*), in which the emitter of the lateral npn bipolar transistor is to be formed, is formed on oxide film 156.

Using photoresist patterns 157*a* and 157*b* as a mask, etching is effected on oxide film 156 and silicon film 152. This forms an opening exposing the surface of epitaxial growth layer 105*a*. Around this opening, oxide films 156*a* and 156*b* as well as silicon films 152*a* and 152*b* are left as shown in FIG. 154.

Figure 154:
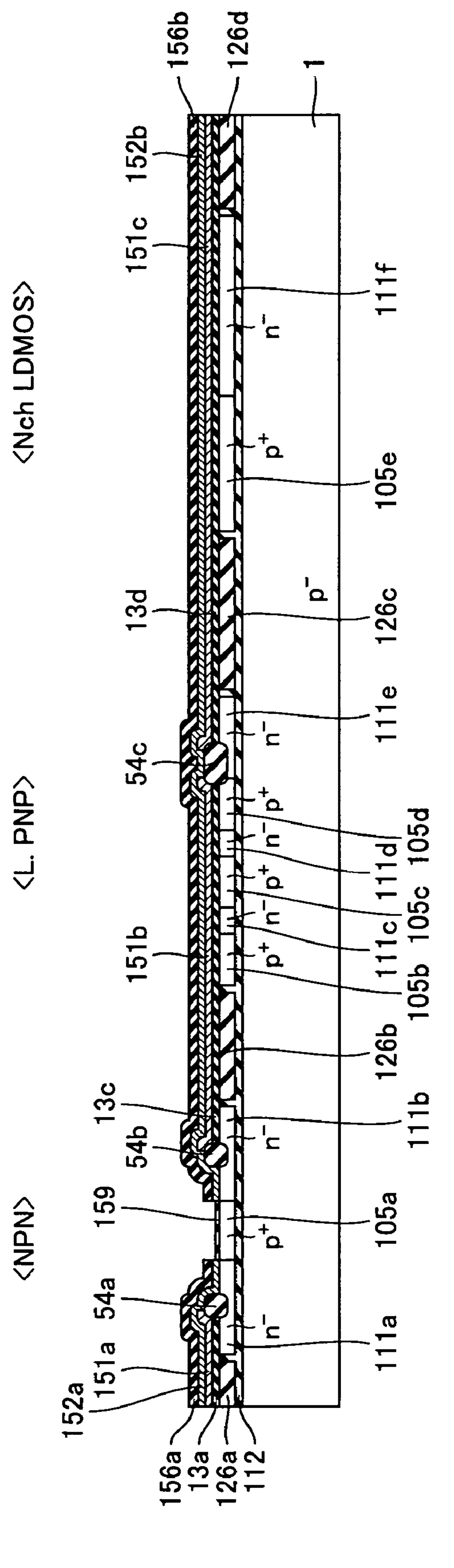
Figure 155:
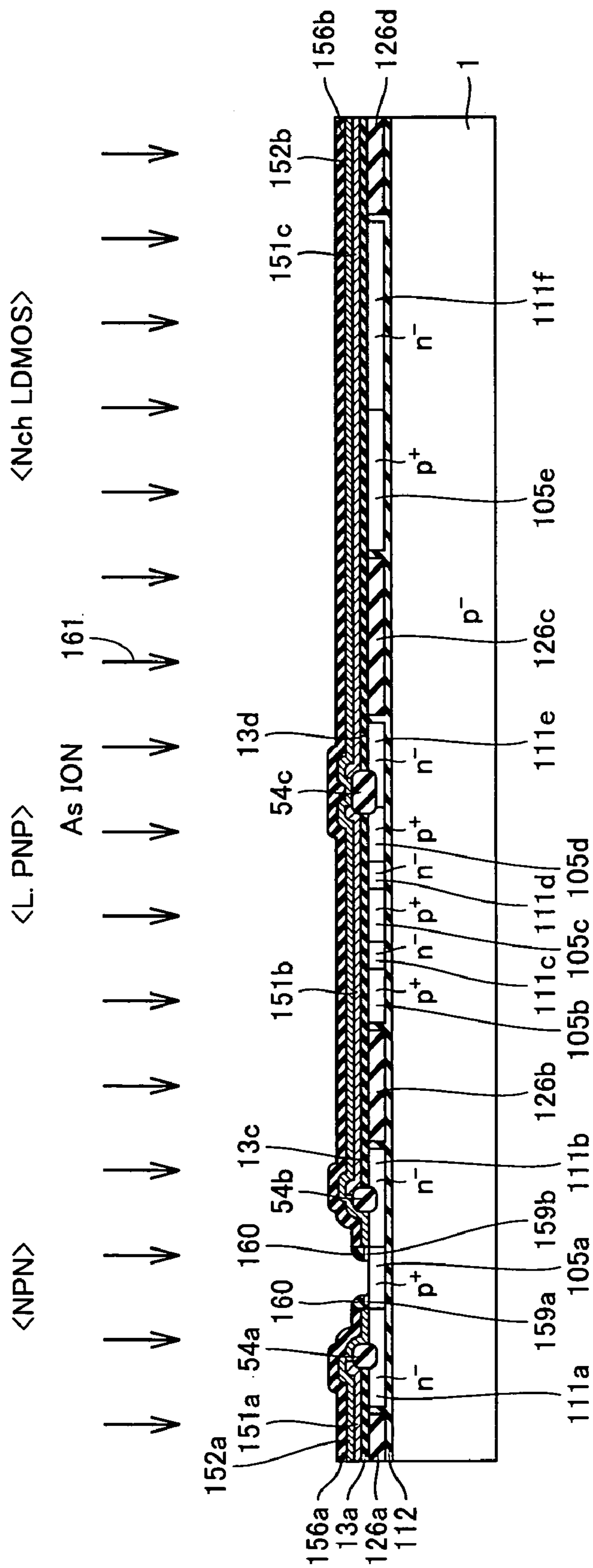

After removing photoresist patterns 157*a* and 157*b*, thermal oxide film 159, e.g., of about 0.01 μm in thickness is formed as shown in FIG. 154. Thereafter, a low pressure CVD method is performed to deposit oxide film 160, e.g., of about 0.1 μm in thickness. Etching is effected on oxide film 160 and thermal oxide film 159 by an RIE method to form an opening exposing the surface of epitaxial growth layer 105*a*. Thereby, a sidewall insulating film made of oxide film 160 is formed on sidewalls of oxide films 156*a* and 156*b* defining the opening.

Using oxide films 156*a* and 156*b* as a mask, arsenic ions are introduced into the surface of epitaxial growth layer 105*a*. Thereafter, thermal processing is performed to form $n^+$-diffusion layer 162 forming the emitter of the lateral npn bipolar transistor at the surface of epitaxial growth layer 105*a* as shown in FIG. 156.

Figure 156:
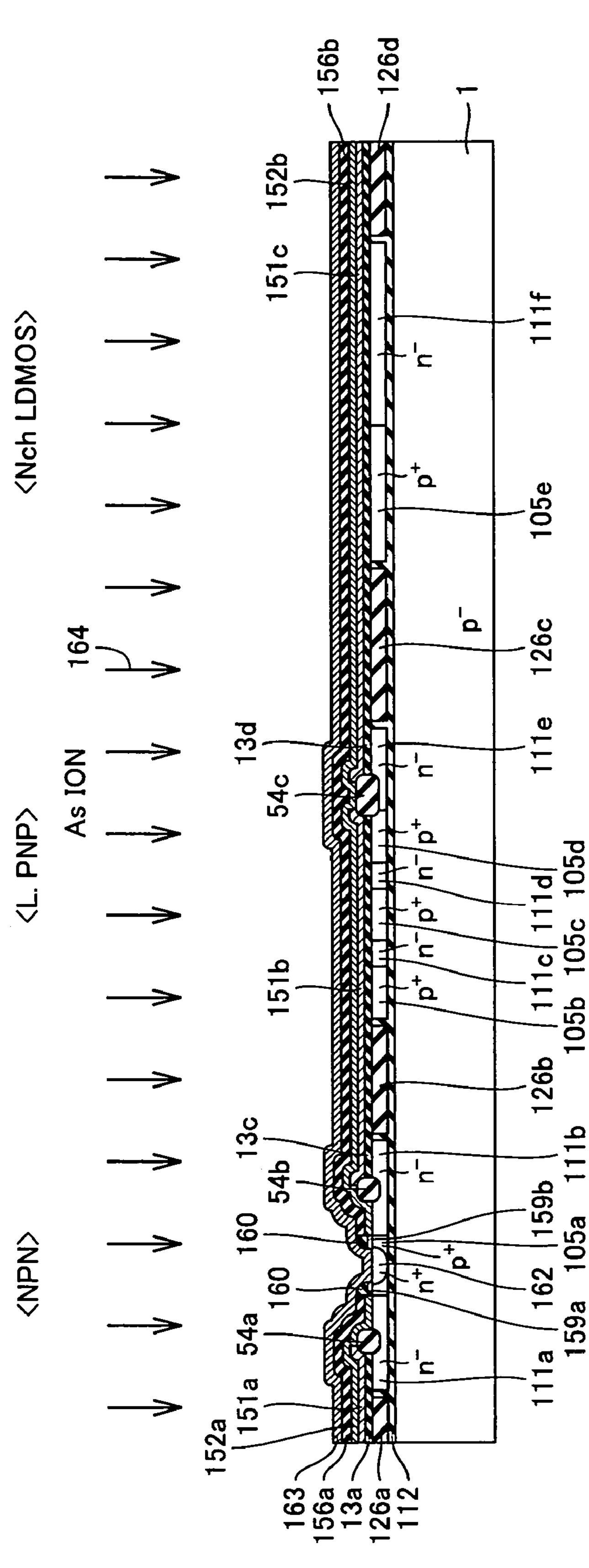

Then, as shown in FIG. 156, a low pressure CVD method is performed to deposit silicon film (semiconductor film) 163, e.g., of about 0.1 μm in thickness made of polycrystalline silicon or amorphous silicon. Then, arsenic ions are implanted into silicon film 163. A photoresist pattern of a predetermined configuration is formed on silicon film 163, and etching is effected on silicon film 163 and oxide films 156*a* and 156*b* masked with this photoresist pattern by an RIE method.

Figure 157:
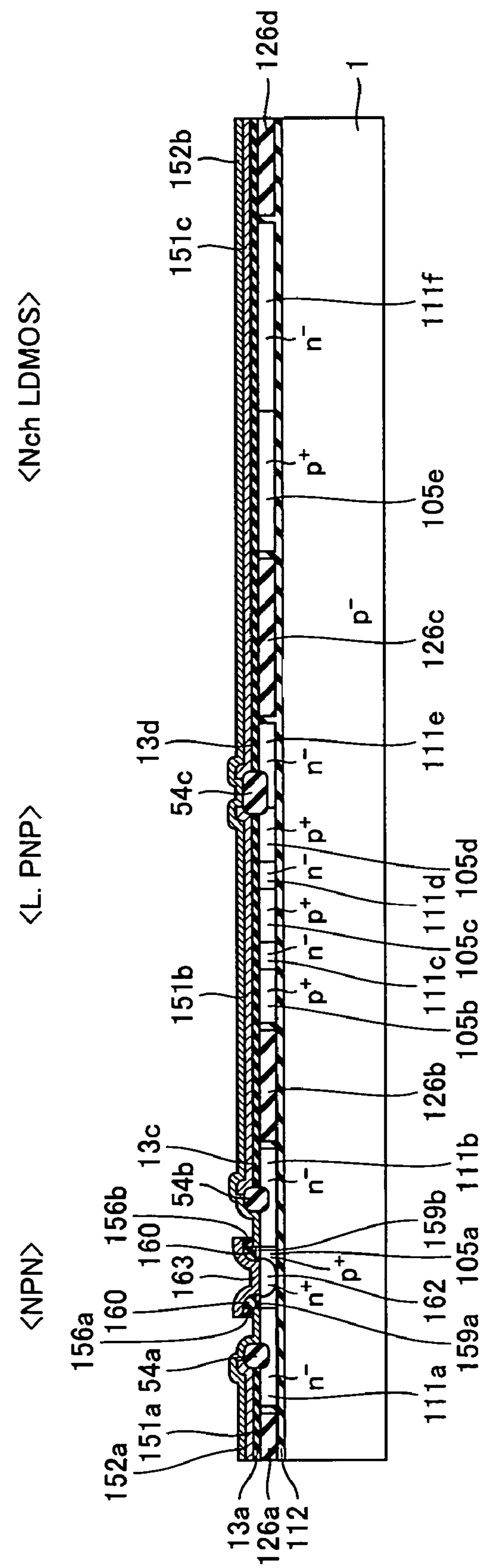

Thereby, silicon film 163 and oxide films 156*a* and 156*b* are patterned to form emitter-leading pad layer 163 as shown in FIG. 157. Oxide films 156*a* and 156*b* remain under emitter-leading pad layer 163.

Figure 158:
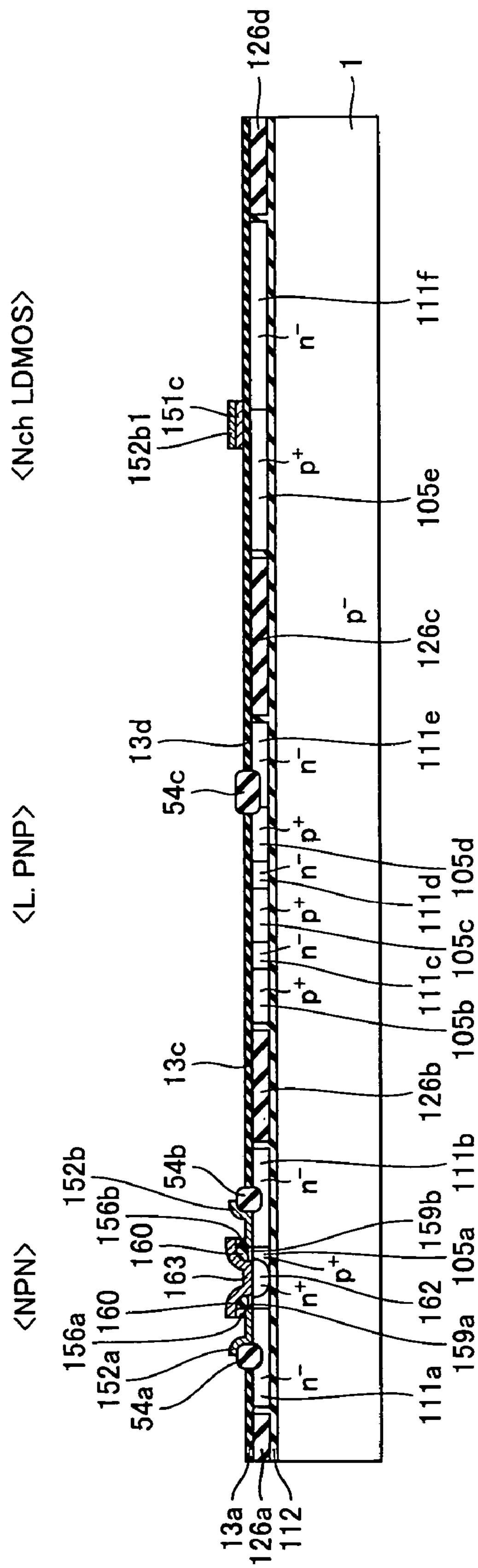

Then, a photoresist pattern of a predetermined configuration is formed on silicon films 152*a* and 152*b*, and etching is effected on silicon films 152*a* and 152*b* masked with this photoresist pattern by an RIE method. Thereby, silicon films 152*a* and 152*b* are patterned to form the base-leading pad layer (152*a* and 152*b*) as shown in FIG. 158. By this processing, a multilayer structure of silicon films 151*c* and 152*b*1 is left on epitaxial growth layer 105*e*. This multilayer structure forms the gate electrode of the lateral DMOS transistor. Thereafter, photoresist pattern is removed.

Figure 159:
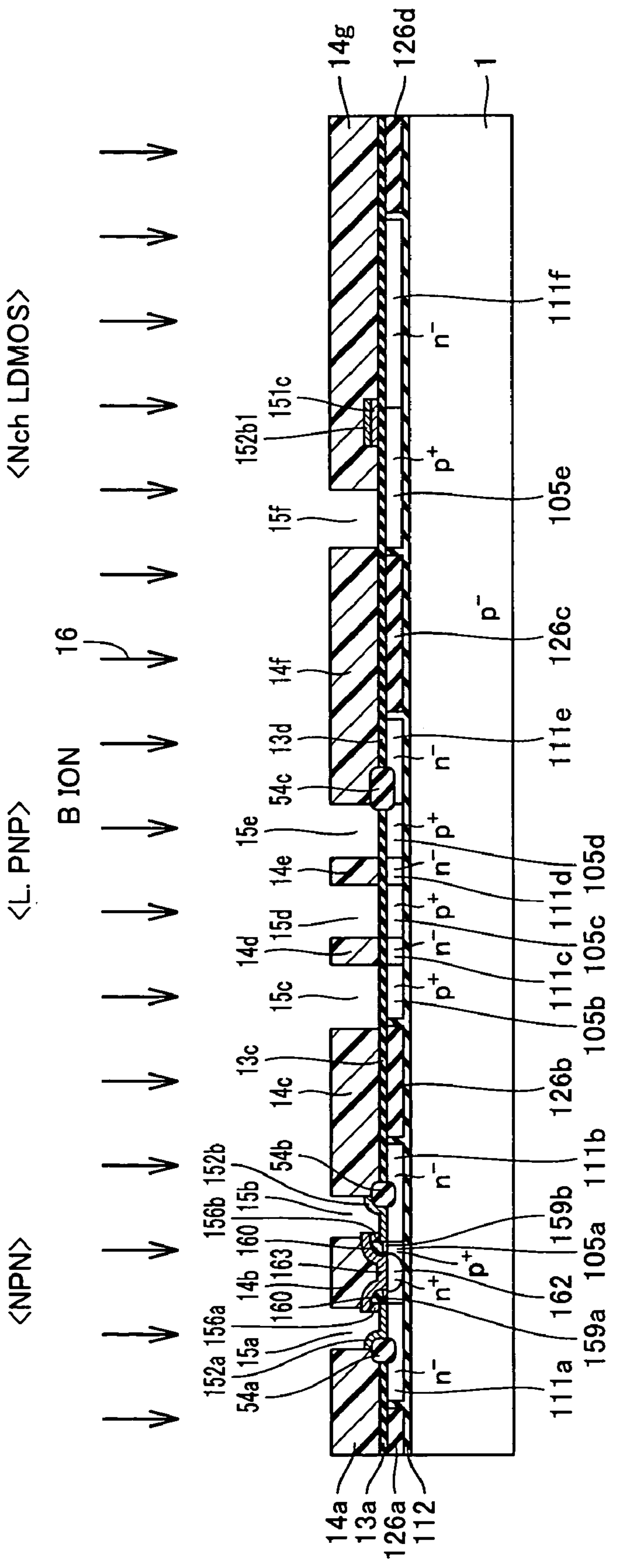

As shown in FIG. 159, processing is then performed to form photoresist patterns 14*a*–14*g* having openings 15*a* and 15*b* located on a region, in which the base-leading layer (17*a* and 17*b*) of the lateral npn bipolar transistor is to be formed, openings 15*c*–15*e* located on a region, in which p-type diffusion layers 17*c*–17*e* forming the collector and emitter of the lateral pnp bipolar transistor are to be formed, and opening 15*f* located on a region, in which p-type diffusion layer 17*f* forming the back gate of the lateral DMOS transistor is to be formed. Using photoresist patterns 14*a*–14*g* as a mask, p-type impurities such as boron ions are introduced by an ion implanting method into $n^-$-silicon substrates 111*a* and 111*b* as well as epitaxial growth layers 105*b*, 105*c*, 105*d* and 105*e*.

Figure 160:
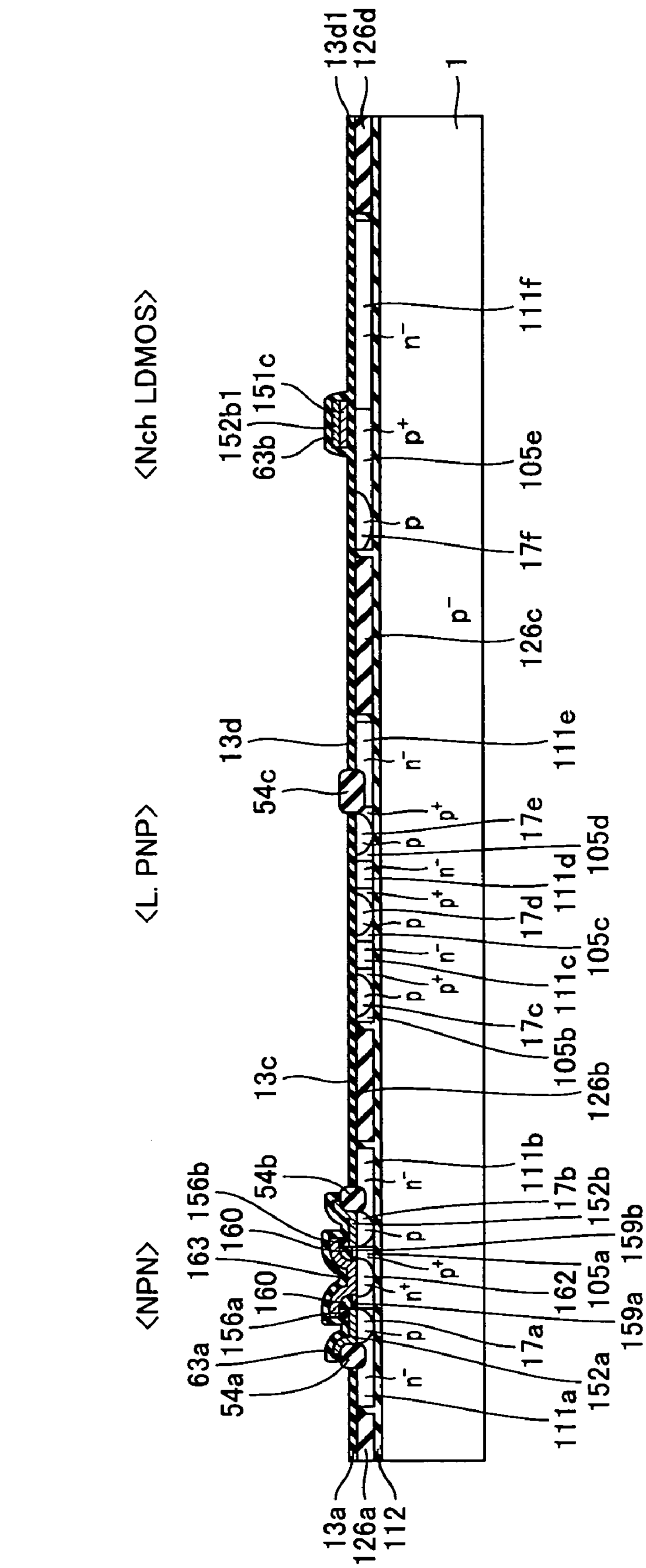

After removing photoresist patterns 14*a*–14*g*, thermal processing is performed. This forms p-type diffusion layers 17*a*–17*f* as shown in FIG. 160. Thus, the thermal processing simultaneously forms the base of the lateral npn bipolar transistor, the collector and emitter of the lateral pnp bipolar transistor, and the back gate of the lateral DMOS transistor.

This thermal processing also forms thermal oxide film 63*a* covering emitter-leading pad layer 163 and the base-leading pad layer (152*a* and 152*b*), and forms thermal oxide film 63*b* covering the gate electrode (151*h* and 152*b*1) of the lateral DMOS transistor.

Figure 161:
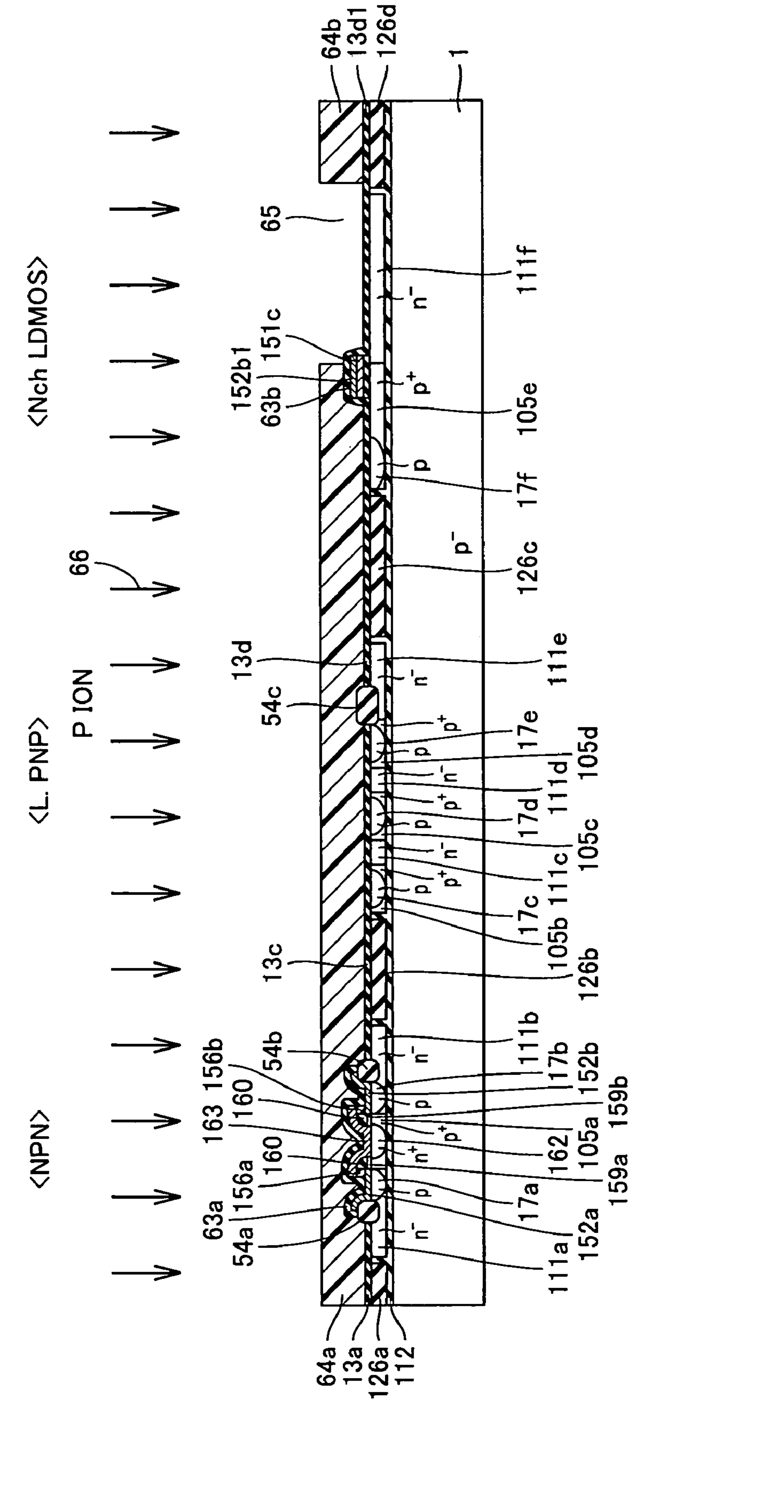
Figure 162:
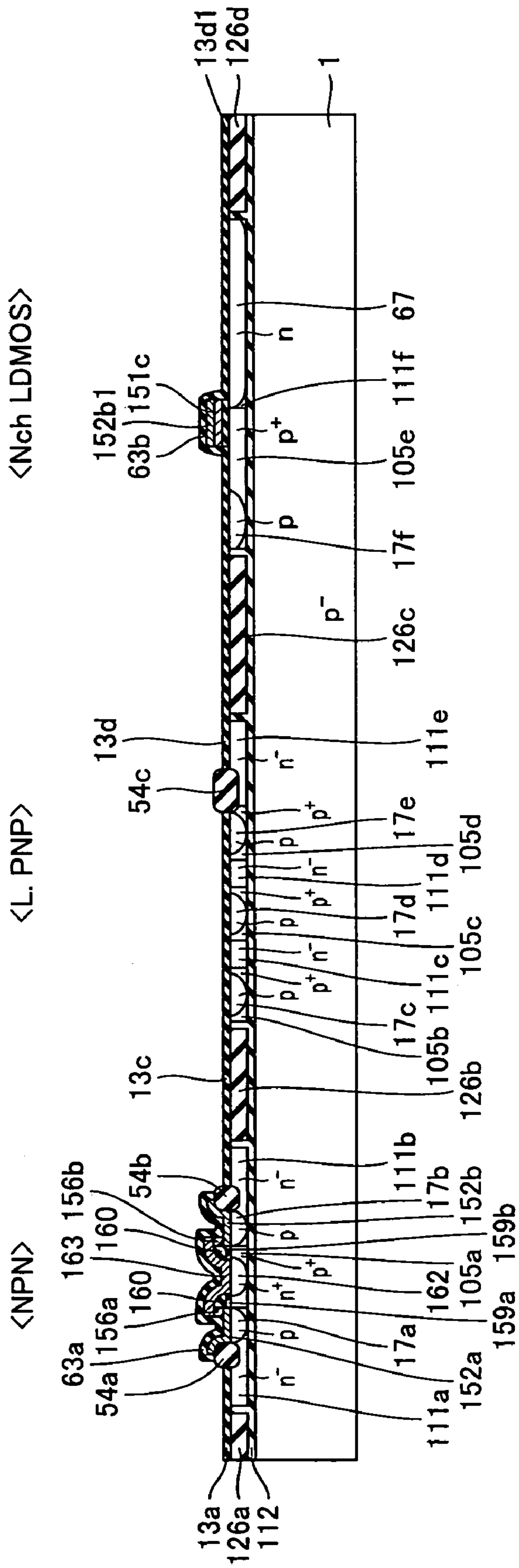

As shown in FIG. 161, photoresist patterns 64*a* and 64*b* having opening 65 are formed on a region, in which the drain of the lateral DMOS transistor is to be formed. Using photoresist patterns 64*a* and 64*b* as a mask, n-type impurities such as phosphorus ions are introduced into $n^-$-silicon substrate 111*f* by an ion implanting method. After removing photoresist patterns 64*a* and 64*b*, thermal processing is performed. This forms n-type diffusion layer ($n^-$-drain) 67 as shown in FIG. 162.

Figure 163:
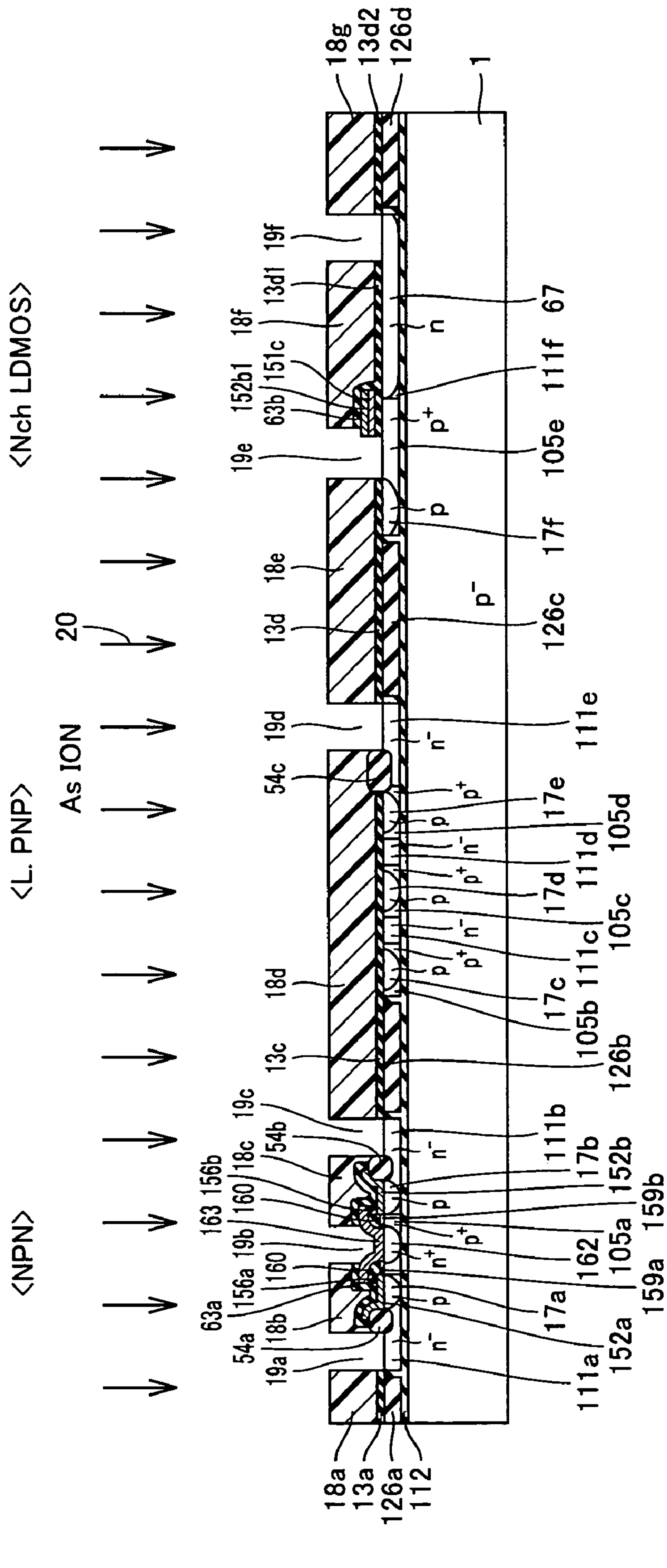

As shown in FIG. 163, processing is performed to form photoresist patterns 18*a*–18*g* having openings located on a region, in which the emitter and collector of the lateral npn bipolar transistor is to be formed, on a region, in which the base of the lateral pnp bipolar transistor is to be formed, and on regions, in which the source and drain of the lateral DMOS transistor are to be formed. Etching is effected on thermal oxide films 13*b*, 63*a*, 13*d*, 63*a*, 13*d* and 13*d*1 masked with photoresist patterns 18*a*–18*g* to form openings 19*a*–19*f*.

Figure 164:
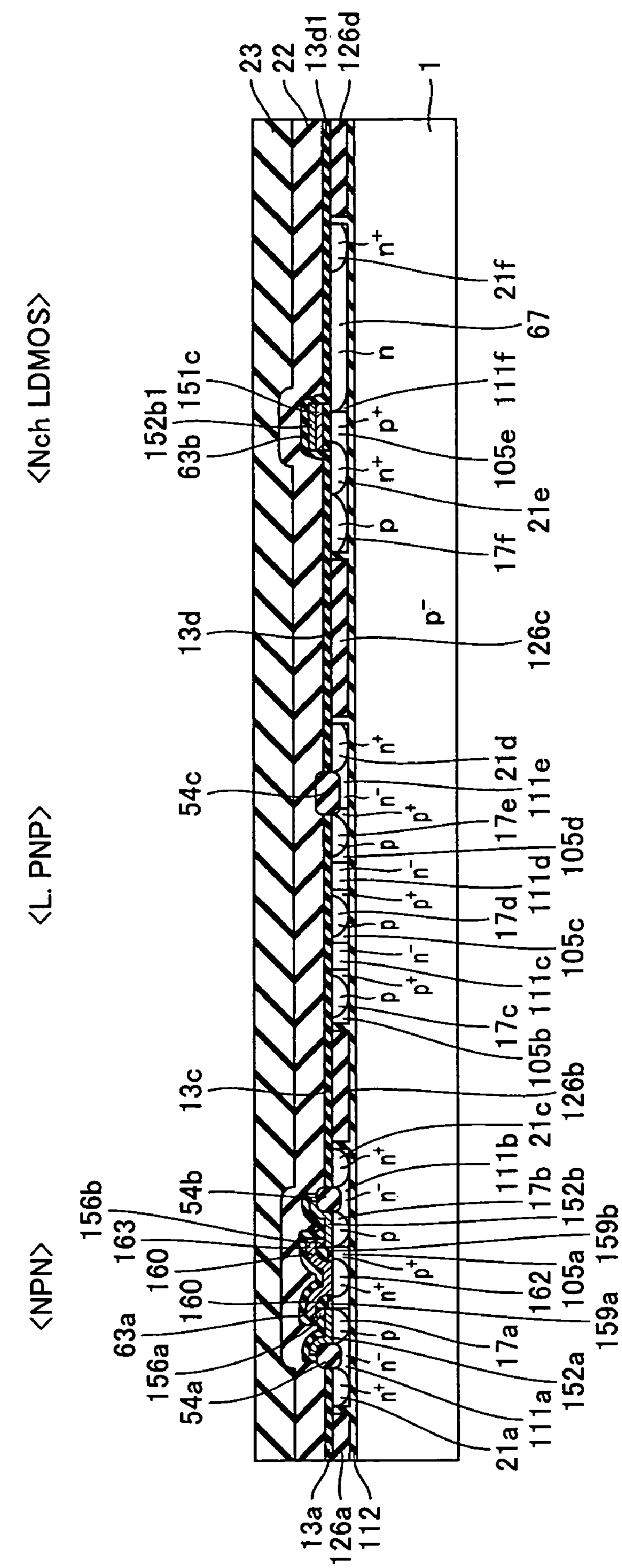

Using photoresist patterns. 18*a*–18*g* as a mask, n-type impurity ions 20 such as arsenic or phosphorus ions are then introduced by an ion implanting method into $n^-$-silicon substrates 111*a*, 111*b*; 111*e* and 111*f*, epitaxial growth layer 105*e* and emitter-leading pad layer 163. After removing photoresist patterns 18*a*–18*g*, thermal processing is performed. This forms $n^+$-diffusion layers 21*a* and 21*c*–21*f* as shown in FIG. 164. Thus, the thermal processing simultaneously forms the collector of the lateral npn bipolar transistor, the base of the lateral pnp bipolar transistor, and the source and drain of the lateral DMOS transistor. This thermal processing also forms a thermal oxide film on implantation openings 19*a*–19*f*.

Then, a CVD method is performed to deposit first interlayer insulating film 22 made of a CVD oxide film, which is, e.g., not doped with impurities and has a thickness of about 0.2 μm. Further, a CVD method is performed to deposit second interlayer insulating film 23 made of a CVD oxide film, which is doped with, e.g., boron and phosphorus, and has a thickness of about 0.6 μm. Thereafter, appropriate thermal processing is performed to fluidize second interlayer insulating film 23 for flattening the wafer surface.

Figure 165:
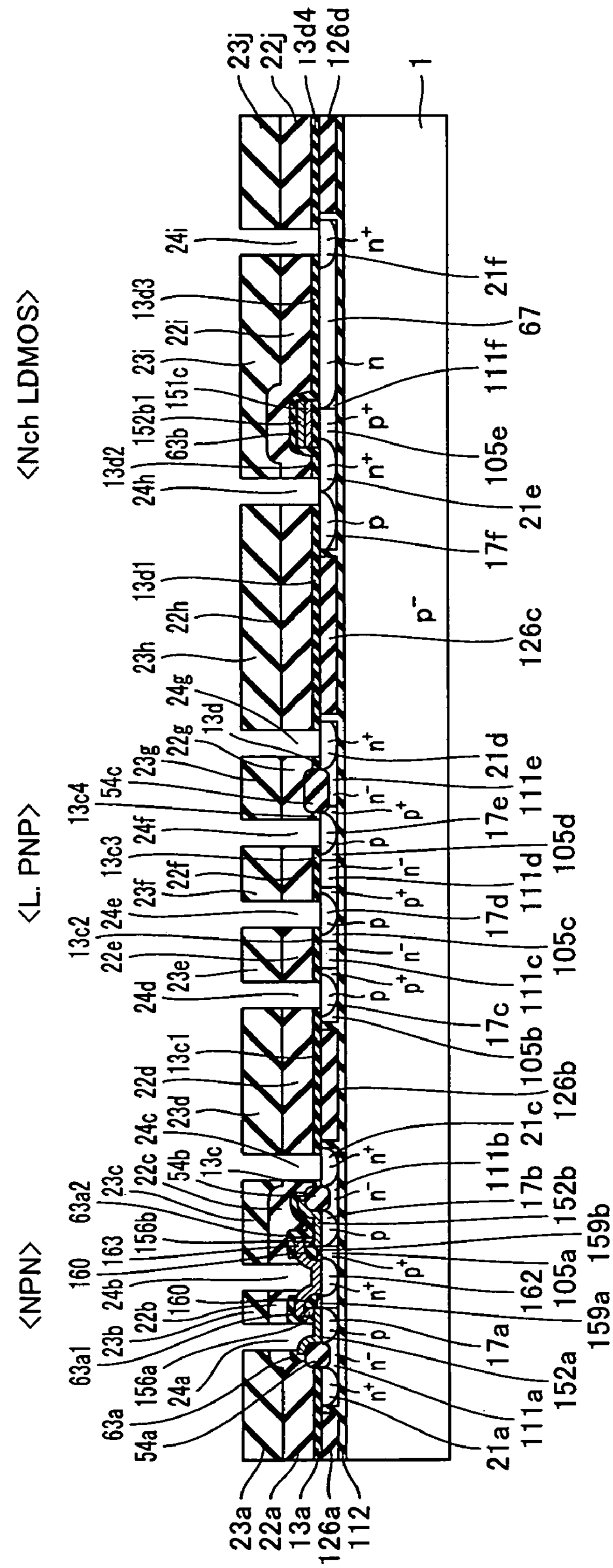

Then, a photoresist pattern (not shown) of a predetermined configuration is formed on second interlayer insulating film 23. Using this photoresist pattern as a mask, dry etching is performed by an RIE method. This etching forms contact holes 24*a*–24*i* as shown in FIG. 165.

First and second interlayer insulating films 22*a*–22*j* and 23*a*–23*j* remain around contact holes 24*a*–24*i*, and also thermal oxide films 63*a*, 63*a*1, 63*a*2, 13*c*, 13*c*1, 13*c*2, 13*c*3, 13*c*4, 13*d*, 13*d*1, 13*d*2, 63*b*, 13*d*3 and 13*d*4 remain. Although not shown, a contact hole for gate electrode (152*b*1 and 151*c*) is formed at the same time.

Then, a sputtering method or the like is performed to form a metal film, which is, e.g., about 0.6 μm in thickness and is made of AlSi, AlCu or the like, over the whole surface. By patterning the metal film, first interconnections 25*a*–25*i* are formed as shown in FIG. 166. Thereafter, the semiconductor device of the eighth embodiment is completed through the steps similar to those in the first embodiment.

Although the embodiments of the invention have been described, appropriate combination of the foregoing features of the various embodiments has been intended from the outset.

The idea and concept of the invention can be summarized as follows. A semiconductor device according to the invention includes a semiconductor substrate of a first conductivity type; a semiconductor layer of a second conductivity type formed on the semiconductor substrate; a field insulating film formed selectively on a surface of the semiconductor layer; an element isolating region of the first conductivity type extending from the surface of the semiconductor layer to the semiconductor substrate, and isolating each of elements; a gate electrode of a DMOS transistor formed on the semiconductor layer with a gate insulating film therebetween; a well region of the first conductivity type formed at the surface of the semiconductor layer, and extending from a source side of the DMOS transistor to a position under the gate electrode; a first impurity diffusion layer of the first conductivity type formed at the surface of the semiconductor layer, and functioning as a base of a first bipolar transistor;

a second impurity diffusion layer of the first conductivity type formed at the surface of the semiconductor layer, and functioning as a resistance; third and fourth impurity diffusion layers of the first conductivity type formed at the surface of the semiconductor layer, and functioning as an emitter and a collector of a second bipolar transistor; a fifth impurity diffusion layer of the first conductivity type formed at a surface of the well region, and functioning as a back gate region of the DMOS transistor; a sixth impurity diffusion layer formed at the surface of the semiconductor layer, functioning as a drain of the DMOS transistor, and having a lightly doped region containing impurities of the second conductivity type at a relatively low concentration and a first heavily doped region containing impurities of the second conductivity type at a relatively high concentration; seventh and eighth impurity diffusion layers of the second conductivity type formed at the surface of the semiconductor layer, and functioning as emitter- and collector-leading layers of the first bipolar transistor; a ninth impurity diffusion layer of the second conductivity type formed at the surface of the semiconductor layer, and functioning as a base-leading layer of the second bipolar transistor; and a tenth impurity diffusion layer formed at the surface of the well region, functioning as a source of the DMOS transistor, and formed of a second heavily doped region containing impurities of the second conductivity type at a concentration similar to the concentration of the first heavily doped region.

The first bipolar transistor is an npn bipolar transistor, the second bipolar transistor is a pnp bipolar transistor, the emitter of the second bipolar transistor is connected to a power supply terminal, a base of the second bipolar transistor is connected to an input terminal, the collector of the second bipolar transistor is connected to the base of the first bipolar transistor, a collector of the first bipolar transistor is connected to the power supply terminal via a resistance, and an emitter of the first bipolar transistor is connected to an output terminal and a drain of the DMOS transistor, a gate of the DMOS transistor is connected to an inverted input terminal, and a source and the back gate region of the DMOS transistor are grounded.

Preferably, the semiconductor device described above includes an interlayer insulating film covering the first bipolar transistor, the second bipolar transistor and the DMOS transistor, and having contact holes reaching the first to tenth impurity diffusion layers and the gate electrode of the DMOS transistor; a heavily doped impurity diffusion layer of the first conductivity type formed at surfaces of the first, second, third, fourth and fifth impurity diffusion layers located immediately under the contact holes; a silicide layer formed at a surface of the heavily doped impurity diffusion layer; a nitride metal layer extending from an end of the silicide layer to a position on a sidewall of the contact hole; and an interconnection formed on the silicide layer and the nitride metal layer.

Preferably, a channel region of the DMOS transistor is formed of a compound semiconductor layer of the first conductivity type containing silicon and germanium (Ge) or containing silicon, germanium and carbon.

According to another aspect of the invention, a semiconductor device includes a semiconductor substrate of a first conductivity type; a semiconductor layer of a second conductivity type formed on the semiconductor substrate with an insulating film therebetween; a field insulating film formed selectively on a surface of the semiconductor layer; an element isolating region extending from a surface of the semiconductor layer to the semiconductor substrate, and isolating each of elements; a compound semiconductor layer of the first conductivity type extending through the semiconductor layer to the insulating film, and containing a combination of silicon and germanium (Ge) or a combination of silicon, germanium and carbon; a gate electrode of a DMOS transistor formed on the compound semiconductor layer with a gate insulating film therebetween; a first impurity diffusion layer of the first conductivity type formed at the surface of the semiconductor layer, and functioning as a base of a first bipolar transistor; a second impurity diffusion layer of the first conductivity type formed at the surface of the semiconductor layer, and functioning as a resistance; third and fourth impurity diffusion layers of the first conductivity type formed at the surface of the semiconductor layer, and functioning as an emitter and a collector of a second bipolar transistor; a fifth impurity diffusion layer of the first conductivity type formed at the surface of the compound semiconductor layer, and functioning as a back gate region of the DMOS transistor; a sixth impurity diffusion layer formed at the surface of the semiconductor layer, functioning as a drain of the DMOS transistor, and having a lightly doped region containing impurities of the second conductivity type at a relatively low concentration and a first heavily doped region containing impurities of the second conductivity type at a relatively high concentration; seventh and eighth impurity diffusion layers of the second conductivity type formed at the surface of the semiconductor layer, and functioning as emitter- and collector-leading layers of the first bipolar transistor; a ninth impurity diffusion layer of the second conductivity type formed at the surface of the semiconductor layer, and functioning as a base-leading layer of the second bipolar transistor; and a tenth impurity diffusion layer formed at the surface of the compound semiconductor layer, functioning as a source of the DMOS transistor, and formed of a second heavily doped region containing impurities of the second conductivity type at a concentration similar to that of the first heavily doped region.

According to still another aspect of the invention, a semiconductor device includes a semiconductor substrate of a first conductivity type; a semiconductor layer of a second conductivity type formed on the semiconductor substrate with an insulating film therebetween; a field insulating film formed selectively on a surface of the semiconductor layer; an element isolating region extending from a surface of the semiconductor layer to the semiconductor substrate, and isolating each of elements; a first compound semiconductor layer of the first conductivity type extending through the semiconductor layer to the insulating film, containing a combination of silicon and germanium (Ge) or a combination of silicon, germanium and carbon, and having a region to be used as a base of a first bipolar transistor; second and third compound semiconductor layers extending through the semiconductor layer to the insulating film, containing a combination of silicon and germanium (Ge) or a combination of silicon, germanium and carbon, and having regions to be used as an emitter and a collector of a second bipolar transistor; a fourth compound semiconductor layer extending through the semiconductor layer to the insulating film, containing a combination of silicon and germanium (Ge) or a combination of silicon, germanium and carbon, and having regions to be used as a channel region of a DMOS transistor and a region immediately under the channel region; a gate electrode of the DMOS transistor formed on the fourth compound semiconductor layer with a gate insulating film therebetween; a first impurity diffusion layer of the first conductivity type formed at the surface of the semiconductor layer, being in contact with a periphery of the first compound semiconductor layer, and functioning as a base-leading layer of the first bipolar transistor; a second impurity diffusion layer of the first conductivity type formed at the surface of the semiconductor layer, and functioning as a resistance; third and fourth impurity diffusion layers of the first conductivity type formed at surfaces of the second and third compound semiconductor layers, and functioning as emitter- and collector-leading layers of the second bipolar transistor; a fifth impurity diffusion layer of the first conductivity type formed at the surface of the fourth compound semiconductor layer, and functioning as a back gate region of the DMOS transistor; a sixth impurity diffusion layer formed at the surface of the semiconductor layer, functioning as a drain of the DMOS transistor, and having a lightly doped region containing impurities of the second conductivity type at a relatively low concentration and a first heavily doped region containing impurities of the second conductivity type at a relatively high concentration; seventh and eighth impurity diffusion layers of the second conductivity type formed at the surface of the semiconductor layer, and functioning as emitter- and collector-leading layers of the first bipolar transistor; a ninth impurity diffusion layer of the second conductivity type formed at the surface of the semiconductor layer, and functioning as a base-leading layer of the second bipolar transistor; and a tenth impurity diffusion layer formed at the surface of the fourth compound semiconductor layer, functioning as a source of the DMOS transistor, and formed of a second heavily doped region containing impurities of the second conductivity type at a concentration similar to that of the first heavily doped region.

It is preferable that the first to tenth impurity diffusion layers described above reach the insulating film. The first impurity diffusion layer preferably has a plurality of first protruding regions protruding outward, and the eighth impurity diffusion layer preferably has a second protruding region protruding inward toward a position between the first protruding regions. Further, the first, seventh and eighth impurity diffusion layers preferably have concentric forms.

In the semiconductor device described above, a gate electrode of the DMOS transistor is preferably formed of a layered structure of a first semiconductor layer forming a lower layer portion and a second semiconductor layer forming an upper layer portion, and the semiconductor device preferably includes a base-leading electrode of the first bipolar transistor located on the first impurity diffusion layer and formed of the second semiconductor layer, and an emitter-leading electrode of the first bipolar transistor located on the seventh impurity diffusion layer, and formed of a third semiconductor layer isolated from the base-leading electrode by an insulating film.

Preferably, impurities of the second conductivity type are diffused from the first semiconductor layer into the second semiconductor layer of the gate electrode such that the second semiconductor layer of the gate electrode attains the second conductivity type, and the base-leading electrode of the first bipolar transistor made of the second semiconductor layer attains the first conductivity type.

The invention also provides a method of manufacturing a semiconductor device including a first bipolar transistor having a base of a first conductivity type, a second bipolar transistor having a base of a second conductivity type, and a DMOS transistor, and the method includes the following steps. A semiconductor layer of a second conductivity type is formed on a semiconductor substrate of the first conductivity type. A field insulating film is selectively formed on a surface of the semiconductor layer. Impurities of the first conductivity type are selectively introduced into the surface of the semiconductor layer to form an element isolating region extending from the surface of the semiconductor layer to the semiconductor substrate, and isolating each of elements. A gate electrode of the DMOS transistor is formed on the semiconductor layer with a gate insulating film therebetween. Impurities of the first conductivity type are selectively introduced into the surface of the semiconductor layer to form a well region extending from the source side of the DMOS transistor to a position under the gate electrode. Impurities of the first conductivity type are selectively introduced into the surface of the semiconductor layer to form a first impurity diffusion layer functioning as a base of a first bipolar transistor, a second impurity diffusion layer functioning as a resistance, third and fourth impurity diffusion layers functioning as an emitter and a collector of the second bipolar transistor, and a fifth impurity diffusion layer functioning as a back gate region of the DMOS transistor and located at the surface of the well region. Impurities of the second conductivity type are selectively introduced into the semiconductor layer to form a lightly doped region of a drain of the DMOS transistor. Impurities of the second conductivity type are selectively introduced into the semiconductor layer to form a sixth impurity diffusion layer functioning as the drain of the DMOS transistor, seventh and eighth impurity diffusion layers functioning as emitter- and collector-leading layers of the first bipolar transistor, a ninth impurity diffusion layer functioning as a base-leading layer of the second bipolar transistor, and a tenth impurity diffusion layer functioning as a source of the DMOS transistor.

Preferably, the method of manufacturing the semiconductor device further includes the following steps. An interlayer insulating film covering the first and second bipolar transistors and the DMOS transistor is formed. Contact holes reaching the first to tenth impurity diffusion layers and the gate electrode of the DRAM transistor are formed in the interlayer insulating film. A mask is formed to expose contact holes reaching the first to fifth impurity diffusion layers, and to cover the contact holes reaching the sixth to tenth impurity diffusion layers and the gate electrode of the DMOS transistor. Using the mask, impurities of the first conductivity type are introduced into the surfaces of the first and third to fifth impurity diffusion layers to form a heavily doped impurity diffusion layer. The mask is removed. A metal film extending into the contact holes is formed on the interlayer insulating film. Thermal processing is effected on the metal film in a nitrogen atmosphere to form a silicide layer at the surface of the heavily doped impurity diffusion layer, and to change the metal film on a sidewall of the contact hole into a metal nitride film. An interconnection is formed on the silicide layer and the metal nitride film.

Further preferably, the method includes the steps of forming an insulating film on a whole surface of the semiconductor layer before forming the well region, forming an opening exposing the surface of the well region in the insulating film, and forming a compound semiconductor layer of the first conductivity type containing a combination of silicon and germanium (Ge) or a combination of silicon, germanium and carbon on the exposed surface of the well region. The step of forming the gate electrode preferably includes the step of forming the gate electrode on the compound semiconductor layer with the gate insulating film therebetween.

According to another aspect of the invention, the invention provides a method of manufacturing a semiconductor device including a first bipolar transistor having a base of a first conductivity type, a second bipolar transistor having a base of a second conductivity type, and a DMOS transistor, and the method includes the following steps. A first trench is formed at a first semiconductor substrate of the second conductivity type. The first trench is filled with a compound semiconductor layer of the first conductivity type containing a combination of silicon and germanium (Ge) or a combination of silicon, germanium and carbon. A second semiconductor substrate of the first conductivity type is joined onto the first semiconductor substrate with a first interlayer insulating film therebetween. A thickness of the first semiconductor substrate is reduced to expose the compound semiconductor layer. A second trench extending through the first semiconductor substrate to the first insulating film is formed. The second trench is filled with a third insulating film or a semiconductor film with a second insulating film therebetween. A field insulating film is selectively formed at the surface of the first semiconductor substrate. A gate electrode of the DMOS transistor is formed on the compound semiconductor layer with a gate insulating film therebetween. Impurities of the first conductivity type are selectively introduced into the first semiconductor substrate and the compound semiconductor layer to form a first impurity diffusion layer functioning as a base of the first bipolar transistor, a second impurity diffusion layer functioning as a resistance, third and fourth impurity diffusion layers functioning as an emitter and a collector of the second bipolar transistor, and a fifth impurity diffusion layer functioning as a back gate region of the DMOS transistor and located at the surface of the compound semiconductor layer. Impurities of the second conductivity type are selectively introduced into the first semiconductor substrate to form a lightly doped region of a drain of the DMOS transistor. Impurities of the second conductivity type are selectively introduced into the first semiconductor substrate and the compound semiconductor layer to form a sixth impurity diffusion layer functioning as the drain of the DMOS transistor, seventh and eighth impurity diffusion layers functioning as emitter- and collector-leading layers of the first bipolar transistor, a ninth impurity diffusion layer functioning as a base-leading layer of the second bipolar transistor, and a tenth impurity diffusion layer functioning as a source of the DMOS transistor.

The steps of forming the gate electrode of the DMOS transistor preferably includes the steps of successively forming the gate insulating film and a first semiconductor layer of the second conductivity type on the first semiconductor substrate and the compound semiconductor layer; patterning the first semiconductor layer to remove the gate insulating film and the first semiconductor layer located on a region to be used for forming the first impurity diffusion layer; forming a second semiconductor layer not doped with impurities and covering the first semiconductor layer; introducing impurities of the first conductivity type into a portion of the second semiconductor layer forming a base-leading electrode of the first bipolar transistor; depositing a first interlayer insulating film on the second semiconductor layer, and patterning the first interlayer insulating film and the second semiconductor layer to form an opening on a region to be used for forming the seventh impurity diffusion layer; depositing a second interlayer insulating film on the first interlayer insulating film, and effecting anisotropic etching on the second interlayer insulating film to form a sidewall spacer on a sidewall of the opening; forming a third semiconductor layer on the second interlayer insulating film, and patterning the third semiconductor layer to form an emitter-leading electrode of the first bipolar transistor; removing the first interlayer insulating film; and patterning the first and second semiconductor layers to form a base-leading electrode of the first bipolar transistor and a gate electrode of the DMOS transistor.

It is preferable that a concentration of the impurities of the second conductivity type introduced into the first semiconductor layer is higher than a concentration of the impurities of the first conductivity type introduced into the second semiconductor layer such that the conductivity type of the second semiconductor layer is changed into the second conductivity type by diffusing the impurities of the second conductivity type from the first semiconductor layer into the second semiconductor layer.

According to still another aspect of the invention, the invention provides a method of manufacturing a semiconductor device including a first bipolar transistor having a base of a first conductivity type, a second bipolar transistor having a base of a second conductivity type, and a DMOS transistor, and the method includes the following steps. First to fourth trenches are formed at a first semiconductor substrate of the second conductivity type with a space between each other. The first to fourth trenches are filled with first to fourth compound semiconductor layers of the first conductivity type containing a combination of silicon and germanium (Ge) or a combination of silicon, germanium and carbon, respectively. A second semiconductor substrate of the first conductivity type is joined onto the first semiconductor substrate with a first interlayer insulating film therebetween. A thickness of the first semiconductor substrate is reduced to expose the first to fourth compound semiconductor layers. A fifth trench extending through the first semiconductor substrate to the first insulating film is formed. The fifth trench is filled with a third insulating film or a semiconductor film with a second insulating film therebetween. A field insulating film is selectively formed at the surface of the first semiconductor substrate. A gate electrode of the DMOS transistor is formed on the fourth compound semiconductor layer with a gate insulating film therebetween. Impurities of the first conductivity type are selectively introduced into the first semiconductor substrate and the second to fourth compound semiconductor layers to form a portion of a first impurity diffusion layer functioning as a base-leading layer of the first bipolar transistor, a second impurity diffusion layer functioning as a resistance, third and fourth impurity diffusion layers functioning as emitter- and collector-leading layers of the second bipolar transistor and located at the surfaces of the second and third compound semiconductor layers, and a fifth impurity diffusion layer functioning as a back gate region of the DMOS transistor and located at the surface of the fourth compound semiconductor layer. Impurities of the second conductivity type are selectively introduced into the first semiconductor substrate to form a lightly doped region of a drain of the DMOS transistor. Impurities of the second conductivity type are selectively introduced into the first semiconductor substrate and the first and fourth compound semiconductor layers to form a sixth impurity diffusion layer functioning as a drain of the DMOS transistor, seventh and eighth impurity diffusion layers functioning as emitter- and collector-leading layers of the first bipolar transistor, a ninth impurity diffusion layer functioning as a base-leading layer of the second bipolar transistor, and a tenth impurity diffusion layer functioning as a source of the DMOS transistor and located at the surface of the fourth compound semiconductor layer.

The steps of forming the first to tenth impurity diffusion layers preferably includes a step of forming the first to tenth impurity diffusion layers reaching the first insulating film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor substrate of a first conductivity type;

a semiconductor layer of a second conductivity type formed on said semiconductor substrate;

a field insulating film formed selectively on a surface of said semiconductor layer;

an element isolating region of the first conductivity type extending from the surface of said semiconductor layer to said semiconductor substrate, and isolating each of elements;

a gate electrode of a DMOS (Double-Diffused Metal Oxide Semiconductor) transistor formed on said semiconductor layer with a gate insulating film therebetween;

a well region of the first conductivity type formed at the surface of said semiconductor layer, and extending from a source side of said DMOS transistor to a position under said gate electrode;

a first impurity diffusion layer of the first conductivity type formed at the surface of said semiconductor layer, and functioning as a base of a first bipolar transistor;

a second impurity diffusion layer of the first conductivity type formed at the surface of said semiconductor layer, and functioning as a resistance;

third and fourth impurity diffusion layers of the first conductivity type formed at the surface of said semiconductor layer, and functioning as an emitter and a collector of a second bipolar transistor;

a fifth impurity diffusion layer of the first conductivity type formed at a surface of said well region, and functioning as a back gate region of said DMOS transistor;

a sixth impurity diffusion layer formed at the surface of said semiconductor layer, functioning as a drain of said DMOS transistor, and having a lightly doped region containing impurities of the second conductivity type at a relatively low concentration and a first heavily doped region containing impurities of the second conductivity type at a relatively high concentration;

seventh and eighth impurity diffusion layers of the second conductivity type formed at the surface of said semiconductor layer, and functioning as emitter- and collector-leading layers of said first bipolar transistor;

a ninth impurity diffusion layer of the second conductivity type formed at the surface of said semiconductor layer, and functioning as a base-leading layer of the second bipolar transistor; and a tenth impurity diffusion layer formed at the surface of said well region, functioning as a source of said DMOS transistor, and formed of a second heavily doped region containing impurities of the second conductivity type at a concentration similar to the concentration of said first heavily doped region.

2. The semiconductor device according to claim 1, wherein said first bipolar transistor is an npn bipolar transistor, and said second bipolar transistor is a pnp bipolar transistor;

the emitter of said second bipolar transistor is connected to a power supply terminal;

a base of said second bipolar transistor is connected to an input terminal;

the collector of said second bipolar transistor is connected to the base of said first bipolar transistor;

a collector of said first bipolar transistor is connected to said power supply terminal via a resistance; and an emitter of said first bipolar transistor is connected to an output terminal and a drain of said DMOS transistor;

a gate of said DMOS transistor is connected to an inverted input terminal; and a source and said back gate region of said DMOS transistor are grounded.

3. The semiconductor device according to claim 1, further comprising:

an interlayer insulating film covering said first bipolar transistor, said second bipolar transistor and said DMOS transistor, and having contact holes reaching said first to tenth impurity diffusion layers and the gate electrode of said DMOS transistor;

a heavily doped impurity diffusion layer of the first conductivity type formed at surfaces of said first, second, third, fourth and fifth impurity diffusion layers located immediately under said contact holes;

a silicide layer formed at a surface of said heavily doped impurity diffusion layer;

a nitrided metal layer extending from an end of said silicide layer to a position on a sidewall of said contact hole; and an interconnection formed on said silicide layer and said nitrided metal layer.

4. The semiconductor device according to claim 1, wherein a channel region of said DMOS transistor is formed of a compound semiconductor layer of the first conductivity type containing silicon and germanium (Ge) or containing silicon, germanium and carbon.

5. A semiconductor device comprising:

a semiconductor substrate of a first conductivity type;

a semiconductor layer of a second conductivity type formed on said semiconductor substrate with an insulating film therebetween;

a field insulating film formed selectively on a surface of said semiconductor layer;

an element isolating region extending from a surface of said semiconductor layer to said semiconductor substrate, and isolating each of elements;

a compound semiconductor layer of the first conductivity type extending through said semiconductor layer to said insulating film, and containing a combination of silicon and germanium (Ge) or a combination of silicon, germanium and carbon;

a gate electrode of a DMOS (Double-Diffused Metal Oxide Semiconductor) transistor formed on said compound semiconductor layer with a gate insulating film therebetween;

a first impurity diffusion layer of the first conductivity type formed at the surface of said semiconductor layer, and functioning as a base of a first bipolar transistor;

a second impurity diffusion layer of the first conductivity type formed at the surface of said semiconductor layer, and functioning as a resistance;

third and fourth impurity diffusion layers of the first conductivity type formed at the surface of said semiconductor layer, and functioning as an emitter and a collector of a second bipolar transistor;

a fifth impurity diffusion layer of the first conductivity type formed at the surface of said compound semiconductor layer, and functioning as a back gate region of said DMOS transistor;

a sixth impurity diffusion layer formed at the surface of said semiconductor layer, functioning as a drain of said DMOS transistor, and having a lightly doped region containing impurities of the second conductivity type at a relatively low concentration and a first heavily doped region containing impurities of the second conductivity type at a relatively high concentration;

seventh and eighth impurity diffusion layers of the second conductivity type formed at the surface of said semiconductor layer, and functioning as emitter- and collector-leading layers of said first bipolar transistor;

a ninth impurity diffusion layer of the second conductivity type formed at the surface of said semiconductor layer, and functioning as a base-leading layer of the second bipolar transistor; and a tenth impurity diffusion layer formed at the surface of said compound semiconductor layer, functioning as a source of said DMOS transistor, and formed of a second heavily doped region containing impurities of the second conductivity type at a concentration similar to that of said first heavily doped region.

6. A semiconductor device comprising:

a semiconductor substrate of a first conductivity type;

a semiconductor layer of a second conductivity type formed on said semiconductor substrate with an insulating film therebetween;

a field insulating film formed selectively on a surface of said semiconductor layer;

an element isolating region extending from a surface of said semiconductor layer to said semiconductor substrate, and isolating each of elements;

a first compound semiconductor layer of the first conductivity type extending through said semiconductor layer to said insulating film, containing a combination of silicon and germanium (Ge) or a combination of silicon, germanium and carbon, and having a region to be used as a base of a first bipolar transistor;

second and third compound semiconductor layers extending through said semiconductor layer to said insulating film, containing a combination of silicon and germanium (Ge) or a combination of silicon, germanium and carbon, and having regions to be used as an emitter and a collector of a second bipolar transistor;

a fourth compound semiconductor layer extending through said semiconductor layer to said insulating film, containing a combination of silicon and germanium (Ge) or a combination of silicon, germanium and carbon, and having regions to be used as a channel region of a DMOS (Double-Diffused Metal Oxide Semiconductor) transistor and a region immediately under the channel region;

a gate electrode of said DMOS transistor formed on said fourth compound semiconductor layer with a gate insulating film therebetween;

a first impurity diffusion layer of the first conductivity type formed at the surface of said semiconductor layer, being in contact with a periphery of said first compound semiconductor layer, and functioning as a base-leading layer of said first bipolar transistor;

a second impurity diffusion layer of the first conductivity type formed at the surface of said semiconductor layer, and functioning as a resistance;

third and fourth impurity diffusion layers of said first conductivity type formed at surfaces of said second and third compound semiconductor layers, and functioning as emitter- and collector-leading layers of said second bipolar transistor;

a fifth impurity diffusion layer of the first conductivity type formed at the surface of said fourth compound semiconductor layer, and functioning as a back gate region of said DMOS transistor;

a sixth impurity diffusion layer formed at the surface of said semiconductor layer, functioning as a drain of said DMOS transistor, and having a lightly doped region containing impurities of the second conductivity type at a relatively low concentration and a first heavily doped region containing impurities of the second conductivity type at a relatively high concentration;

seventh and eighth impurity diffusion layers of the second conductivity type formed at the surface of said semiconductor layer, and functioning as emitter- and collector-leading layers of said first bipolar transistor;

a ninth impurity diffusion layer of the second conductivity type formed at the surface of said semiconductor layer, and functioning as a base-leading layer of the second bipolar transistor; and a tenth impurity diffusion layer formed at the surface of said fourth compound semiconductor layer, functioning as a source of said DMOS transistor, and formed of a second heavily doped region containing impurities of the second conductivity type at a concentration similar to that of said first heavily doped region.

7. The semiconductor device according to claim 6, wherein said first to tenth impurity diffusion layers reach said insulating film.

8. The semiconductor device according to claim 7, wherein said first impurity diffusion layer has a plurality of first protruding regions protruding outward, and said eighth impurity diffusion layer has a second protruding region protruding inward toward a position between said first protruding regions.

9. The semiconductor device according to claim 8, wherein said first, seventh and eighth impurity diffusion layers have concentric forms.

10. The semiconductor device according to claim 6, wherein a gate electrode of said DMOS transistor is formed of a stacked structure of a first semiconductor layer forming a lower layer portion and a second semiconductor layer forming an upper layer portion; and said semiconductor device further comprises a base-leading electrode of said first bipolar transistor located on said first impurity diffusion layer and formed of said second semiconductor layer, and an emitter-leading electrode of said first bipolar transistor located on said seventh impurity diffusion layer, and formed of a third semiconductor layer isolated from said base-leading electrode by an insulating film.

11. The semiconductor device according to claim 10, wherein impurities of the second conductivity type are diffused from said first semiconductor layer into the second semiconductor layer of said gate electrode such that the second semiconductor layer of said gate electrode attains the second conductivity type, and said base-leading electrode of the first bipolar transistor made of said second semiconductor layer attains the first conductivity type.

* * * * *